United States Patent
Lu et al.

(10) Patent No.: US 11,653,559 B2
(45) Date of Patent: May 16, 2023

(54) METAL COMPLEX CONTAINING A FIRST LIGAND, A SECOND LIGAND, AND A THIRD LIGAND

(71) Applicant: BEIJING SUMMER SPROUT TECHNOLOGY CO., LTD., Beijing (CN)

(72) Inventors: Nannan Lu, Beijing (CN); Zhihong Dai, Beijing (CN); Qi Zhang, Beijing (CN); Cuifang Zhang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 281 days.

(21) Appl. No.: 16/870,258

(22) Filed: May 8, 2020

(65) Prior Publication Data
US 2020/0358010 A1    Nov. 12, 2020

(30) Foreign Application Priority Data

May 9, 2019    (CN) .......................... 201910373360.9

(51) Int. Cl.
*C07F 15/00*    (2006.01)
*C09K 11/06*    (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .......................... H01L 51/0085; C07F 15/0033
See application file for complete search history.

(56) References Cited

U.S. PATENT DOCUMENTS

| 5,703,436 A | 12/1997 | Forrest et al. |
| 5,707,745 A | 1/1998 | Forrest et al. |
| (Continued) | | |

FOREIGN PATENT DOCUMENTS

| CN | 103159798 A | 6/2013 |
| CN | 103204880 A | 7/2013 |
| (Continued) | | |

OTHER PUBLICATIONS

C.W. Tang et al.; Organic Electroluminescent Diodes; Applied Physics Letters; 1987, 51 (12): pp. 913-915.
(Continued)

*Primary Examiner* — Caleb E Henry
(74) *Attorney, Agent, or Firm* — Sandberg Phoenix & von Gontard PC

(57) ABSTRACT

A metal complex containing three different ligands which may be used as a light-emitting material in a light-emitting layer of an organic electroluminescent device. These new complexes can not only achieve device performed desired to be adjusted or improved by adjusting substituents but also have the effect of effectively controlling increase of the evaporation temperature. Further disclosed are an electroluminescent device and a compound formulation including the metal complex.

20 Claims, 2 Drawing Sheets

(51) Int. Cl.
  *H10K 85/30* (2023.01)
  *H10K 50/11* (2023.01)
  *H10K 101/10* (2023.01)
(52) U.S. Cl.
  CPC ............... *C09K 2211/1029* (2013.01); *C09K 2211/185* (2013.01); *H10K 50/11* (2023.02); *H10K 2101/10* (2023.02)

(56) References Cited

U.S. PATENT DOCUMENTS

| | | |
|---|---|---|
| 5,844,363 A | 12/1998 | Gu et al. |
| 6,097,147 A | 8/2000 | Baldo et al. |
| 6,303,238 B1 | 10/2001 | Thompson et al. |
| 7,279,704 B2 | 10/2007 | Walters et al. |
| 7,968,146 B2 | 6/2011 | Wagner et al. |
| 2003/0072964 A1 | 4/2003 | Kwong et al. |
| 2003/0096138 A1 | 5/2003 | Lecloux et al. |
| 2003/0230980 A1 | 12/2003 | Forrest et al. |
| 2004/0174116 A1 | 9/2004 | Lu et al. |
| 2004/0241495 A1 | 12/2004 | Kwong et al. |
| 2006/0008671 A1 | 1/2006 | Kwong et al. |
| 2006/0008673 A1 | 1/2006 | Kwong et al. |
| 2007/0259205 A1 | 11/2007 | Ionkin et al. |
| 2007/0278936 A1 | 12/2007 | Herron et al. |
| 2008/0001515 A1 | 1/2008 | Iwanaga et al. |
| 2008/0074033 A1 | 3/2008 | Ionkin et al. |
| 2008/0194853 A1 | 8/2008 | Kim et al. |
| 2008/0261076 A1 | 10/2008 | Kwong et al. |
| 2010/0051869 A1 | 3/2010 | Chichak et al. |
| 2010/0090591 A1 | 4/2010 | Alleyne et al. |
| 2010/0270916 A1 | 10/2010 | Xia et al. |
| 2012/0119190 A1 | 5/2012 | Alleyne et al. |
| 2012/0181511 A1 | 7/2012 | Ma et al. |
| 2012/0217868 A1 | 8/2012 | Ma et al. |
| 2013/0146848 A1 | 6/2013 | Ma et al. |
| 2013/0299795 A1 | 11/2013 | Xia et al. |
| 2013/0328019 A1 | 12/2013 | Xia et al. |
| 2015/0001472 A1 | 1/2015 | Boudreault et al. |
| 2015/0053939 A1 | 2/2015 | Adamovich et al. |
| 2015/0171348 A1 | 6/2015 | Stoessel et al. |
| 2015/0188061 A1 | 7/2015 | Xia et al. |
| 2015/0214494 A1 | 7/2015 | Xia et al. |
| 2015/0236277 A1 | 8/2015 | Boudreault et al. |
| 2015/0287933 A1 | 10/2015 | Kottas et al. |
| 2015/0295187 A1 | 10/2015 | Boudreault et al. |
| 2015/0315222 A1 | 11/2015 | Boudreault et al. |
| 2015/0349273 A1 | 12/2015 | Hung et al. |
| 2015/0357587 A1 | 12/2015 | Kishino et al. |
| 2015/0364701 A1 | 12/2015 | Horiuchi et al. |
| 2016/0028023 A1 | 1/2016 | Boudreault et al. |
| 2016/0093808 A1 | 3/2016 | Adamovich et al. |
| 2016/0104848 A1 | 4/2016 | Boudreault et al. |
| 2016/0111661 A1 | 4/2016 | Boudreault et al. |
| 2016/0190486 A1 | 6/2016 | Lin et al. |
| 2016/0359122 A1 | 12/2016 | Boudreault et al. |
| 2017/0018718 A1* | 1/2017 | Jang ............... C09K 11/06 |
| 2017/0084849 A1 | 3/2017 | Tsai et al. |
| 2017/0092880 A1 | 3/2017 | Boudreault et al. |
| 2017/0098788 A1 | 4/2017 | Lee et al. |
| 2017/0098789 A1 | 4/2017 | Boudreault et al. |
| 2017/0229663 A1 | 8/2017 | Tsai et al. |
| 2017/0288157 A1 | 10/2017 | Joseph et al. |
| 2017/0365799 A1 | 12/2017 | Ji et al. |
| 2017/0365800 A1 | 12/2017 | Tsai et al. |
| 2017/0365801 A1 | 12/2017 | Margulies et al. |
| 2018/0013077 A1 | 1/2018 | Boudreault et al. |
| 2018/0051007 A1* | 2/2018 | Jung ............... H01L 51/0074 |
| 2018/0066180 A1* | 3/2018 | Huh ............... H01L 51/50 |
| 2018/0086775 A1* | 3/2018 | Hong ............... C09K 11/06 |
| 2018/0134954 A1 | 5/2018 | Tsai et al. |
| 2018/0190914 A1 | 7/2018 | Tsai et al. |
| 2018/0190915 A1 | 7/2018 | Ji et al. |
| 2018/0240988 A1 | 8/2018 | Boudreault et al. |
| 2018/0248126 A1* | 8/2018 | Huh ............... H01L 51/0058 |
| 2018/0277774 A1 | 9/2018 | Boudreault et al. |
| 2018/0315930 A1* | 11/2018 | Han ............... C07D 405/10 |
| 2018/0337341 A1* | 11/2018 | Heo ............... C07D 405/10 |
| 2018/0337348 A1* | 11/2018 | Jung ............... C07D 405/10 |
| 2019/0006602 A1* | 1/2019 | Chun ............... C07C 211/61 |
| 2019/0067598 A1 | 2/2019 | Li et al. |
| 2019/0077818 A1 | 3/2019 | Xia |
| 2019/0103574 A1 | 4/2019 | Xia |
| 2019/0127406 A1 | 5/2019 | Xia |
| 2019/0194234 A1 | 6/2019 | Xia |
| 2019/0237683 A1 | 8/2019 | Boudreault et al. |
| 2019/0248818 A1 | 8/2019 | Boudreault |
| 2019/0251619 A1 | 8/2019 | Kuchenski et al. |
| 2019/0252627 A1 | 8/2019 | Joseph et al. |
| 2020/0099000 A1 | 3/2020 | Zhang et al. |
| 2020/0251666 A1 | 8/2020 | Cai et al. |
| 2020/0354391 A1 | 11/2020 | Zhang et al. |
| 2020/0358010 A1 | 11/2020 | Lu et al. |
| 2020/0358011 A1 | 11/2020 | Lu et al. |
| 2021/0115069 A1 | 4/2021 | Dai et al. |
| 2021/0242411 A1 | 8/2021 | Liu et al. |
| 2022/0131093 A1 | 4/2022 | Zhang et al. |

FOREIGN PATENT DOCUMENTS

| | | |
|---|---|---|
| CN | 104022232 A | 9/2014 |
| CN | 108191916 A | 6/2018 |
| CN | 109438521 | 3/2019 |
| CN | 109467575 A | 3/2019 |
| CN | 109575083 A | 4/2019 |
| CN | 109651444 A | 4/2019 |
| CN | 109721628 A | 5/2019 |
| CN | 109956977 A | 7/2019 |
| CN | 110283216 A | 9/2019 |
| EP | 2907820 A1 | 8/2015 |
| EP | 2940098 A1 | 11/2015 |
| EP | 3007244 A1 | 4/2016 |
| JP | 1998158639 A | 6/1998 |
| JP | 2005508437 A | 3/2005 |
| JP | 2008532998 A | 8/2008 |
| JP | 2009539768 A | 11/2009 |
| JP | 2010516622 A | 5/2010 |
| JP | 2012525405 A | 10/2012 |
| JP | 2013121957 A | 6/2013 |
| JP | 2015010093 A | 1/2015 |
| JP | 2015530982 A | 10/2015 |
| JP | 2020186234 A | 11/2020 |
| JP | 2020186236 A | 11/2020 |
| KR | 20060097320 A | 9/2006 |
| KR | 20090039464 A | 4/2009 |
| KR | 20110077350 A | 7/2011 |
| KR | 20130110934 A | 10/2013 |
| KR | 20160041771 A | 4/2016 |
| KR | 20170142949 A | 12/2017 |
| KR | 20180065353 A | 6/2018 |
| KR | 20200130660 A | 11/2020 |
| KR | 20200130661 A | 11/2020 |
| KR | 20200130667 A | 11/2020 |
| WO | 2002044189 A1 | 6/2002 |
| WO | 2006095951 A1 | 9/2006 |
| WO | 2007143201 A1 | 12/2007 |
| WO | 2018084189 A | 5/2018 |
| WO | 2018084189 A1 | 5/2018 |
| WO | 2018105986 A1 | 6/2018 |
| WO | 2018124697 A1 | 7/2018 |

OTHER PUBLICATIONS

Japanese Office action dated May 7, 2021 from corresponding Japanese Application No. 2020-082876 with English translation.
Office action dated Mar. 24, 2022 from corresponding Korean Application No. 10-2020-0055253 with English translation.
Office action dated Mar. 25, 2022 from corresponding German Application No. 10 2020 205 828.8 with English translation.
The non-final office action cited in U.S. Appl. No. 16/869,770, dated Jul. 11, 2022.

(56) References Cited

OTHER PUBLICATIONS

Uoyama, Hiroki, et al., "Highly efficient organic light-emitting diodes from delayed fluorescence", Nature, vol. 492, Dec. 13, 2012 (7 pages).

Yuji Kawanishi, Tetsu Miyazawa, Taichi Abe, Deuterium Compound for Electronic Devices, Wako Organic Square 36 (2011), pp. 2-3. (21 pages total).

Yoko Sugiyama, Development of Phosphor Deuteride Light Probe, Taiyo Nippon Sanso Technical Report, No. 36 (2017), pp. 1-4. (8 pages total).

First office action dated May 18, 2022 from corresponding Chinese patent application 201910373360.9.

Search report dated May 18, 2022 from corresponding Chinese patent application 201910373360.9 which issued together with the Chinese first office action.

Second office action dated Nov. 30, 2022 from corresponding Chinese patent application 201910373360.9.

Second office action dated Feb. 24, 2022 from corresponding Japanese patent application 2020-082876.

Third office action dated Dec. 26, 2022 from corresponding Japanese patent application 2020-082876.

Second office action dated Oct. 25, 2022 from corresponding Korean patent application 10-2020-0055253.

\* cited by examiner

METAL COMPLEX CONTAINING A FIRST LIGAND, A SECOND LIGAND, AND A THIRD LIGAND

CROSS-REFERENCE TO RELATED APPLICATIONS

This application claims priority to a Chinese patent application No. CN201910373360.9 filed on May 9, 2019, disclosure of which is incorporated herein by reference in its entirety.

TECHNICAL FIELD

The present disclosure relates to compounds for organic electronic devices, for example, organic light-emitting devices. More particularly, the present disclosure relates to a metal complex containing three different ligands, and an electroluminescent device and a compound formulation including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Phosphorescent metal complexes can be used as phosphorescent doping materials of light-emitting layers and applied to the field of organic electroluminescence lighting or display. An iridium complex containing a phenyl fused-pyridine ligand is an important class of structures of red phosphorescent materials. To meet needs in different cases, researchers can adjust performance of a material on a certain basis by adjusting different substituents on a ligand of the material to obtain phosphorescent metal complexes with different performance.

U.S. Pat. Pub. No. US20150188061A1 disclosed an iridium complex having a structure represent by the general formula: $Ir(L^1)(L^2)(L^3)$, wherein ligands $L_1$ and $L_2$ may be the same or different, and at least two of ligands $L_1$, $L_2$ and $L_3$ are connected together. Specific examples are

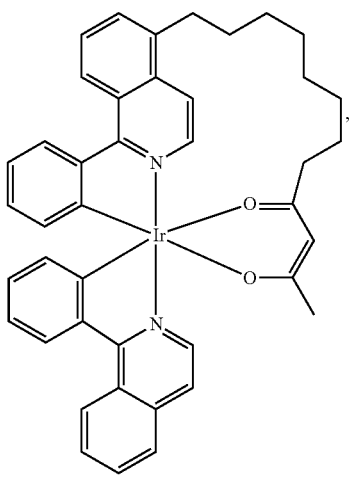

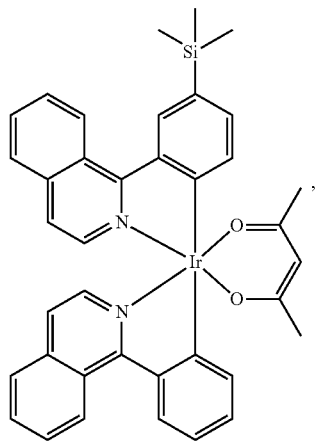

closed by this application has no other substituents except an aryl substituent at 1-position. A specific example disclosed in this application includes the following structure:

but this application claimed that the compound was not successfully obtained in a sufficient purity, and thus the performance of the compound was not verified by corresponding device data. This application did not pay attention to the case where the isoquinoline ring has substituents at other positions except the aryl substituent at 1-position.

U.S. Pat. Pub. Nos. US20150357587A1 and US20150364701A1 each disclosed an iridium complex for an organic electronic light-emitting device: $Ir(L_1)(L_2)(L_3)$, wherein a partial structure $IrL_1$ includes the following structure:

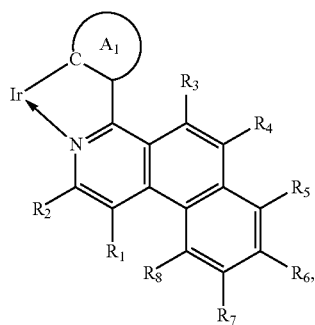

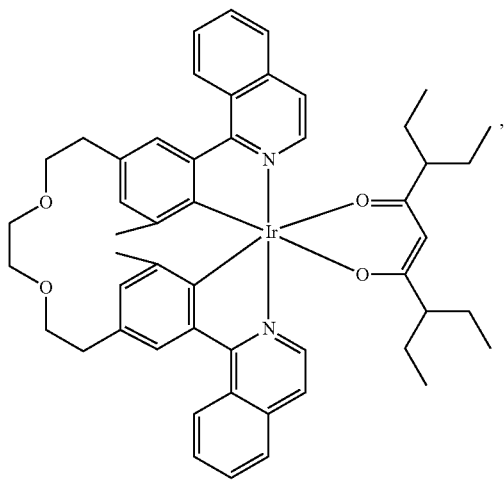

etc. This application also has not verified performance of the compounds. This application did not pay attention to the case where three different ligands are not connected to each other.

U.S. Pat. Pub. No. US20070278936A1 disclosed a compound having Formula II:

Formula II

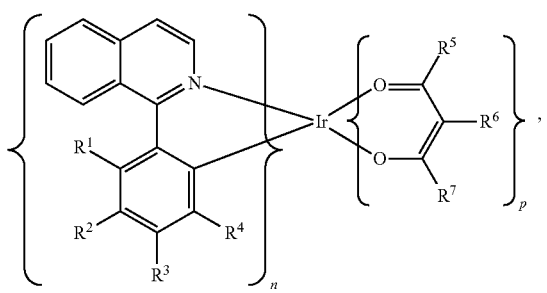

wherein n is 1, 2 or 3, p is 0, 1 or 2, and n+p=3. It can be seen from Formula II that the isoquinoline ring in the ligand of the compound having the structure of Formula II dismeanwhile, a partial structure $IrL_2$ includes the following structure:

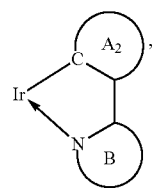

and $L_1$ and $L_2$ represent different ligands. Specific examples are:

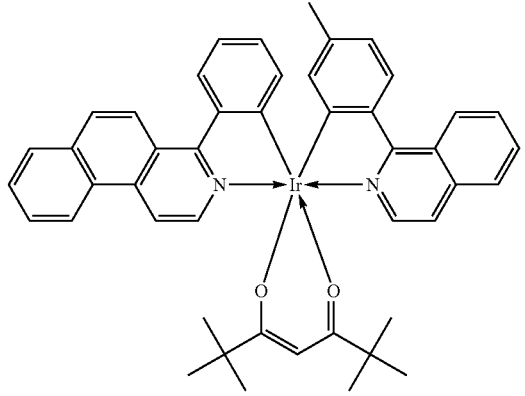

Ir-309

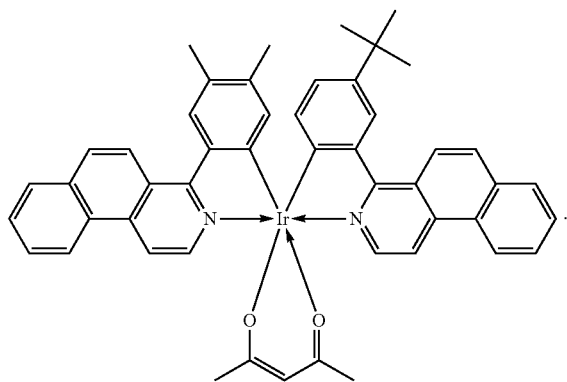

Ir-311

The ligand $L_1$ disclosed in this application has to include a fused isoquinoline structure, and no attention was paid to the case where the ligand has no fused isoquinoline structure.

U.S. Pat. Pub. No. US20130328019A1 disclosed a compound having $L_1L_2MX$, wherein $L_1$ is

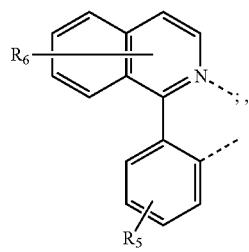

$L_2$ and X are monoanionic bidentate ligands, $L_2$ may be

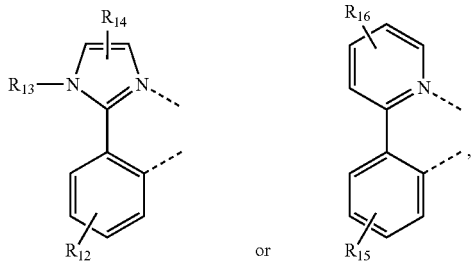

and X are different from each other. A specific example is

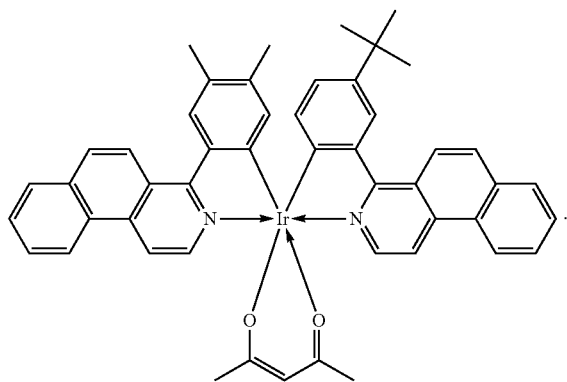

The inventor of this application noticed the effect of inclusion of three different ligands in a complex on adjusting the optoelectrical performance of the complex, but did not notice the advantage of concurrent using two ligands having an aryl isoquinoline-like structure among three different ligands.

However, performance of some of the above-mentioned compounds in the related art has not been verified, and no attention has been paid to the selection of ligand structures, especially the influence of three ligands with different structures on the thermal stability of the corresponding metal complexes. The di-(arylisoquinoline)iridium acetylacetone complex with a type of $M(L_a)_2(L_c)$ is an important ring for red phosphorescent materials. Different substituents are tried in previous researches to control and improve a certain aspect of performance of such complexes. For example, substituents with large molecular weights are introduced into both aryl isoquinolines to improve external quantum efficiency, which, however, has a disadvantage that the evaporation temperature of the metal complex increases greatly and its thermal stability decreases.

SUMMARY

The present disclosure aims to provide a series of novel metal complexes containing three different ligands to solve at least part of the above-mentioned problems. The metal complexes may be used as light-emitting materials in organic electroluminescent devices. When used for preparing electroluminescent devices, these novel metal complexes can not only achieve the device performance desired to be controlled or improved by adjusting substituents but also have the effect of effectively controlling increase of the evaporation temperature.

According to an embodiment of the present disclosure, disclosed is a metal complex having a general formula of $M(L_a)_m(L_b)_n(L_c)_q$, wherein $L_a$, $L_b$ and $L_c$ are a first ligand, a second ligand and a third ligand coordinated to the metal M respectively;

wherein m is selected from an integer greater than or equal to 1, n is selected from an integer greater than or equal to 1, q is selected from an integer greater than or equal to 1, and m+n+q equals the oxidation state of the metal M;

wherein $L_a$ and $L_b$ are ligands with different structures, and each independently has a structure represented by Formula 1:

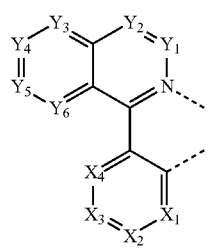

Formula 1 wherein $X_1$ to $X_4$ are each independently selected from $CR_1$ or N;

wherein $Y_1$ to $Y_6$ are each independently selected from $CR_2$ or N, and at least one of $Y_1$ to $Y_6$ is $CR_2$;

wherein $R_1$ and $R_2$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 1, adjacent substituents $R_1$ can be optionally joined to form a ring which has a number of ring atoms less than or equal to 6;

in the ligands $L_a$ and/or $L_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

wherein $L_c$ has a structure represented by Formula 2:

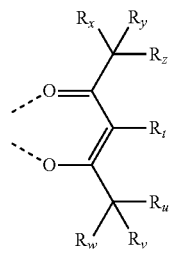

Formula 2 wherein $R_t$ to $R_z$ are each independently selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

According to another embodiment of the present disclosure, further disclosed is an electroluminescent device, including an anode, a cathode and an organic layer disposed between the anode and the cathode, wherein the organic layer includes the metal complex described above.

According to another embodiment of the present disclosure, further disclosed is a compound formulation which includes the metal complex described above.

The novel metal complex containing three different ligands disclosed by the present disclosure may be used as a light-emitting material in an electroluminescent device. These novel metal complexes are complexes including two ligands having different aryl isoquinoline-like structures and they can control the evaporation temperature through the asymmetry in the structure of the substituents on the two ligands, which can help achieve a low evaporation temperature and reduce the risk of decomposition due to thermal energy during mass production, and can also achieve controlled or improved device performance similar to that obtained by using two structures with substituents having larger molecular weights.

DETAILED DESCRIPTION

Figure 1:
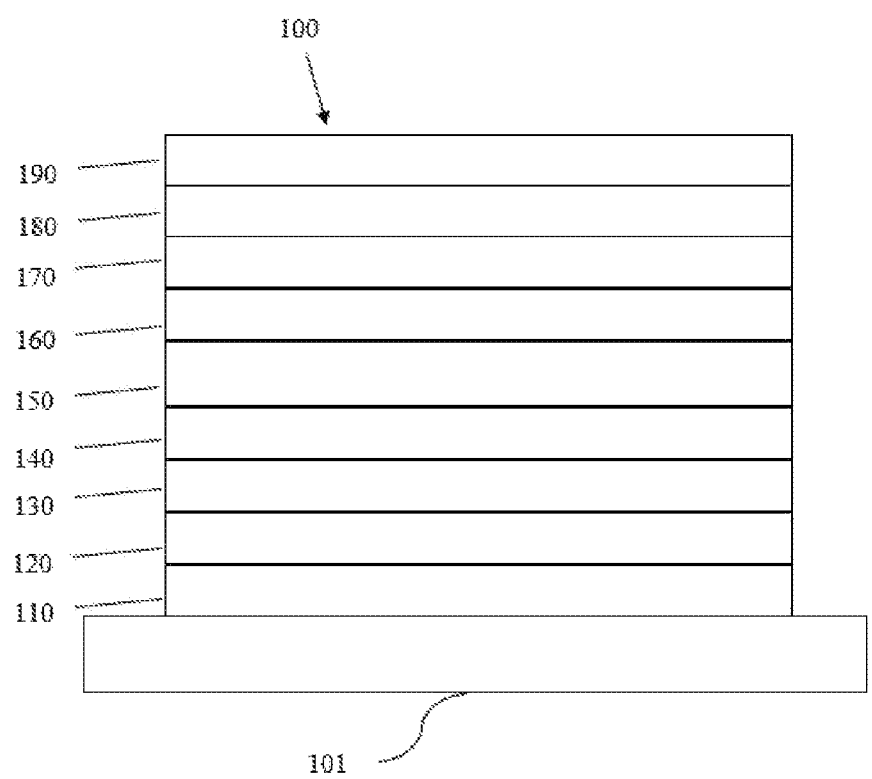
FIG. 1 is a schematic diagram of an organic light-emitting apparatus that may include a compound and a compound formulation disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Pub. No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Pub. No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Pub. No. 2003/0230980, which are incorporated by reference herein in their entireties. Examples of injection layers are provided in U.S. Pub. No. 2004/0174116, which is incorporated by reference herein in its entirety. A description of protective layers may be found in U.S. Pub. No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
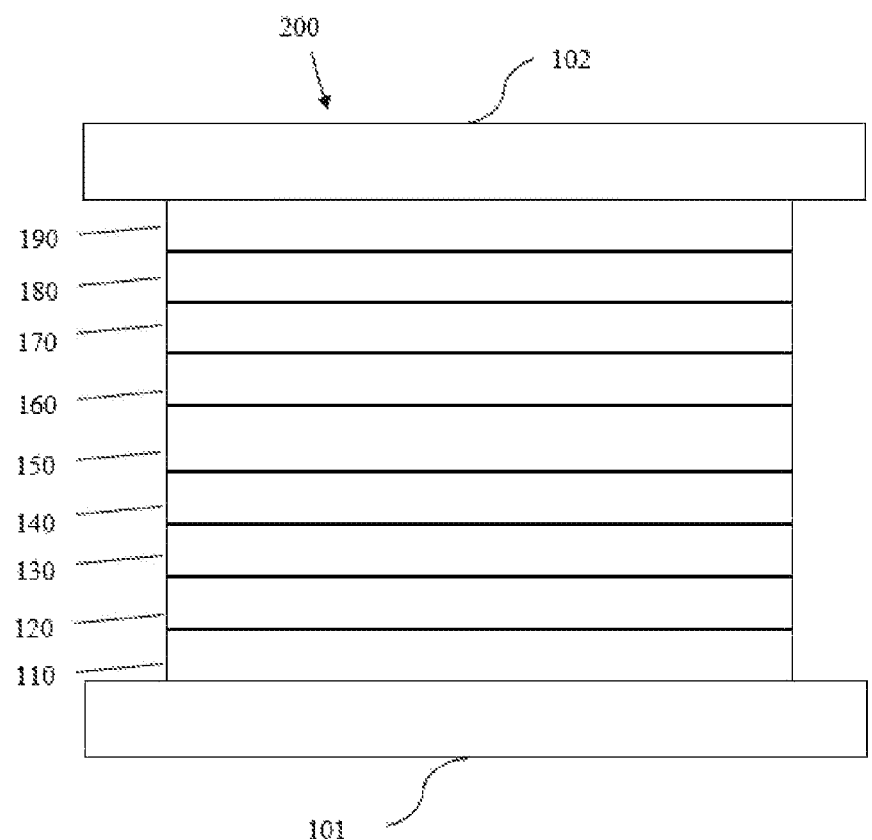
FIG. 2 is a schematic diagram of another organic light-emitting apparatus that may include a compound and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta$EST. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups (including two groups) selected from the group consisting of deuterium, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, when adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

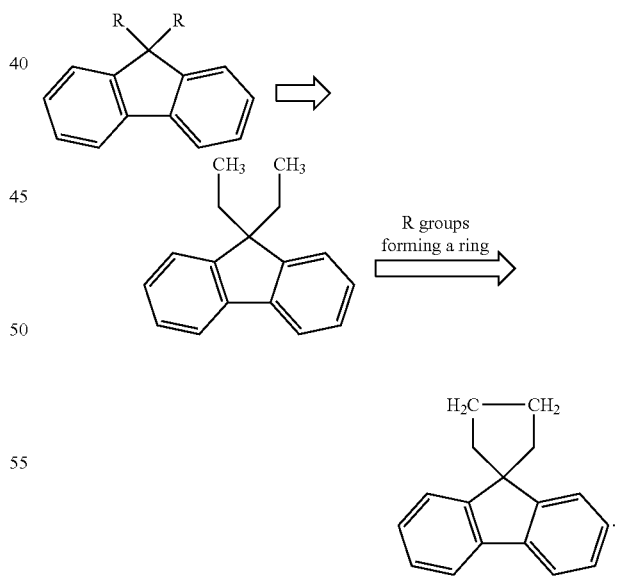

The expression that adjacent substituents can be optionally joined to form a ring is also intended to mean that two substituents bonded to carbon atoms which are directly bonded to each other are joined to each other via a chemical bond to form a ring, which can be exemplified by the following formula:

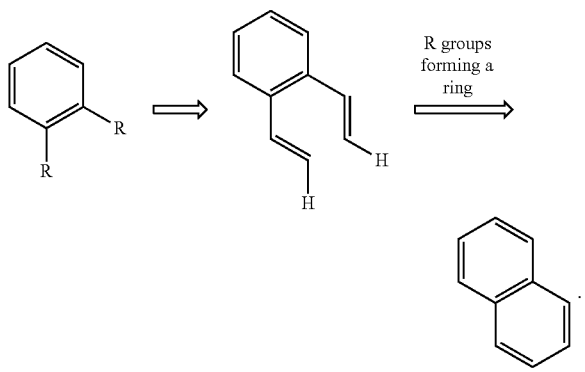

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

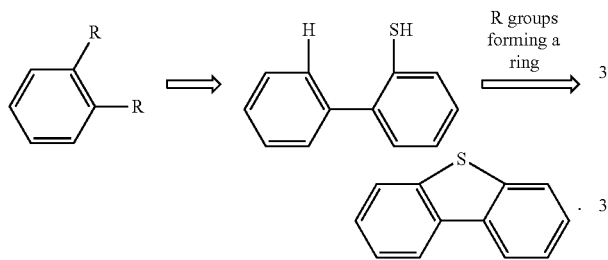

According to an embodiment of the present disclosure, disclosed is a metal complex, having a general formula of $M(L_a)_m(L_b)_n(L_c)_q$, wherein $L_a$, $L_b$ and $L_c$ are a first ligand, a second ligand and a third ligand coordinated to the metal M respectively;

wherein m is selected from an integer greater than or equal to 1 (for example, m is selected from 1 or 2), n is selected from an integer greater than or equal to 1 (for example, n is selected from 1 or 2), q is selected from an integer greater than or equal to 1 (for example, q is selected from 1 or 2), and m+n+q equals the oxidation state of the metal M;

wherein $L_a$ and $L_b$ are ligands with different structures, and each independently represented by Formula 1:

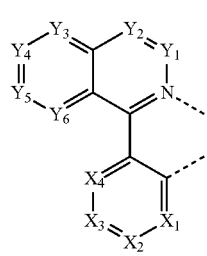

Formula 1 wherein $X_1$ to $X_4$ are each independently selected from $CR_1$ or N;

wherein $Y_1$ to $Y_6$ are each independently selected from $CR_2$ or N, and at least one of $Y_1$ to $Y_6$ is $CR_2$;

wherein $R_1$ and $R_2$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 1, for substituents $R_1$ only, adjacent substituents can be optionally joined to form a ring which has a number of ring atoms less than or equal to 6;

in the ligands $L_a$ and/or $L_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

wherein $L_c$ has a structure represented by Formula 2:

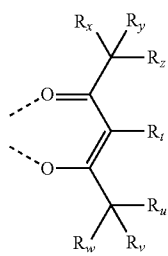

Formula 2 wherein $R_t$, $R_u$, $R_v$, $R_w$, $R_x$, $R_y$, and $R_z$ are each independently selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

In an embodiment of the present disclosure, the expression in Formula 1 that "for substituents $R_1$ only, adjacent substituents can be optionally joined to form a ring" refers to that in the structure of Formula 1, merely adjacent substituents $R_1$ can be optionally joined to form a ring, but adjacent substituents $R_2$ are not joined to form a ring, and adjacent substituents $R_1$ and $R_2$ are not joined to form a ring. When adjacent substituents $R_1$ are joined to form a ring, the number of ring atoms of the resulting ring should be less than or equal to 6. In some embodiment, adjacent substituents $R_1$ are not joined to form a ring. In Formula 2, adjacent substituents $R_x$, $R_y$, $R_z$, $R_t$, $R_u$, $R_v$ and $R_w$ are not joined to form a ring.

In embodiments of the present disclosure, in the ligands $L_a$ and/or $L_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof. The above definition is intended to include the following three cases: (1) at least one of all substituents $R_2$ in ligand $L_a$ and ligand $L_b$ is selected from the above range, or (2) at least one of all substituents $R_2$ in ligand $L_a$ alone is selected from the above range, or (3) at least one of all substituents $R_2$ in ligand $L_b$ alone is selected from the above range. That is to say, when one or more of $Y_1$ to $Y_6$ in the ligands $L_a$ and $L_b$ are selected from $CR_2$, the case where all $R_2$ in the ligands $L_a$ and $L_b$ are hydrogen does not exist.

In embodiments of the present disclosure, no matter which substituent (for example includes, but is not limited to substituted alkyl) in their defined range $R_t$, $R_u$, $R_v$, $R_w$, $R_x$, $R_y$ and $R_z$ in Formula 2 are each independently selected from, none of $R_t$, $R_u$, $R_v$, $R_w$, $R_x$, $R_y$ and $R_z$ contains halogen, especially fluorine.

According to an embodiment of the present disclosure, the metal M is selected from the group consisting of Cu, Ag, Au, Ru, Rh, Pd, Os, Ir and Pt.

According to an embodiment of the present disclosure, the metal M is selected from Pt or Ir.

According to an embodiment of the present disclosure, the metal M is selected from Ir.

According to an embodiment of the present disclosure, at least one of $X_1$ to $X_4$ is selected from $CR_1$.

According to an embodiment of the present disclosure, $X_1$ and $X_4$ are each independently selected from $CR_1$, and/or $Y_1$ to $Y_6$ are each independently selected from $CR_2$.

According to an embodiment of the present disclosure, $X_1$ is each independently $CR_1$ and/or $X_3$ is each independently $CR_1$, and $R_1$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

According to an embodiment of the present disclosure, $X_1$ is each independently $CR_1$, $X_3$ is each independently $CR_1$, and $R_1$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms.

According to an embodiment of the present disclosure, $X_1$ is each independently $CR_1$, $X_3$ is each independently $CR_1$, and $R_1$ is independently selected from substituted or unsubstituted alkyl having 1 to 20 carbon atoms.

According to an embodiment of the present disclosure, $Y_1$ is each independently $CR_2$ and/or $Y_4$ is each independently $CR_2$, and $R_2$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

According to an embodiment of the present disclosure, $Y_1$ is each independently $CR_2$, $Y_4$ is each independently $CR_2$, and $R_2$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms.

According to an embodiment of the present disclosure, $Y_1$ is each independently $CR_2$, $Y_4$ is each independently $CR_2$, and $R_2$ is independently selected from substituted or unsubstituted alkyl having 1 to 20 carbon atoms or substituted or unsubstituted alkylsilyl having 3 to 20 carbon atoms.

According to an embodiment of the present disclosure, $Y_1$ is CD, $Y_4$ is $CR_2$, and $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms; preferably, $R_2$ is selected from substituted or unsubstituted alkyl having 1 to 20 carbon atoms or substituted or unsubstituted alkylsilyl having 3 to 20 carbon atoms.

According to an embodiment of the present disclosure, $Y_2$, $Y_3$, $Y_5$ and $Y_6$ are each CH, $Y_1$ is CD, $Y_4$ is $CR_2$, and $R_2$ is selected from substituted or unsubstituted alkyl having 1 to 20 carbon atoms or substituted or unsubstituted alkylsilyl having 3 to 20 carbon atoms.

According to an embodiment of the present disclosure, $Y_1$, $Y_2$, $Y_3$, $Y_4$ and $Y_6$ are each CH, $Y_5$ is $CR_2$, and $R_2$ is independently selected from substituted or unsubstituted alkyl having 1 to 20 carbon atoms.

According to an embodiment of the present disclosure, $Y_2$, $Y_3$, $Y_4$, $Y_5$ and $Y_6$ are each CH, $Y_1$ is $CR_2$, and $R_2$ is independently selected from substituted or unsubstituted alkyl having 1 to 20 carbon atoms.

According to an embodiment of the present disclosure, $R_2$ is independently selected from the group consisting of: hydrogen, deuterium, methyl, isopropyl, 2-butyl, isobutyl, t-butyl, pent-3-yl, cyclopentyl, cyclohexyl, 4,4-dimethylcyclohexyl, neopentyl, 2,4-dimethylpent-3-yl, 3,3,3-trifluoro-2,2-dimethylpropyl, 1,1-dimethylsilacyclohex-4-yl, cyclopentylmethyl, cyanomethyl, cyano, trifluoromethyl, bromine, chlorine, trimethylsilyl, phenyldimethylsilyl, phenyl and 3-pyridyl.

According to an embodiment of the present disclosure, $L_a$ and $L_b$ have different structures and are each independently selected from the group consisting of $L_{x1}$ to $L_{x1065}$. For specific structures of $L_{x1}$ to $L_{x165}$, see claim 11. In the numbers of the specific structures of the ligands described above, x represents a or b. That is, a ligand

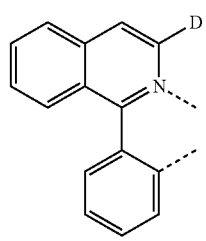

$L_{x1}$ numbered $L_{x1}$ not only represents a ligand

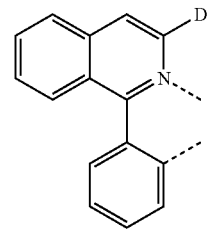

$L_{a1}$ numbered $L_{a1}$ but also represents a ligand

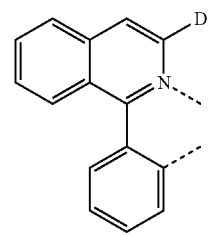

$L_{b1}$ numbered $L_{b1}$. Ligand numbers $L_{x2}$ to $L_{x1065}$ have the same meaning as $L_{x1}$.

According to an embodiment of the present disclosure, in Formula 2, $R_t$, $R_u$, $R_v$, $R_w$, $R_x$, $R_y$, and $R_z$ are each independently selected from the group consisting of: hydrogen, deuterium, substituted or unsubstituted alkyl having 1 to 20 carbon atoms, substituted or unsubstituted cycloalkyl having 3 to 20 ring carbon atoms, and combinations thereof.

According to an embodiment of the present disclosure, in Formula 2, $R_t$ is selected from hydrogen, deuterium or methyl, and $R_u$ to $R_z$ are each independently selected from hydrogen, deuterium, methyl, ethyl, propyl, cyclobutyl, cyclopentyl, cyclohexyl, 3-methylbutyl, 3-ethylpentyl or combinations thereof.

According to another embodiment of the present disclosure, $L_c$ is selected from the group consisting of $L_{c1}$ to $L_{c84}$. Wherein, for specific structures of $L_{c1}$ to $L_{c84}$, see claim 13.

According to an embodiment of the present disclosure, hydrogen in any one, any two or three of the ligands $L_a$, $L_b$ and $L_c$ may be partially or fully substituted by deuterium.

According to an embodiment of the present disclosure, the metal complex is $IrL_aL_bL_c$, wherein $L_a$ and $L_b$ have different structures, $L_a$ is any one selected from $L_{a1}$ to $L_{a1065}$, $L_b$ is any one selected from $L_{b1}$ to $L_{b1065}$, and $L_c$ is any one selected from $L_{c1}$ to $L_{c84}$.

According to an embodiment of the present disclosure, the metal complex is $IrL_aL_bL_c$, wherein $L_a$ and $L_b$ have different structures, $L_a$ is any one selected from $L_{a1}$ to $L_{a108}$, $L_{a112}$ to $L_{a144}$, $L_{a148}$ to $L_{a288}$, $L_{a292}$ to $L_{a362}$, $L_{a364}$ to $L_{a432}$, $L_{a436}$ to $L_{a720}$ and $L_{a757}$ to $L_{a1065}$, $L_b$ is any one selected from $L_{b1}$ to $L_{b1065}$, and $L_c$ is any one selected from $L_{c1}$ to $L_{c84}$.

According to an embodiment of the present disclosure, the metal complex is $IrL_aL_bL_c$, wherein $L_a$ and $L_b$ have different structures, $L_a$ is selected from $L_{a39}$, $L_b$ is any one selected from $L_{b1}$ to $L_{b1065}$, and $L_c$ is any one selected from $L_{c1}$ to $L_{c84}$.

According to an embodiment of the present disclosure, the metal complex is selected from the group consisting of:

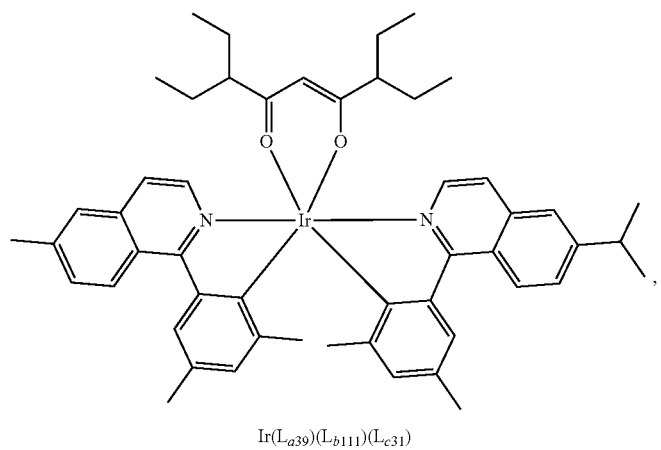
Ir(L<sub>a39</sub>)(L<sub>b111</sub>)(L<sub>c31</sub>)
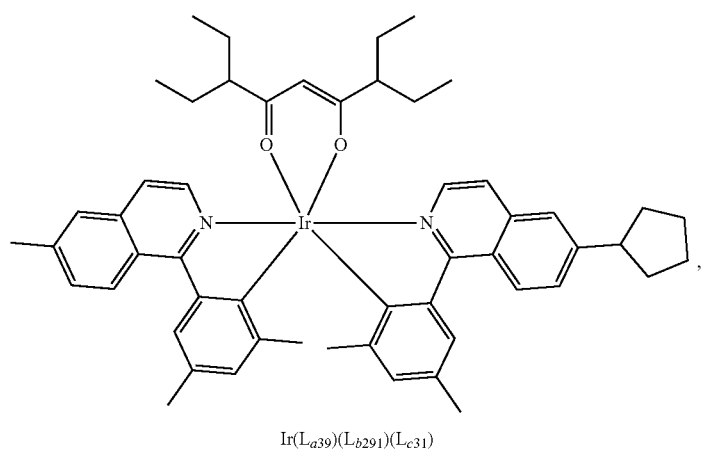
Ir(L<sub>a39</sub>)(L<sub>b291</sub>)(L<sub>c31</sub>)
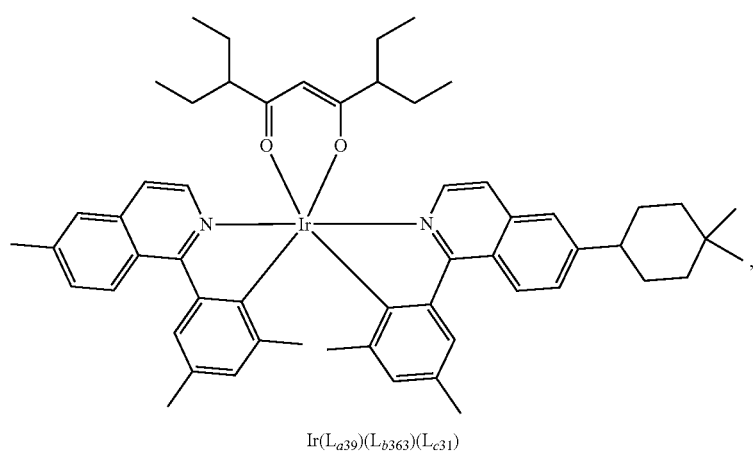
Ir(L<sub>a39</sub>)(L<sub>b363</sub>)(L<sub>c31</sub>)

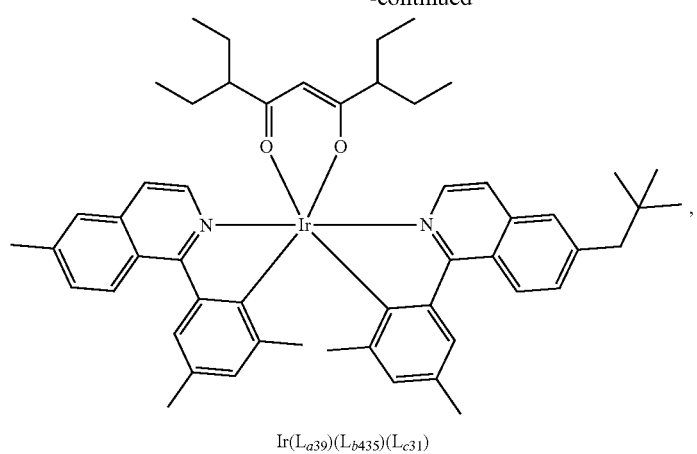
Ir(L$_{a39}$)(L$_{b435}$)(L$_{c31}$)
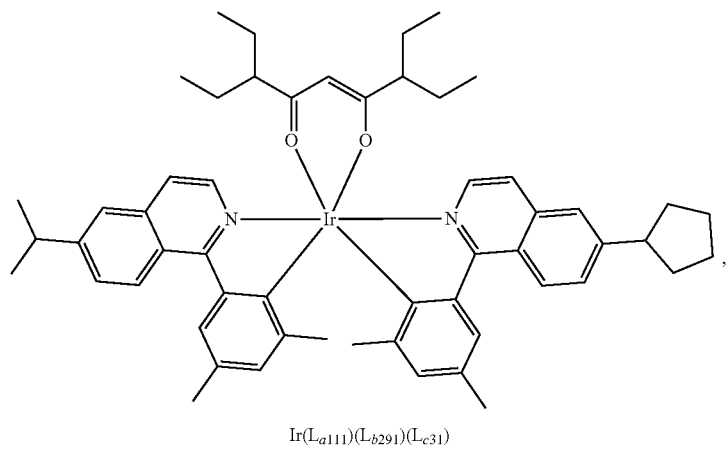
Ir(L$_{a111}$)(L$_{b291}$)(L$_{c31}$)
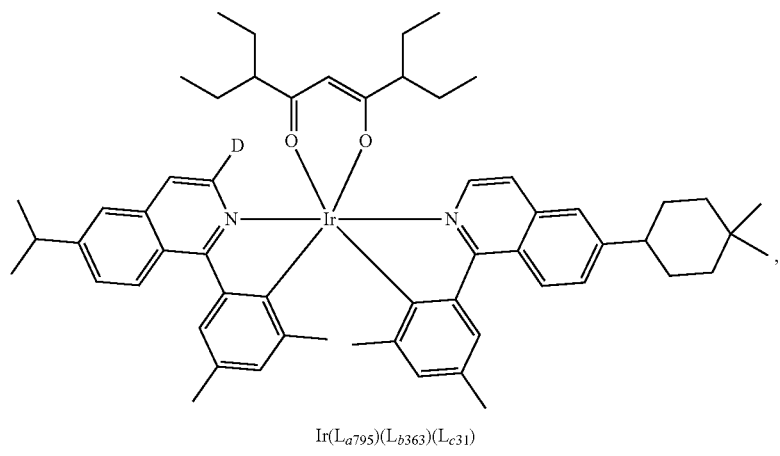
Ir(L$_{a795}$)(L$_{b363}$)(L$_{c31}$)

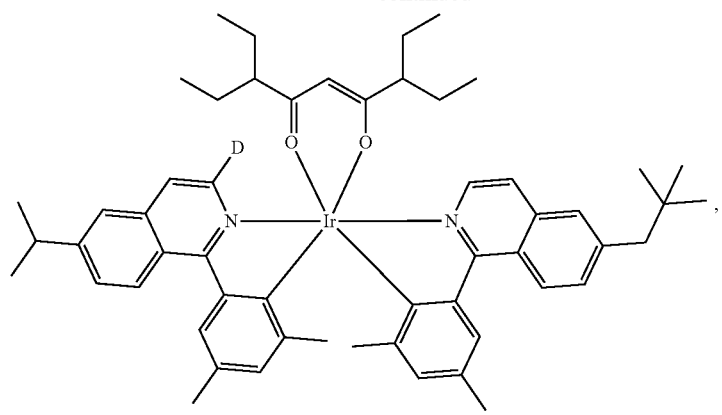
Ir(L$_{a795}$)(L$_{b435}$)(L$_{c31}$)
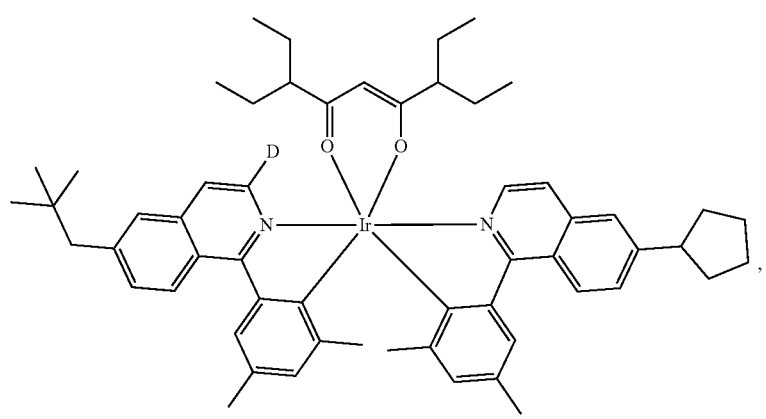
Ir(L$_{a903}$)(L$_{b291}$)(L$_{c31}$)
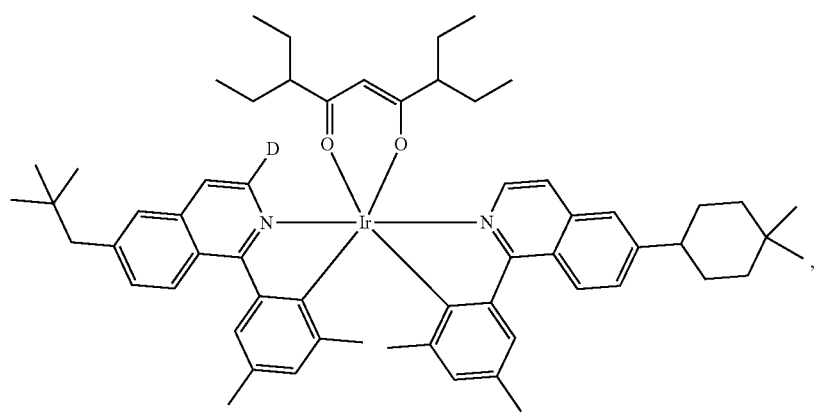
Ir(L$_{a903}$)(L$_{b363}$)(L$_{c31}$)

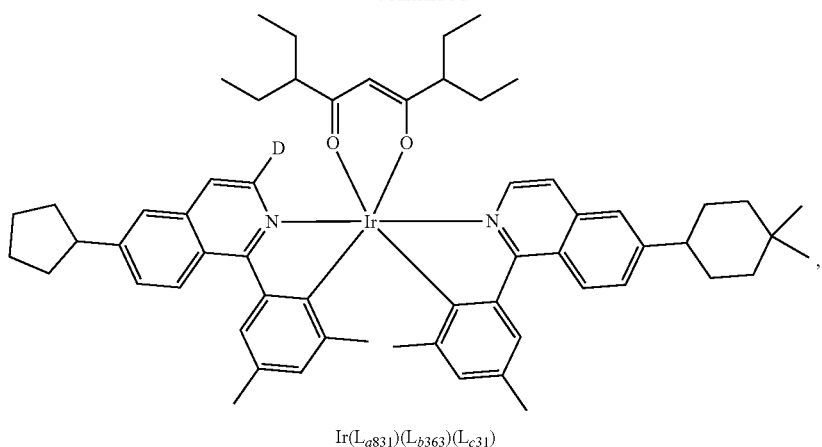
Ir(L*a*831)(L*b*363)(L*c*31)
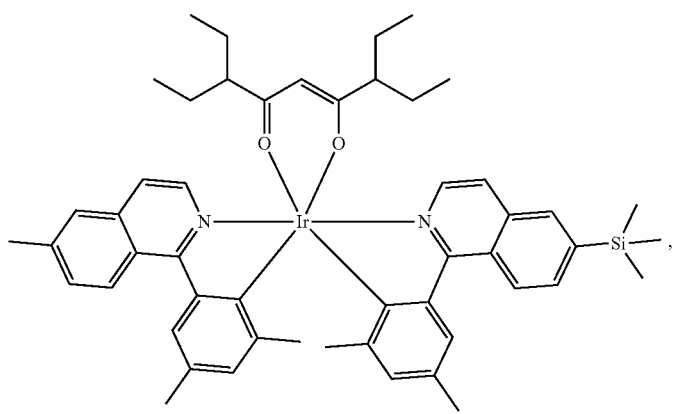
Ir(L*a*39)(L*b*615)(L*c*31)
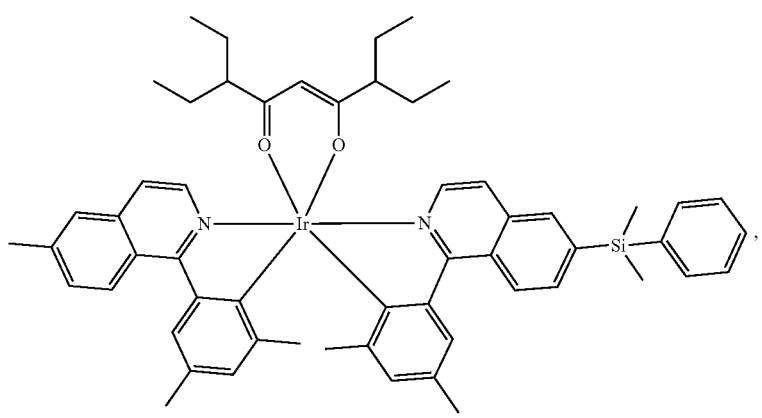
Ir(L*a*39)(L*b*651)(L*c*31)

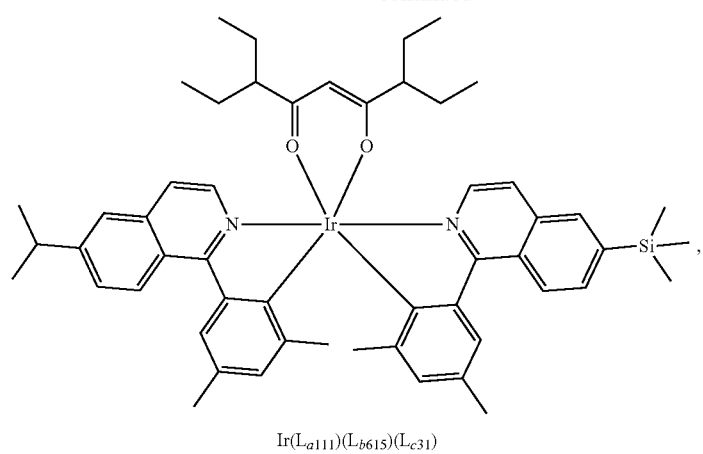
Ir(L_{a111})(L_{b615})(L_{c31})
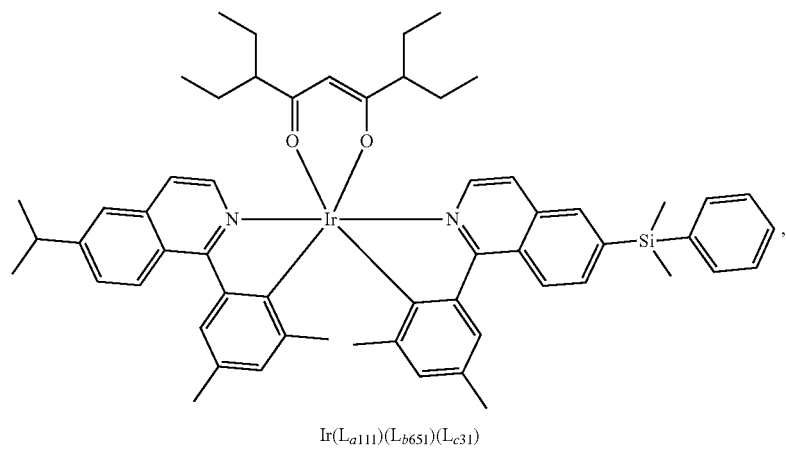
Ir(L_{a111})(L_{b651})(L_{c31})
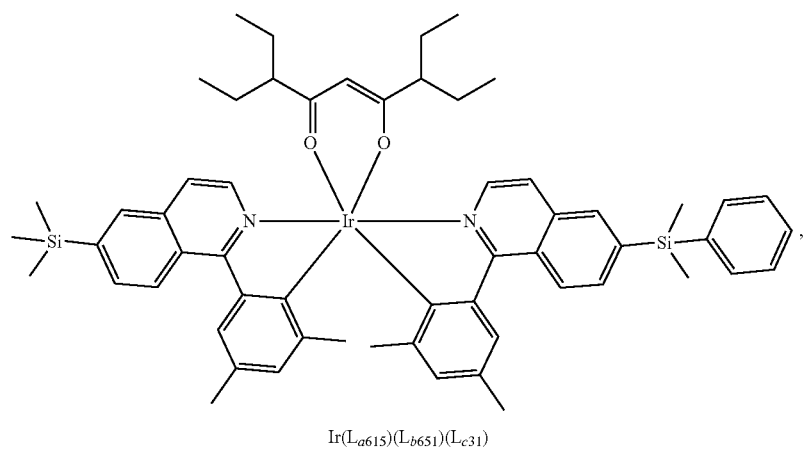
Ir(L_{a615})(L_{b651})(L_{c31})

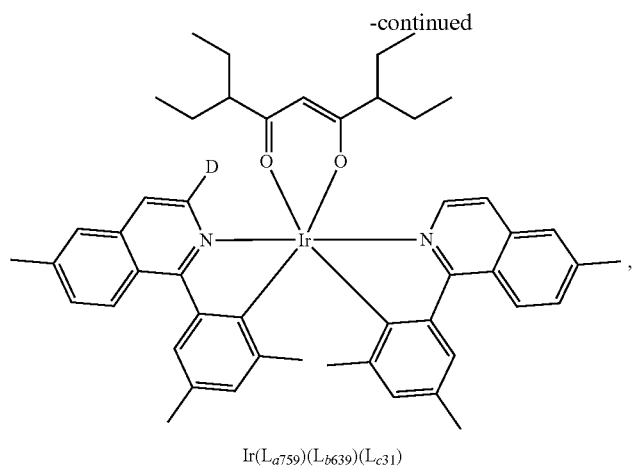
Ir(L*a*759)(L*b*639)(L*c*31),
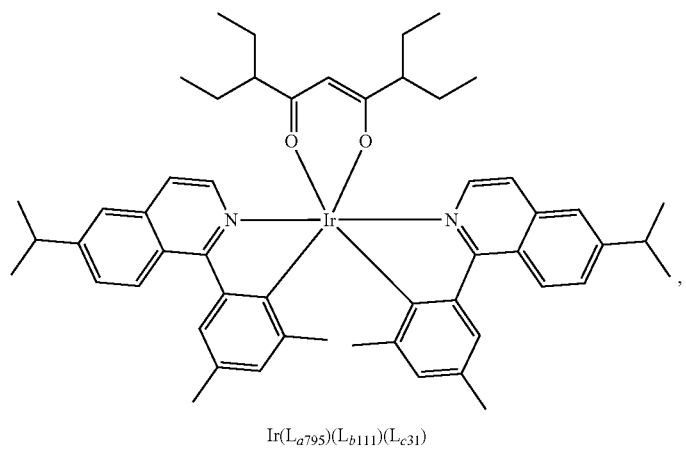
Ir(L*a*795)(L*b*111)(L*c*31),
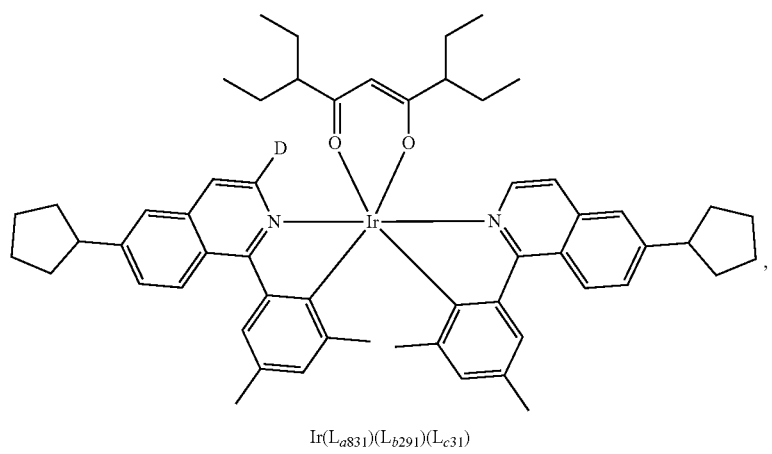
Ir(L*a*831)(L*b*291)(L*c*31),

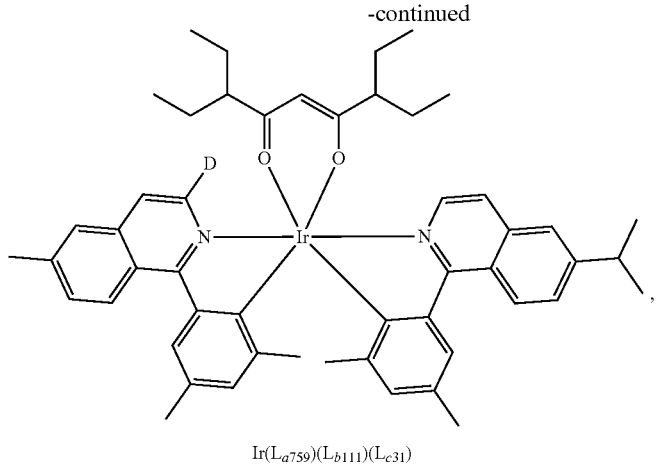
Ir(L$_{a759}$)(L$_{b111}$)(L$_{c31}$),
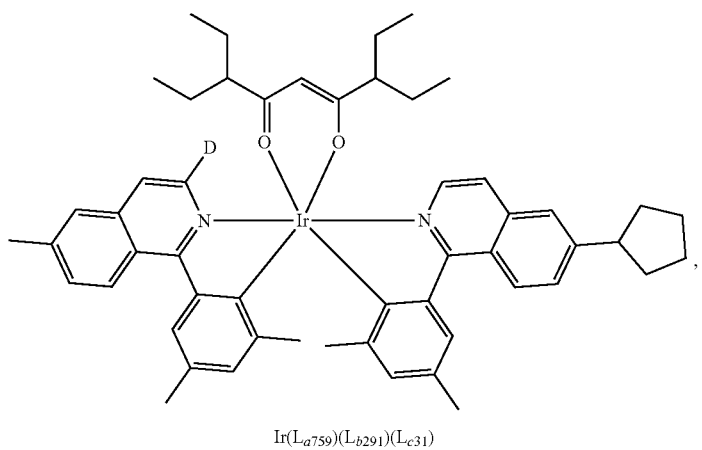
Ir(L$_{a759}$)(L$_{b291}$)(L$_{c31}$),
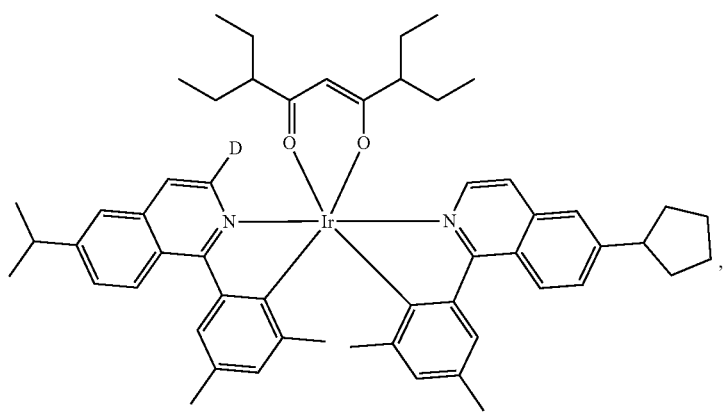
Ir(L$_{a795}$)(L$_{b291}$)(L$_{c31}$),

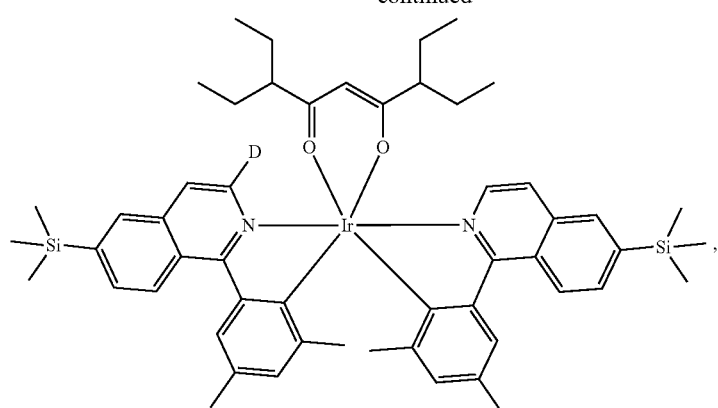
Ir(L*a*867)(L*b*615)(L*c*31)
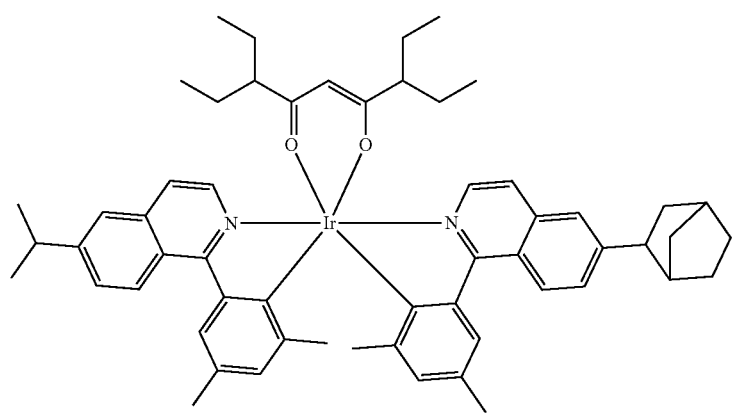
Ir(L*a*111)(L*b*960)(L*c*31)
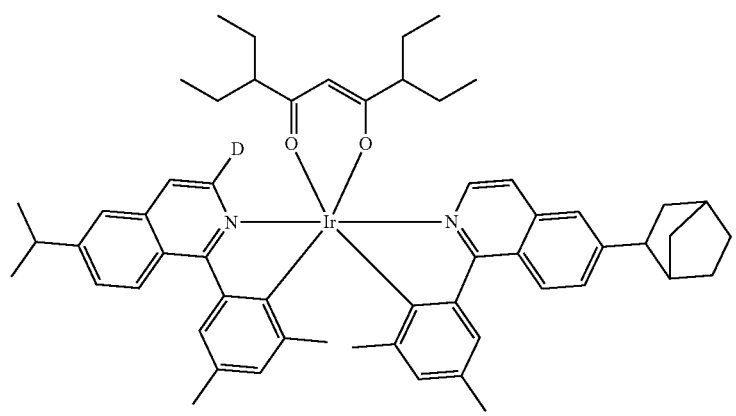
Ir(L*a*795)(L*b*960)(L*c*31)

-continued
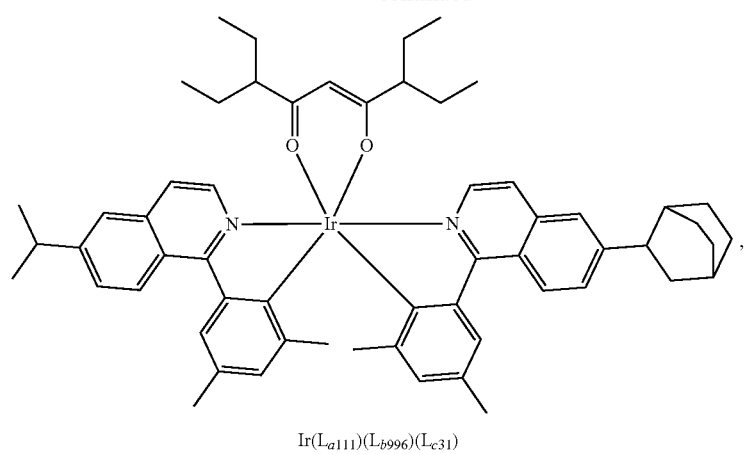
Ir(L$_{a111}$)(L$_{b996}$)(L$_{c31}$)
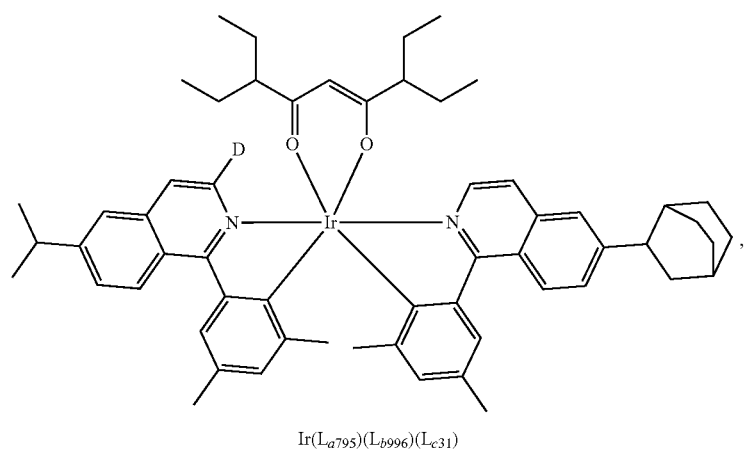
Ir(L$_{a795}$)(L$_{b996}$)(L$_{c31}$)
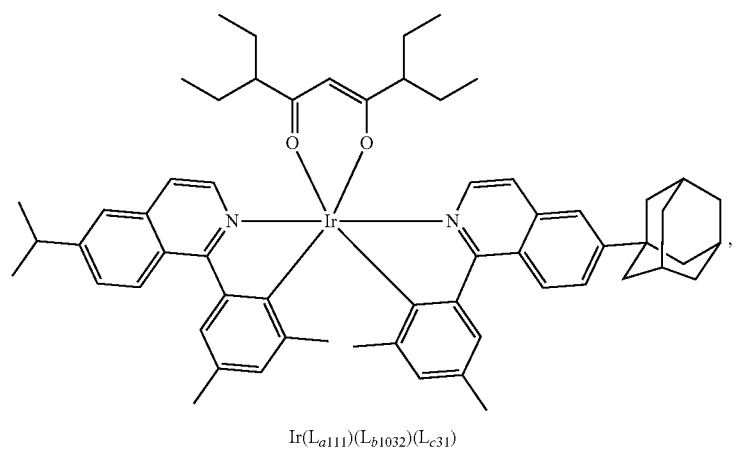
Ir(L$_{a111}$)(L$_{b1032}$)(L$_{c31}$)

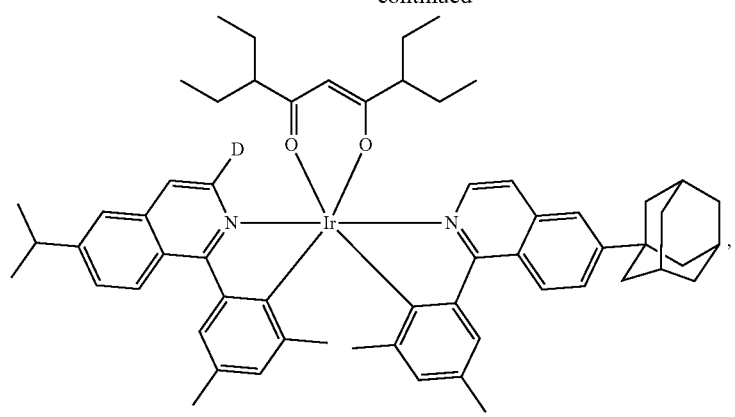
Ir(L*a*795)(L*b*1032)(L*c*31)
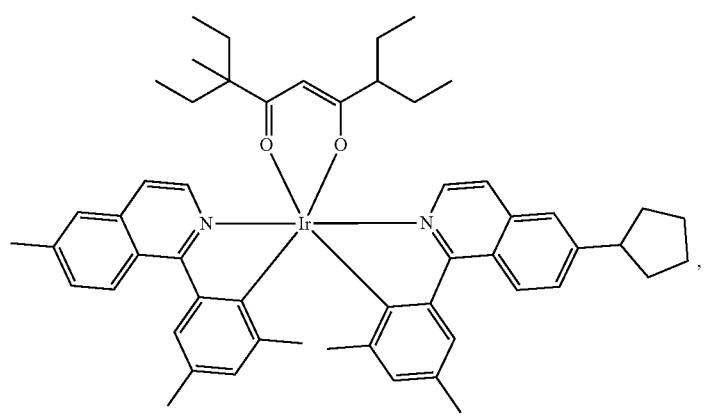
Ir(L*a*39)(L*b*291)(L*c*55)
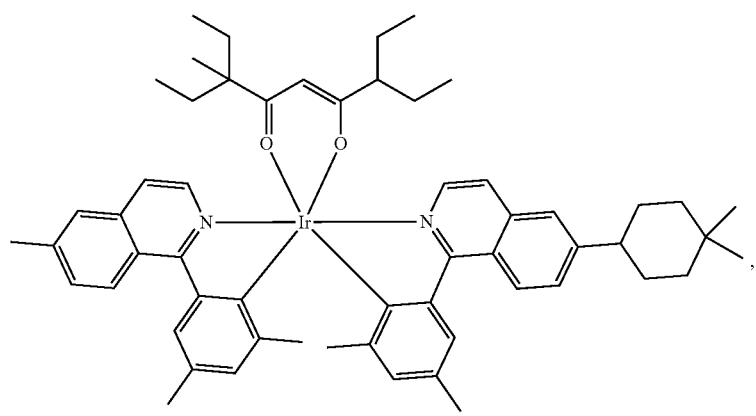
Ir(L*a*39)(L*b*363)(L*c*55)

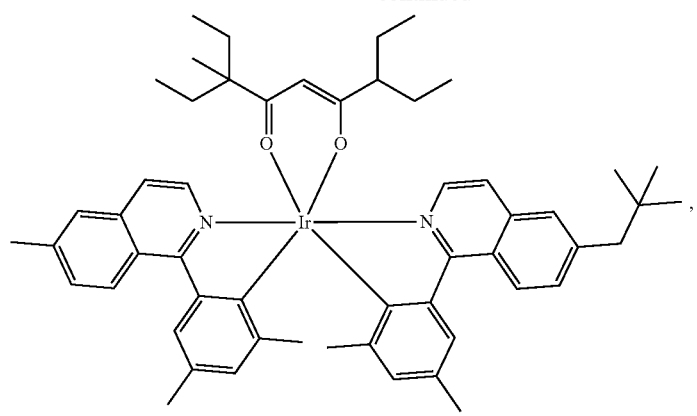
Ir(L$_{a39}$)(L$_{b435}$)(L$_{c55}$)
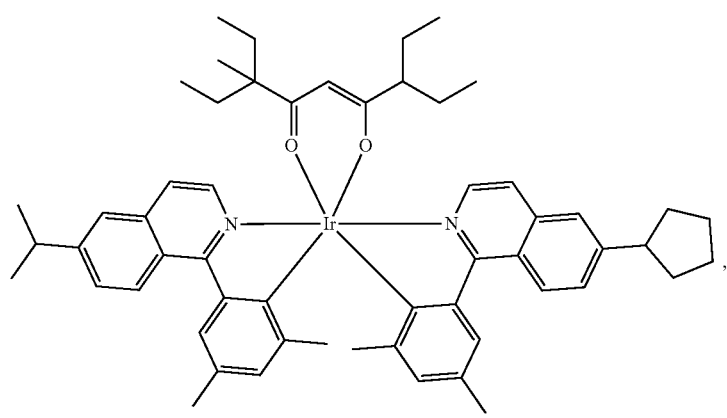
Ir(L$_{a111}$)(L$_{b291}$)(L$_{c55}$)
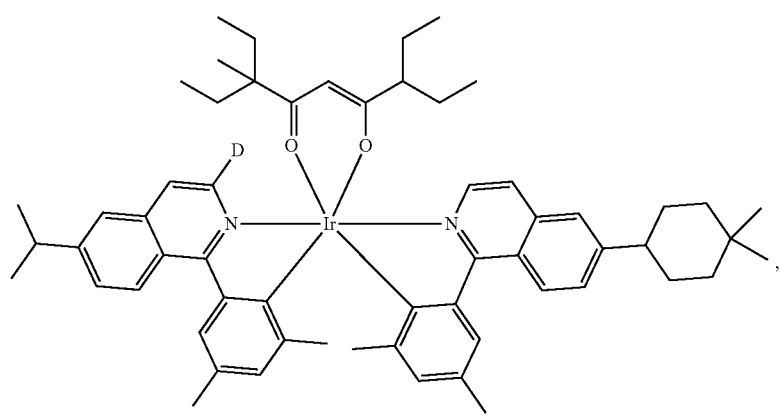
Ir(L$_{a795}$)(L$_{b363}$)(L$_{c55}$)

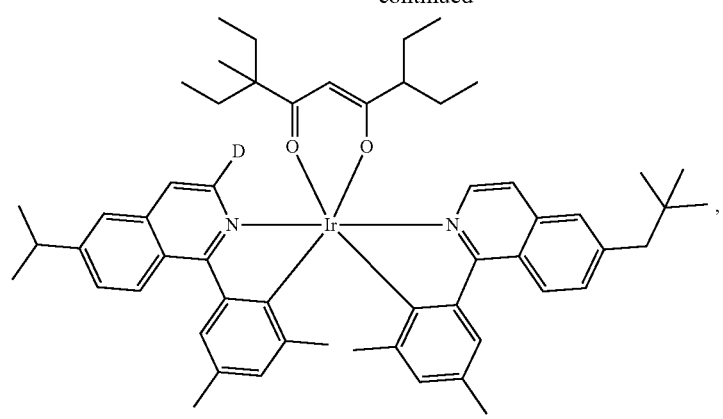
Ir(L$_{a795}$)(L$_{b435}$)(L$_{c55}$)
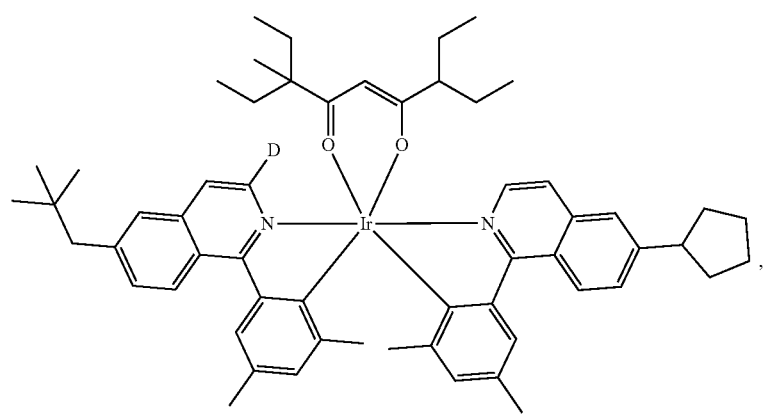
Ir(L$_{a903}$)(L$_{b291}$)(L$_{c55}$)
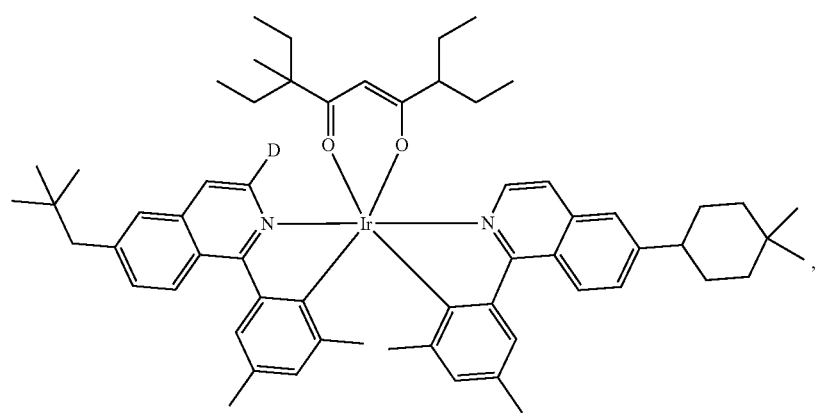
Ir(L$_{a903}$)(L$_{b363}$)(L$_{c55}$)

-continued
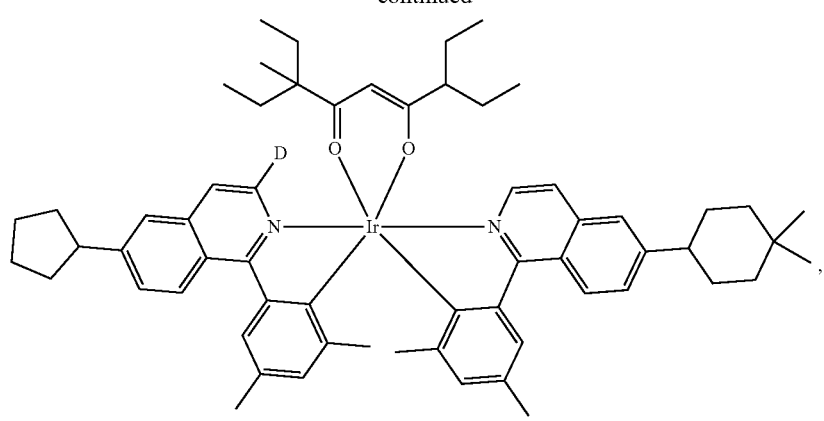
Ir(L_{a831})(L_{b363})(L_{c55})
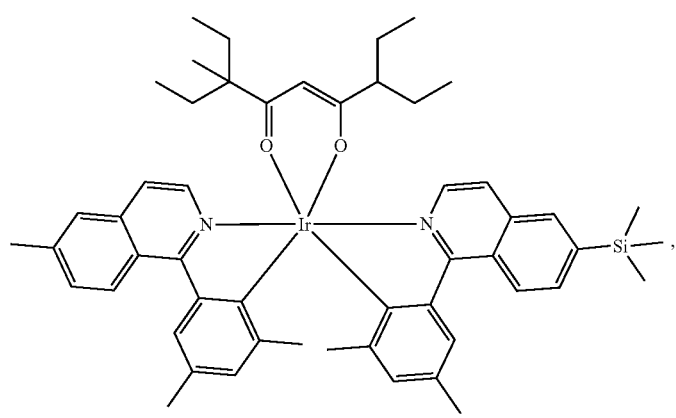
Ir(L_{a39})(L_{b615})(L_{c55})
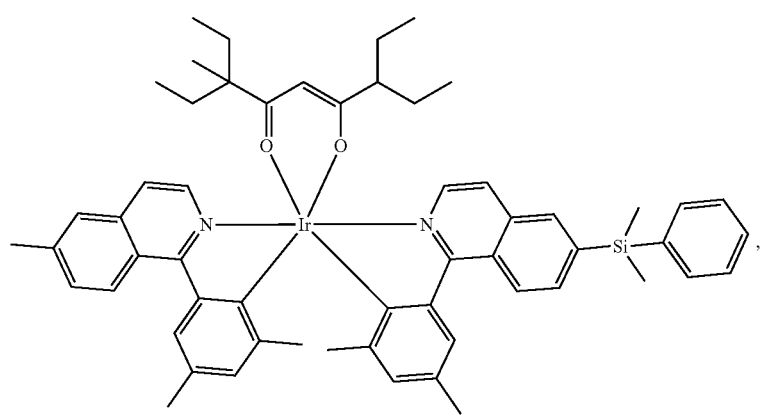
Ir(L_{a39})(L_{b651})(L_{c55})

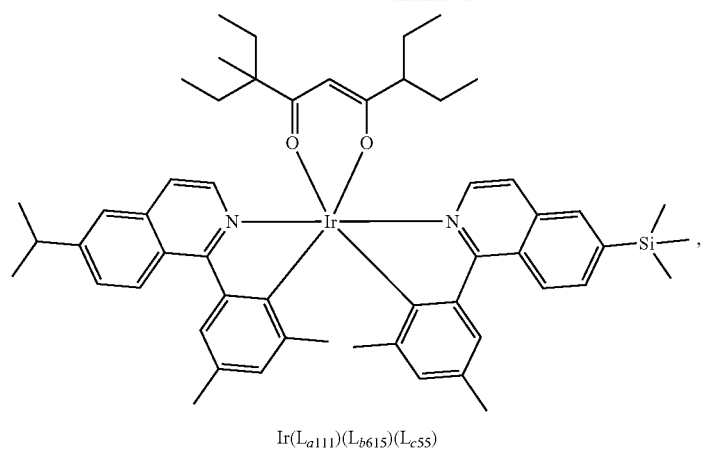
Ir(L_{a111})(L_{b615})(L_{c55})
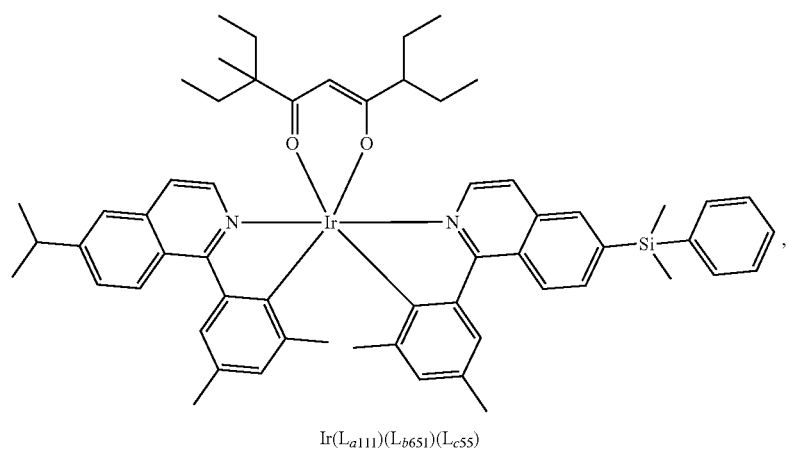
Ir(L_{a111})(L_{b651})(L_{c55})
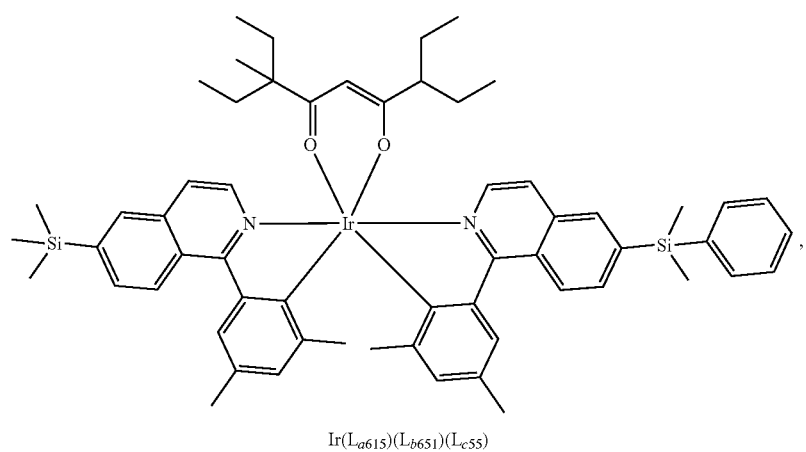
Ir(L_{a615})(L_{b651})(L_{c55})

-continued
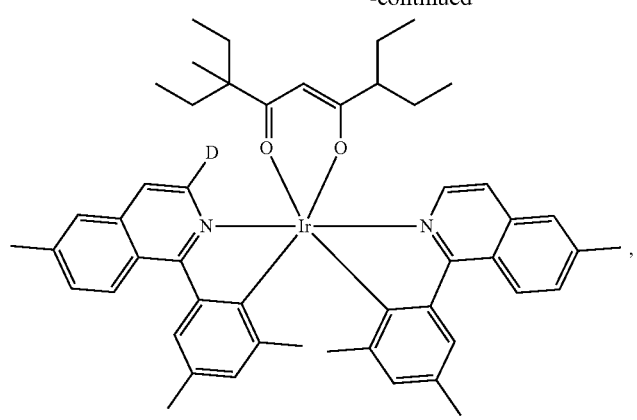
Ir(L$_{a759}$)(L$_{b39}$)(L$_{c55}$)
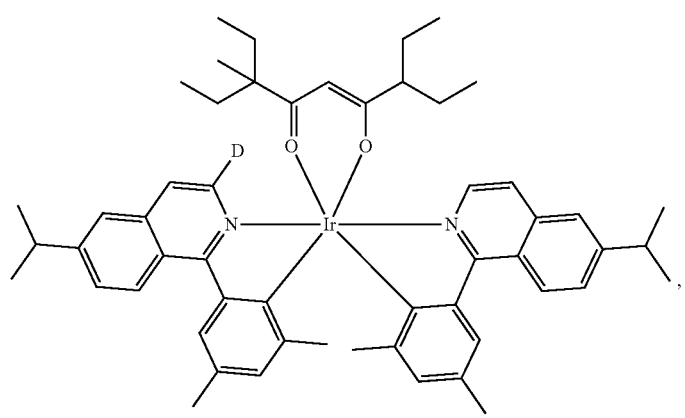
Ir(L$_{a795}$)(L$_{b111}$)(L$_{c55}$)
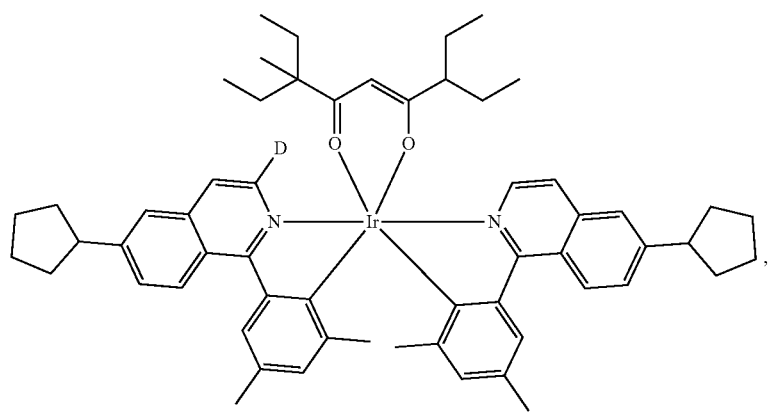
Ir(L$_{a831}$)(L$_{b291}$)(L$_{c55}$)

-continued
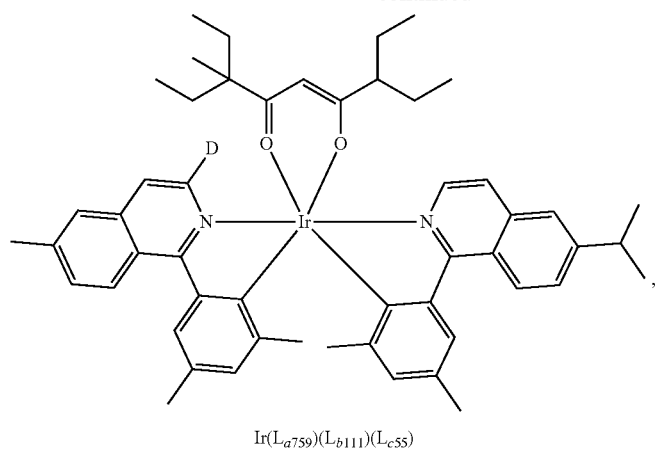
Ir(L$_{a759}$)(L$_{b111}$)(L$_{c55}$)
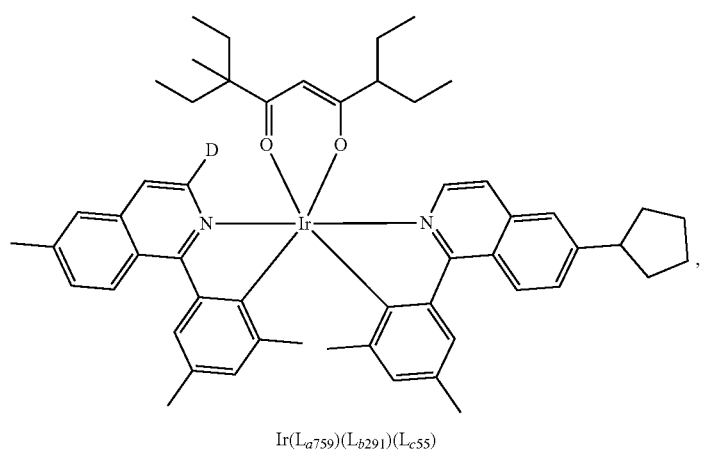
Ir(L$_{a759}$)(L$_{b291}$)(L$_{c55}$)
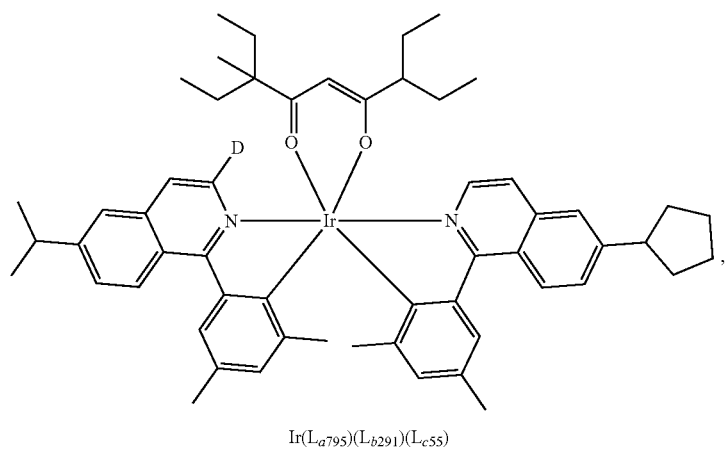
Ir(L$_{a795}$)(L$_{b291}$)(L$_{c55}$)

-continued
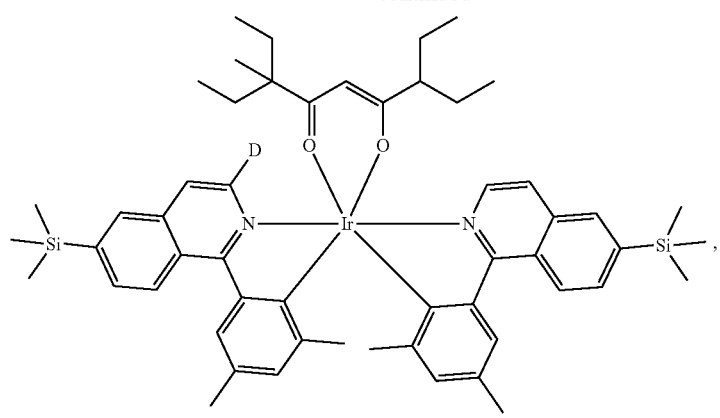
Ir(L$_{a867}$)(L$_{b615}$)(L$_{c55}$)
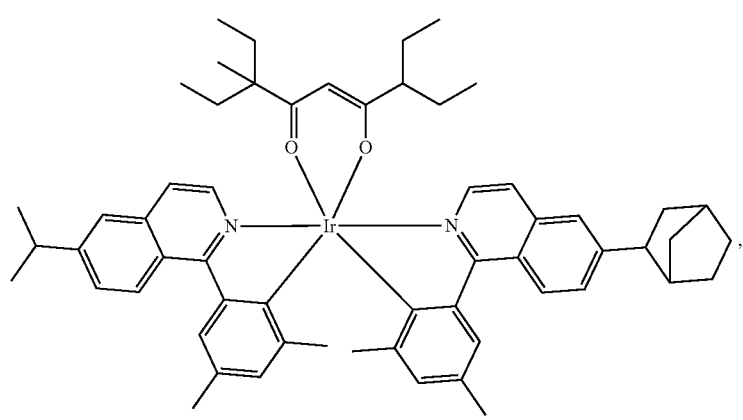
Ir(L$_{a111}$)(L$_{b960}$)(L$_{c55}$)
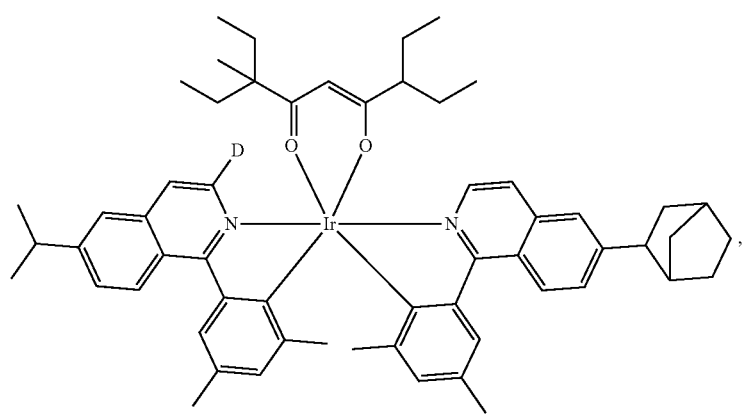
Ir(L$_{a795}$)(L$_{b960}$)(L$_{c55}$)

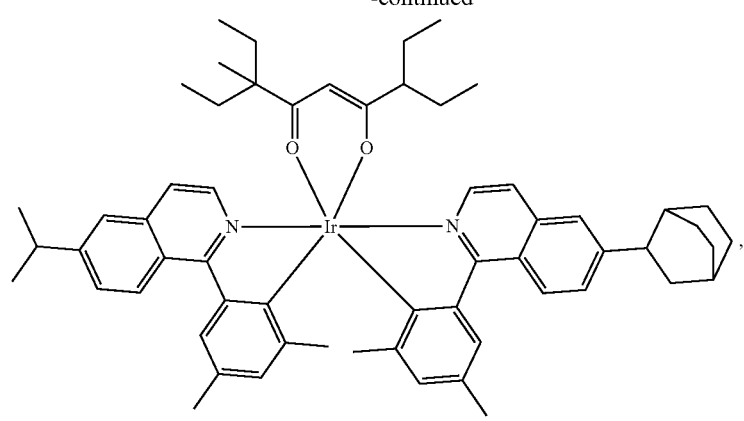
Ir(L_{a111})(L_{b996})(L_{c55})
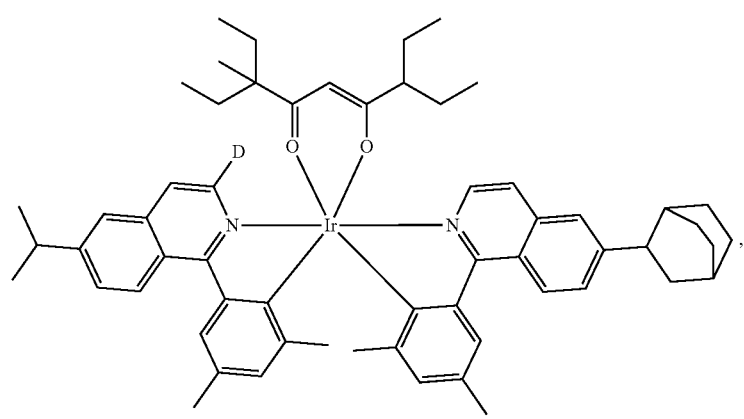
Ir(L_{a795})(L_{b996})(L_{c55})
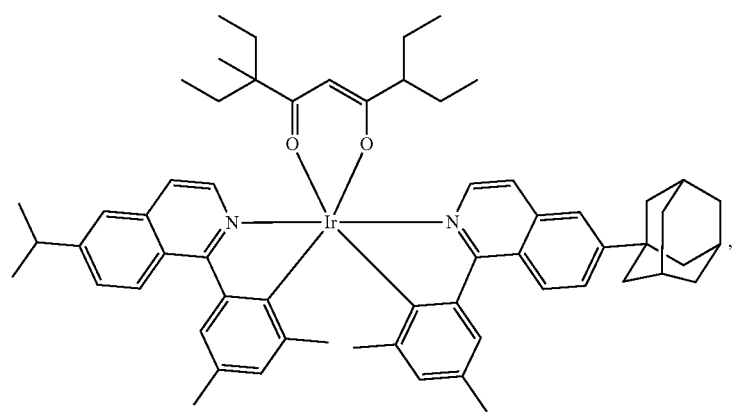
Ir(L_{a111})(L_{b1032})(L_{c55})

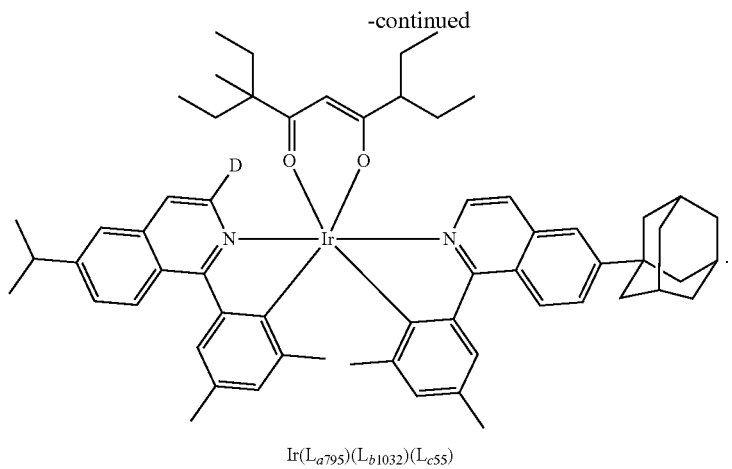

Ir(L$_{a795}$)(L$_{b1032}$)(L$_{c55}$)

According to an embodiment of the present disclosure, further disclosed is an electroluminescent device, which includes:
an anode,
a cathode, and
an organic layer disposed between the anode and the cathode, wherein the organic layer includes a metal complex having a general formula of M(L$_a$)$_m$(L$_b$)$_n$(L$_c$)$_q$, wherein L$_a$, L$_b$ and L$_c$ are a first ligand, a second ligand and a third ligand coordinated to the metal M respectively;
wherein m is selected from an integer greater than or equal to 1, n is selected from an integer greater than or equal to 1, q is selected from an integer greater than or equal to 1, and m+n+q equals the oxidation state of the metal M;
wherein L$_a$ and L$_b$ are ligands with different structures, and each independently represented by Formula 1:

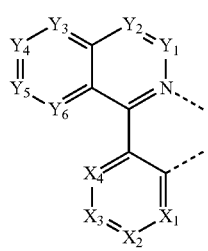

Formula 1 wherein $X_1$ to $X_4$ are each independently selected from $CR_1$ or N;
wherein $Y_1$ to $Y_6$ are each independently selected from $CR_2$ or N, and at least one of $Y_1$ to $Y_6$ is $CR_2$;
wherein $R_1$ and $R_2$ are each independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;
in Formula 1, adjacent substituents $R_1$ can be optionally joined to form a ring;
in the ligands L$_a$ and/or L$_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;
wherein L$_c$ has a structure represented by Formula 2:

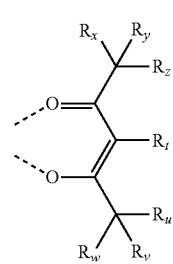

Formula 2 wherein $R_t$ to $R_z$ are each independently selected from the group consisting of: hydrogen, deuterium, substituted or unsubstituted alkyl having 1 to 20 carbon atoms, substior unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

According to an embodiment of the present disclosure, the device emits red light.

According to an embodiment of the present disclosure, the device emits white light.

According to an embodiment of the present disclosure, in the device, the organic layer is a light-emitting layer, and the metal complex is a light-emitting material.

According to an embodiment of the present disclosure, in the device, the organic layer further includes a host material.

According to an embodiment of the present disclosure, the host material includes at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to another embodiment of the present disclosure, further disclosed is a compound formulation which includes the metal complex whose specific structure is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, light emitting dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

A method for preparing a compound in the present disclosure is not limited herein. Typically, the following compounds are taken as examples without limitations, and synthesis routes and preparation methods thereof are described below.

Synthesis Example 1: Synthesis of Compound Ir($L_{a39}$)($L_{b291}$)($L_{c55}$)

Step 1: synthesis of ethyl 2-ethyl-2-methylbutyrate

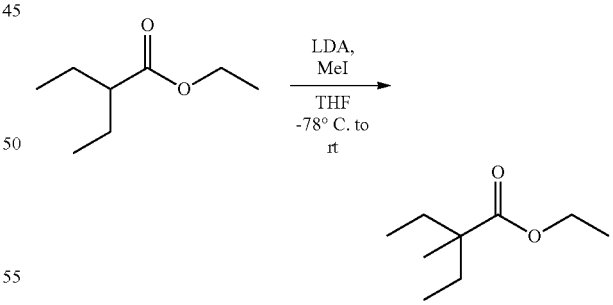

Ethyl 2-ethylbutyrate (50.0 g, 346 mmol) was dissolved in 600 mL of tetrahydrofuran, N$_2$ was bubbled into the obtained solution for 3 min, and then the solution was cooled to −78° C. 190 mL of 2 M di-isopropylamide lithium in tetrahydrofuran was added dropwise into the solution under N$_2$ protection at −78° C. After the dropwise addition was finished, the reaction solution was kept reacting at −78° C. for 30 min, and then iodomethane (58.9 g, 415 mmol) was slowly added. After the dropwise addition was finished, the reaction was slowly warmed to room temperature for overnight. Then, a saturated ammonium chloride solution was slowly added to quench the reaction, and then liquid layers were separated. The organic phase was collected, and the aqueous phase was extracted twice with dichloromethane. The organic phases were combined and dried and rotary evaporated to dryness to obtain the desired ethyl 2-ethyl-2-methylbutyrate (52.2 g with a yield of 95%).

Step 2: Synthesis of 2-ethyl-2-methylbutyric acid

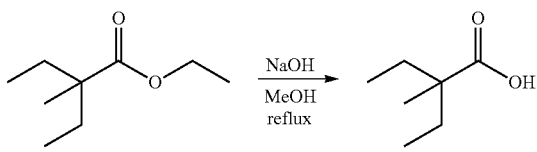

Ethyl 2-ethyl-2-methylbutyrate (52.2 g, 330 mmol) was dissolved in methanol, sodium hydroxide (39.6 g, 990 mmol) was added to the solution, and then the obtained reaction mixture was heated to reflux for 12 h and cooled then to room temperature. Methanol was removed by rotary evaporation, the pH of the reaction solution was adjusted to 1 by adding 3M hydrochloric acid, and then extraction was performed several times with dichloromethane. The organic phases were combined and dried and rotary evaporated to dryness to obtain 2-ethyl-2-methylbutyric acid (41.6 g with a yield of 97%).

Step 3: Synthesis of 3-ethyl-3-methylpentan-2-one

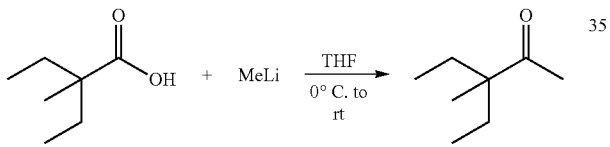

2-Ethyl-2-methylbutyric acid (13.0 g, 100 mmol) was dissolved in 200 mL of tetrahydrofuran, $N_2$ was bubbled into the obtained solution for 3 min, and then the solution was cooled to 0° C. 230 mL of methyl lithium (1.3 M) in ether was added dropwise into the solution under $N_2$ protection at 0° C. After the dropwise addition was finished, the reaction solution was kept reacting at 0° C. for 2 h, and then was warmed to room temperature for overnight. After TLC showed that the reaction was finished, 1 M hydrochloric acid was slowly added to quench the reaction, and then liquid layers were separated. The organic phase was collected, and the aqueous phase was extracted twice with dichloromethane. The organic phases were combined and dried and rotary evaporated to dryness to obtain the target product, 3-ethyl-3-methylpentan-2-one (11.8 g with a yield of 92%).

Step 4: Synthesis of 2-ethylbutyryl chloride

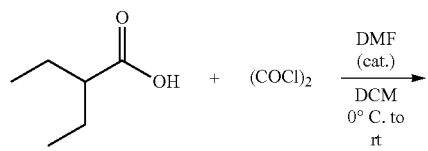

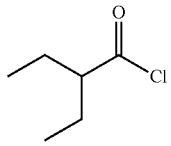

2-Ethylbutyric acid (11.6 g, 100 mmol) was dissolved in dichloromethane, 1 drop of DMF was added as a catalyst, and then $N_2$ was bubbled into the obtained solution for 3 min. The reaction was then cooled to 0° C., and oxalyl chloride (14.0 g, 110 mmol) was added dropwise thereto. After the dropwise addition was finished, the reaction was warmed to room temperature. When no gas was evolved from the reaction system, the reaction solution was rotary evaporated to dryness. The obtained crude 2-ethylbutyryl chloride was used directly in the next reaction without further purification.

Step 5: Synthesis of 3,7-diethyl-3-methylnonane-4,6-dione

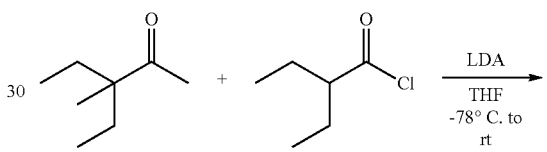

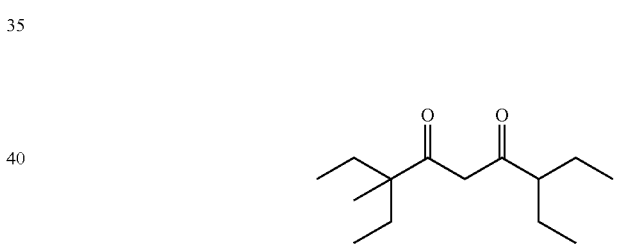

3-Ethyl-3-methylpentan-2-one (11.8 g, 92 mmol) was dissolved in tetrahydrofuran, $N_2$ was bubbled into the obtained solution for 3 min, and then the solution was cooled to −78° C. 55 mL of 2 M di-isopropylamide lithium in tetrahydrofuran was added dropwise to the solution. After the dropwise addition was finished, the reaction solution was kept reacting at −78° C. for 30 min, and then 2-ethylbutyryl chloride (100 mmol) was slowly added. After the dropwise addition was finished, the reaction was slowly warmed to room temperature for overnight. 1 M hydrochloric acid was slowly added to quench the reaction, and then liquid layers were separated. The organic phase was collected, and the aqueous phase was extracted twice with dichloromethane. The organic phases were combined and dried and rotary evaporated to dryness to obtain a crude product. The crude product was purified by column chromatography (with an eluent of petroleum ether) and distilled under reduced pressure to obtain the target product 3,7-diethyl-3-methyl-nonane-4,6-dione (4.7 g with a yield of 23%).

Step 6: Synthesis of 1-(3,5-dimethylphenyl)-6-cyclopentylisoquinoline

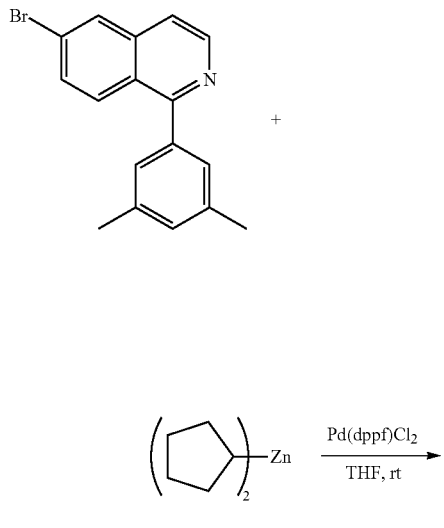

A 250 mL three-neck flask was degassed and purged with nitrogen, and then cyclopentylmagnesium bromide (64 mL, 64 mmol) was added. A solution of zinc chloride (19.5 mL, 32 mmol) was added dropwise at 0° C. After the addition was finished, the mixture was reacted at room temperature for 30 min to prepare a cyclopentyl zinc reagent. 6-Bromo-1-(3,5-dimethylphenyl)isoquinoline (10 g, 32 mmol) and Pd(dppf)Cl$_2$ (702 mg, 0.96 mmol) were added in a 500 ml three-neck flask. The system was degassed and purged with nitrogen. THF (136 mL) was added and then the prepared zinc reagent was added. The mixture was reacted overnight at room temperature. After GC-MS detected that the reaction was finished, water was added to quench the reaction. The organic phase was separated, and the aqueous phase was extracted with ethyl acetate. The organic phases were combined, washed with saturated brine, dried with anhydrous sodium sulfate, filtered and concentrated, mixed with Celite, and separated by chromatography to obtain 1-(3,5-dimethylphenyl)-6-cyclopentylisoquinoline (8.2 g with a yield of 85%) as a colorless oily product.

Step 7: Synthesis of 1-(3,5-dimethylphenyl)-6-methylisoquinoline

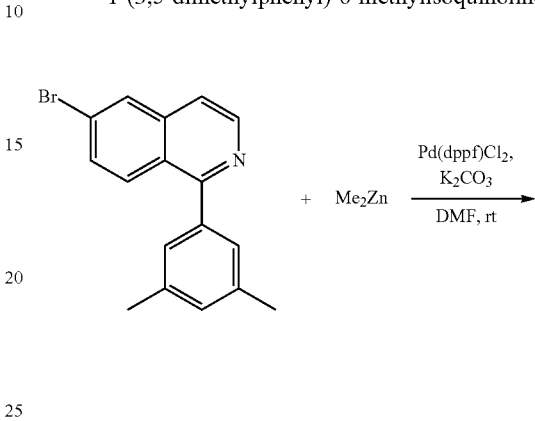

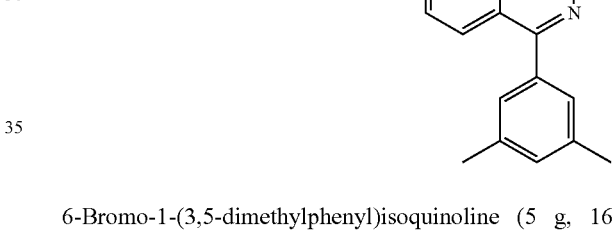

6-Bromo-1-(3,5-dimethylphenyl)isoquinoline (5 g, 16 mmol), Pd(dppf)Cl$_2$ (535 mg, 0.8 mmol), K$_2$CO$_3$ (5.3 g, 40 mmol) and DMF (80 mL) were added in a 500 ml three-neck flask. The reaction system was degassed and purged with nitrogen, added with a solution of Me$_2$Zn in toluene (24 mL, 24 mmol), and reacted overnight at room temperature. After GC-MS detected that the reaction was finished, water was added to quench the reaction. The organic phase was separated, and the aqueous phase was extracted with ethyl acetate. The organic phases were combined, washed with saturated brine, dried with anhydrous sodium sulfate, filtered and concentrated, mixed with Celite, and separated by column chromatography to obtain 1-(3,5-dimethylphenyl)-6-methylisoquinoline (3.2 g with a yield of 81%) as a white solid.

Step 8: synthesis of compound Ir(L$_{a39}$)(L$_{b291}$)(L$_{c55}$)

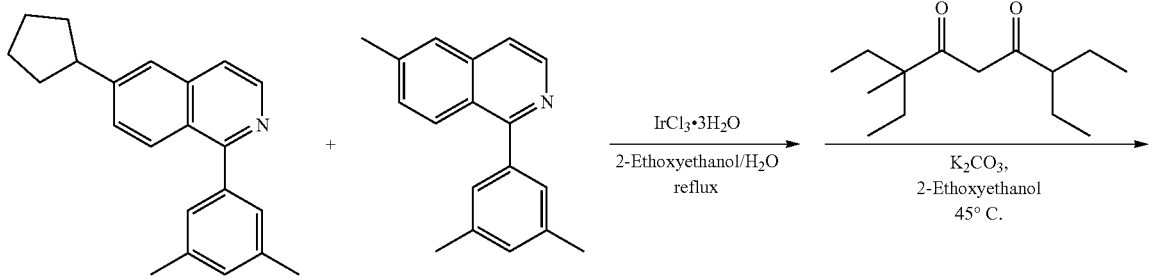

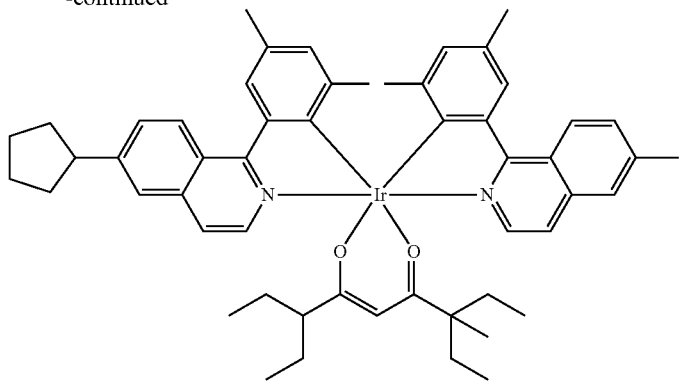

1-(3,5-Dimethylphenyl)-6-cyclopentylisoquinoline (3.62 g, 12 mmol), 1-(3,5-dimethylphenyl)-6-methylisoquinoline (2.96 g, 12 mmol), $IrCl_3 \cdot 3H_2O$ (2.11 g, 6 mmol), ethoxyethanol (63 mL) and water (21 mL) were added in a 500 mL single-neck flask. The system was degassed and purged with nitrogen, and refluxed for 24 h. The reaction was cooled to room temperature, filtered, and the filter cake was washed with ethanol to obtain an iridium dimer.

3,7-Diethyl-3-methylnonane-4,6-dione (2.716 g, 12 mmol), $K_2CO_3$ (4.15 g, 30 mmol) and ethoxyethanol (84 mL) were added to the iridium dimer (4.78 g). The mixture was reacted overnight at 45° C. under a nitrogen atmosphere. After TLC detected that the reaction was finished, stirring was stopped and the reaction solution was cooled to room temperature. The reaction solution was filtered through Celite, the filter cake was washed with an appropriate amount of EtOH, and the crude product was washed with DCM into a 500 mL eggplant-shaped flask. EtOH (about 60 mL) was added in the crude product, and DCM was removed by rotary evaporation at room temperature until a large amount of solids was precipitated. The solids were filtered and dried to obtain 4.4 g of crude product, which was separated by chromatography to obtain the target product, compound $Ir(L_{a39})(L_{b291})(L_{c55})$ (0.99 g with purity of 99.9%). The product was confirmed as the target product with a molecular weight of 964.

Synthesis Example 2: Synthesis of Compound $Ir(L_{a111})(L_{b291})(L_{c55})$

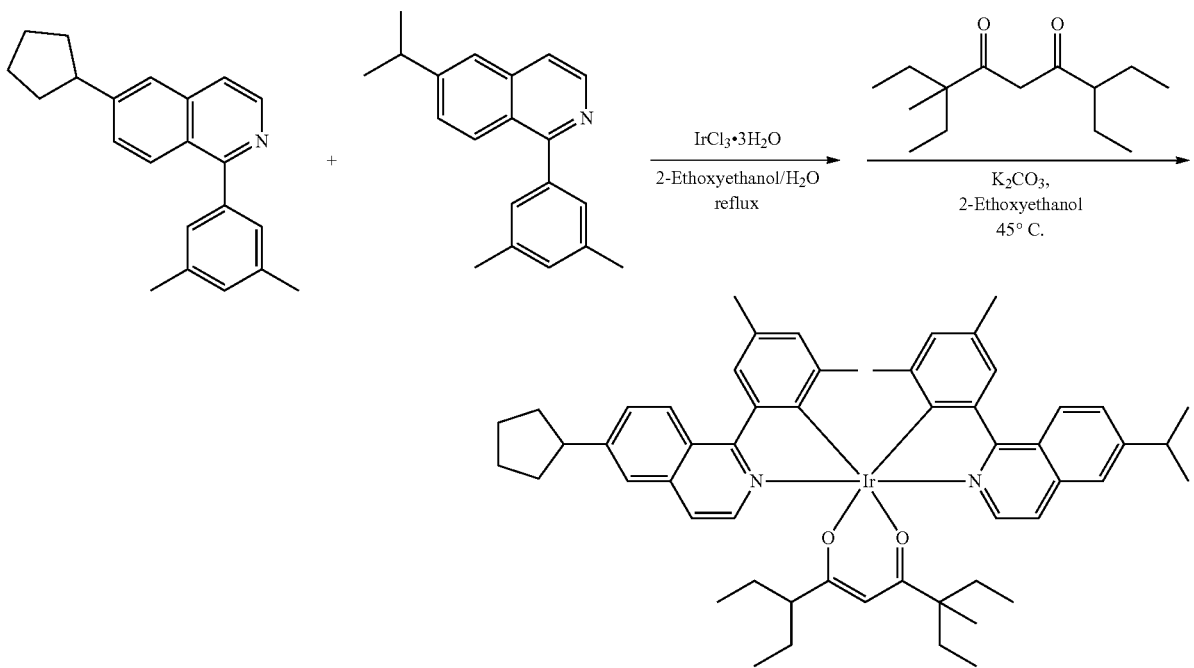

1-(3,5-Dimethylphenyl)-6-cyclopentylisoquinoline (3 g, 9.95 mmol), 1-(3,5-dimethylphenyl)-6-isopropylisoquinoline (2.74 g, 9.95 mmol), $IrCl_3 \cdot 3H_2O$ (1.76 g, 4.975 mmol), ethoxyethanol (60 mL) and water (20 mL) were added in a 500 mL single-neck flask. The system was degassed and purged with nitrogen, and refluxed for 24 h. The reaction was cooled to room temperature, filtered, and the filter cake was washed with ethanol to obtain an iridium dimer.

3,7-Diethyl-3-methylnonane-4,6-dione (2.25 g, 9.95 mmol), $K_2CO_3$ (3.44 g, 24.9 mmol) and ethoxyethanol (60 mL) were added to the iridium dimer. The mixture was reacted overnight at 45° C. under a nitrogen atmosphere. After TLC detected that the reaction was finished, the reaction solution was no longer stirred and was cooled to room temperature. The reaction solution was filtered through Celite, the filter cake was washed with an appropriate amount of EtOH, and the crude product was washed with DCM into a 500 mL eggplant-shaped bottle. EtOH (about 60 mL) was added in the crude product, and DCM was removed by rotary evaporation at room temperature until a large amount of solids was precipitated. The solids were filtered and dried to obtain 3.8 g of crude product, which was separated by chromatography to obtain the target product, compound Ir($L_{a111}$)($L_{b291}$)($L_{c55}$) (0.53 g with purity of 98.7%). The product was confirmed as the target product with a molecular weight of 992.

Synthesis Example 3: Synthesis of Compound Ir($L_{a39}$)($L_{b65}$)($L_{c55}$)

Step 1: synthesis of 1-(3,5-dimethylphenyl)-6-trimethylsilylisoquinoline

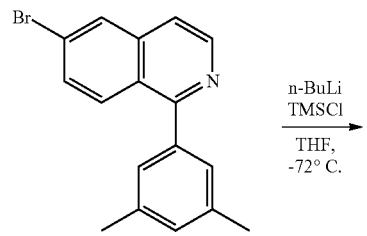

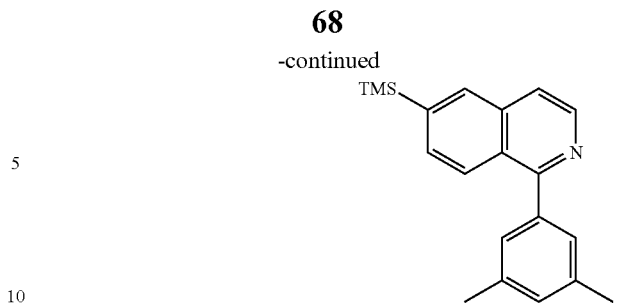

6-Bromo-1-(3,5-dimethylphenyl)isoquinoline (48.05 mmol, 15 g) was dissolved in 160 mL of THF. The reaction system was evacuated and purged with nitrogen three times. The reaction flask was placed in a dry ice-ethanol system to be cooled to −72° C., and n-BuLi (2.5 M, 57.7 mmol, 23.1 mL) was slowly added dropwise to the system. After the dropwise addition was finished, the mixture was reacted for 30 min, and then trimethylchlorosilane (7.82 g, 72.1 mmol) was added dropwise to the system. After the dropwise addition was finished, the reaction was slowly returned to room temperature for overnight. The reaction was monitored by TLC until it was finished. Water was added to quench the reaction. A layer of tetrahydrofuran was separated, and the aqueous phase was extracted three times with ethyl acetate. The organic phases were combined, dried, subjected to rotary evaporation and purified by column chromatography to obtain 1-(3,5-dimethylphenyl)-6-trimethylsilylisoquinoline (11.7 g with a yield of 79%) as a colorless oily liquid.

Step 2: Synthesis of Compound Ir($L_{a39}$)($L_{b65}$)($L_{c55}$)

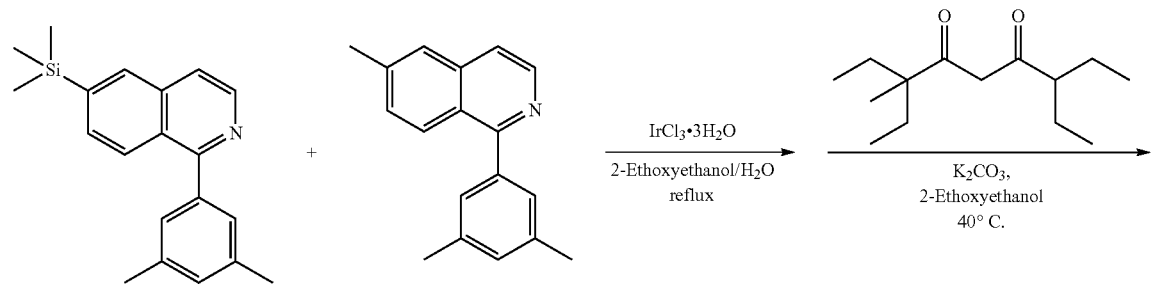

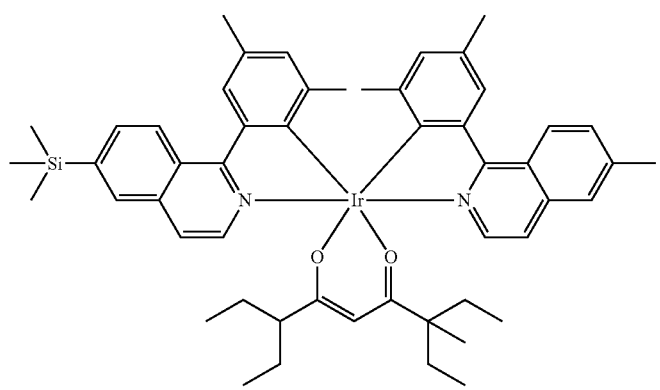

A mixture of 1-(3,5-dimethylphenyl)-6-trimethylsilylisoquinoline (3.14 g, 10.3 mmol), 1-(3,5-dimethylphenyl)-6-methylisoquinoline (6.36 g, 25.7 mmol), iridium trichloride trihydrate (3.17 g, 9.0 mmol), 2-ethoxyethanol (96 mL) and water (32 mL) was refluxed under a nitrogen atmosphere for 40 h. The reaction solution was cooled to room temperature and filtered. The obtained solid was washed several times with methanol and dried to obtain an iridium dimer.

Under a nitrogen atmosphere, the iridium dimer (4.48 g) in the above step, 3,7-diethyl-3-methylnonane-4,6-dione (1.96 g, 8.65 mmol), and $K_2CO_3$ (3.98 g, 28.8 mmol) were heated in 2-ethoxyethanol (83 mL) to 40° C. and stirred for 24 h. After the reaction was finished, the reaction system was naturally cooled to room temperature, and the precipitate was filtered through Celite and washed with ethanol. The obtained solid was added with dichloromethane, and the filtrate was collected. The solvent was removed in vacuum, and the residual was mixed with Celite and separated by column chromatography to obtain $Ir(L_{a39})(L_{b615})(L_{c55})$ (0.83 g with a purity of 99.4%). The product was confirmed as the target product with a molecular weight of 968.

Comparative Example 1: Synthesis of Comparative Compound $Ir(L_{a291})_2(L_{c55})$ 1-(3,5-Dimethylphenyl)-6-cyclopentylisoquinoline (3.2 g, 10.7 mmol), $IrCl_3 \cdot 3H_2O$ (1.27 g, 3.6 mmol), ethoxyethanol (45 mL) and water (15 mL) were added in a 250 mL single-neck flask. The system was evacuated and purged with nitrogen, and refluxed for 24 h. The reaction solution was cooled to room temperature and the resultant red solid was filtered. The red solid was washed with EtOH and dried to obtain an iridium dimer (2.3 g, 77%).

The iridium dimer (1.05 g, 0.62 mmol), 3,7-diethyl-3-methylnonane-4,6-dione (562 mg, 2.48 mmol), $K_2CO_3$ (857 mg, 6.2 mmol) and ethoxyethanol (20 mL) were added in a 250 mL single-neck flask and reacted for 18 h at room temperature under a nitrogen atmosphere. The reaction solution was filtered through Celite, the filter cake was washed with an appropriate amount of EtOH, and the crude product was washed with DCM into a 250 mL eggplant-shaped bottle. EtOH (about 30 mL) was added in the crude product, and DCM was removed by rotary evaporation at room temperature until a large amount of solids was precipitated. The solids were filtered, washed with an appropriate amount of EtOH, and dried to obtain $Ir(L_{a291})_2(L_{c55})$ (750 mg with purity of 99.9%). The obtained product was confirmed as a target product with a molecular weight of 1018.

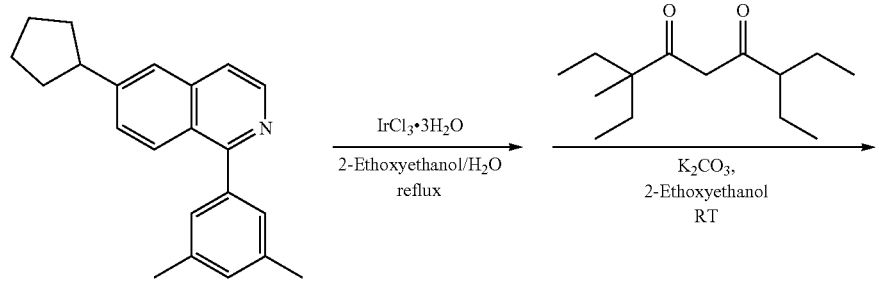

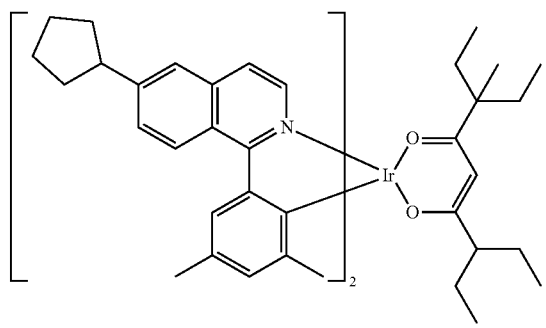

Comparative Example 2: Synthesis of Comparative Compound Ir(L$_{a65}$)$_2$(L$_{c55}$)

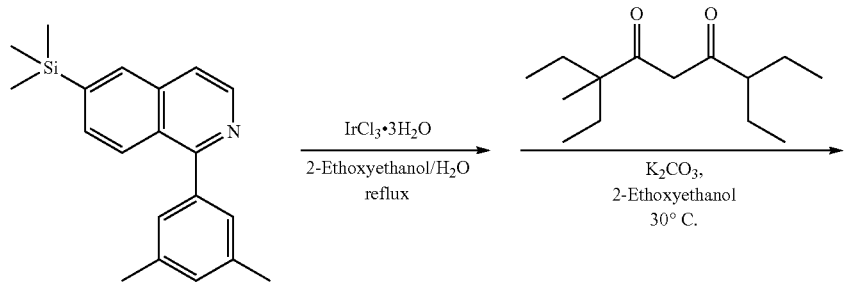

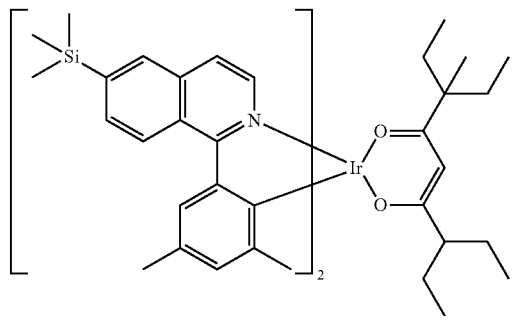

A mixture of 1-(3,5-dimethylphenyl)-6-(trimethylsilyl) isoquinoline (2.70 g, 8.8 mmol), iridium trichloride trihydrate (1.03 g, 2.93 mmol), 2-ethoxyethanol (30 mL) and water (10 mL) was refluxed under a nitrogen atmosphere for 24 h. The reaction solution was cooled to room temperature and filtered. The obtained solid was washed several times with methanol and dried to obtain an iridium dimer (1.93 g with a yield of 78).

Under a nitrogen atmosphere, the iridium dimer (1.93 g, 1.15 mmol) in the above step, 3,7-diethyl-3-methylnonane-4,6-dione (0.79 g, 3.5 mmol), K$_2$CO$_3$ (1.59 g, 11.5 mmol) and 2-ethoxyethanol (33 mL) were heated to 30° C. and stirred for 24 h. After TLC detected that the reaction was finished, the reaction system was naturally cooled to room temperature, and the precipitate was filtered through Celite and washed with ethanol. The obtained solid was added with dichloromethane, and the filtrate was collected. Ethanol was then added and the obtained solution was concentrated, but not to dryness. The solution was filtered and pumped to dry to obtain Ir(L$_{a615}$)$_2$(L$_{c55}$) which was refluxed in acetonitrile, cooled, filtered, and further purified to obtain compound Ir(L$_{a615}$)$_2$(L$_{c55}$) (2.0 g with purity of 99.9%). The obtained product was confirmed as a target product with a molecular weight of 1027.

Those skilled in the art will appreciate that the above preparation method is merely illustrative, and those skilled in the art can obtain other compound structures of the present disclosure through the improvements of the preparation method.

Device Example 1

First, a glass substrate having an Indium Tin Oxide (ITO) anode with a thickness of 120 nm was cleaned, and then treated with oxygen plasma and UV ozone. After the treatment, the substrate was dried in a glovebox to remove water. The substrate was mounted on a substrate holder and loaded into a vacuum chamber. Organic layers specified below were sequentially deposited through vacuum thermal evaporation on the ITO anode at a rate of 0.2 to 2 Angstroms per second at a vacuum degree of about 10$^{-8}$ torr. Compound HI was used as a hole injection layer (HIL). Compound HT was used as a hole transporting layer (HTL). Compound EB was used as an electron blocking layer (EBL). The compound Ir(L$_{a39}$)(L$_{b291}$)(L$_{c55}$) of the present disclosure was doped in a host compound RH to be used as an emissive layer (EML). Compound HB was used as a hole blocking layer (HBL). On the HBL, a mixture of Compound ET and 8-hydroxyquino-linolato-lithium (Liq) was deposited as an electron transporting layer (ETL). Liq with a thickness of 1 nm was deposited as an electron injection layer, and Al with a thickness of 120 nm was deposited as a cathode. The device was transferred back to the glovebox and encapsulated with a glass lid and a moisture getter to complete the device.

Device Example 2

The preparation method in Device Example 2 was the same as that in Device Example 1, except that the compound $Ir(L_{a39})(L_{b291})(L_{c55})$ of the present disclosure in the emissive layer (EML) was substituted by the compound $Ir(L_{a39})(L_{b615})(L_{c55})$ of the present disclosure.

Device Comparative Example 1

The preparation method in Device Comparative Example 1 was the same as that in Device Example 1, except that the compound $Ir(L_{a39})(L_{b291})(L_{c55})$ of the present disclosure in the emissive layer (EML) was substituted by the comparative compound $Ir(L_{a39})_2(L_{c55})$.

Device Comparative Example 2

The preparation method in Device Comparative Example 2 was the same as that in Device Example 1, except that the compound $Ir(L_{a39})(L_{b291})(L_{c55})$ of the present disclosure in the emissive layer (EML) was substituted by the comparative compound $Ir(L_{a291})_2(L_{c55})$.

Device Comparative Example 3

The preparation method in Device Comparative Example 3 was the same as that in Device Example 1, except that the compound $Ir(L_{a39})(L_{b291})(L_{c55})$ of the present disclosure in the emissive layer (EML) was substituted by the comparative compound $Ir(L_{a615})_2(L_{c55})$.

Detail structures and thicknesses of part of layers of the device are shown in the following table. A layer using more than one material is obtained by doping different compounds in their weight proportions as described.

TABLE 1

| Device No. | HIL | HTL | EBL | EML | HBL | ETL |
|---|---|---|---|---|---|---|
| Example 1 | Compound HI (100 Å) | Compound HT (400 Å) | Compound EB (50 Å) | Compound RH: compound $Ir(L_{a39})(L_{b291})(L_{c55})$ (98:2) (400 Å) | Compound HB (50 Å) | Compound ET: Liq (40:60) (350 Å) |
| Example 2 | Compound HI (100 Å) | Compound HT (400 Å) | Compound EB (50 Å) | Compound RH: compound $Ir(L_{a39})(L_{b615})(L_{c55})$ (98:2) (400 Å) | Compound HB (50 Å) | Compound ET: Liq (40:60) (350 Å) |
| Comparative Example 1 | Compound HI (100 Å) | Compound HT (400 Å) | Compound EB (50 Å) | Compound RH: compound $Ir(L_{a39})_2(L_{b615})$ (98:2) (400 Å) | Compound HB (50 Å) | Compound ET: Liq (40:60) (350 Å) |
| Comparative Example 2 | Compound HI (100 Å) | Compound HT (400 Å) | Compound EB (50 Å) | Compound compound $Ir(L_{a291})_2(L_{c55})$ (98:2) (400 Å) | RH: Compound HB (50 Å) | Compound ET: Liq (40:60) (350 Å) |
| Comparative Example 3 | Compound HI (100 Å) | Compound HT (400 Å) | Compound EB (50 Å) | Compound RH: compound $Ir(L_{a615})_2(L_{c55})$ (98:2) (400 Å) | Compound HB (50 Å) | Compound ET: Liq (40:60) (350 Å) |

Structures of the materials used in the device are shown as follows:

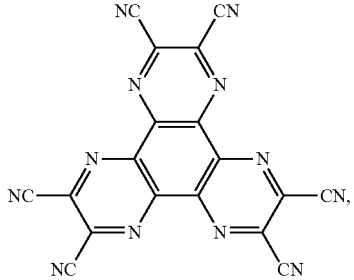

Compound HI

Compound HT
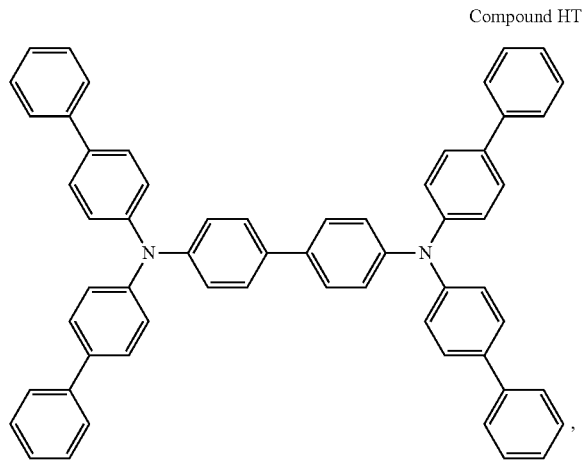
Compound EB
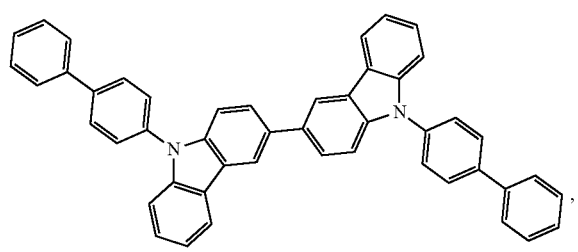
Compound HB
Compound RH
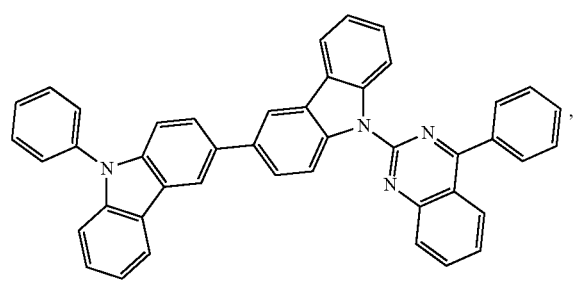
Compound ET
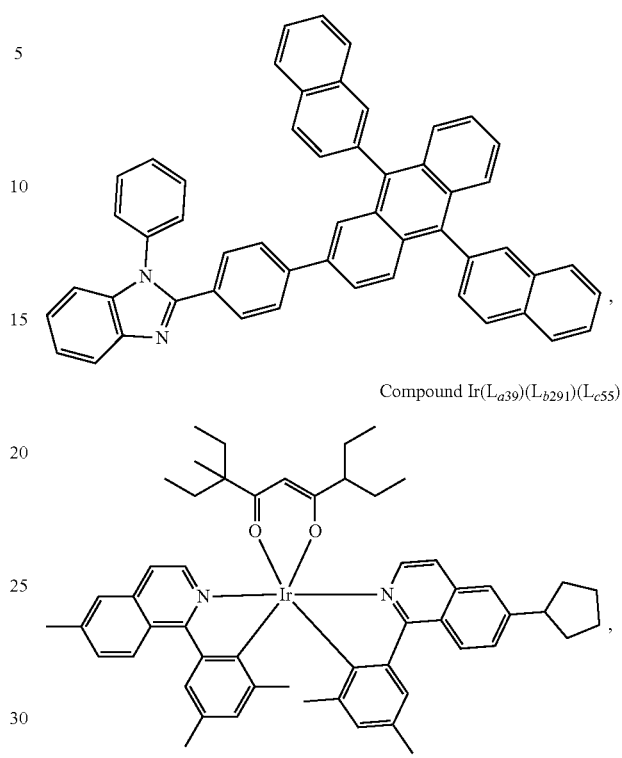
Compound Ir(L$_{a39}$)(L$_{b291}$)(L$_{c55}$)
Compound Ir(L$_{a39}$)(L$_{b615}$)(L$_{c55}$)
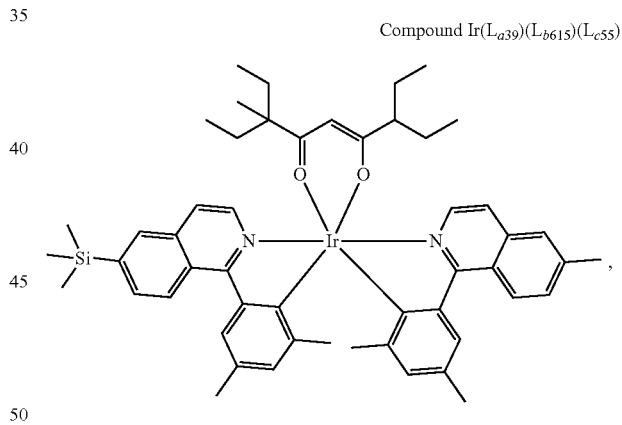
Compound Ir(L$_{a39}$)$_2$L$_{c55}$
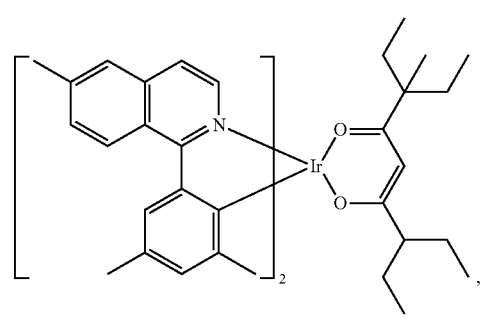

-continued

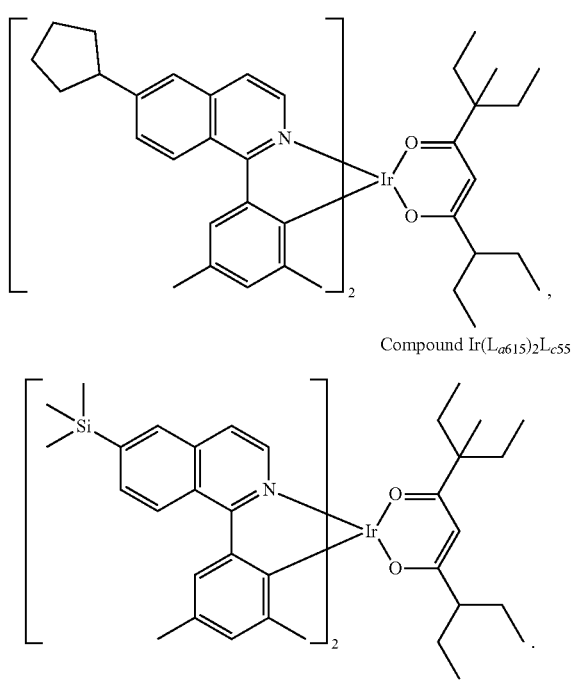

Compound Ir(L$_{a291}$)$_2$L$_{c55}$

Compound Ir(L$_{a615}$)$_2$L$_{c55}$

Current-voltage-luminance (IVL) and lifetime characteristics of the device were measured at different current densities and voltages. Table 2 shows external quantum efficiency (EQE), maximum emission wavelength λmax and voltage (V) measured at 1000 nits. Table 3 shows evaporation temperatures (T$_{evap}$ @ 0.5 Å/s) of the materials at an evaporation rate of 0.5 Å/s at a vacuum degree of 2×10$^{-7}$ torr or below.

TABLE 2

Device data

| Device No. | λmax (nm) | Voltage (V) | EQE (%) |
|---|---|---|---|
| Example 1 | 624 | 3.88 | 25.59 |
| Comparative Example 1 | 625 | 4.13 | 24.72 |
| Comparative Example 2 | 623 | 3.91 | 26.67 |
| Example 2 | 634 | 3.94 | 24.31 |
| Comparative Example 3 | 638 | 4.00 | 24.72 |

TABLE 3

Data on the evaporation temperatures

| Device No. using a compound | Compound | The substituent at 6-position of a ligand | The substituent at 6-position of a ligand | Molecular Weight | T$_{evap}$ @ 0.5 Å/s |
|---|---|---|---|---|---|
| Example 1 | Ir(L$_{a39}$)(L$_{b291}$)(L$_{c55}$) | methyl | cyclopentyl | 964 | 232 |
| Comparative Example 1 | Ir(L$_{a39}$)$_2$(L$_{c55}$) | methyl | methyl | 910 | 219 |
| Comparative Example 2 | Ir(L$_{a291}$)$_2$(L$_{c55}$) | cyclopentyl | cyclopentyl | 1018 | 252 |
| Example 2 | Ir(L$_{a39}$)(L$_{b615}$)(L$_{c55}$) | methyl | trimethylsilyl | 968 | 215 |
| Comparative Example 3 | Ir(L$_{a615}$)$_2$(L$_{c55}$) | trimethylsilyl | trimethylsilyl | 1027 | 231 |

Generally, in researches focused on improving material performance, mono- or multi-substitution is introduced on phenyl isoquinoline, or modification is further introduced on the substituent(s) in order to adjust performance such as efficiency and emission wavelength. However, this will increase the molecular weight of the material and require a higher evaporation temperature, which may cause a decrease in evaporation stability. The present disclosure forms an asymmetric complex structure by coordinating iridium with two different isoquinoline ligands, and thus can effectively control the increase of the evaporation temperature while obtaining desired performance such as the efficiency and the emission wavelength of the material. As shown in Tables 2 and 3, with the derivation from Ir(L$_{a39}$)$_2$(L$_{c55}$) containing two methyl groups to Ir(L$_{a39}$)(L$_{b291}$)(L$_{c55}$) containing one methyl group and one cyclopentyl group, the molecular weight increased by 54 g/mol, from 910 g/mol to 964 g/mol, and the evaporation temperature increased by 13° C., from 219° C. to 232° C.; and, with the derivation to Ir(L$_{a291}$)$_2$(L$_{c55}$) containing two cyclopentyl groups, the molecular weight increased by 108 g/mol, from 910 g/mol to 1018 g/mol, and the evaporation temperature increased by 36° C., from 219° C. to 252° C. Related device performance comparisons showed that both Example 1 and Comparative Example 2 achieved higher EQE than Comparative Example 1, which demonstrated that the two different ligands of the present disclosure can not only effectively control the evaporation temperature but also achieve the device performance of improved efficiency due to substituents with larger molecular weights. In addition, Example 1 also achieved a lower voltage than Comparative Examples 1 and 2.

With the derivation from Ir(L$_{a39}$)$_2$(L$_{c55}$) containing two methyl groups to Ir(L$_{a39}$)(L$_{b615}$)(L$_{c55}$) containing one methyl group and one trimethylsilyl group, the molecular weight increased by 58 g/mol, from 910 g/mol to 968 g/mol, and the evaporation temperature unexpectedly decreased by 4° C., from 219° C. to 215° C.; and, with the derivation to Ir(L$_{a615}$)$_2$(L$_{c55}$) containing two trimethylsilyl groups, the molecular weight increased by 117 g/mol, from 910 g/mol to 1027 g/mol, and the evaporation temperature increased by 12° C., from 219° C. to 231° C. Related device performance comparisons showed that both Example 2 and Comparative Example 3 achieved a significant red-shift λmax with respect to Comparative Example 1, which demonstrated that the two different ligands of the present disclosure can not only achieve a lower evaporation temperature but also achieve the device performance of emission wavelength red-shift due to trimethylsilyl substituents. In addition, Example 2 also achieved a lower voltage than Comparative Examples 1 and 3.

The above data significantly shows that the complex structure with two different phenylisoquinoline ligands of the present disclosure has a clear effect on controlling the increase of the evaporation temperature and can also maintain the device performance due to corresponding substituents. The complex structure is of great help for the industry to both control or improve device performance and control the evaporation temperature to cooperate with production, for example, to reduce the evaporation temperature to prevent material aging, and to finely adjust evaporation to optimize mixed evaporation, etc.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex, having a general formula of $M(L_a)_m(L_b)_n(L_c)_q$, wherein $L_a$, $L_b$ and $L_c$ are a first ligand, a second ligand and a third ligand coordinated to the metal M respectively;

wherein m is selected from an integer greater than or equal to 1, n is selected from an integer greater than or equal to 1, q is selected from an integer greater than or equal to 1, and m+n+q equals the oxidation state of the metal M;

wherein $L_a$ and $L_b$ are ligands with different structures, and each independently represented by Formula 1:

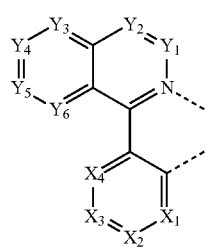

Formula 1 wherein $X_1$ to $X_4$ are each independently selected from $CR_1$ or N;

wherein $Y_1$ to $Y_6$ are each independently selected from $CR_2$ or N, and at least one of $Y_1$ to $Y_6$ is $CR_2$;

wherein $R_1$ and $R_2$ are each independently selected from the group consisting of:

hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 1, for substituents $R_1$ only, adjacent substituents can be optionally joined to form a ring which has a number of ring atoms less than or equal to 6;

in the ligands $L_a$ and/or $L_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

wherein $L_c$ has a structure represented by Formula 2:

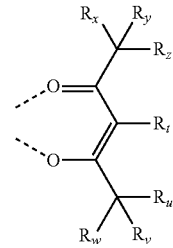

Formula 2 wherein $R_t$, $R_u$, $R_v$, $R_w$, $R_x$, $R_y$ and $R_z$ are each independently selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

2. The metal complex of claim 1, wherein the metal M is selected from the group consisting of Cu, Ag, Au, Ru, Rh, Pd, Os, Ir and Pt; preferably, the metal M is selected from Pt or Ir.

3. The metal complex of claim 1, wherein at least one of $X_1$ to $X_4$ is selected from $CR_1$.

4. The metal complex of claim 1, wherein $X_1$ and $X_4$ are each independently selected from $CR_1$, and/or $Y_1$ to $Y_6$ are each independently selected from $CR_2$.

5. The metal complex of claim 1, wherein $X_1$ is each independently $CR_1$ and/or $X_3$ is each independently $CR_1$, and $R_1$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;
preferably, $R_1$ is independently selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms; more preferably, $R_1$ is independently selected from substituted or unsubstituted alkyl having 1 to 20 carbon atoms.

6. The metal complex of claim 1, wherein $Y_1$ is each independently $CR_2$ and/or $Y_4$ is each independently $CR_2$, and $R_2$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;
preferably, $R_2$ is independently selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms;
more preferably, $R_2$ is independently selected from substituted or unsubstituted alkyl having 1 to 20 carbon atoms or substituted or unsubstituted alkylsilyl having 3 to 20 carbon atoms.

7. The metal complex of claim 1, wherein $Y_1$ is CD, $Y_4$ is $CR_2$, and $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and substituted or unsubstituted alkylsilyl having 3 to 20 carbon atoms;
preferably, $R_2$ is selected from substituted or unsubstituted alkyl having 1 to 20 carbon atoms or substituted or unsubstituted alkylsilyl having 3 to 20 carbon atoms, and $Y_2$, $Y_3$, $Y_5$ and $Y_6$ are each CH.

8. The metal complex of claim 1, wherein $Y_1$, $Y_2$, $Y_3$, $Y_4$ and $Y_6$ are each CH, $Y_5$ is $CR_2$, and $R_2$ is selected from substituted or unsubstituted alkyl having 1 to 20 carbon atoms.

9. The metal complex of claim 1, wherein $Y_2$, $Y_3$, $Y_4$, $Y_5$ and $Y_6$ are each CH, $Y_1$ is $CR_2$, and $R_2$ is selected from substituted or unsubstituted alkyl having 1 to 20 carbon atoms.

10. The metal complex of claim 1, wherein $R_2$ is each independently selected from the group consisting of: hydrogen, deuterium, methyl, isopropyl, 2-butyl, isobutyl, t-butyl, pent-3-yl, cyclopentyl, cyclohexyl, 4,4-dimethylcyclohexyl, neopentyl, 2,4-dimethylpent-3-yl, 3,3,3-trifluoro-2,2-dimethylpropyl, 1,1-dimethylsilacyclohex-4-yl, cyclopentylmethyl, cyanomethyl, cyano, trifluoromethyl, bromine, chlorine, trimethylsilyl, phenyldimethylsilyl, phenyl and 3-pyridyl.

11. The metal complex of claim 1, wherein $L_a$ and $L_b$ have different structures and are each independently selected from the group consisting of:

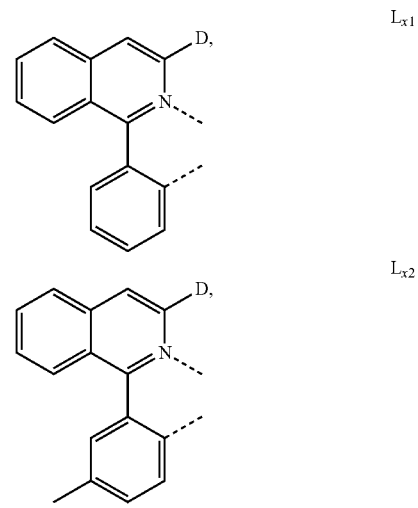

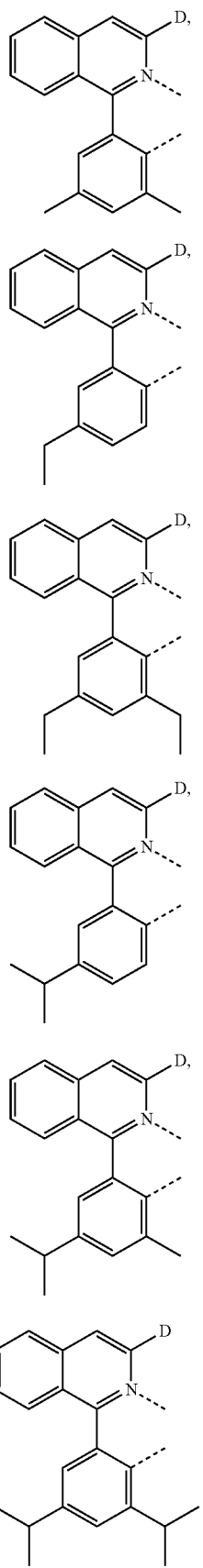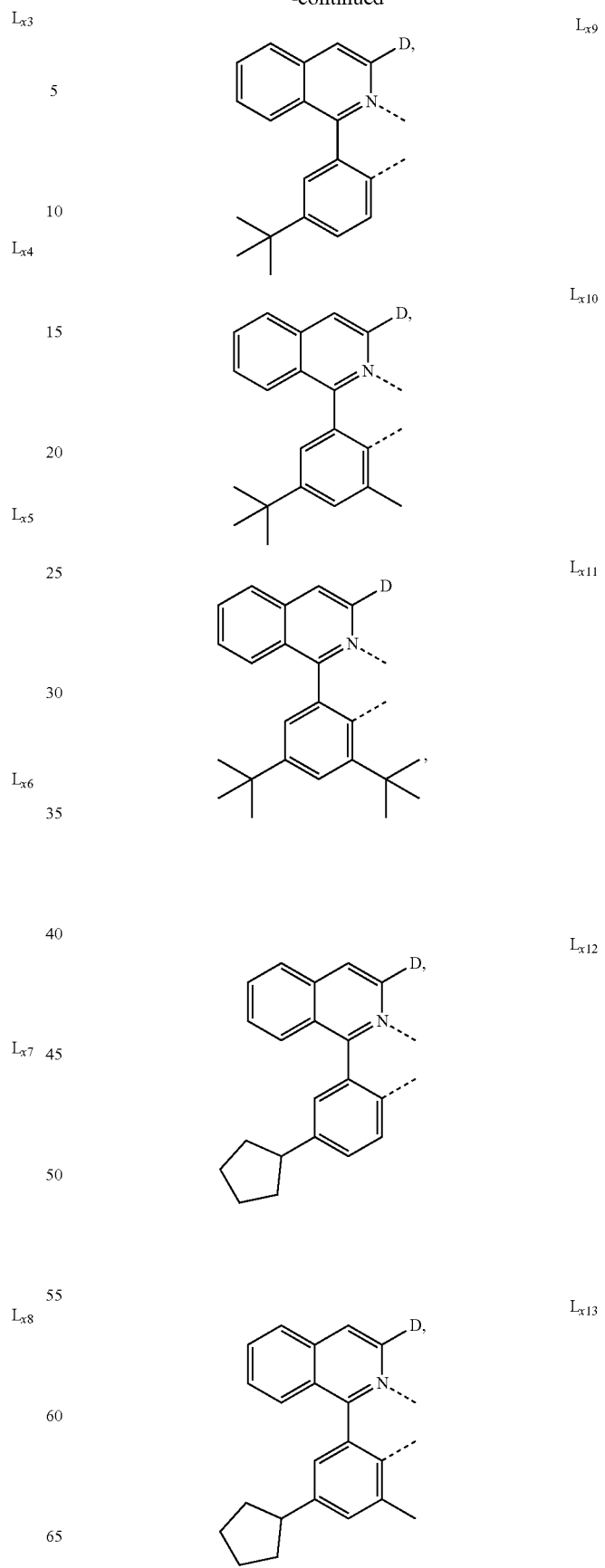

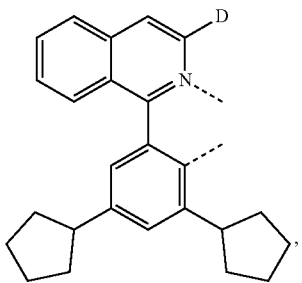 L_{x14}
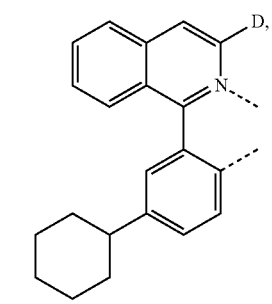 L_{x15}
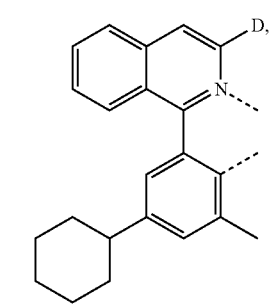 L_{x16}
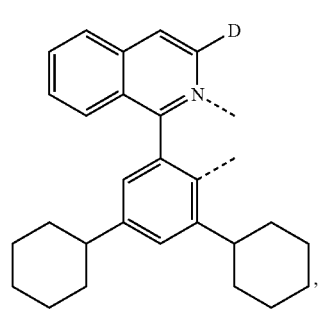 L_{x17}
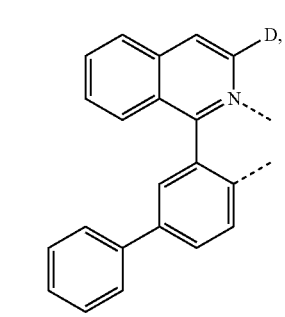 L_{x18}
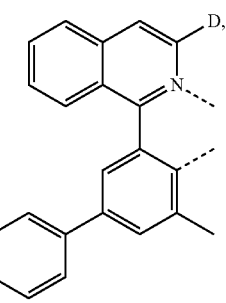 L_{x19}
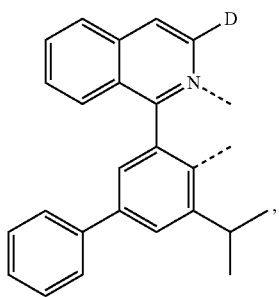 L_{x20}
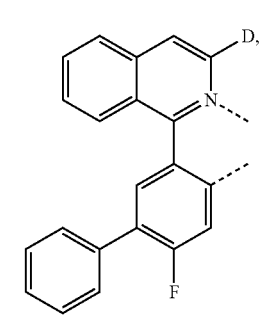 L_{x21}
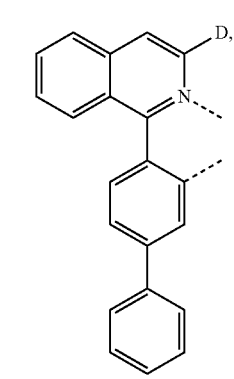 L_{x22}
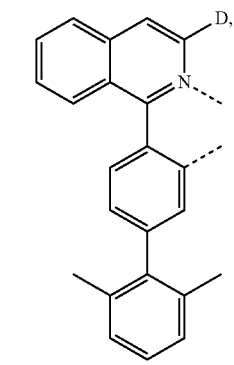 L_{x23}

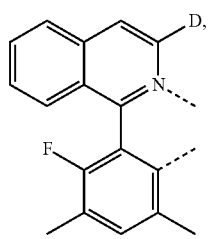 L_{x24}
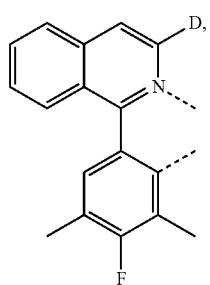 L_{x25}
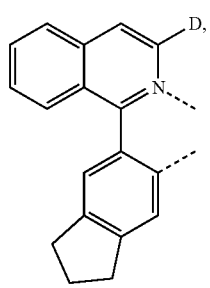 L_{x26}
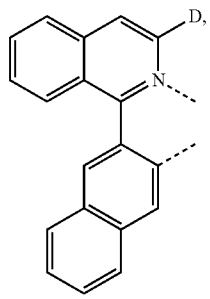 L_{x27}
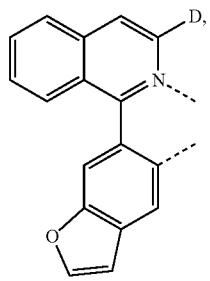 L_{x28}
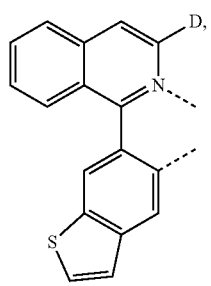 L_{x29}
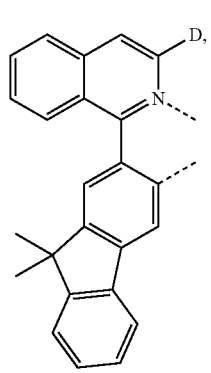 L_{x30}
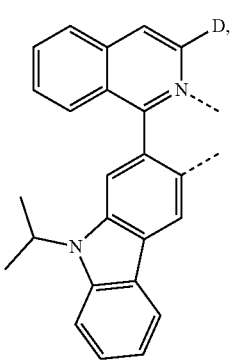 L_{x31}
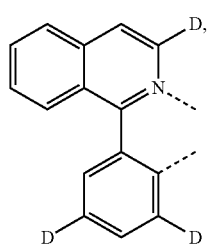 L_{x32}
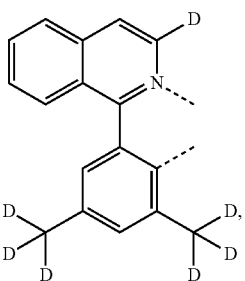 L_{x33}

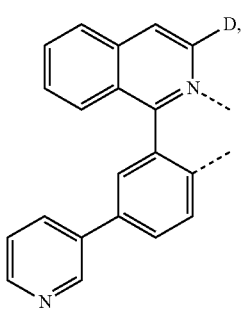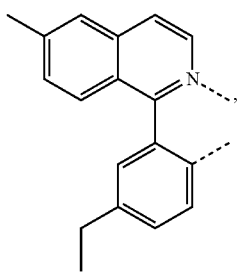

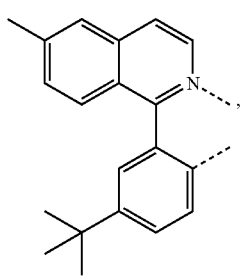 L<sub>x45</sub>
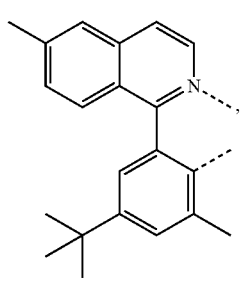 L<sub>x46</sub>
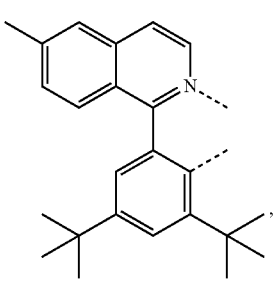 L<sub>x47</sub>
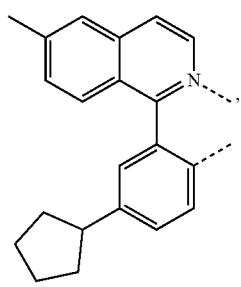 L<sub>x48</sub>
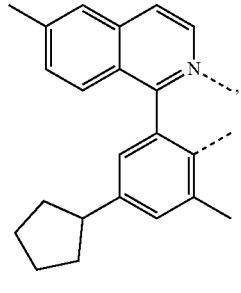 L<sub>x49</sub>
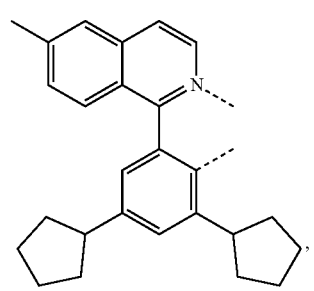 L<sub>x50</sub>
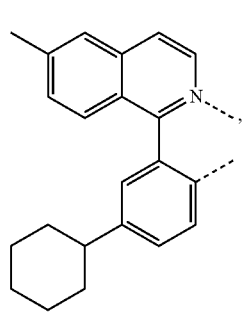 L<sub>x51</sub>
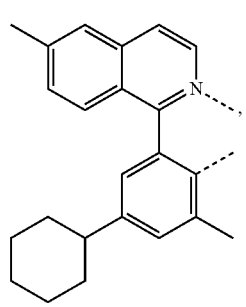 L<sub>x52</sub>
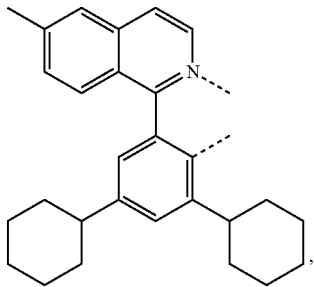 L<sub>x53</sub>
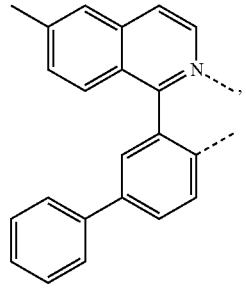 L<sub>x54</sub>

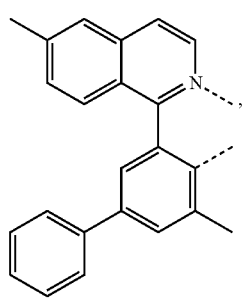 L_{x55}
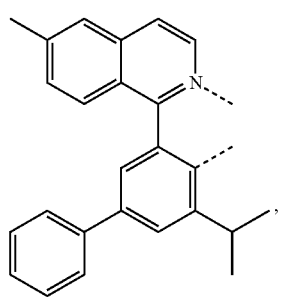 L_{x56}
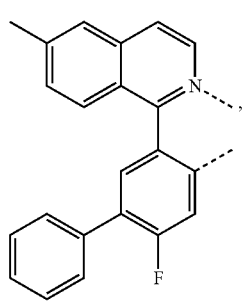 L_{x57}
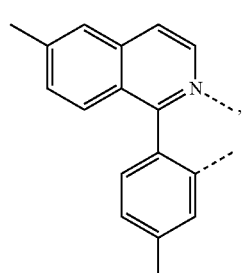 L_{x58}
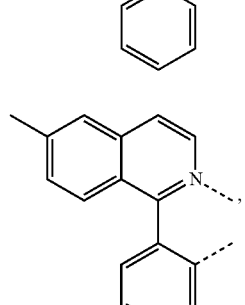 L_{x59}
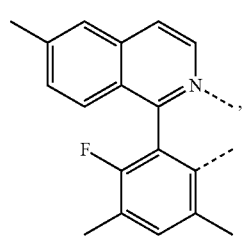 L_{x60}
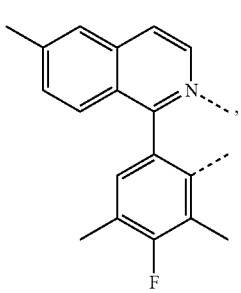 L_{x61}
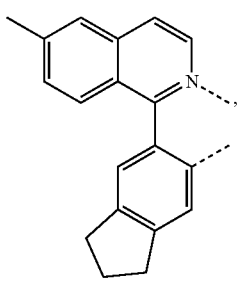 L_{x62}
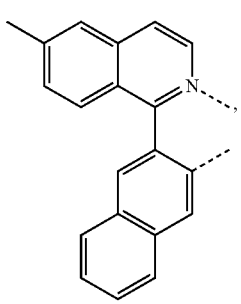 L_{x63}
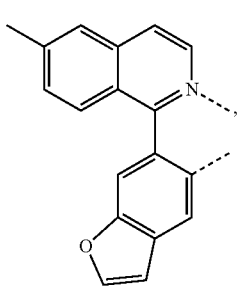 L_{x64}

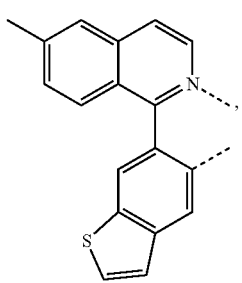 L<sub>x65</sub>
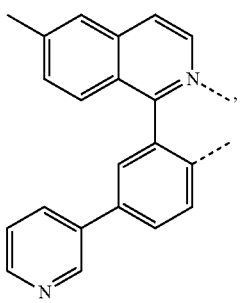 L<sub>x70</sub>
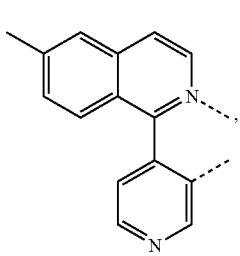 L<sub>x71</sub>
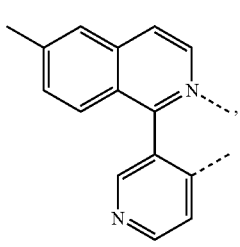 L<sub>x72</sub>
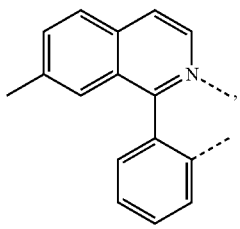 L<sub>x73</sub>
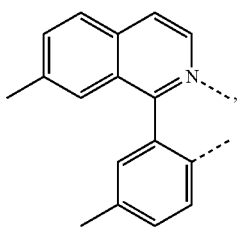 L<sub>x74</sub>
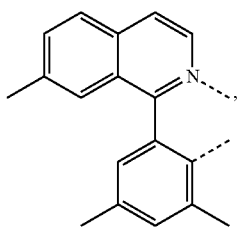 L<sub>x75</sub>

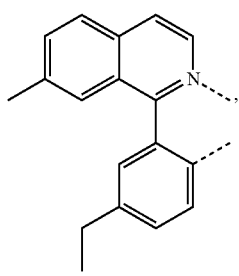 L_x76
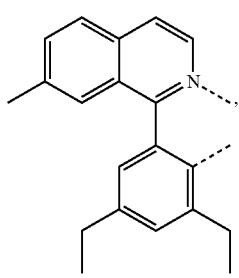 L_x77
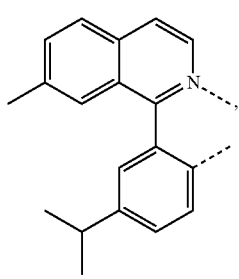 L_x78
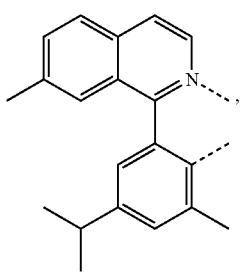 L_x79
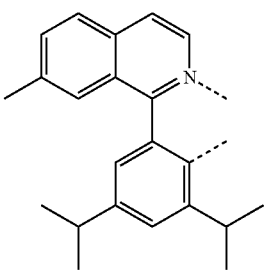 L_x80
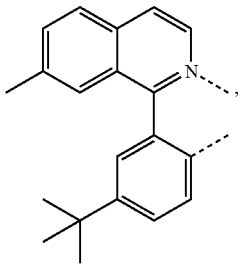 L_x81
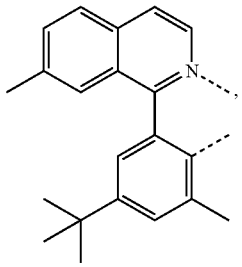 L_x82
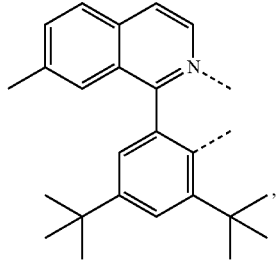 L_x83
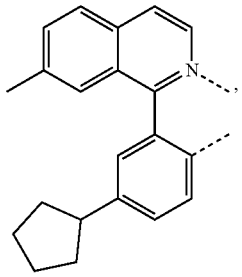 L_x84
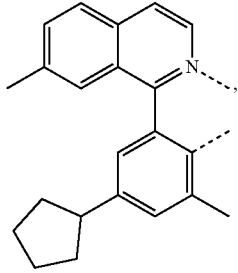 L_x85

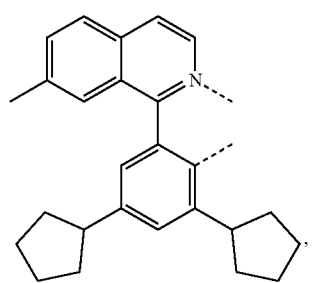 L<sub>x86</sub>
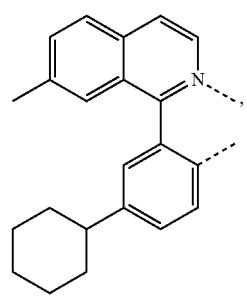 L<sub>x87</sub>
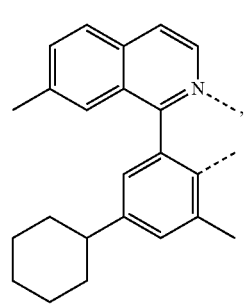 L<sub>x88</sub>
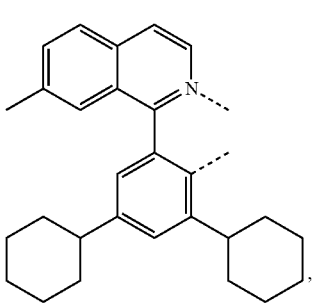 L<sub>x89</sub>
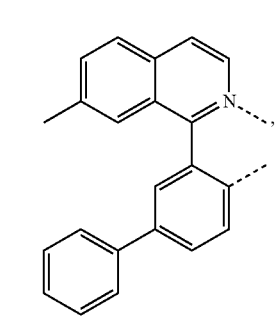 L<sub>x90</sub>
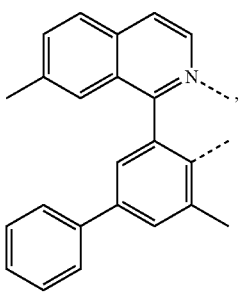 L<sub>x91</sub>
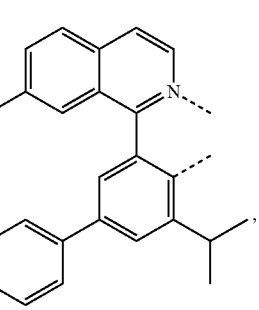 L<sub>x92</sub>
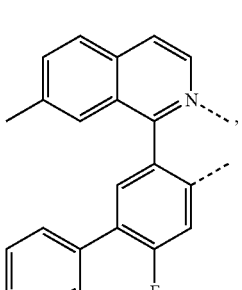 L<sub>x93</sub>
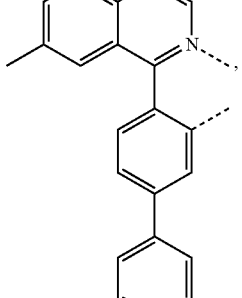 L<sub>x94</sub>
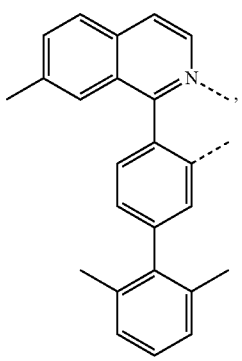 L<sub>x95</sub>

| | |
|---|---|
| 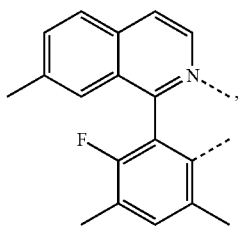 L$_{x96}$ | 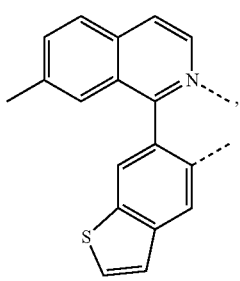 L$_{x101}$ |
| 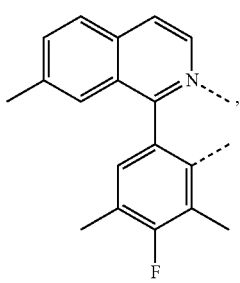 L$_{x97}$ | 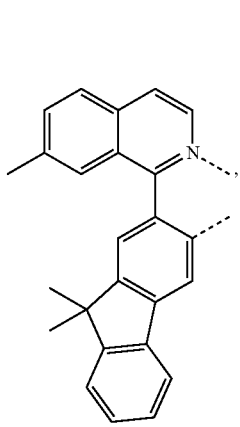 L$_{x102}$ |
| 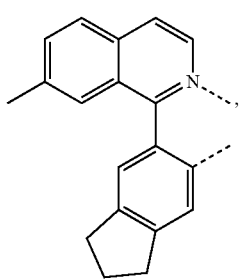 L$_{x98}$ | 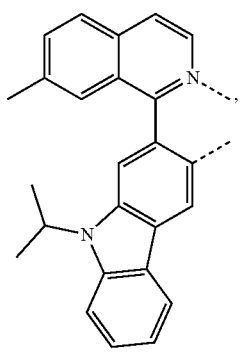 L$_{x103}$ |
| 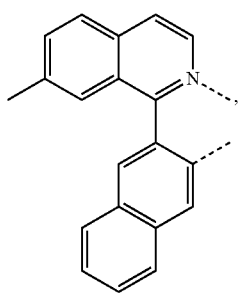 L$_{x99}$ | 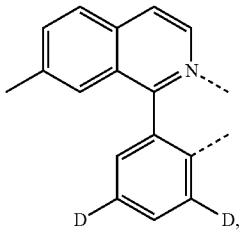 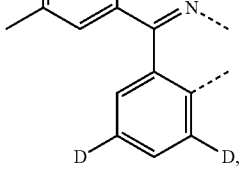 L$_{x104}$ |
| 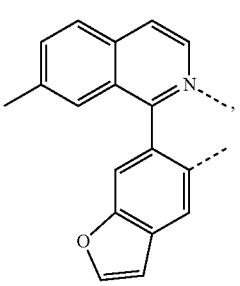 L$_{x100}$ | 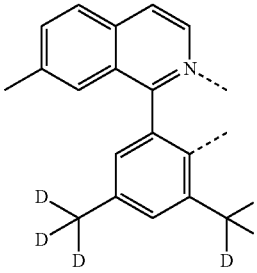 L$_{x105}$ |

L_{x106}
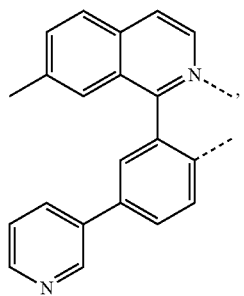
L_{x107}
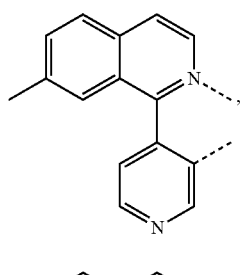
L_{x108}
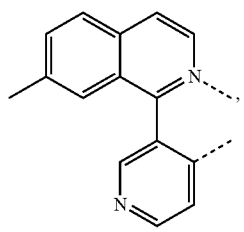
L_{x109}
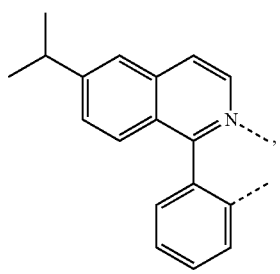
L_{x110}
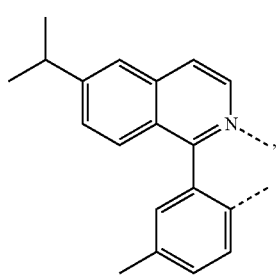
L_{x111}
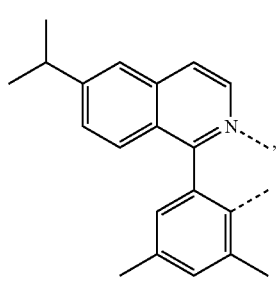
L_{x112}
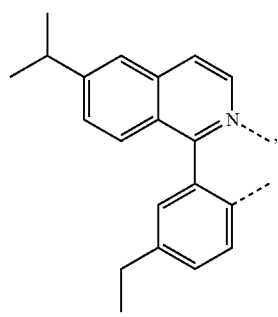
L_{x113}
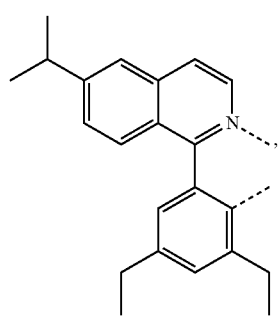
L_{x114}
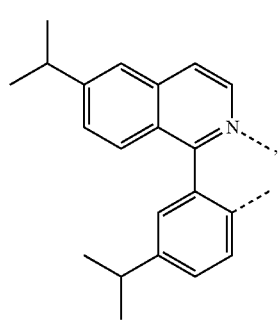
L_{x115}
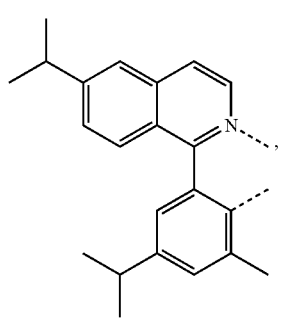
L_{x116}
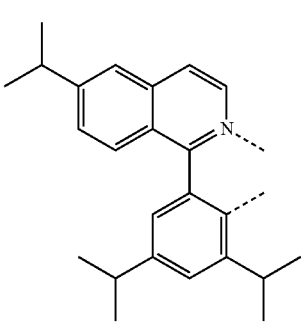

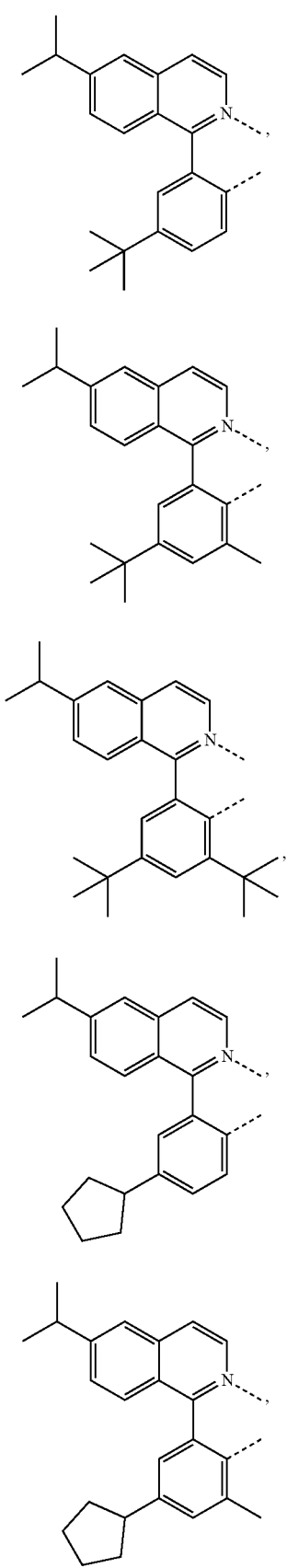
L_{x117}
L_{x118}
L_{x119}
L_{x120}
L_{x121}
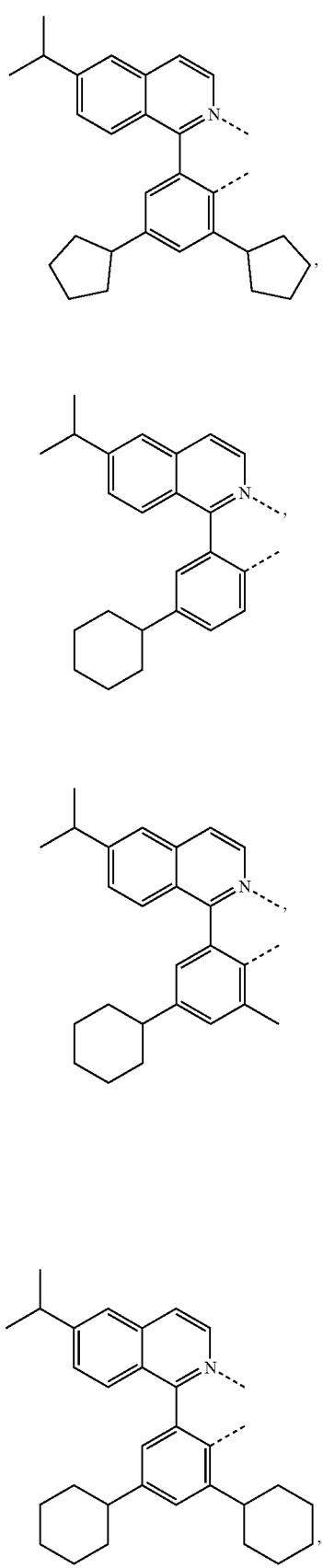
L_{x122}
L_{x123}
L_{x124}
L_{x125}

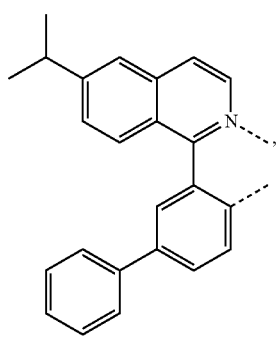 L<sub>x126</sub>
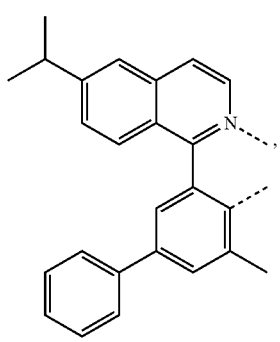 L$_{x127}$
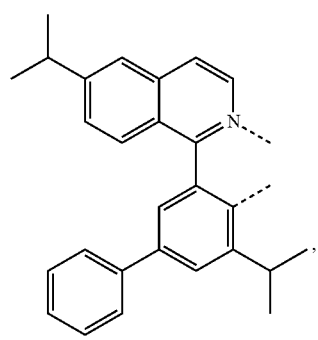 L$_{x128}$
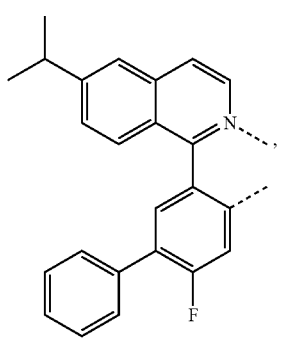 L$_{x129}$
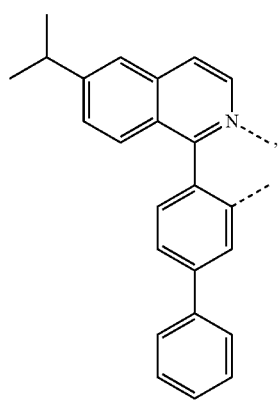 L$_{x130}$
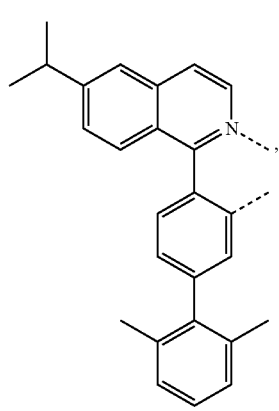 L$_{x131}$
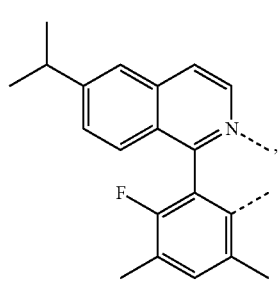 L$_{x132}$
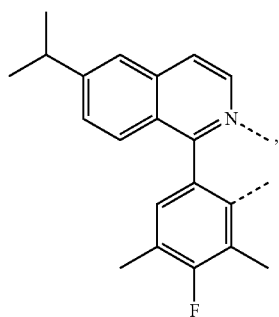 L$_{x133}$ 109
-continued
L$_{x134}$
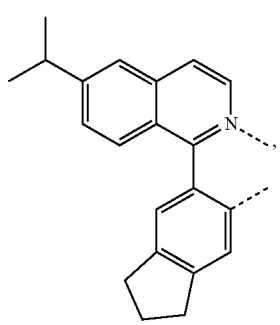,
L$_{x135}$
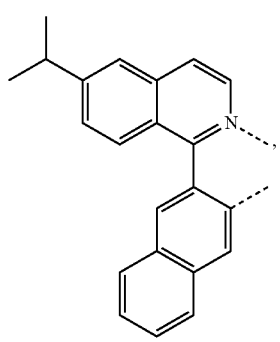,
L$_{x136}$
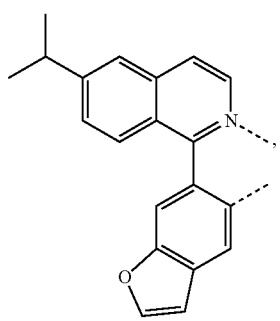,
L$_{x137}$
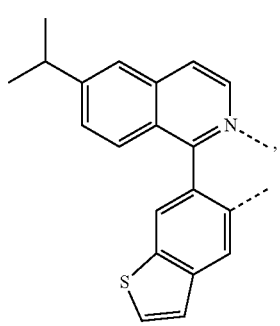,
110
-continued
L$_{x138}$
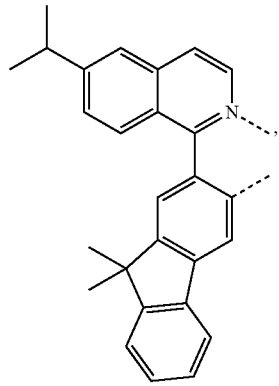,
L$_{x139}$
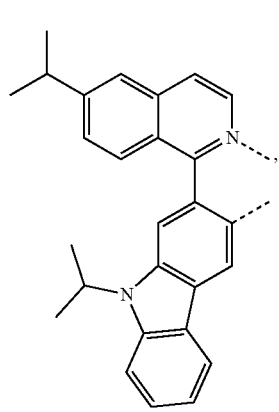,
L$_{x140}$
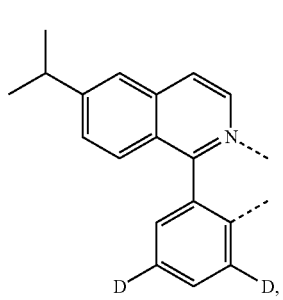,
L$_{x141}$
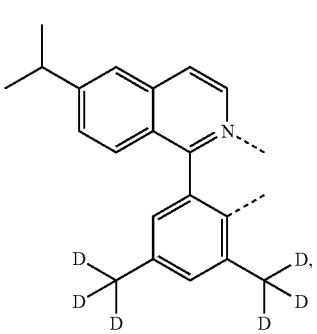

-continued
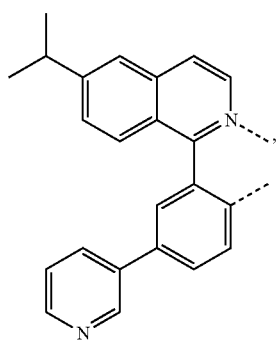
L<sub>x142</sub>
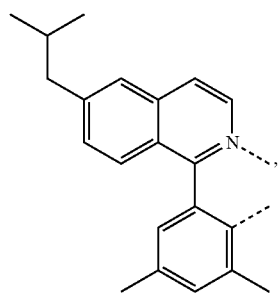
$L_{x147}$
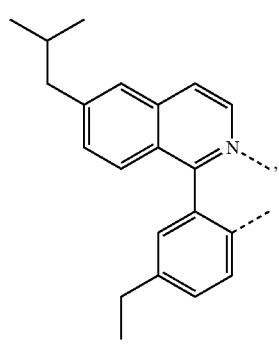
$L_{x148}$
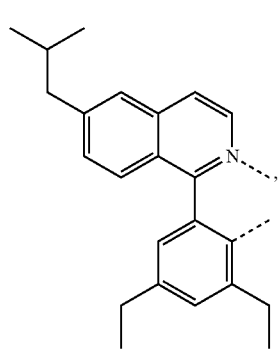
$L_{x149}$
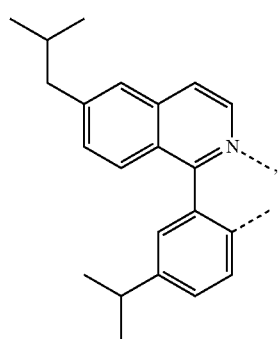
$L_{x150}$
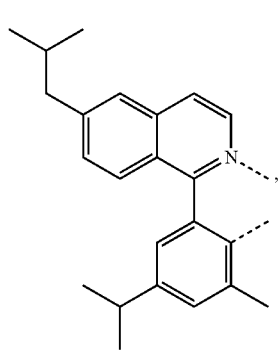
$L_{x151}$
L<sub>x143</sub>
L<sub>x144</sub>
L<sub>x145</sub>
L<sub>x146</sub>

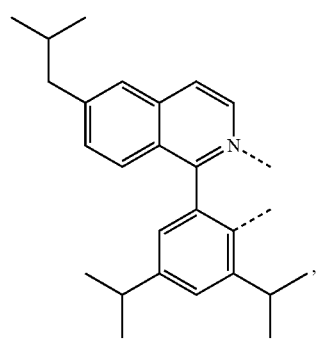
$L_{x152}$
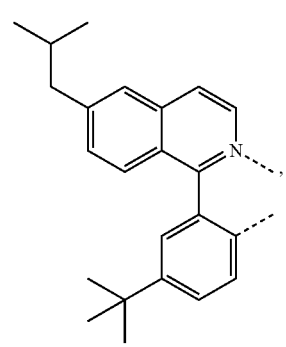
$L_{x153}$
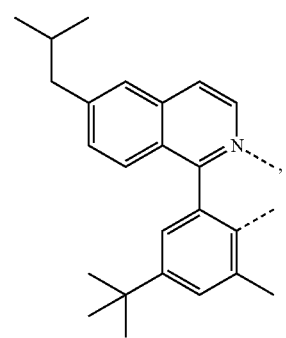
$L_{x154}$
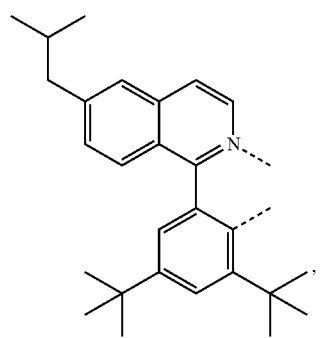
$L_{x155}$
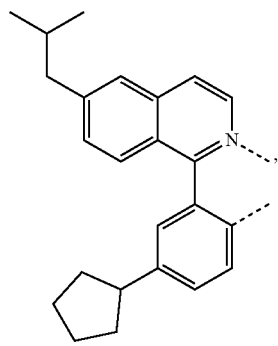
$L_{x156}$
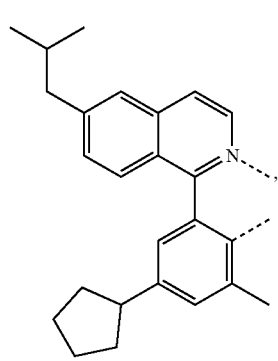
$L_{x157}$
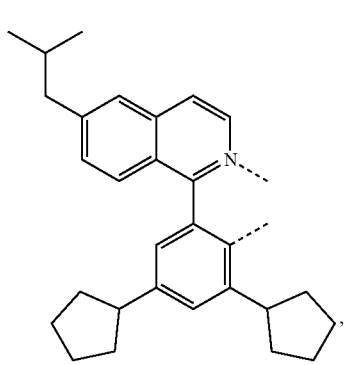
$L_{x158}$
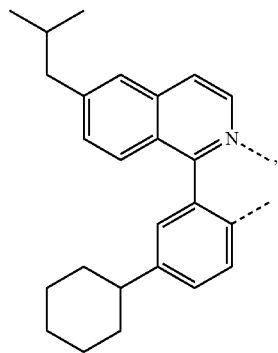
$L_{x159}$

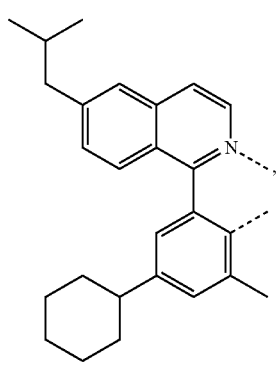
L<sub>x160</sub>
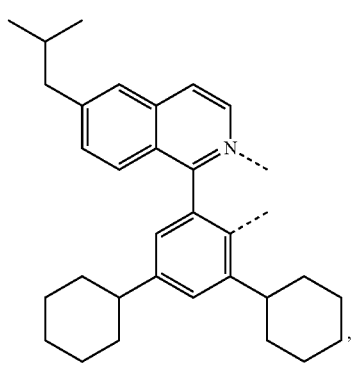
L<sub>x161</sub>
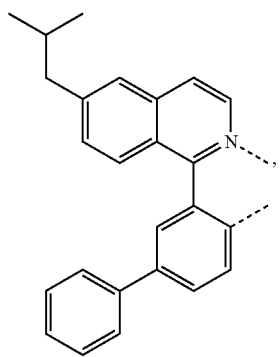
L<sub>x162</sub>
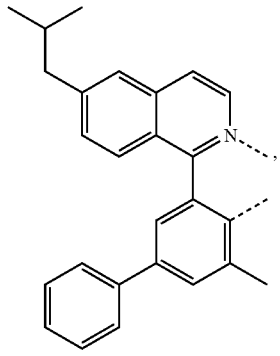
L<sub>x163</sub>
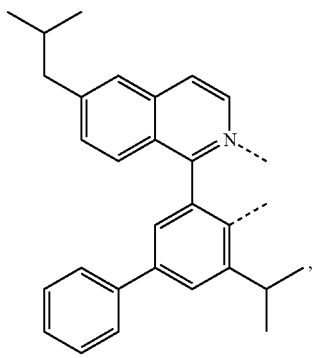
L<sub>x164</sub>
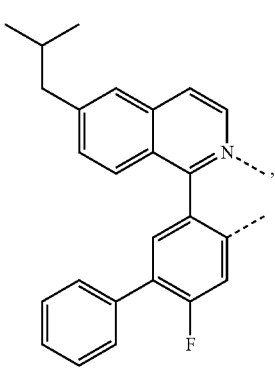
L<sub>x165</sub>
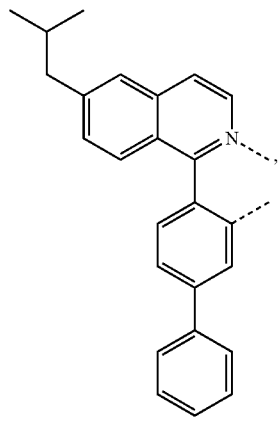
L<sub>x166</sub>
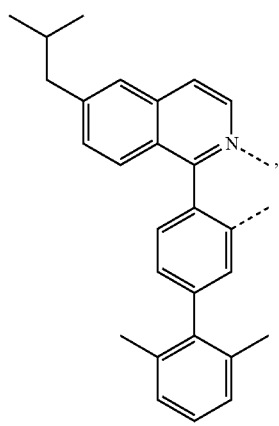
L<sub>x167</sub>

-continued
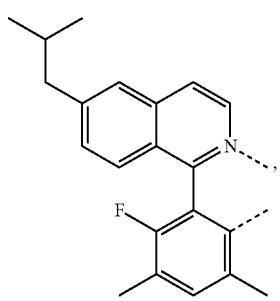
L<sub>x168</sub>
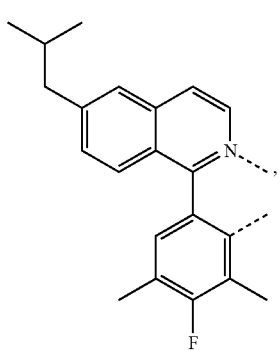
L<sub>x169</sub>
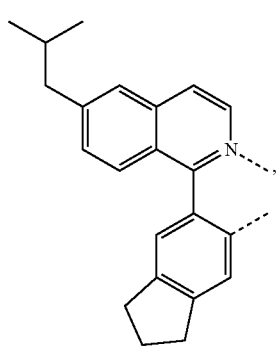
L<sub>x170</sub>
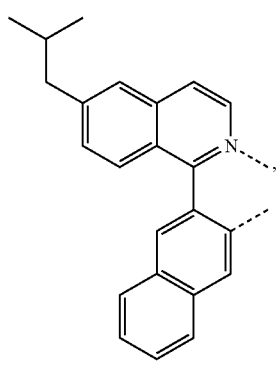
L<sub>x171</sub>
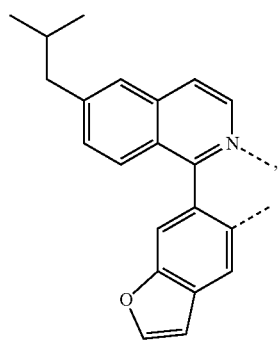
L<sub>x172</sub>
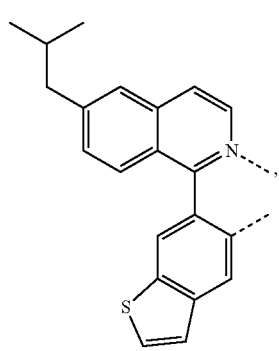
L<sub>x173</sub>
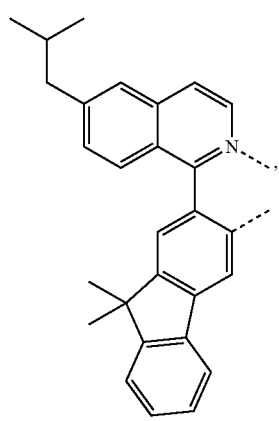
L<sub>x174</sub>
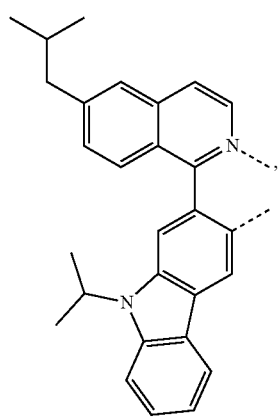
L<sub>x175</sub>

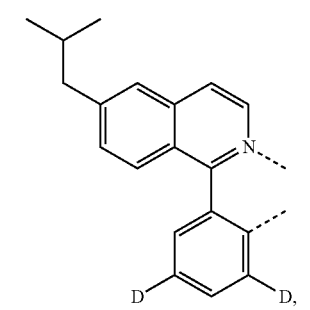
L$_{x176}$
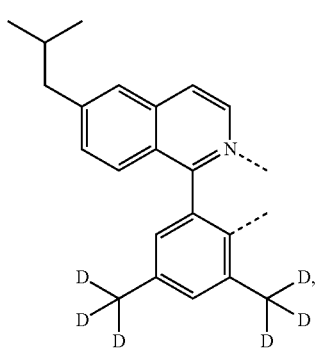
L$_{x177}$
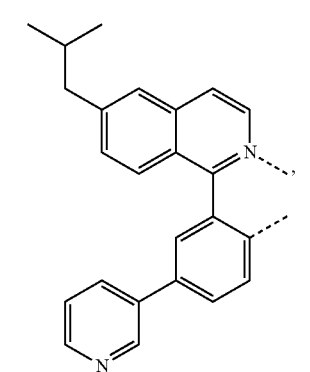
L$_{x178}$
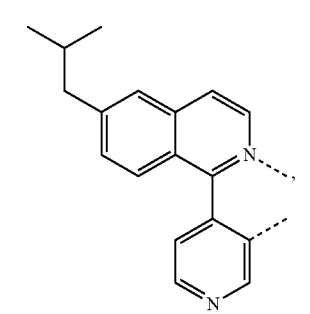
L$_{x179}$
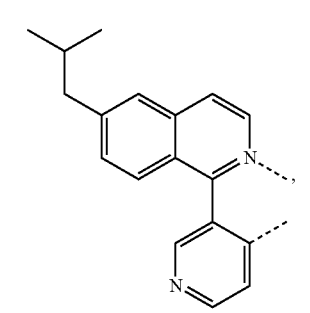
L$_{x180}$
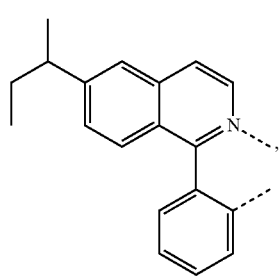
L$_{x181}$
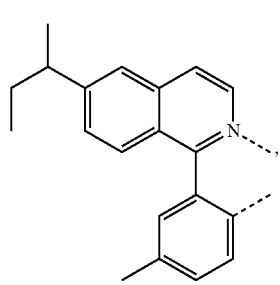
L$_{x182}$
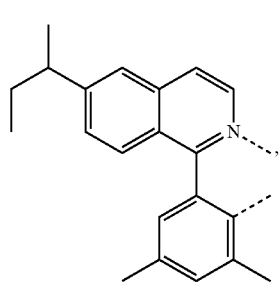
L$_{x183}$
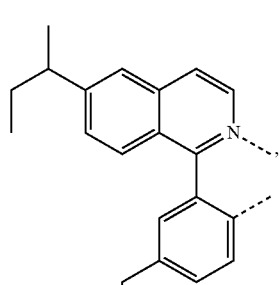
L$_{x184}$
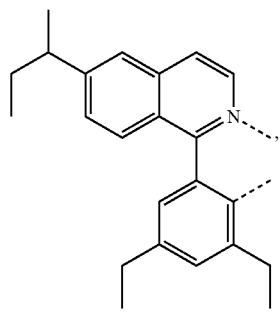
L$_{x185}$

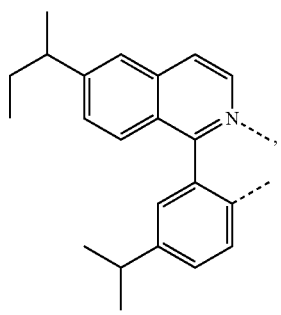
L<sub>x186</sub>
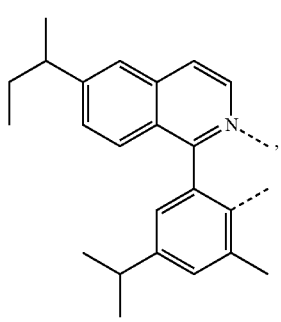
L<sub>x187</sub>
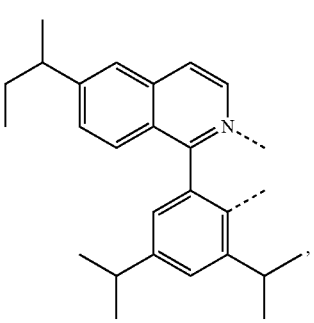
L<sub>x188</sub>
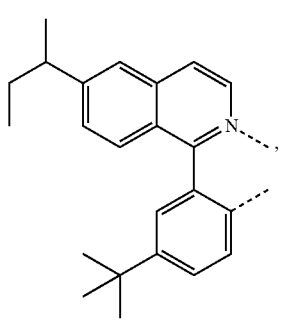
L<sub>x189</sub>
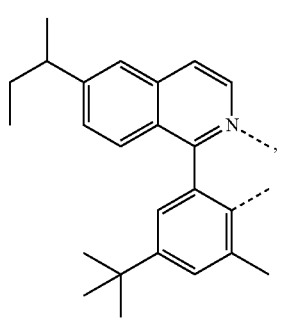
L<sub>x190</sub>
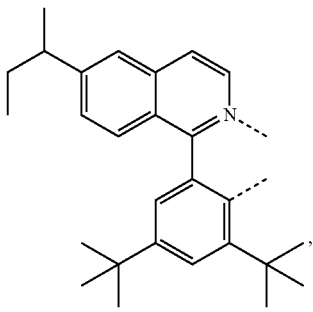
L<sub>x191</sub>
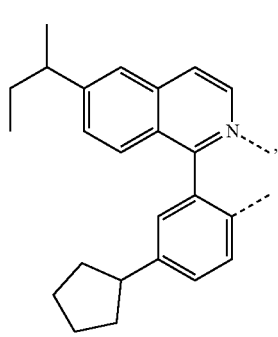
L<sub>x192</sub>
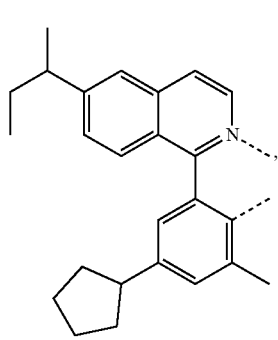
L<sub>x193</sub>
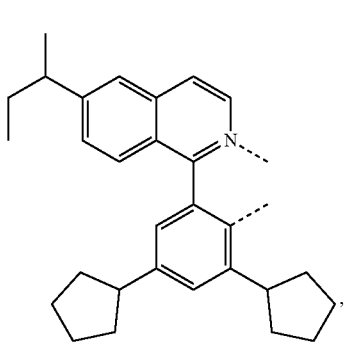
L<sub>x194</sub>
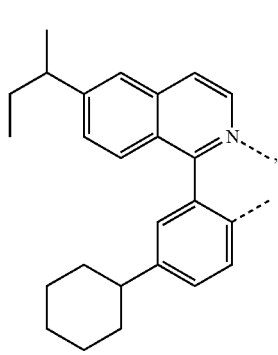
L<sub>x195</sub>

-continued
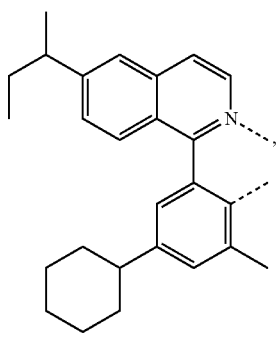 L$_{x196}$
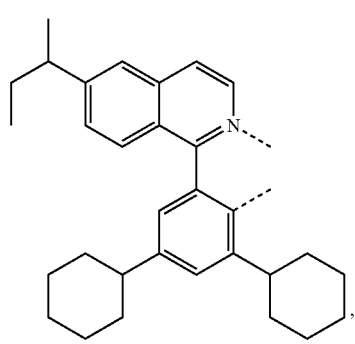 L$_{x197}$
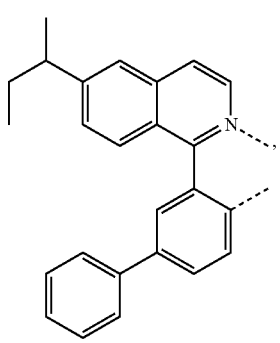 L$_{x198}$
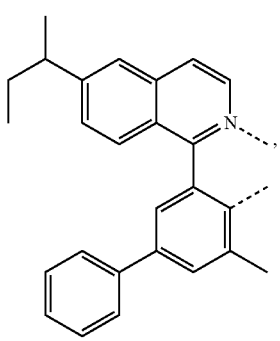 L$_{x199}$
-continued
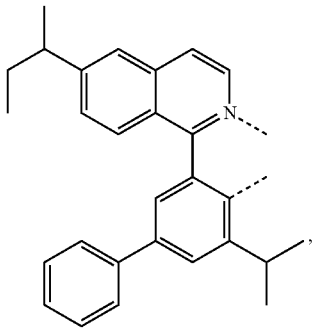 L$_{x200}$
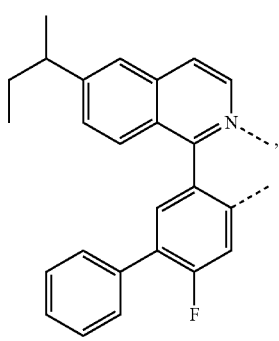 L$_{x201}$
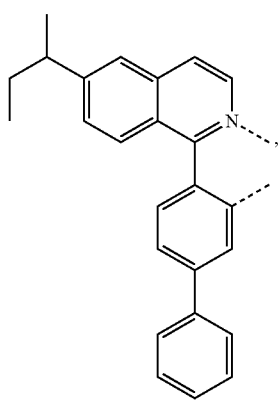 L$_{x202}$
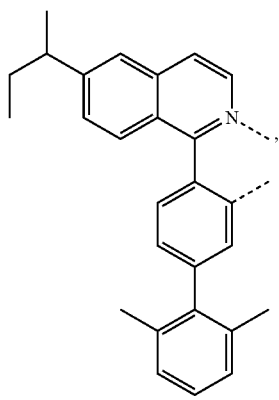 L$_{x203}$

| | |
|---|---|
| L_{x204} 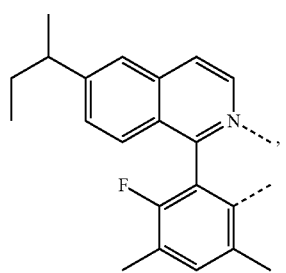 | L_{x209} 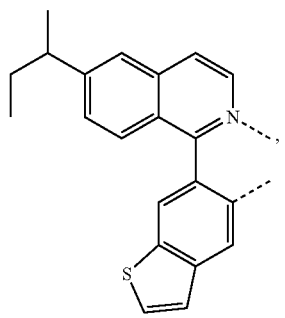 |
| L_{x205} 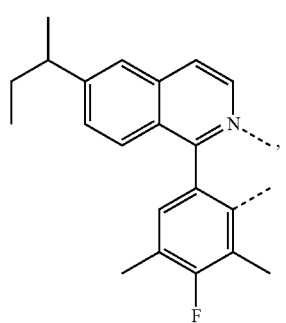 | L_{x210} 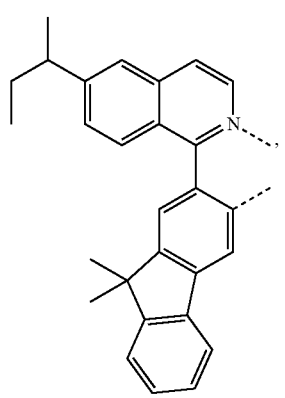 |
| L_{x206} 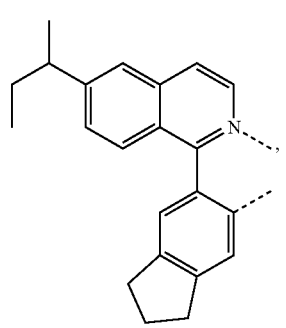 | L_{x211} 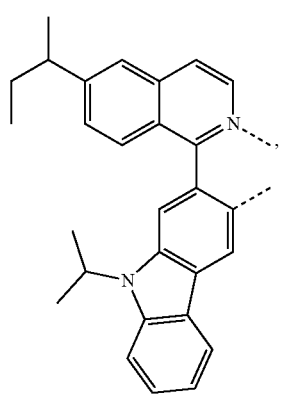 |
| L_{x207} 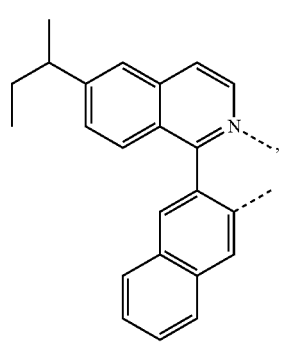 | L_{x212} 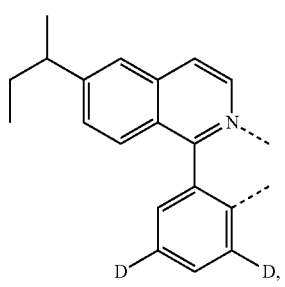 |
| L_{x208} 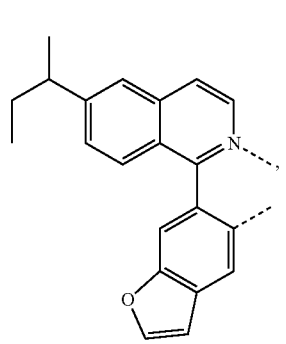 | |

-continued
L_{x213}
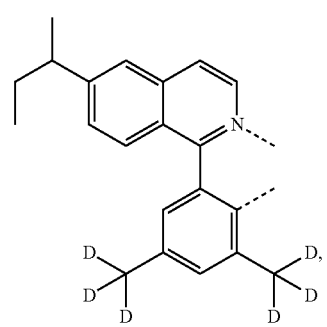
L_{x214}
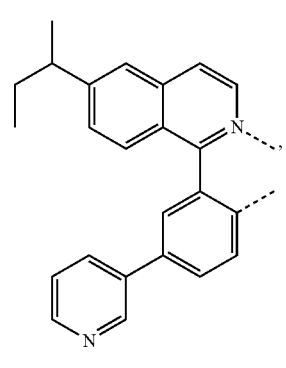
L_{x215}
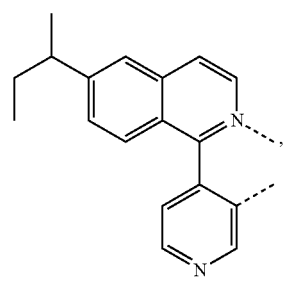
L_{x216}
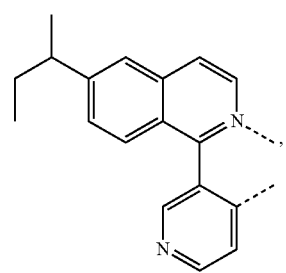
L_{x217}
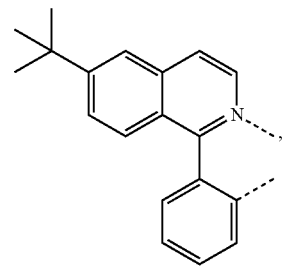
-continued
L_{x218}
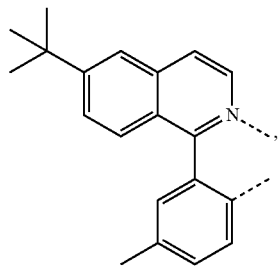
L_{x219}
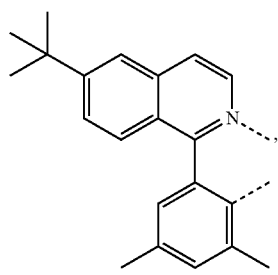
L_{x220}
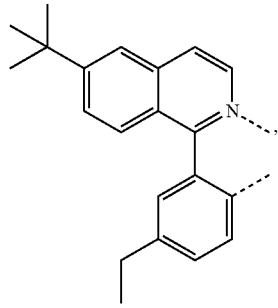
L_{x221}
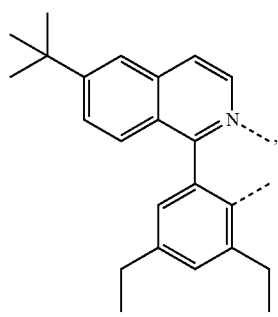
L_{x222}
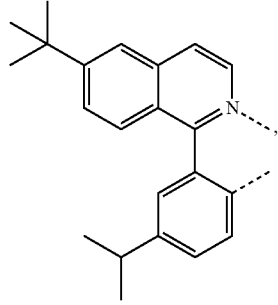

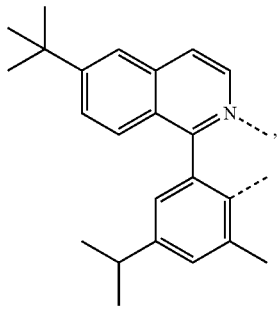 L<sub>x223</sub>
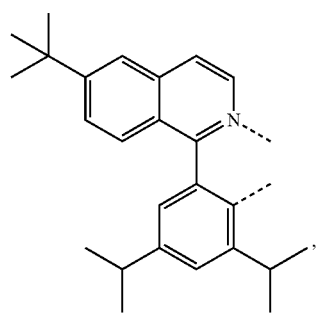 L<sub>x224</sub>
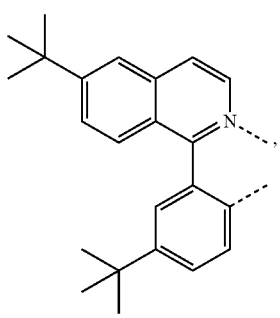 L<sub>x225</sub>
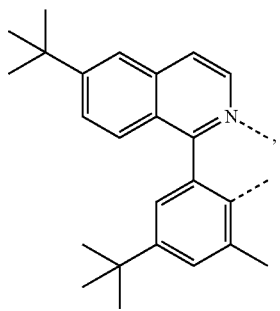 L<sub>x226</sub>
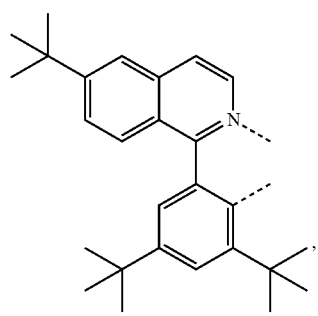 L<sub>x227</sub>
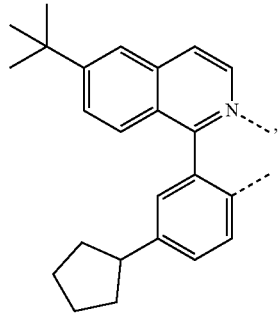 L<sub>x228</sub>
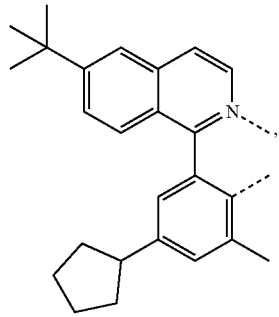 L<sub>x229</sub>
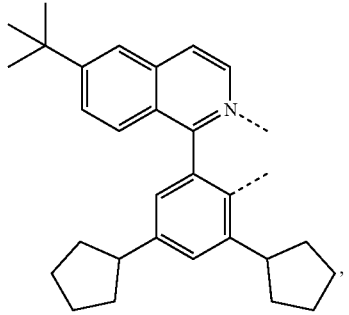 L<sub>x230</sub>
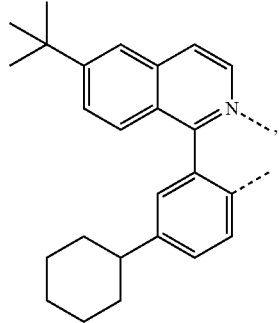 L<sub>x231</sub>

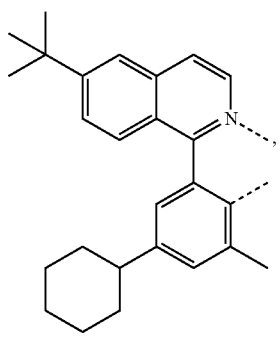 L<sub>x232</sub>
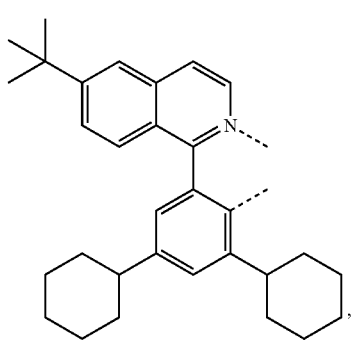 L<sub>x233</sub>
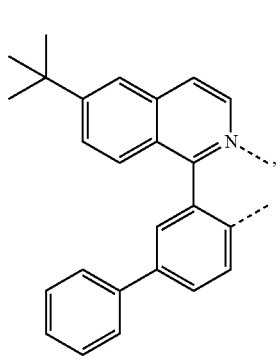 L<sub>x234</sub>
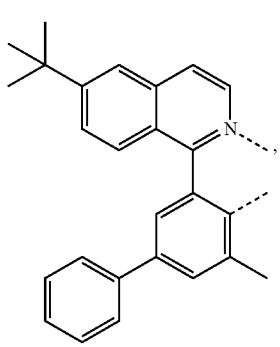 L<sub>x235</sub>
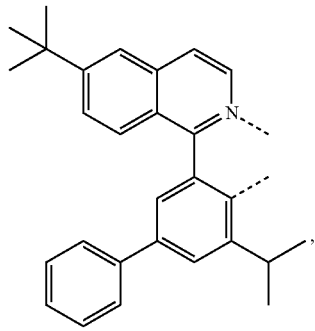 L<sub>x236</sub>
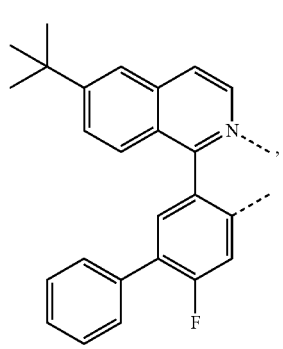 L<sub>x237</sub>
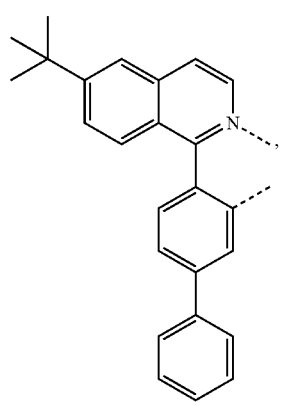 L<sub>x238</sub>
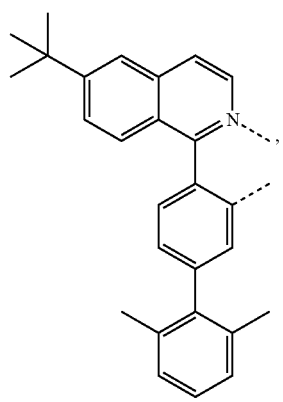 L<sub>x239</sub>

L<sub>x240</sub> 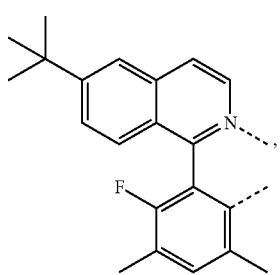
L<sub>x241</sub> 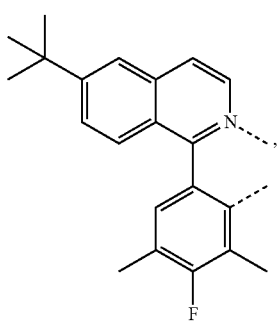
L<sub>x242</sub> 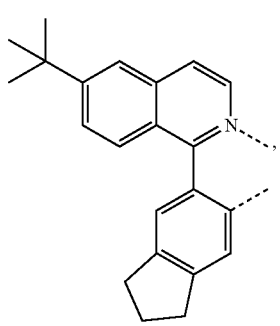
L<sub>x243</sub> 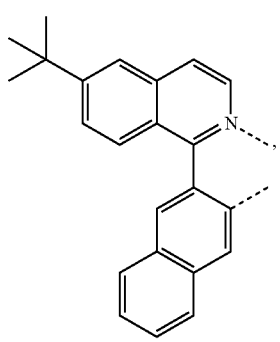
L<sub>x244</sub> 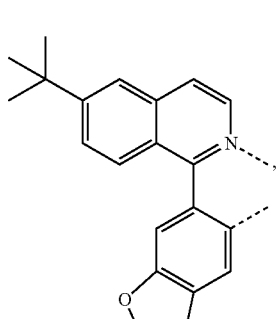
L<sub>x245</sub> 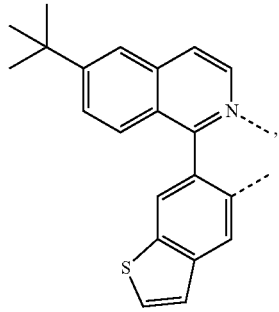
L<sub>x246</sub> 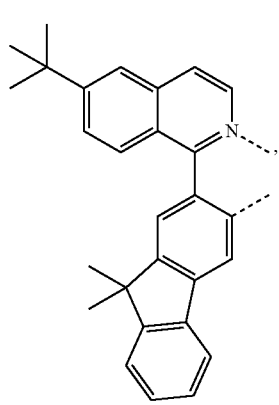
L<sub>x247</sub> 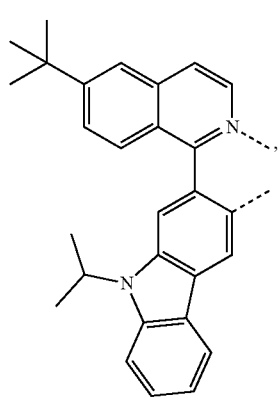
L<sub>x248</sub> 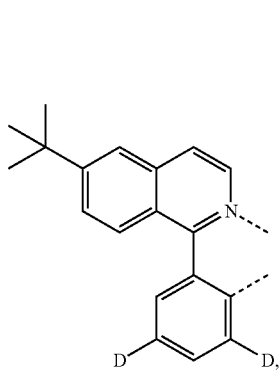

-continued
L<sub>x249</sub>
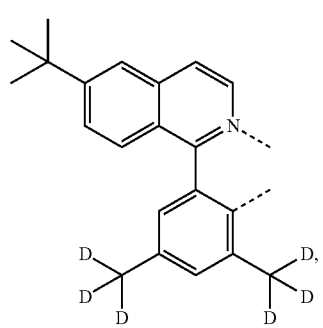
L<sub>x250</sub>
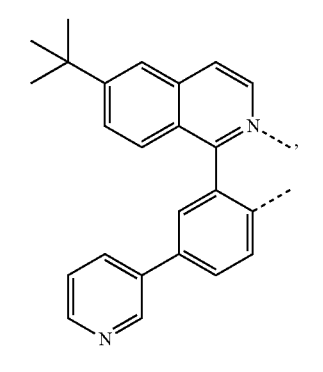
L<sub>x251</sub>
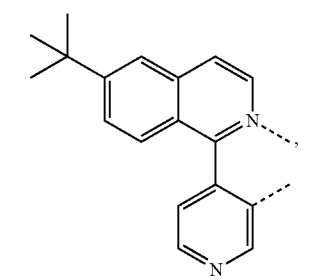
L<sub>x252</sub>
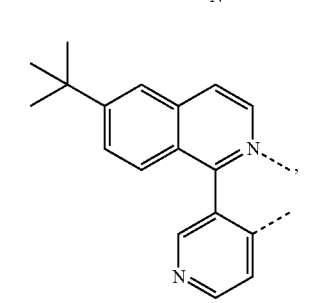
L<sub>x253</sub>
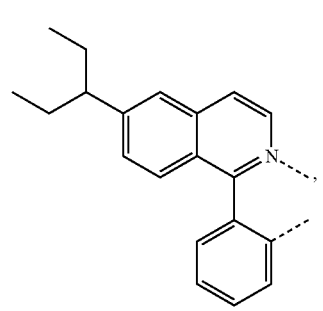
-continued
L<sub>x254</sub>
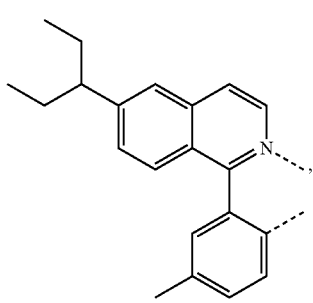
L<sub>x255</sub>
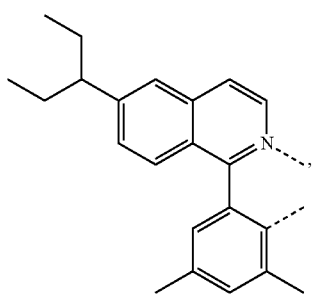
L<sub>x256</sub>
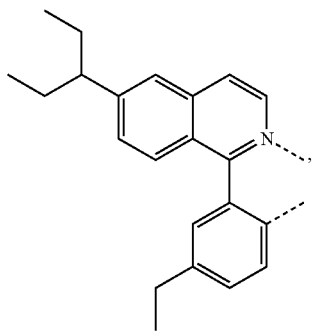
L<sub>x257</sub>
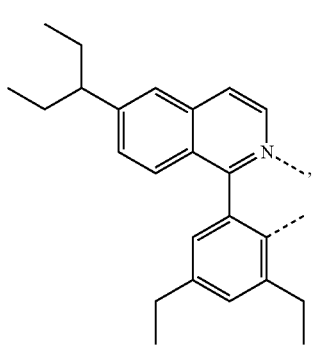
L<sub>x258</sub>
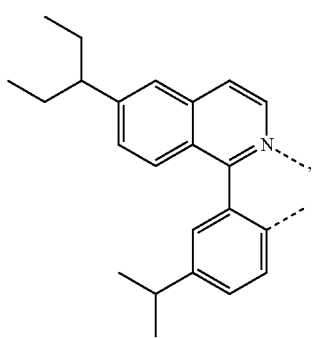

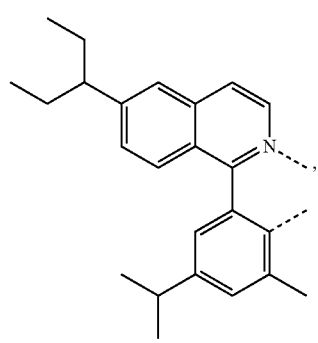 L<sub>x259</sub>
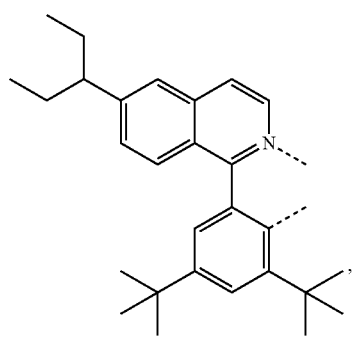 L<sub>x263</sub>
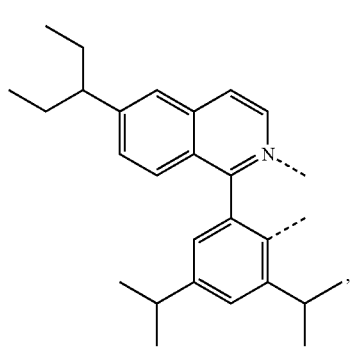 L<sub>x260</sub>
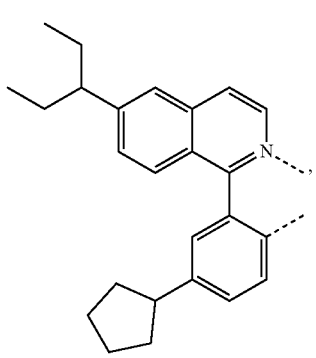 L<sub>x264</sub>
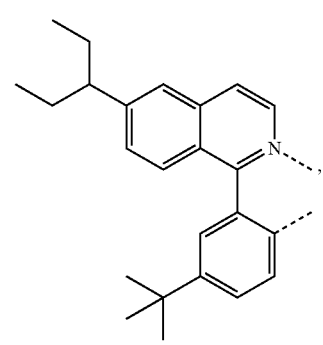 L<sub>x261</sub>
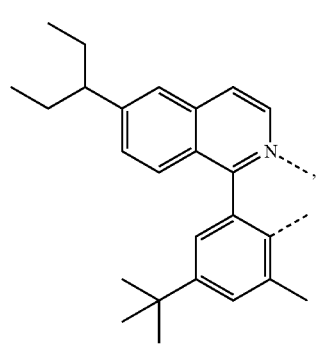 L<sub>x262</sub>
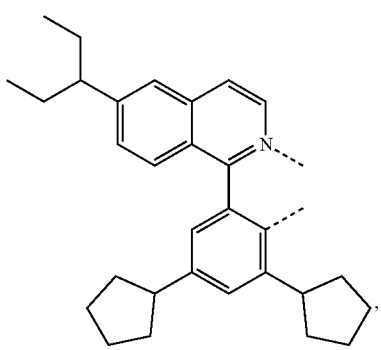 L<sub>x266</sub>

L<sub>x267</sub>
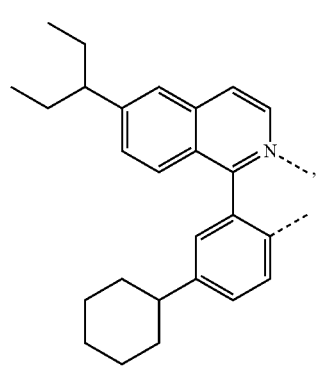
L<sub>x268</sub>
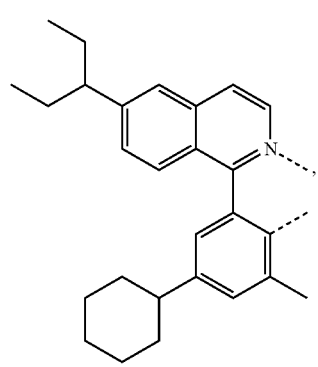
L<sub>x269</sub>
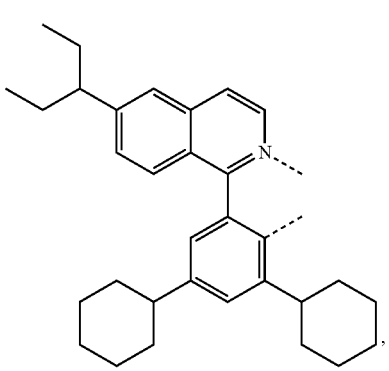
L<sub>x270</sub>
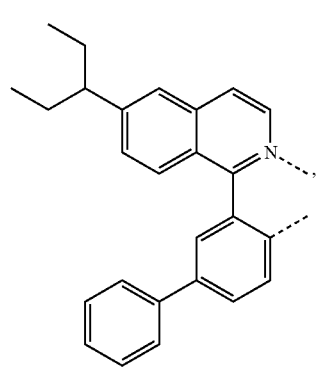
L<sub>x271</sub>
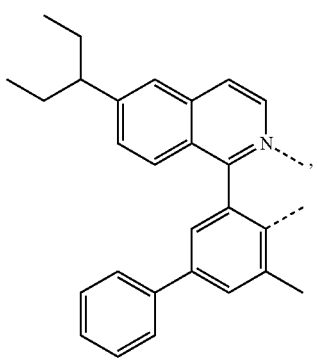
L<sub>x272</sub>
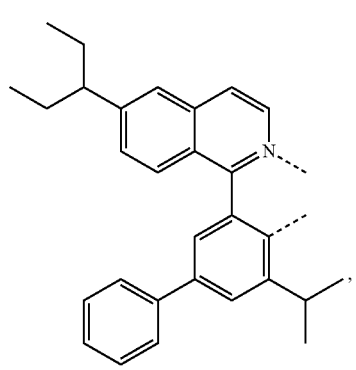
L<sub>x273</sub>
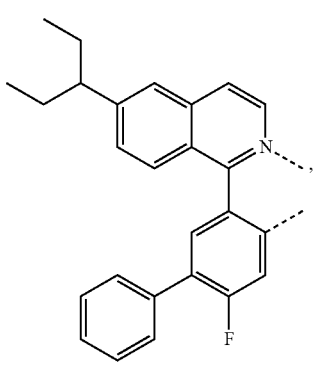
L<sub>x274</sub>
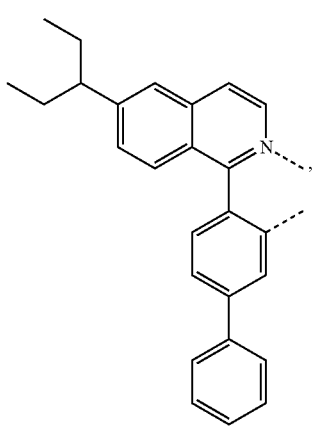

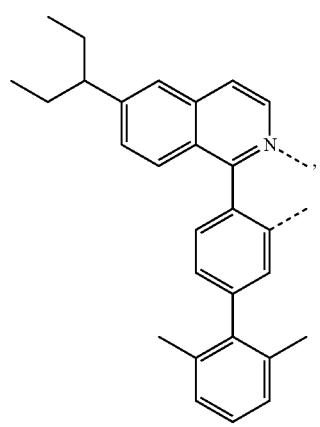 L_{x275}
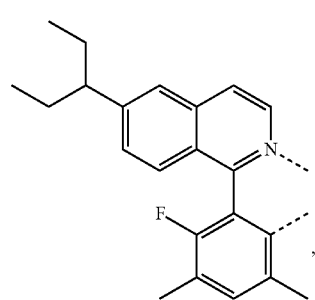 L_{x276}
L_{x277}
L_{x278}
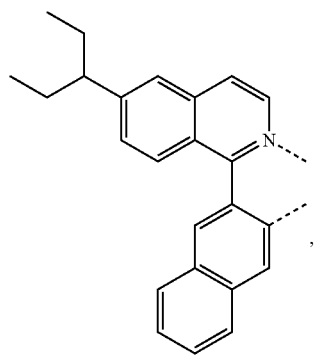 L_{x279}
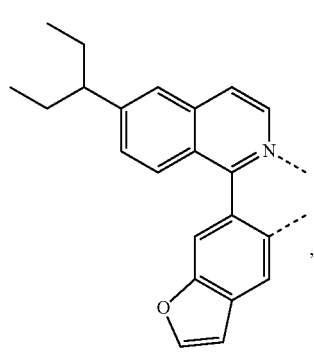 L_{x280}
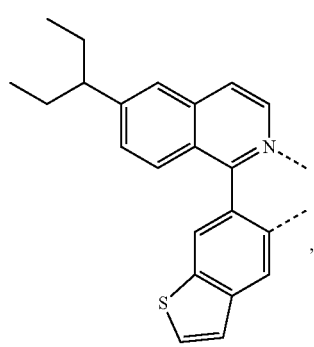 L_{x281}
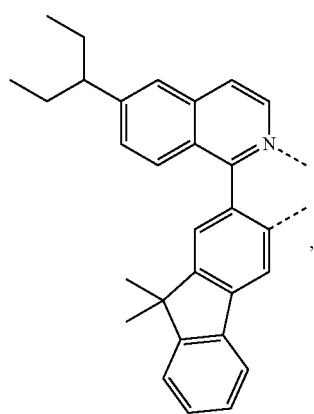 L_{x282}

-continued
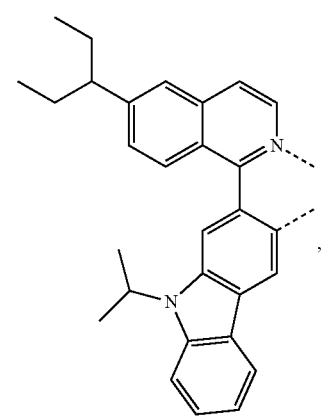
L<sub>x283</sub>
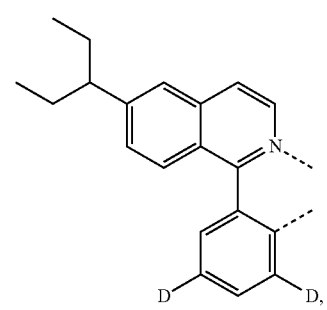
L<sub>x284</sub>
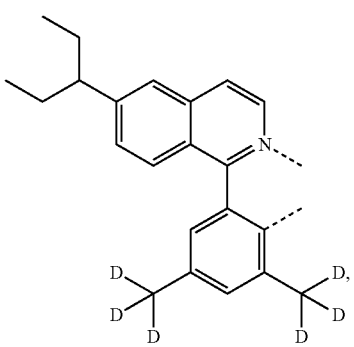
L<sub>x285</sub>
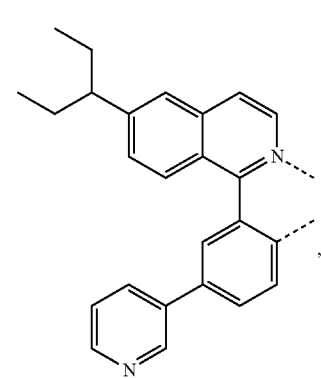
L<sub>x286</sub>
-continued
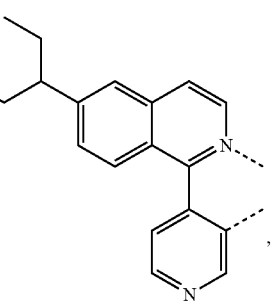
L<sub>x287</sub>
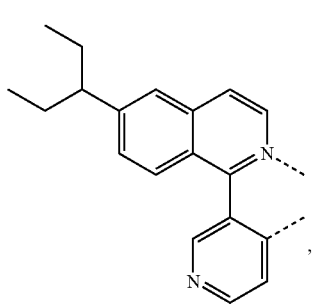
L<sub>x288</sub>
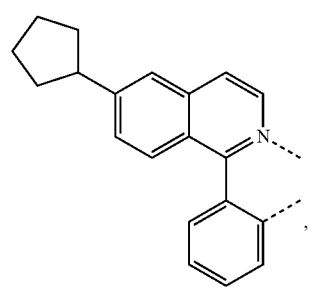
L<sub>x289</sub>
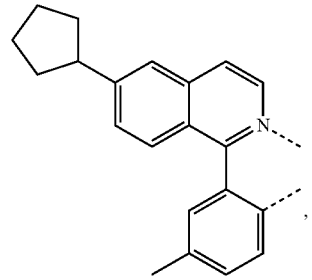
L<sub>x290</sub>
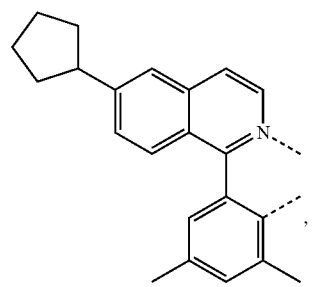
L<sub>x291</sub>

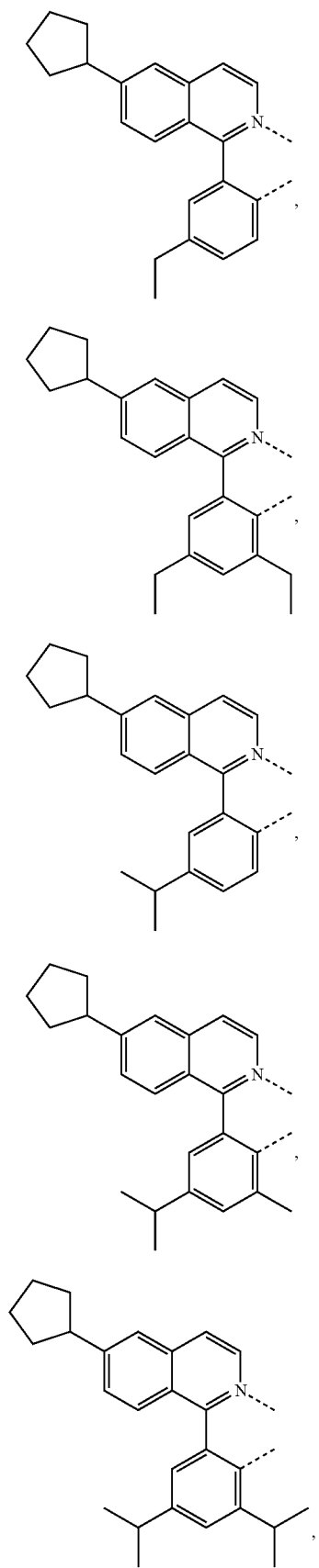
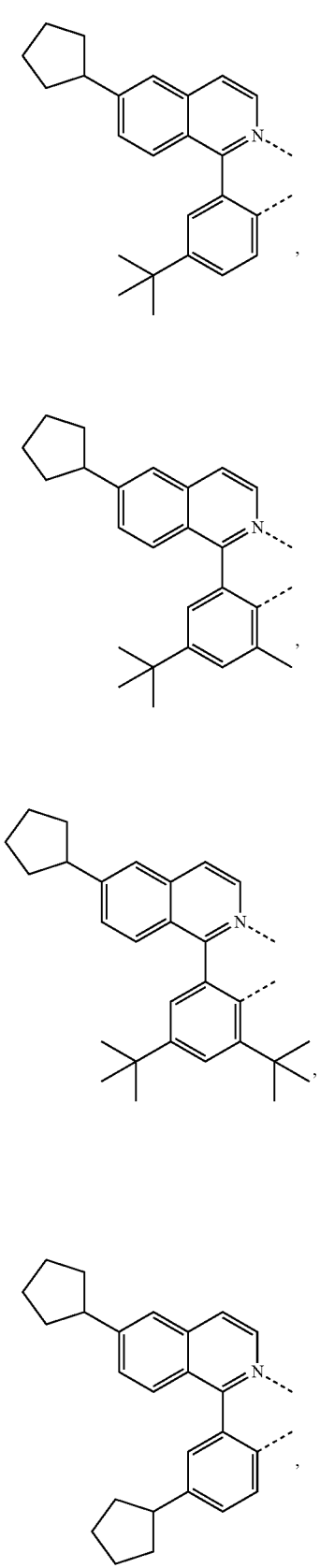

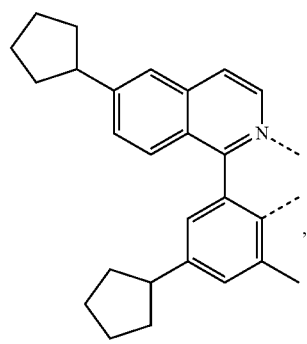 L<sub>x301</sub>
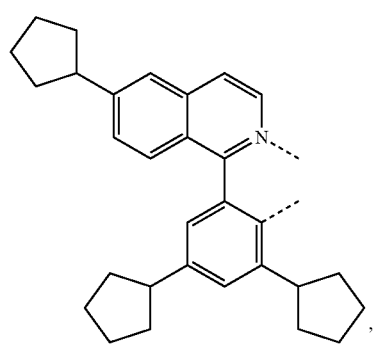 L<sub>x302</sub>
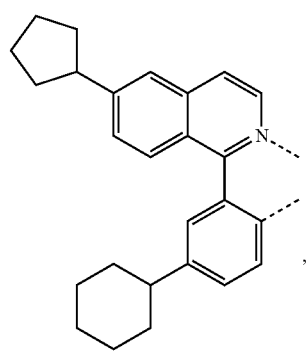 L<sub>x303</sub>
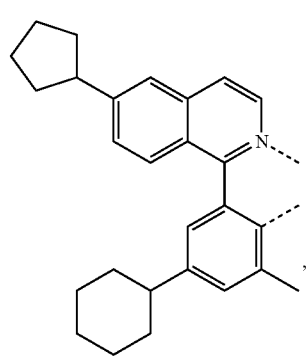 L<sub>x304</sub>
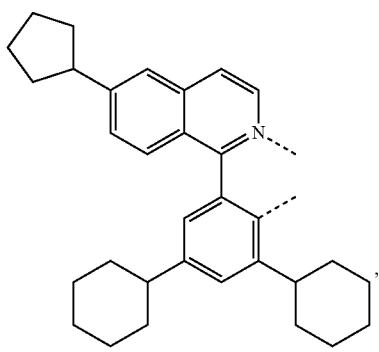 L<sub>x305</sub>
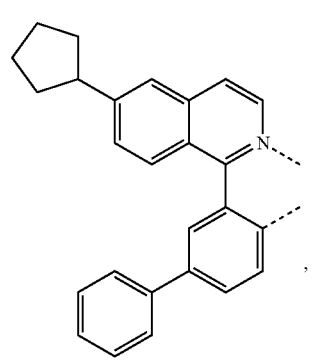 L<sub>x306</sub>
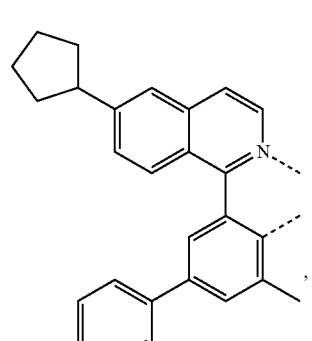 L<sub>x307</sub>
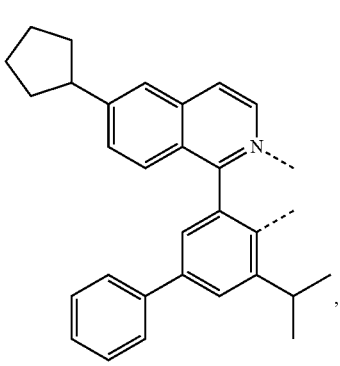 L<sub>x308</sub>

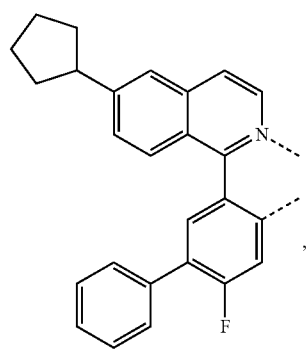 L_{x309}
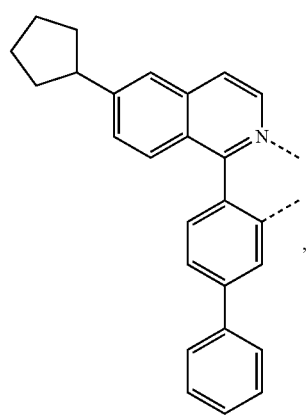 L_{x310}
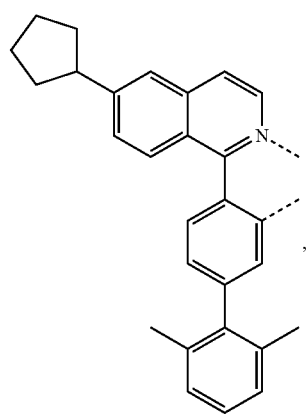 L_{x311}
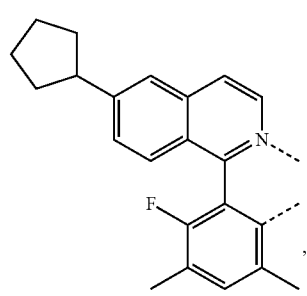 L_{x312}
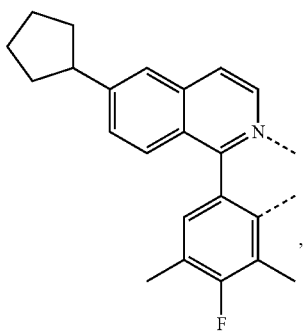 L_{x313}
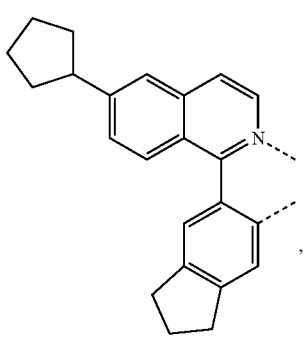 L_{x314}
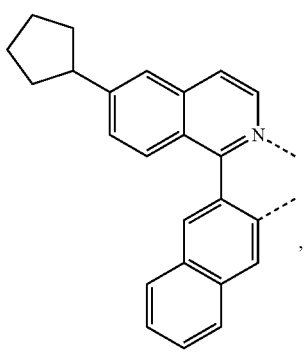 L_{x315}
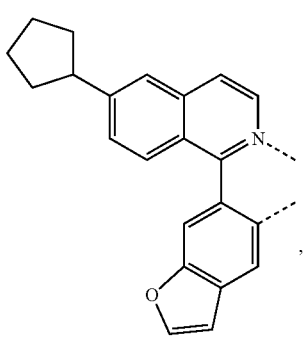 L_{x316}

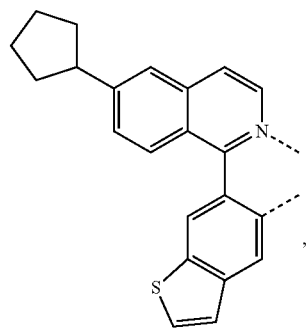 L<sub>x317</sub>
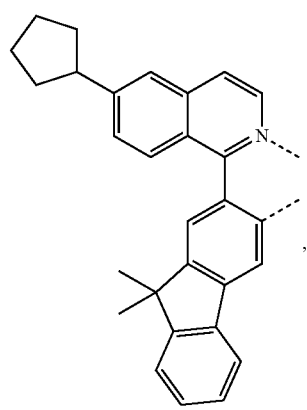 L<sub>x318</sub>
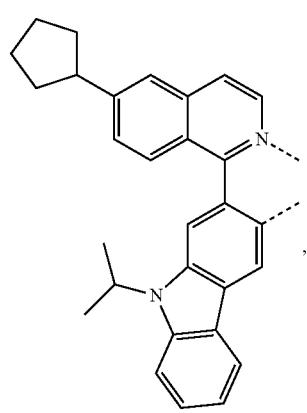 L<sub>x319</sub>
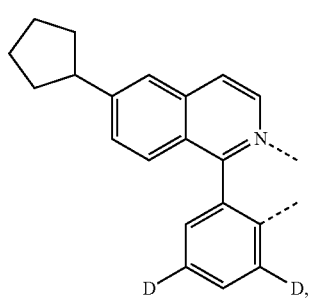 L<sub>x320</sub>
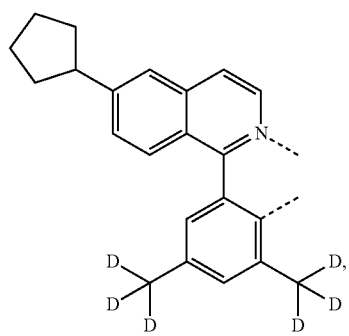 L<sub>x321</sub>
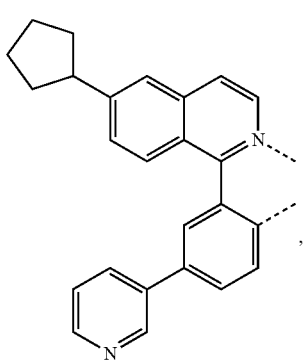 L<sub>x322</sub>
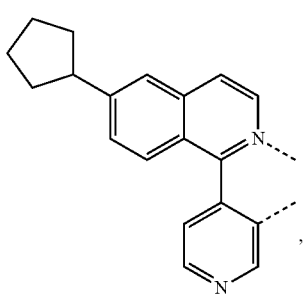 L<sub>x323</sub>
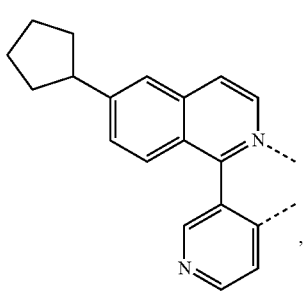 L<sub>x324</sub>
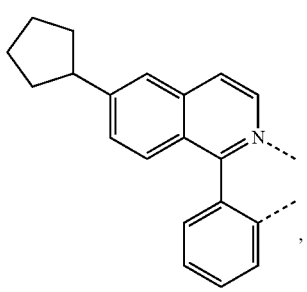 L<sub>x325</sub>

153
-continued
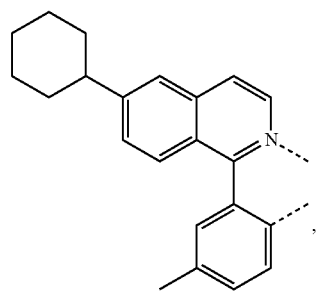
L_{x326}
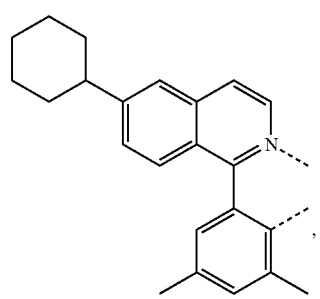
L_{x327}
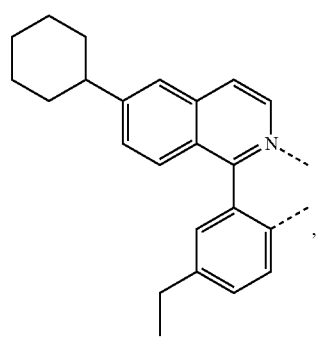
L_{x328}
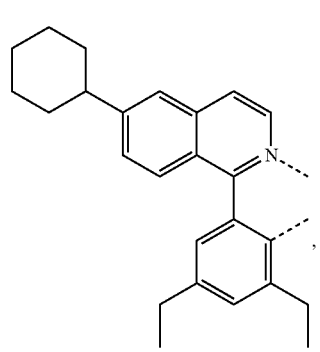
L_{x329}
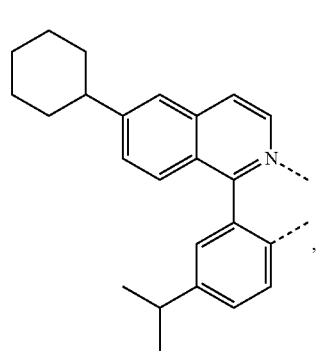
L_{x330}
154
-continued
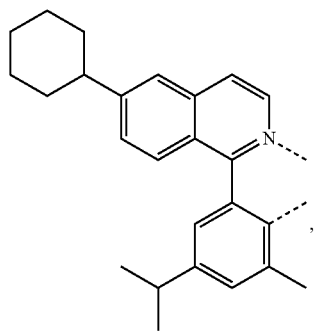
L_{x331}
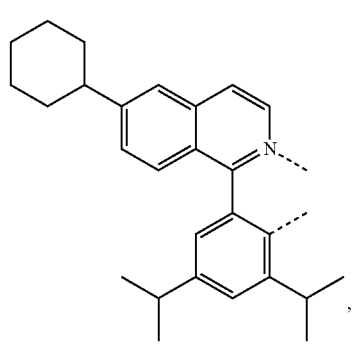
L_{x332}
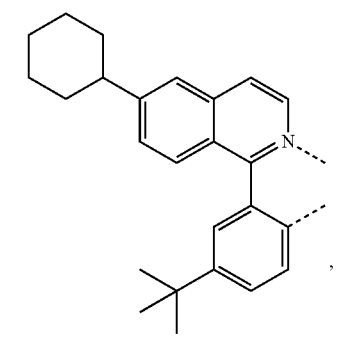
L_{x333}
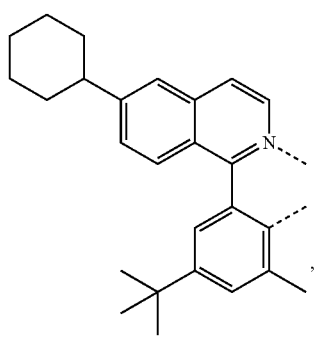
L_{x334}

155 -continued
L<sub>x335</sub>
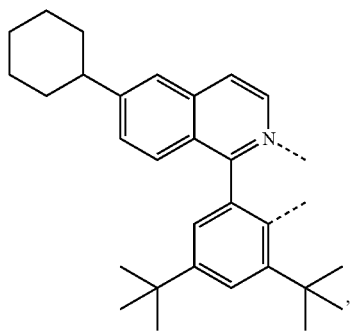
L<sub>x336</sub>
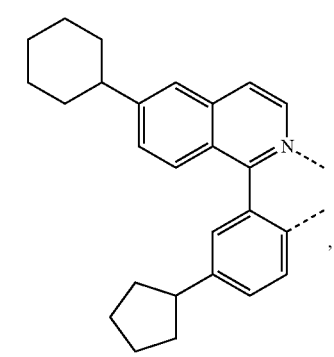
L<sub>x337</sub>
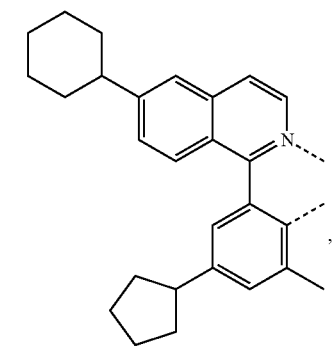
L<sub>x338</sub>
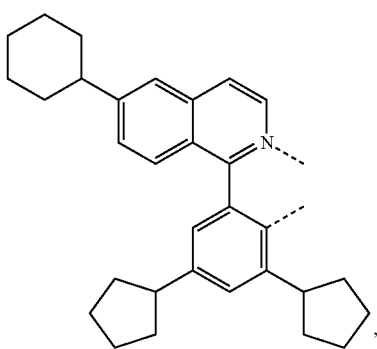
156 -continued
L<sub>x339</sub>
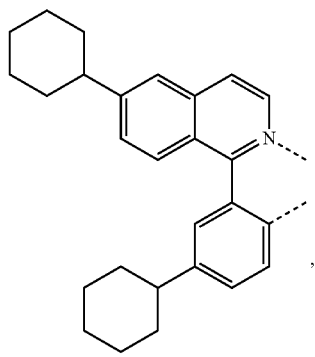
L<sub>x340</sub>
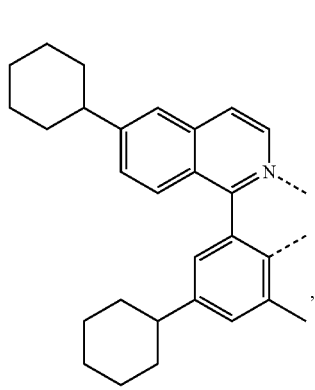
L<sub>x341</sub>
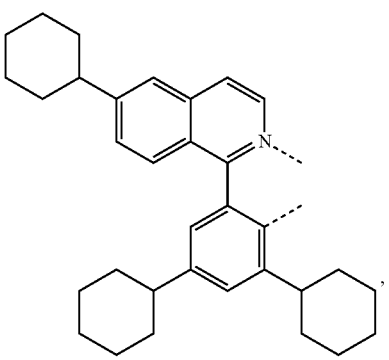
L<sub>x342</sub>
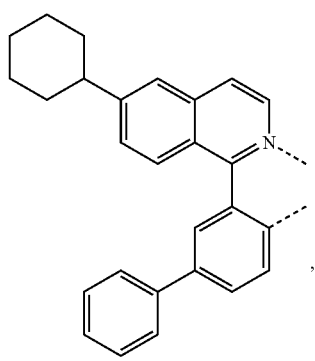

157
-continued
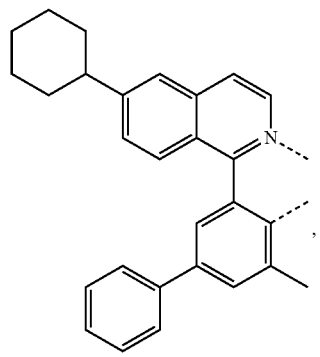
L<sub>x343</sub>
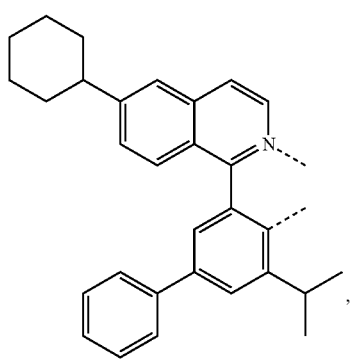
L<sub>x344</sub>
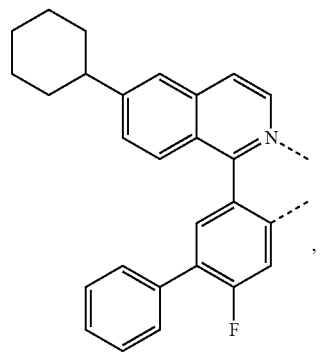
L<sub>x345</sub>
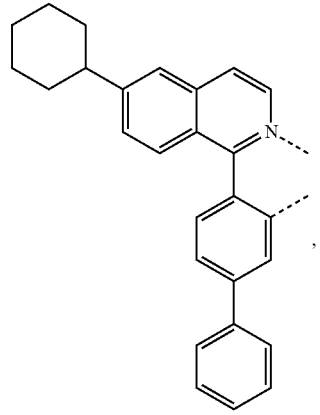
L<sub>x346</sub>
158
-continued
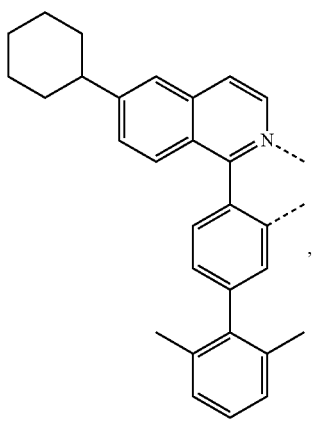
L<sub>x347</sub>
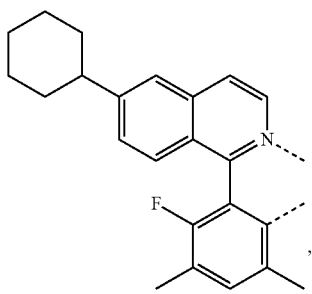
L<sub>x348</sub>
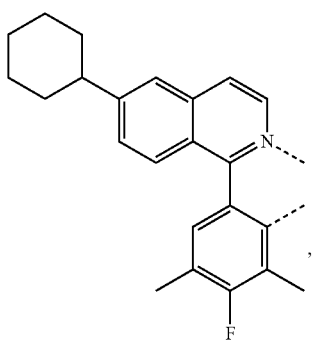
L<sub>x349</sub>
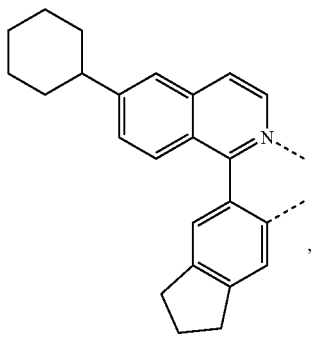
L<sub>x350</sub>

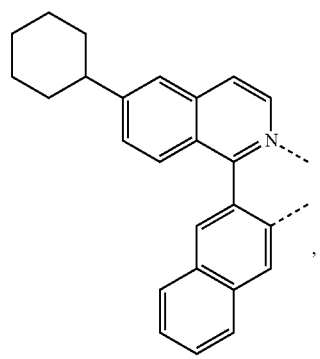 L<sub>x351</sub>
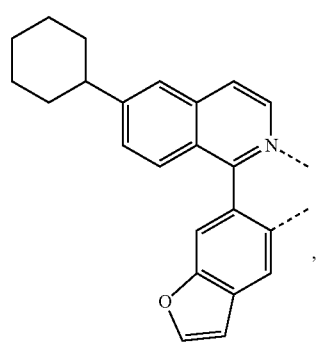 L$_{x352}$
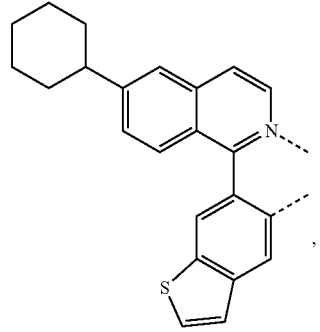 L$_{x353}$
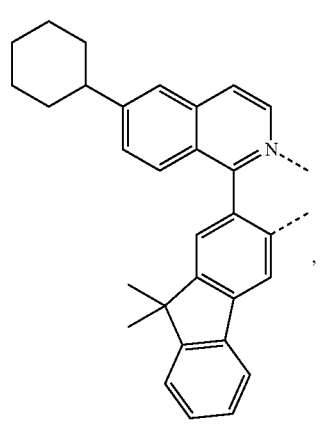 L$_{x354}$
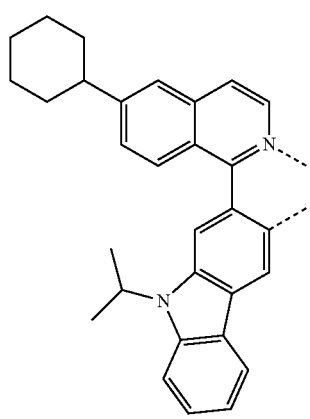 L$_{x355}$
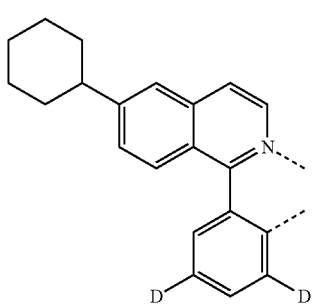 L$_{x356}$
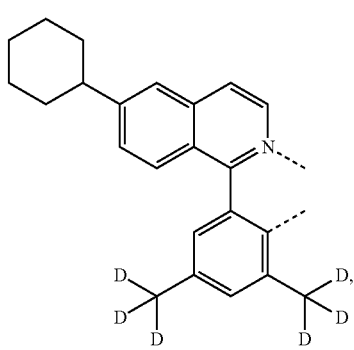 L$_{x357}$
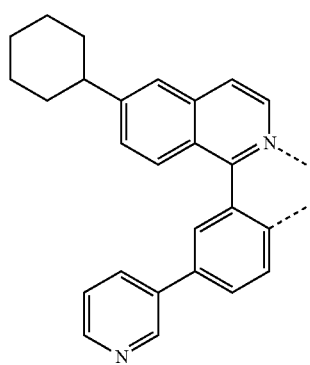 L$_{x358}$

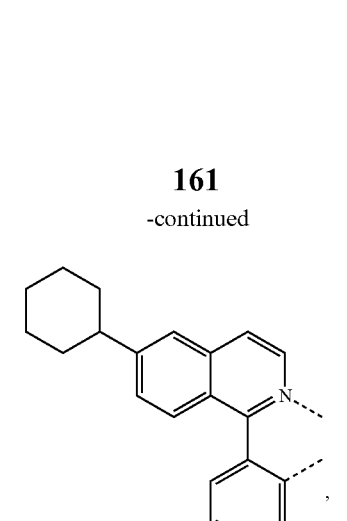
L_x359,
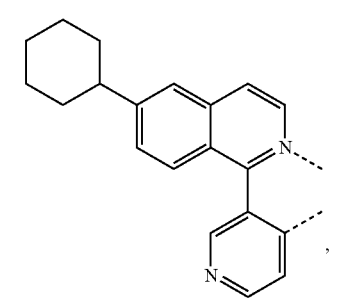
L_x360,
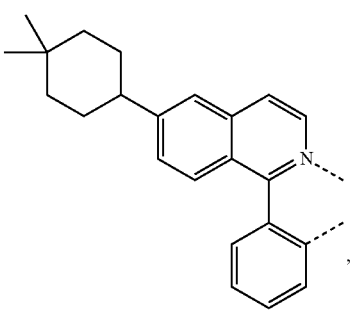
L_x361,
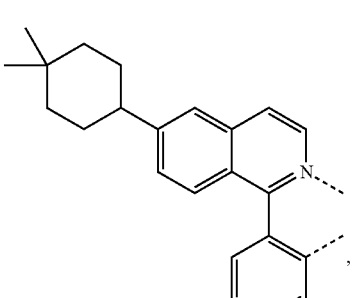
L_x362,
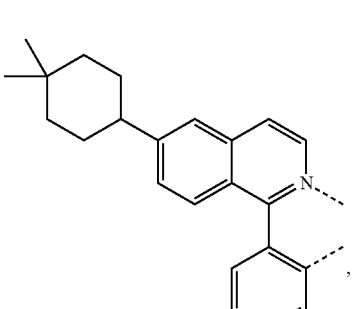
L_x363,
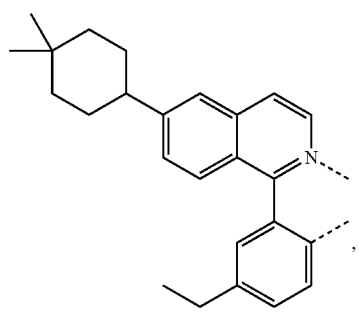
L_x364,
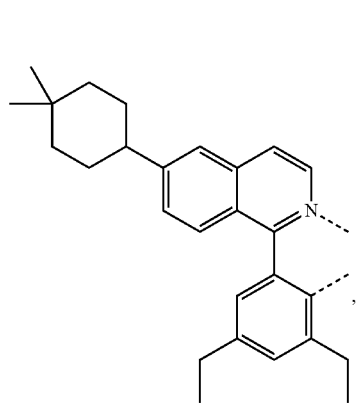
L_x365,
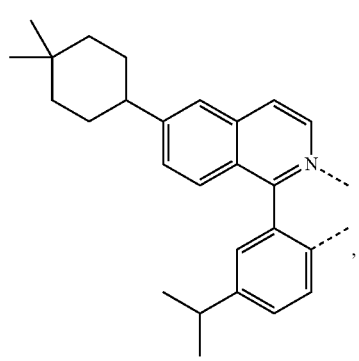
L_x366,
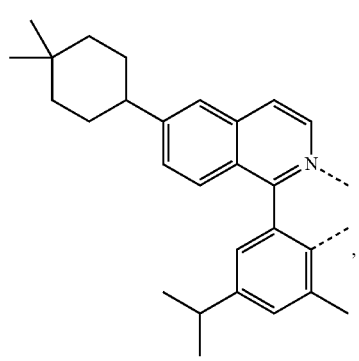
L_x367

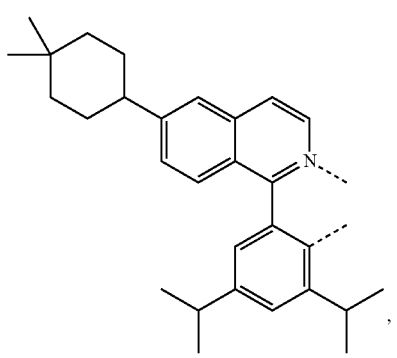 L$_{x368}$
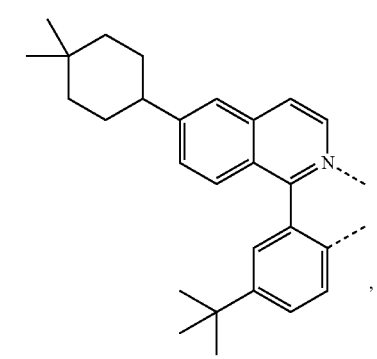 L$_{x369}$
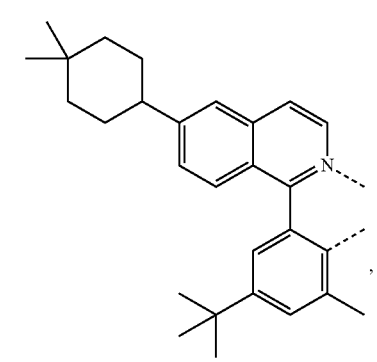 L$_{x370}$
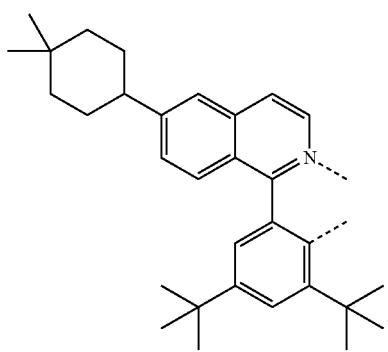 L$_{x371}$
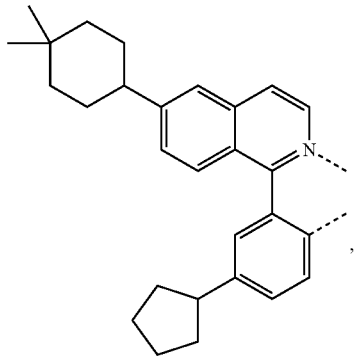 L$_{x372}$
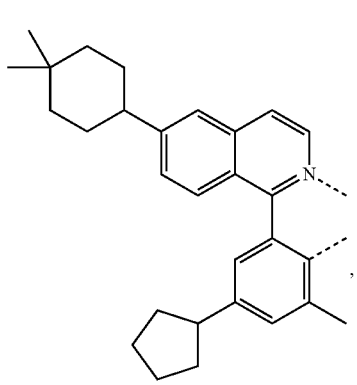 L$_{x373}$
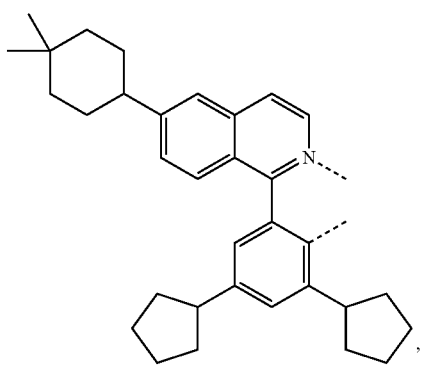 L$_{x374}$
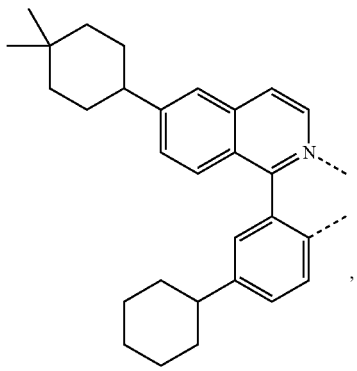 L$_{x375}$

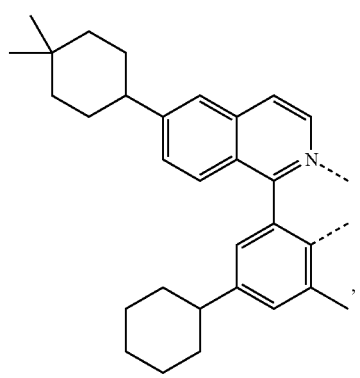 $L_{x376}$
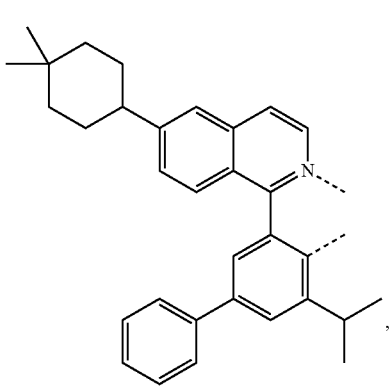 $L_{x380}$
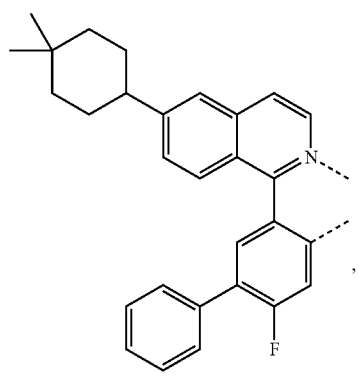 $L_{x377}$, $L_{x381}$
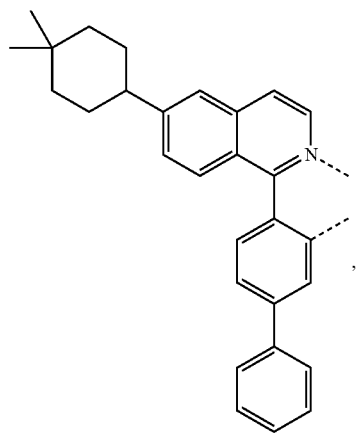 $L_{x378}$, $L_{x382}$
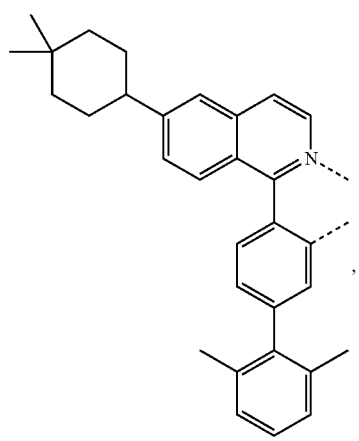 $L_{x379}$, $L_{x383}$

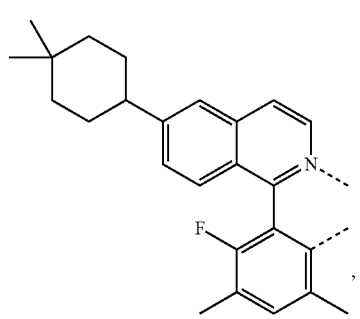
L<sub>x384</sub>
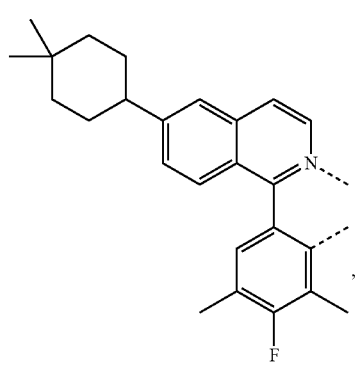
L<sub>x385</sub>
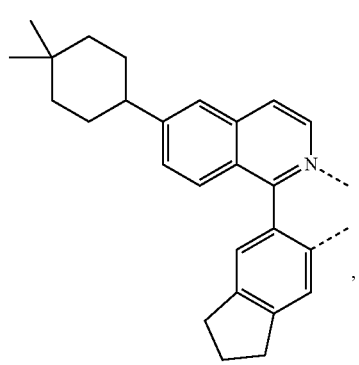
L<sub>x386</sub>
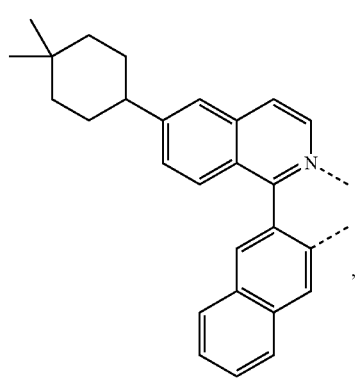
L<sub>x387</sub>
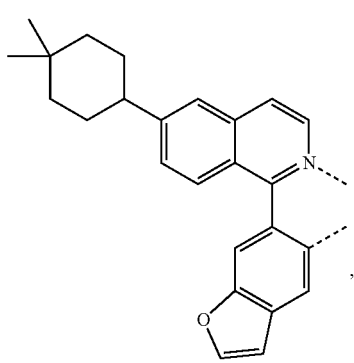
L<sub>x388</sub>
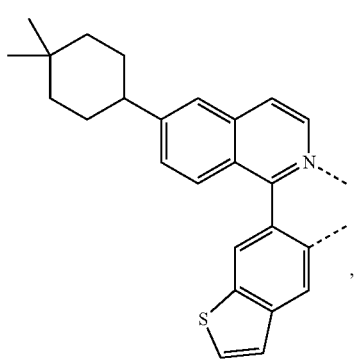
L<sub>x389</sub>
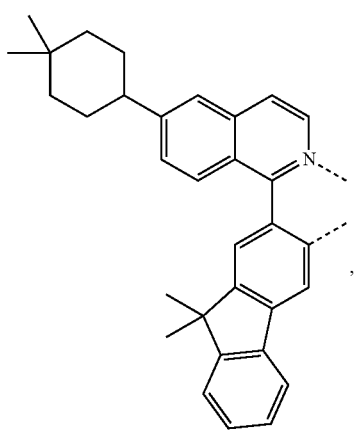
L<sub>x390</sub>
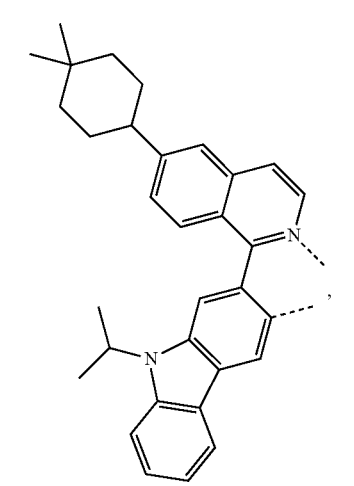
L<sub>x391</sub>

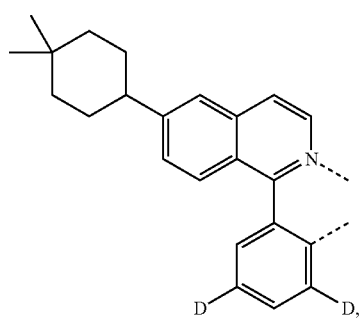 L_{x392}
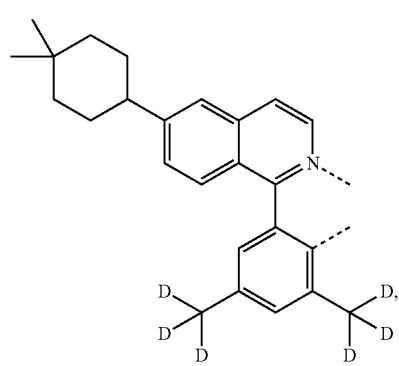 L_{x393}
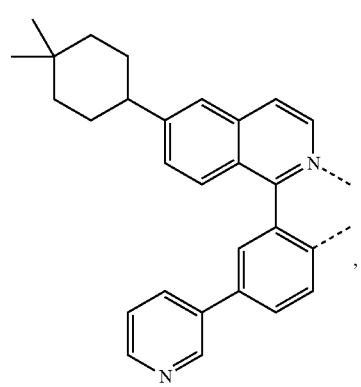 L_{x394}
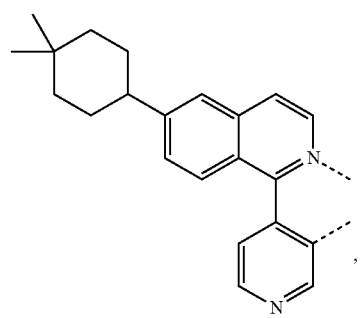 L_{x395}
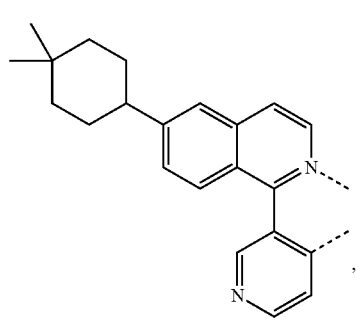 L_{x396}
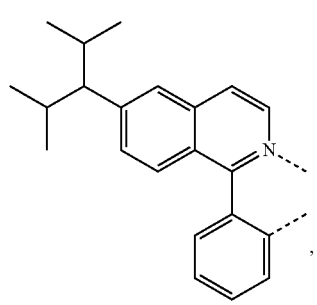 L_{x397}
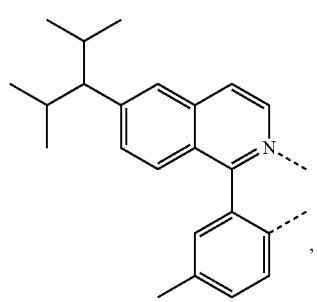 L_{x398}
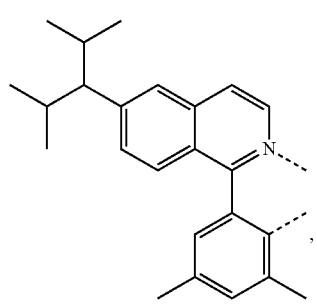 L_{x399}
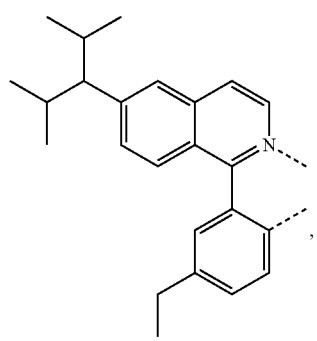 L_{x400}

L$_{x401}$
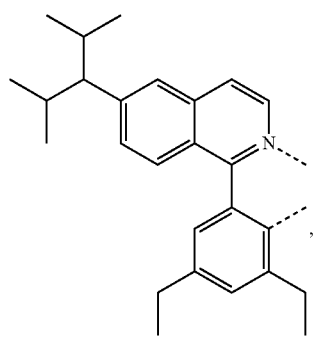
L$_{x402}$
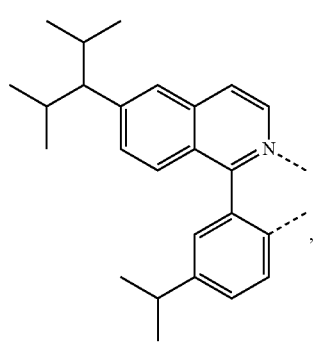
L$_{x403}$
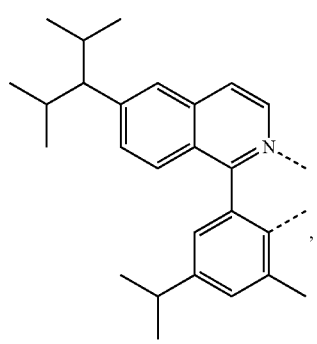
L$_{x404}$
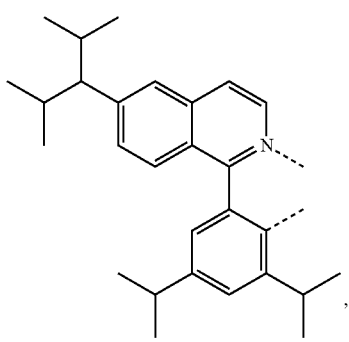
L$_{x405}$
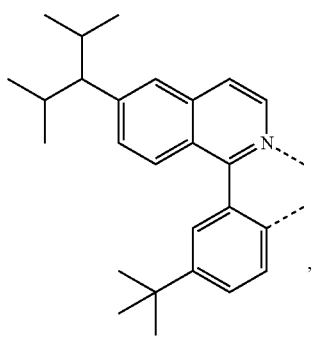
L$_{x406}$
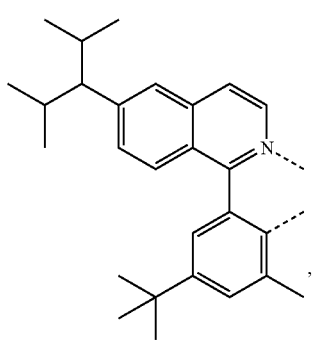
L$_{x407}$
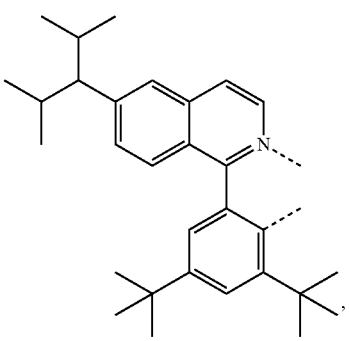
L$_{x408}$
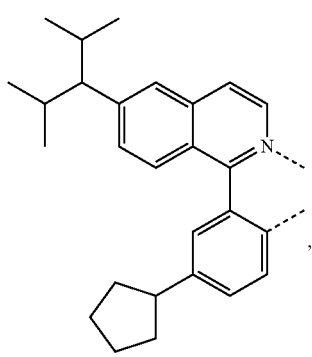

L<sub>x409</sub>
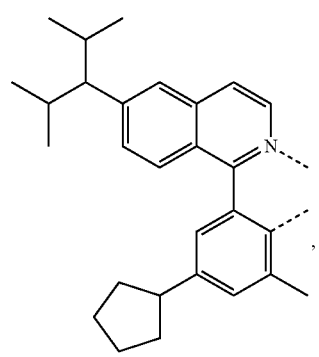
L<sub>x410</sub>
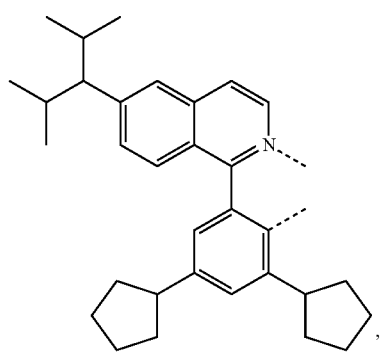
L<sub>x411</sub>
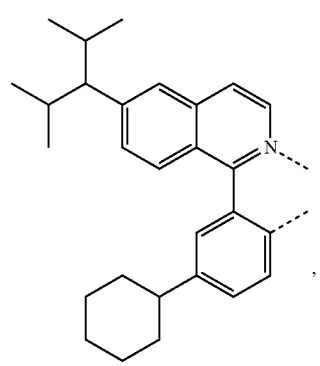
L<sub>x412</sub>
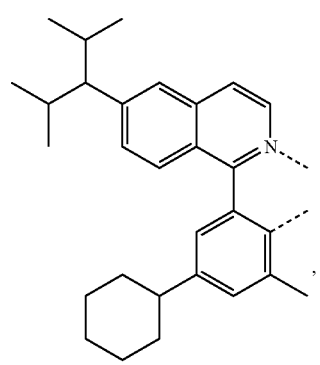
L<sub>x413</sub>
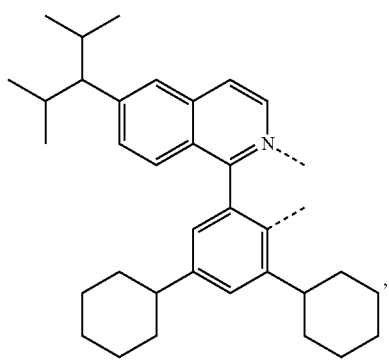
L<sub>x414</sub>
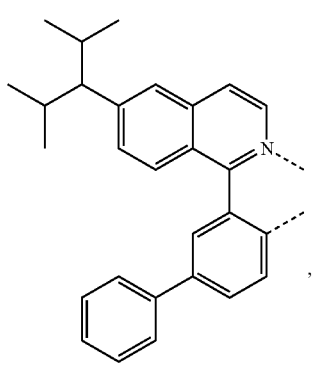
L<sub>x415</sub>
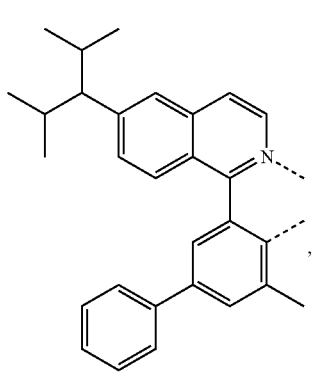
L<sub>x416</sub>
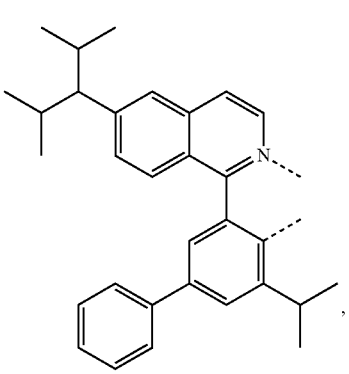

175
-continued
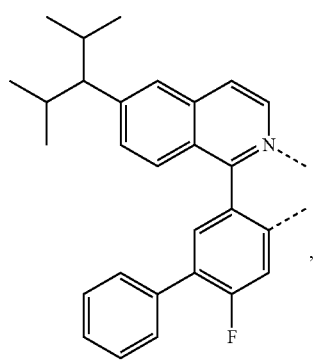
L<sub>x417</sub>
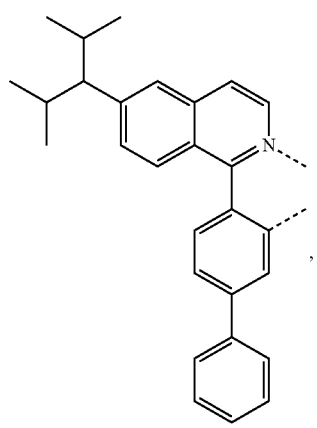
L<sub>x418</sub>
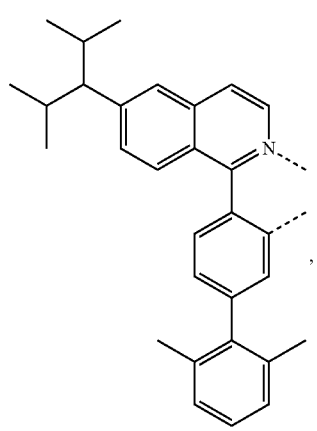
L<sub>x419</sub>
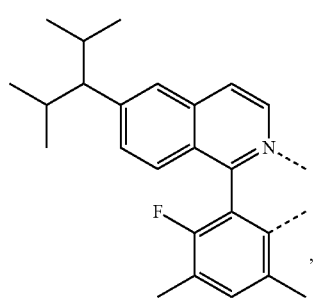
L<sub>x420</sub>
176
-continued
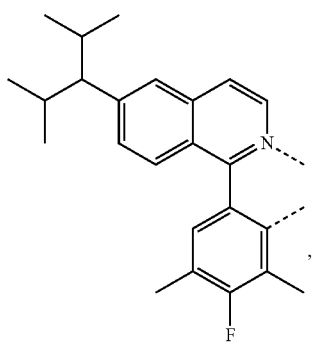
L<sub>x421</sub>
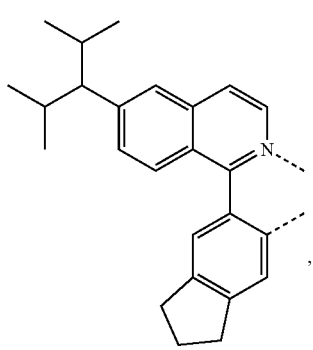
L<sub>x422</sub>
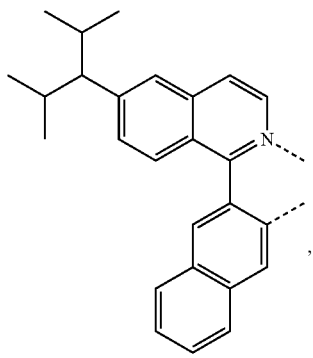
L<sub>x423</sub>
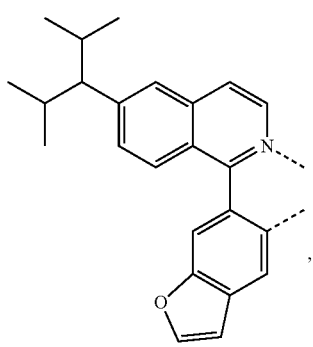
L<sub>x424</sub>

177
-continued
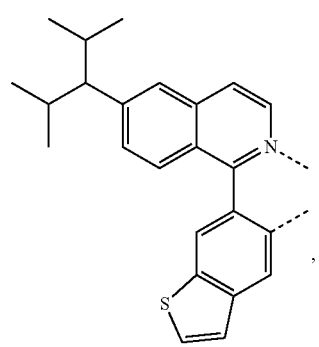
$L_{x425}$
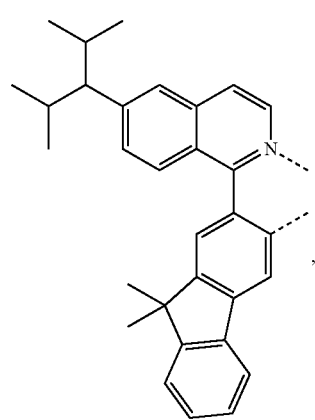
$L_{x426}$
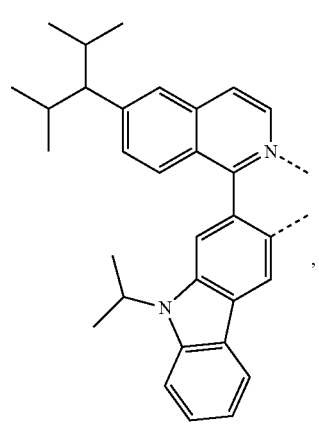
$L_{x427}$
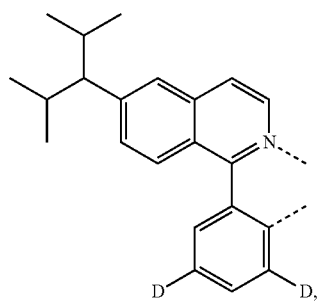
$L_{x428}$
178
-continued
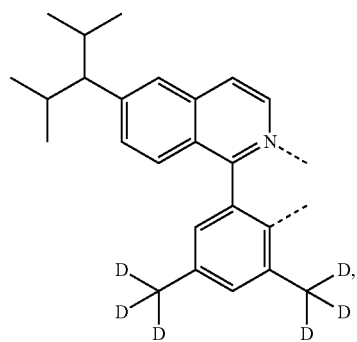
$L_{x429}$
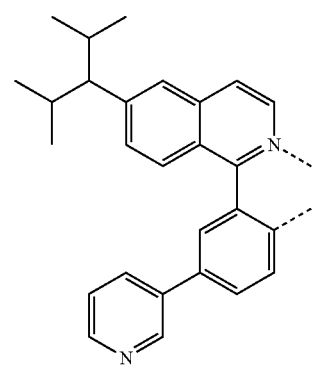
$L_{x430}$
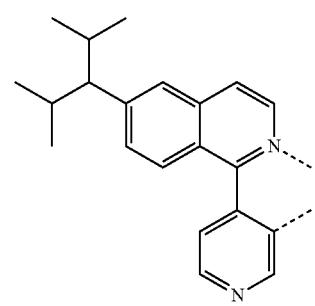
$L_{x431}$
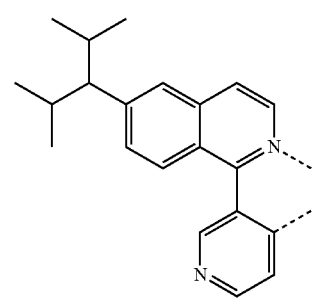
$L_{x432}$
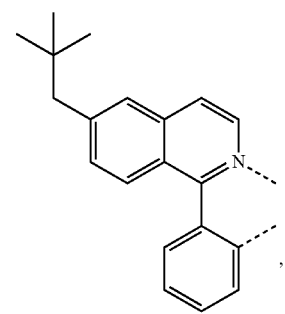
$L_{x433}$ -continued
L<sub>x434</sub>
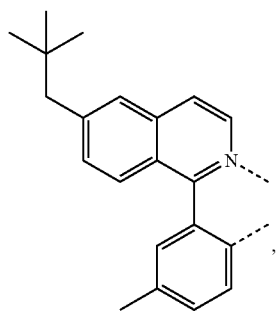
L<sub>x435</sub>
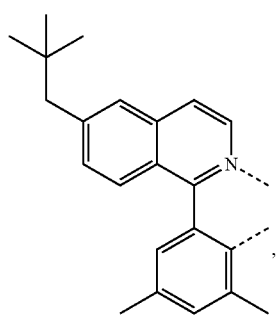
L<sub>x436</sub>
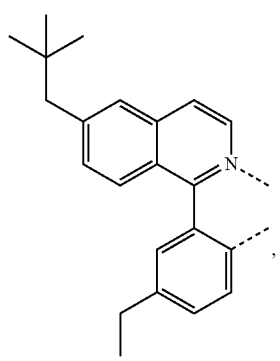
L<sub>x437</sub>
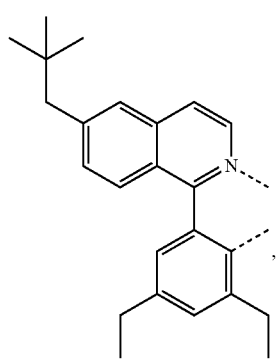
-continued
L<sub>x438</sub>
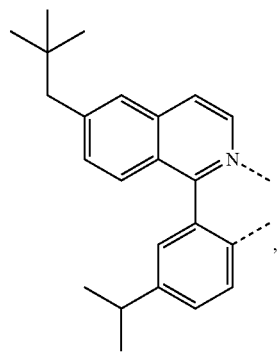
L<sub>x439</sub>
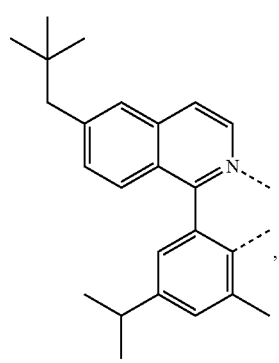
L<sub>x440</sub>
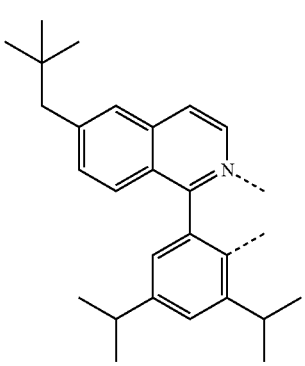
L<sub>x441</sub>
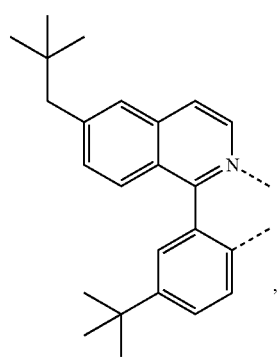

L*x442*
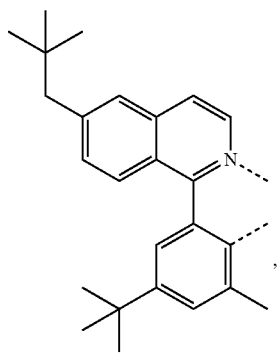
L*x443*
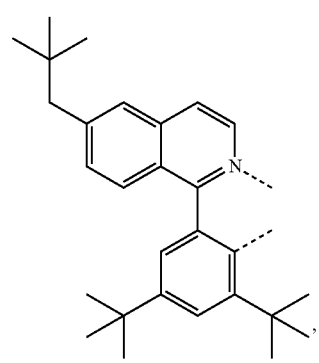
L*x444*
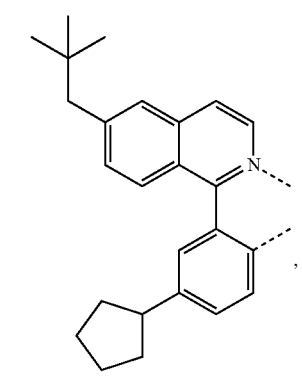
L*x445*
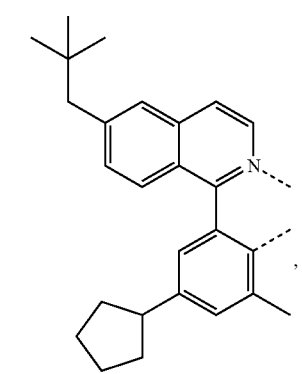
L*x446*
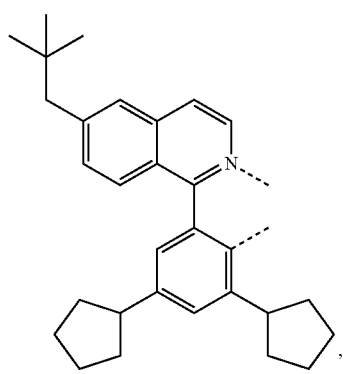
L*x447*
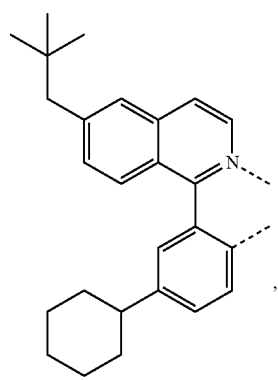
L*x448*
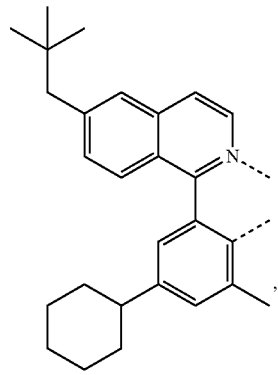
L*x449*
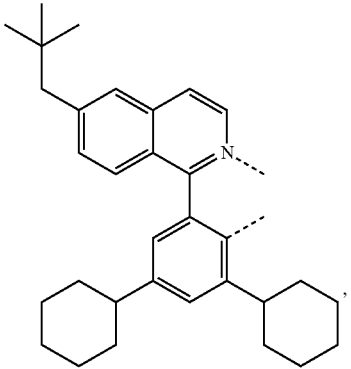

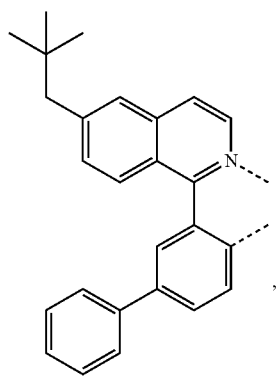 $L_{x450}$
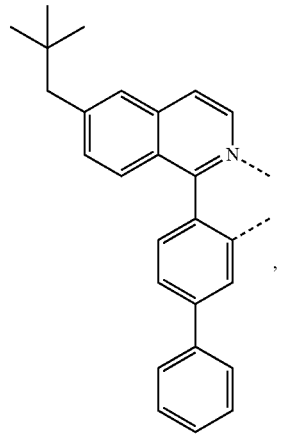 $L_{x454}$
$L_{x451}$
$L_{x455}$
$L_{x452}$
$L_{x456}$
$L_{x453}$
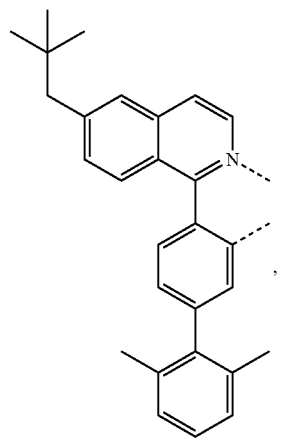
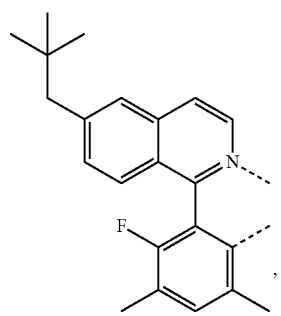 $L_{x457}$
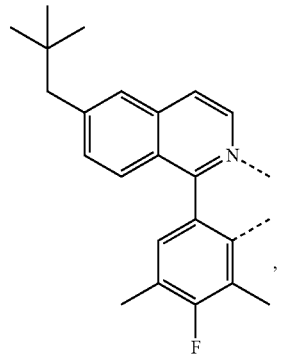

L<sub>x458</sub>
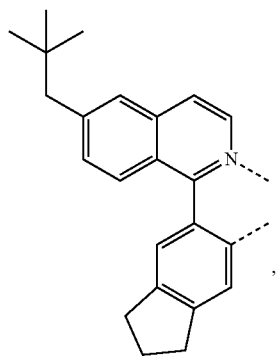
L<sub>x459</sub>
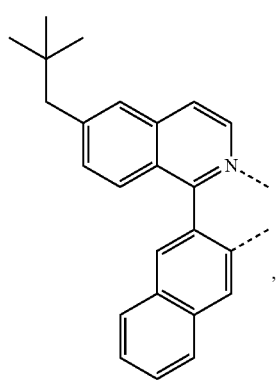
L<sub>x460</sub>
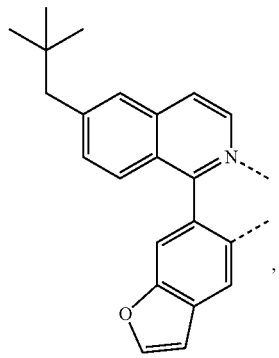
L<sub>x461</sub>
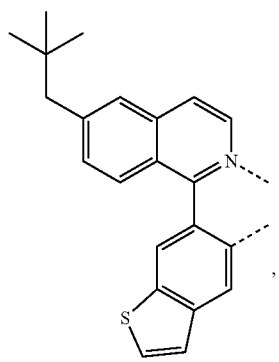
L<sub>x462</sub>
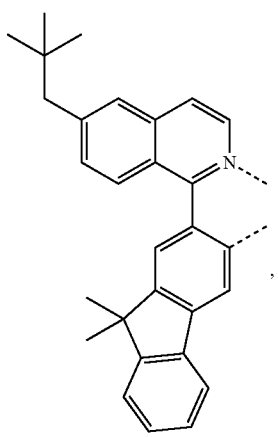

187
-continued
188
-continued
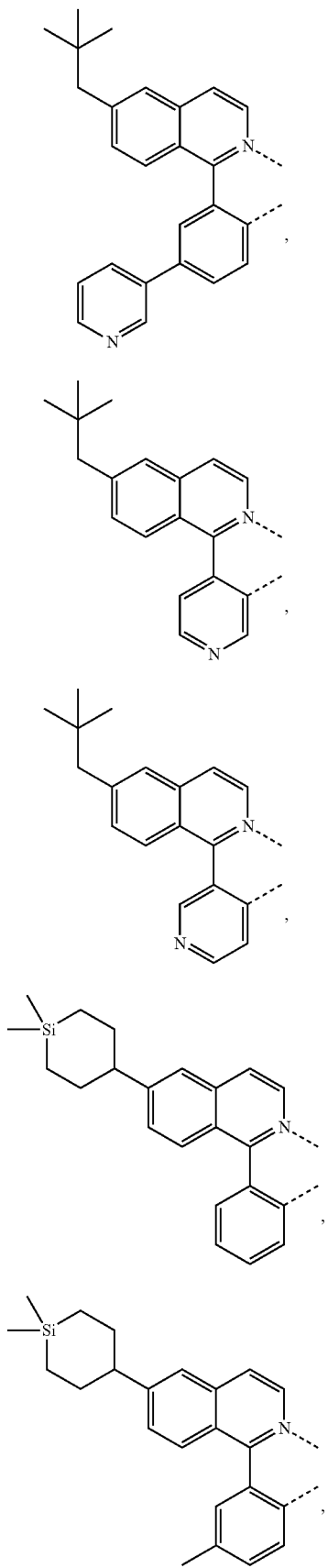
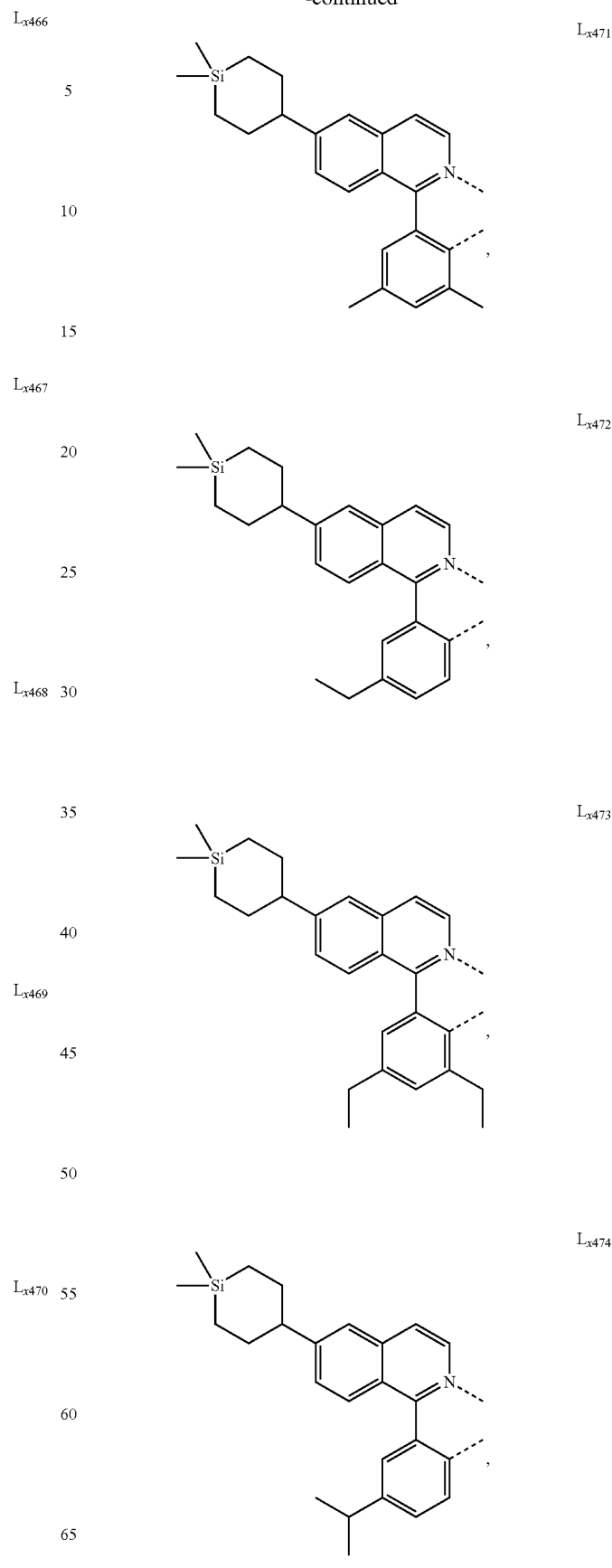

| | |
|---|---|
| 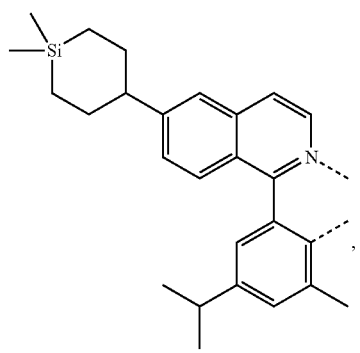 L$_{x475}$ | 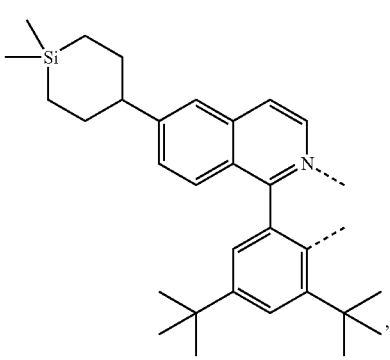 L$_{ax479}$ |
| 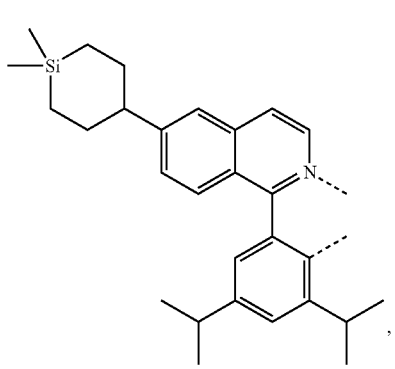 L$_{x476}$ | 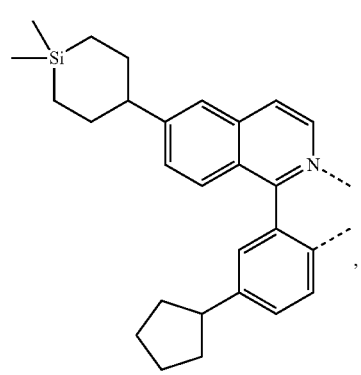 L$_{x480}$ |
| 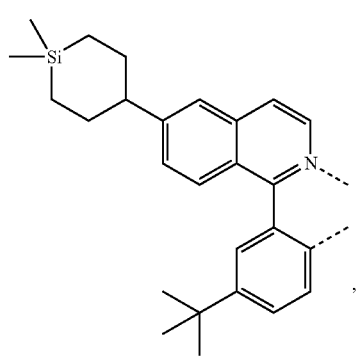 L$_{x477}$ | 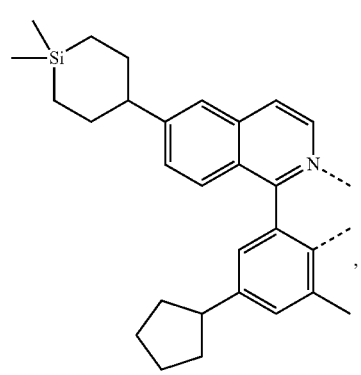 L$_{x481}$ |
| 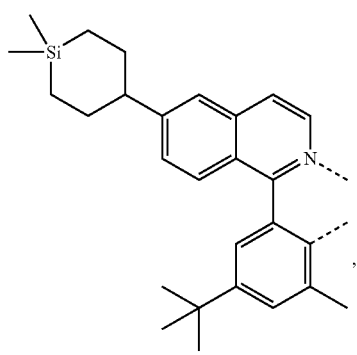 L$_{x478}$ | 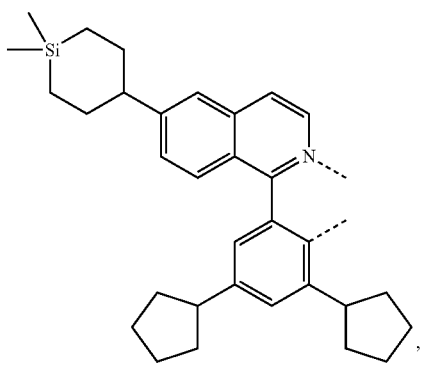 L$_{x482}$ |

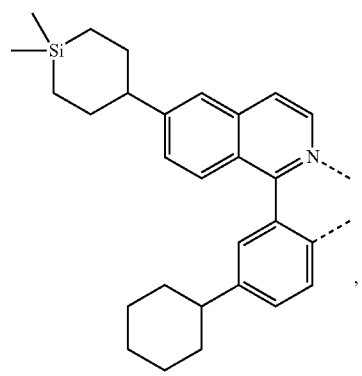 L<sub>x483</sub>
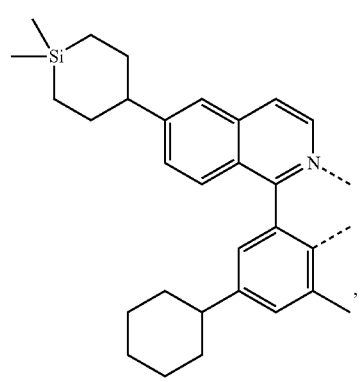 L<sub>x484</sub>
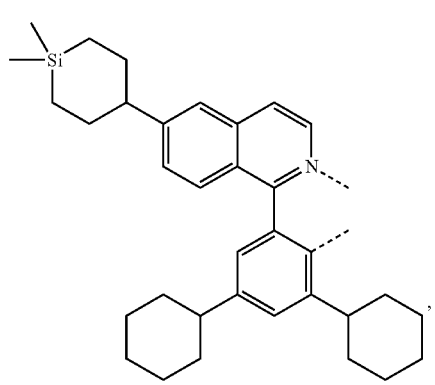 L<sub>x485</sub>
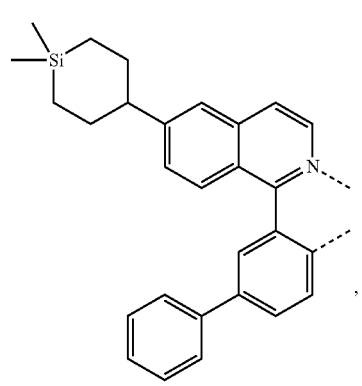 L<sub>x486</sub>
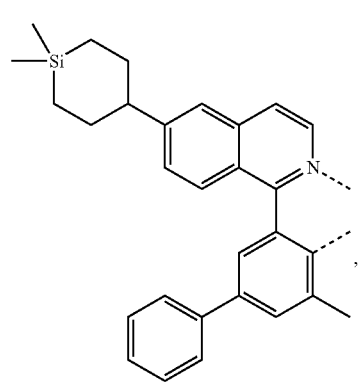 L<sub>x487</sub>
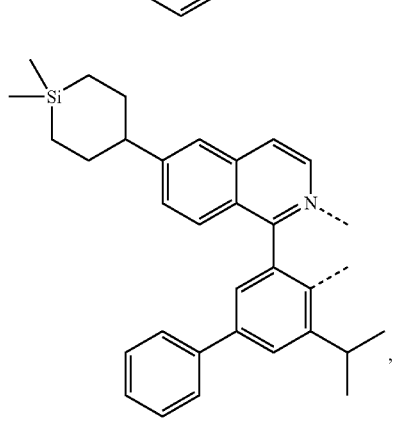 L<sub>x488</sub>
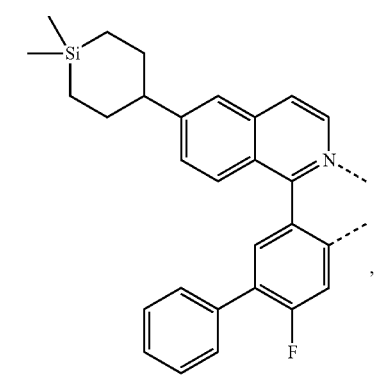 L<sub>x489</sub>
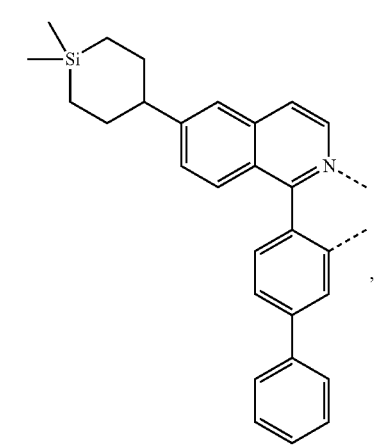 L<sub>x490</sub>

-continued
L<sub>x491</sub>
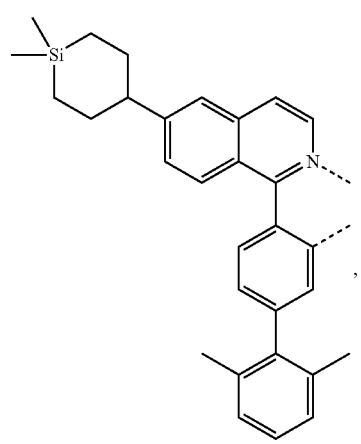
L<sub>x492</sub>
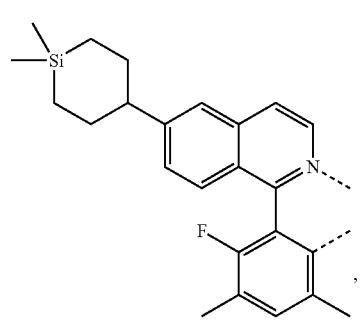
L<sub>x493</sub>
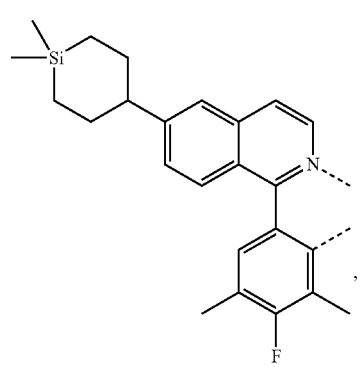
L<sub>x494</sub>
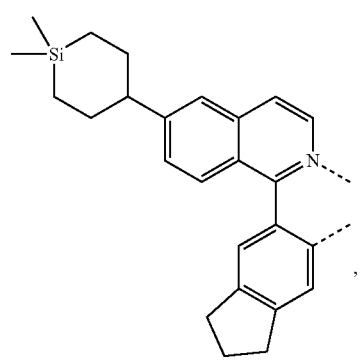
-continued
L<sub>x495</sub>
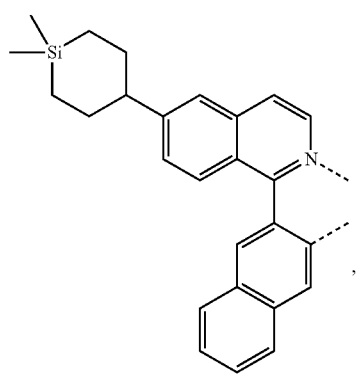
L<sub>x496</sub>
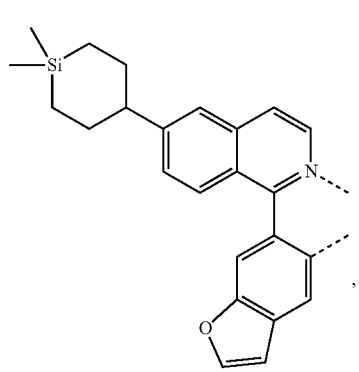
L<sub>x497</sub>
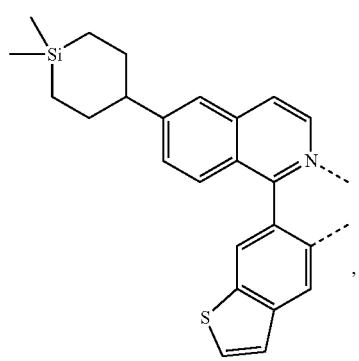
L<sub>x498</sub>
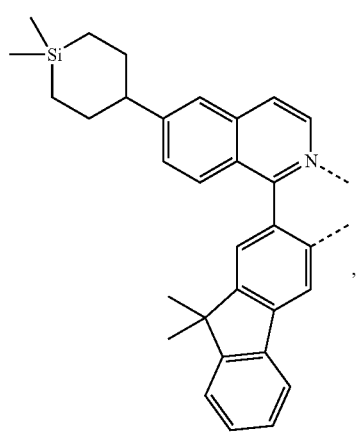

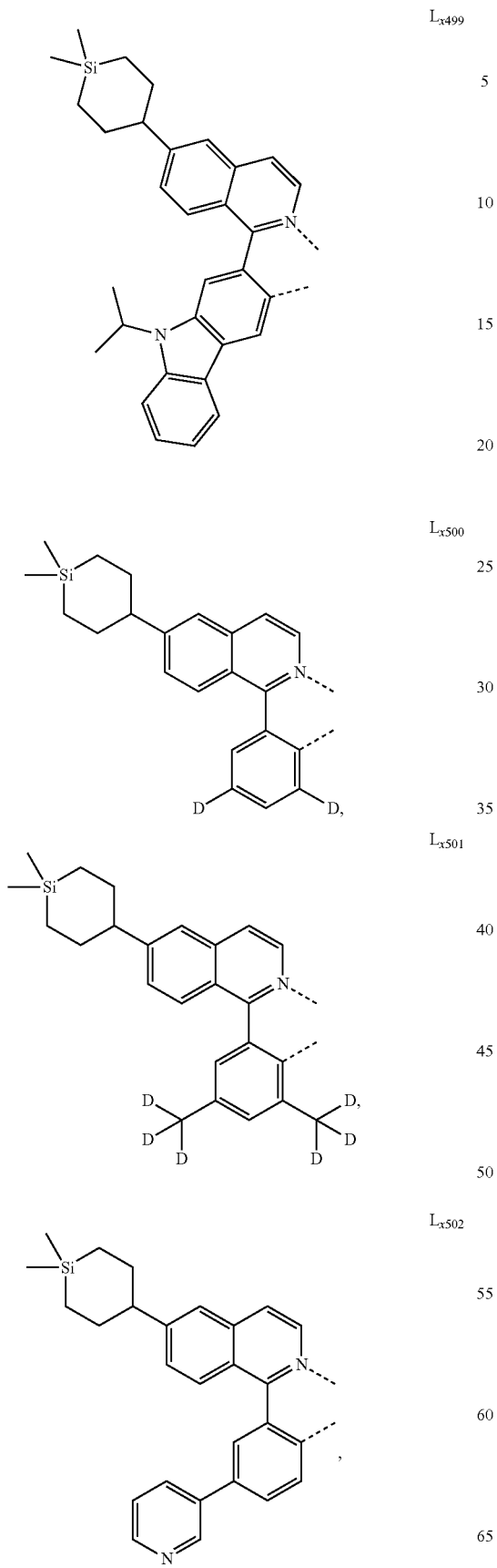
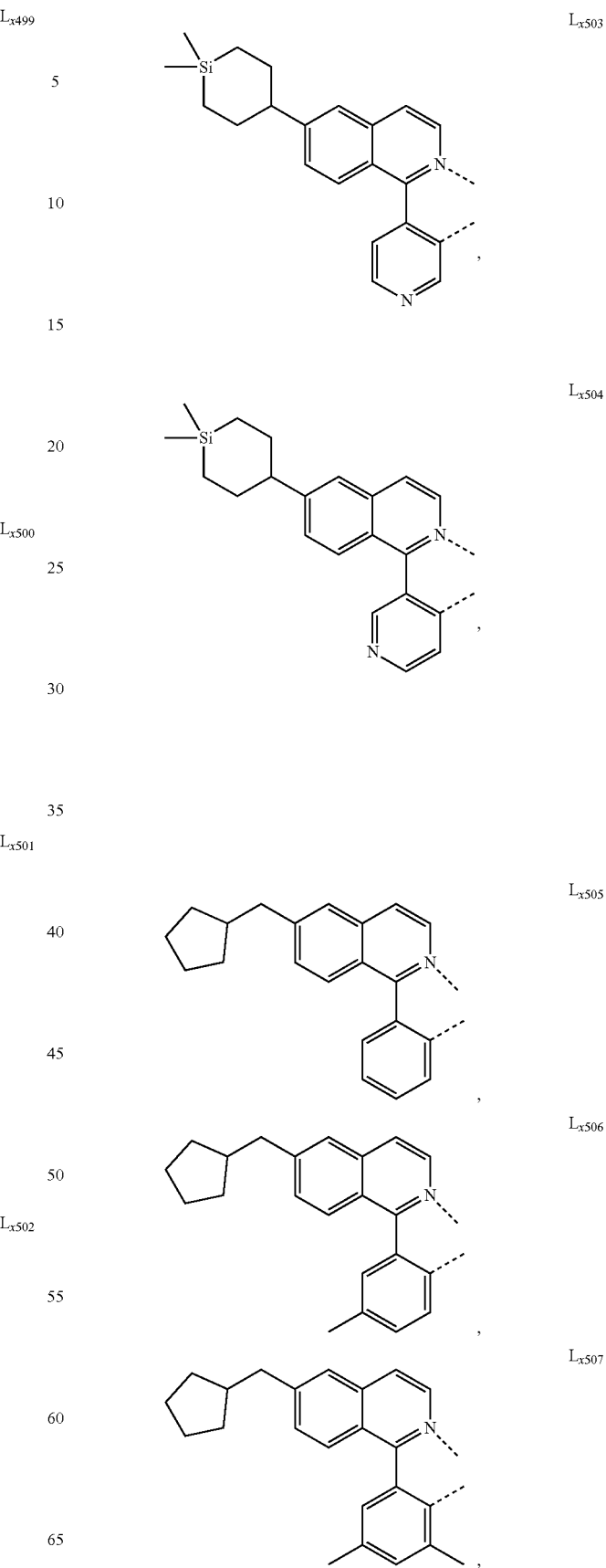

-continued

L<sub>x508</sub>

L<sub>x509</sub>

L<sub>x510</sub>

L<sub>x511</sub>

L<sub>x512</sub>

-continued

L<sub>x513</sub>

L<sub>x514</sub>

L<sub>x515</sub>

L<sub>x516</sub>

L<sub>x517</sub>

199
-continued
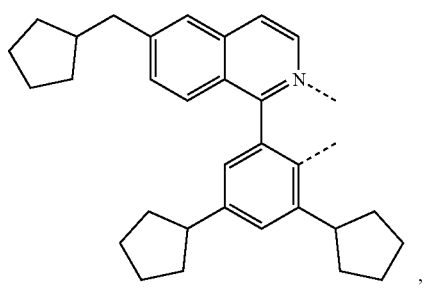
, L_{x518}
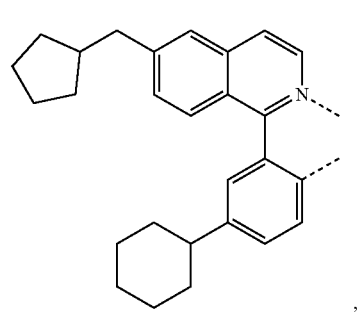
, L_{x519}
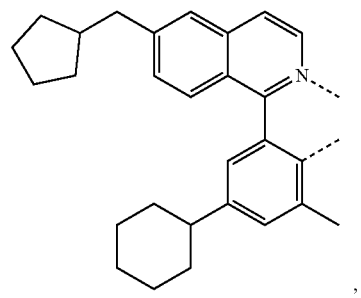
, L_{x520}
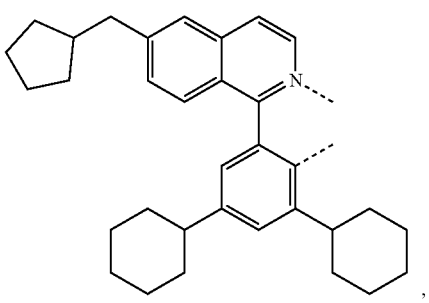
, L_{x521}
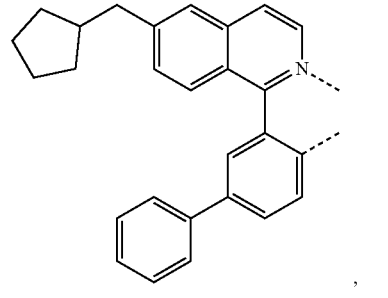
, L_{x522}
200
-continued
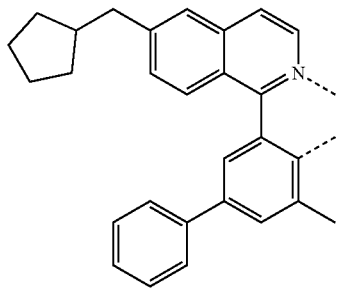
, L_{x523}
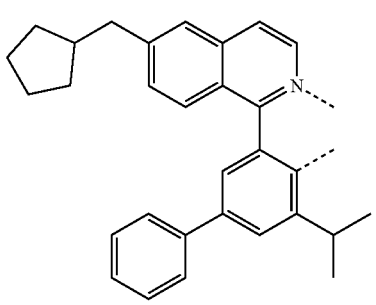
, L_{x524}
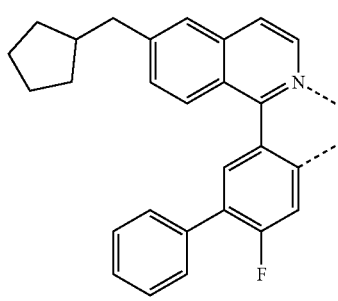
, L_{x525}
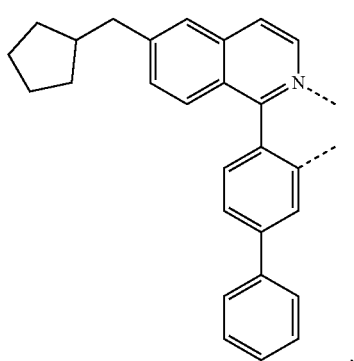
, L_{x526}
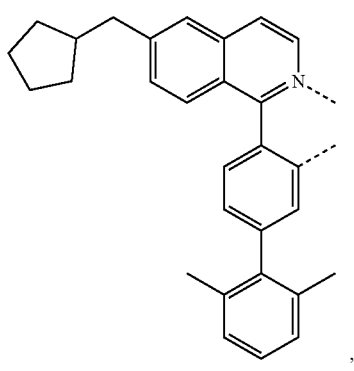
, L_{x527}

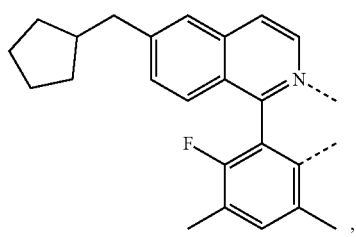 L_{x528}
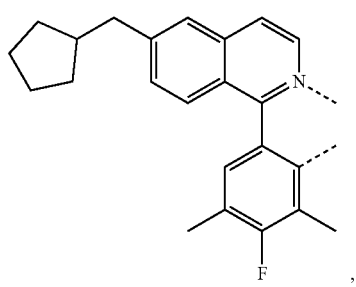 L_{x529}
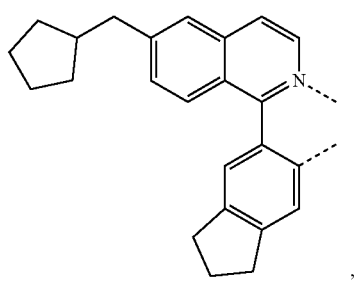 L_{x530}
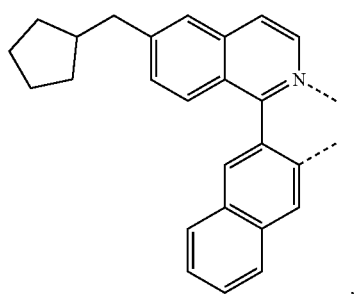 L_{x531}
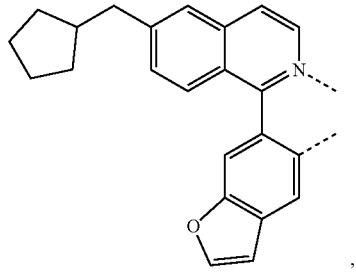 L_{x532}
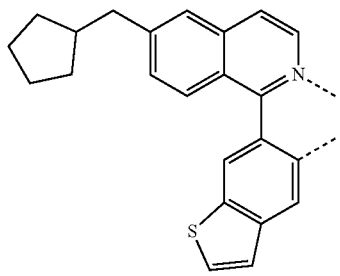 L_{x533}
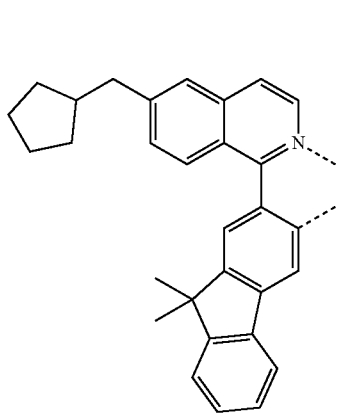 L_{x534}
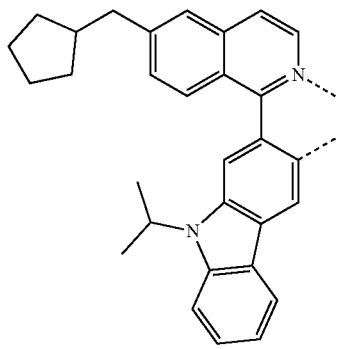 L_{x535}
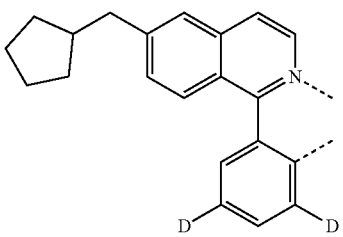 L_{x536}
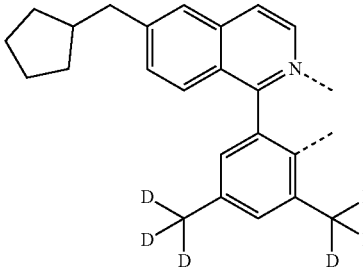 L_{x537}

-continued
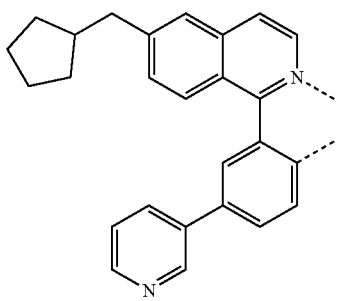  L<sub>x538</sub>
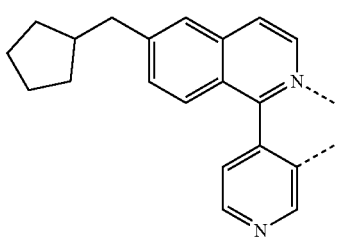  L<sub>x539</sub>
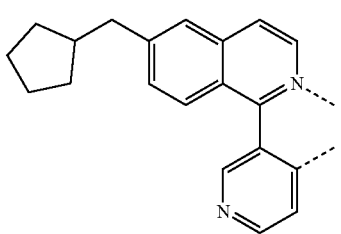  L<sub>x540</sub>
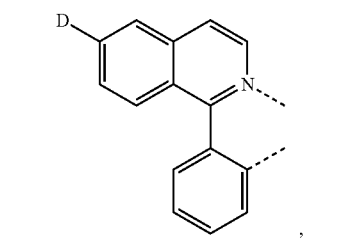  L<sub>x541</sub>
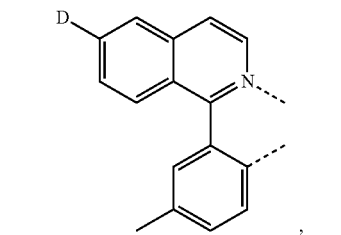  L<sub>x542</sub>
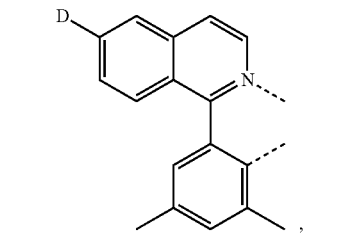  L<sub>x543</sub>
-continued
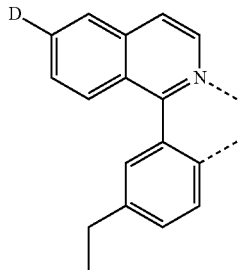  L<sub>x544</sub>
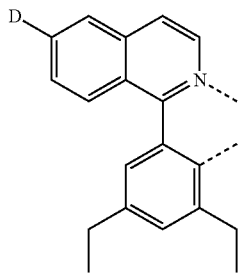  L<sub>x545</sub>
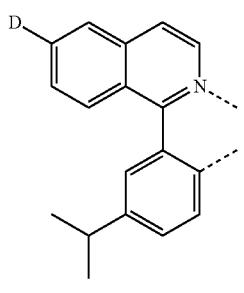  L<sub>x546</sub>
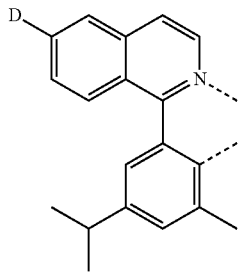  L<sub>x547</sub>
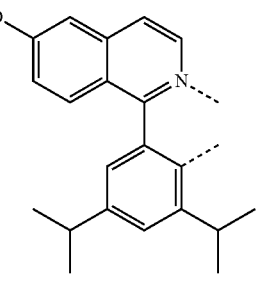  L<sub>x548</sub>

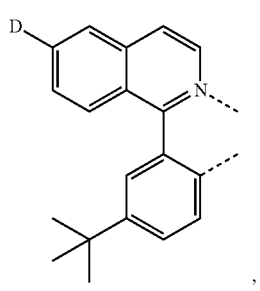
L<sub>x549</sub>
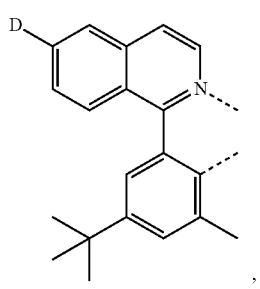
L<sub>x550</sub>
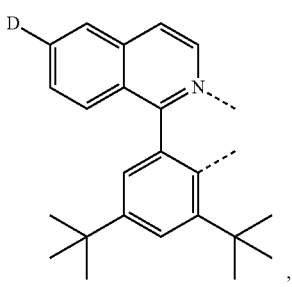
L<sub>x551</sub>
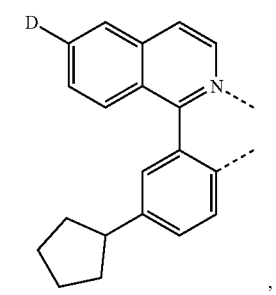
L<sub>x552</sub>
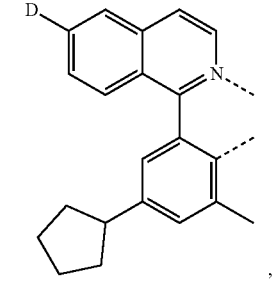
L<sub>x553</sub>
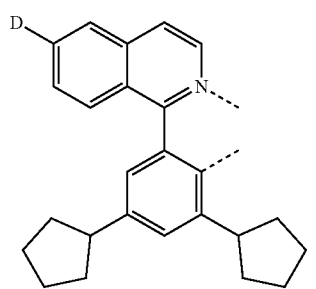
L<sub>x554</sub>
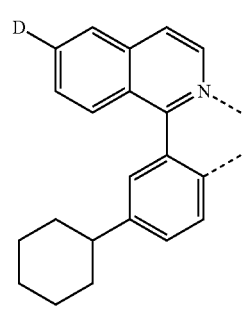
L<sub>x555</sub>
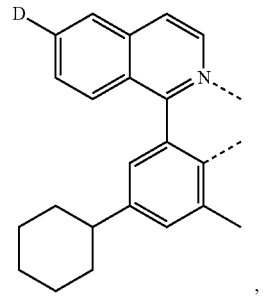
L<sub>x556</sub>
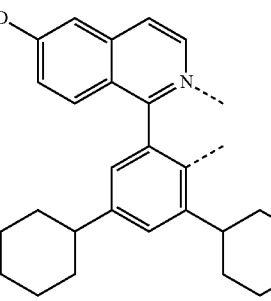
L<sub>x557</sub>
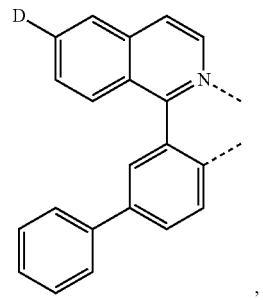
L<sub>x558</sub>

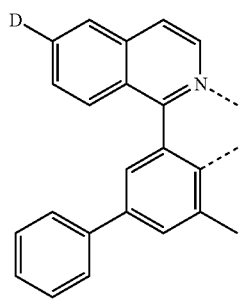 L<sub>x559</sub>
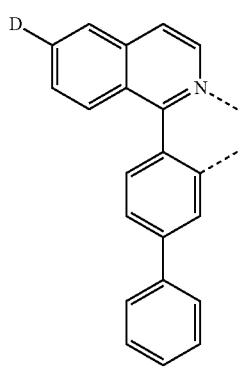 L<sub>x562</sub>
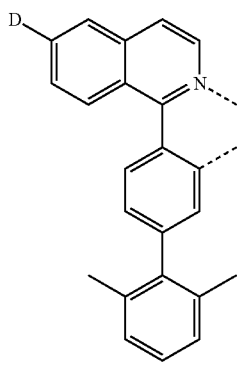 L<sub>x563</sub>
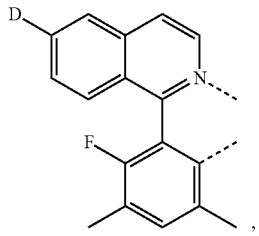 L<sub>x564</sub>
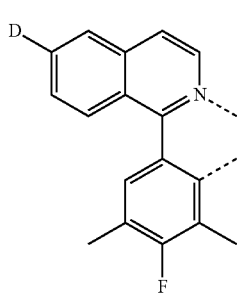 L<sub>x565</sub>
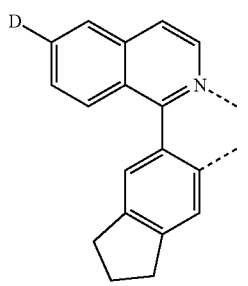 L<sub>x566</sub>
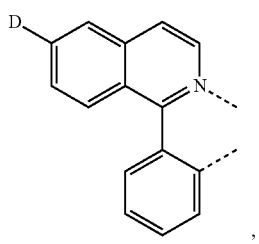 L<sub>x567</sub>

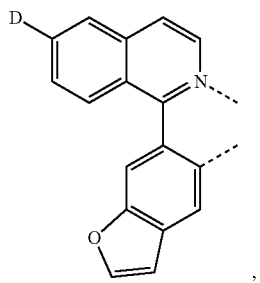 L$_{x568}$
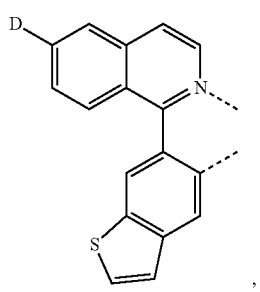 L$_{x569}$
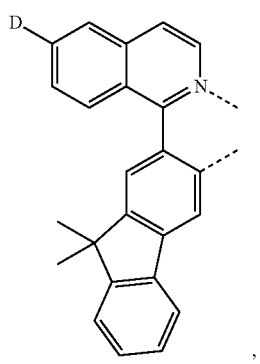 L$_{x570}$
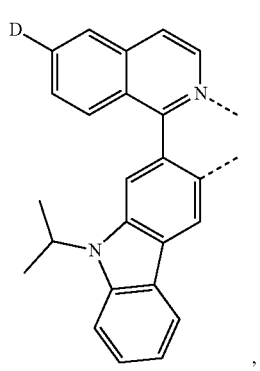 L$_{x571}$
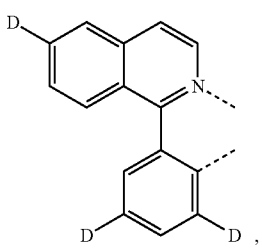 L$_{x572}$
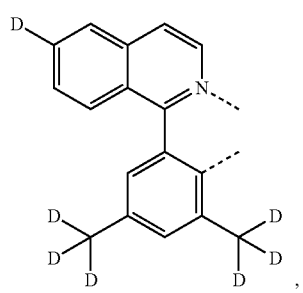 L$_{x573}$
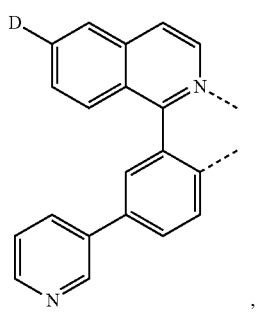 L$_{x574}$
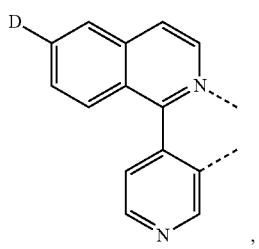 L$_{x575}$
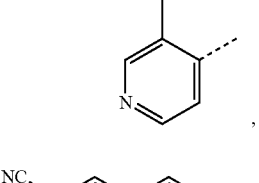 L$_{x576}$
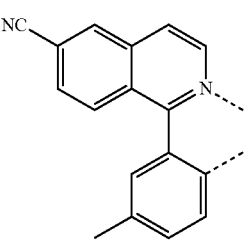 L$_{x577}$
L$_{x578}$

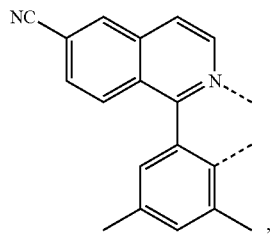 L<sub>x579</sub>
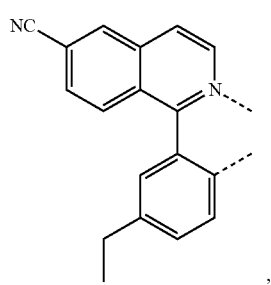 L<sub>x580</sub>
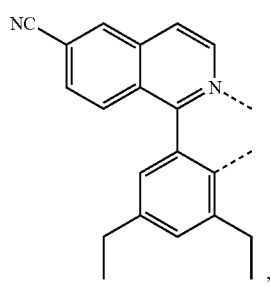 L<sub>x581</sub>
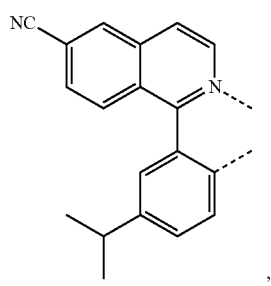 L<sub>x582</sub>
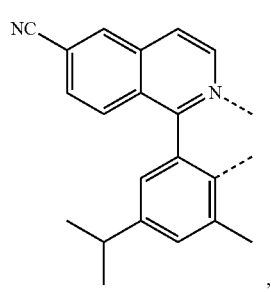 L<sub>x583</sub>
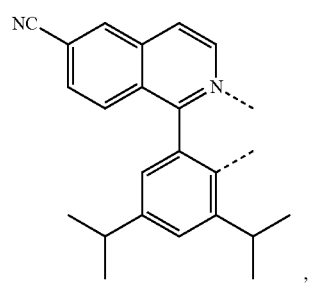 L<sub>x584</sub>
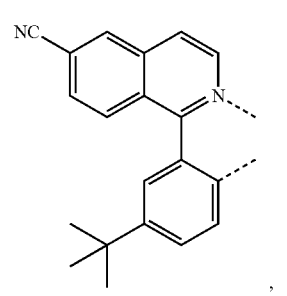 L<sub>x585</sub>
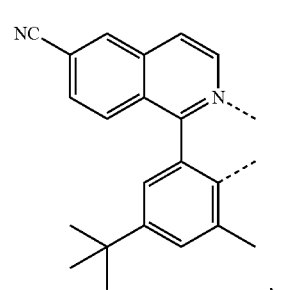 L<sub>x586</sub>
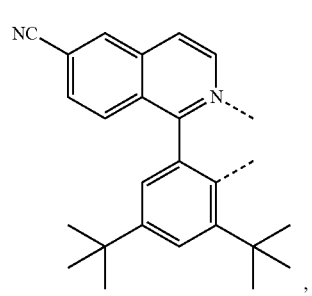 L<sub>x587</sub>
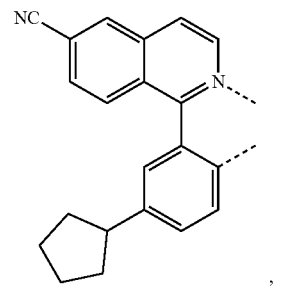 L<sub>x588</sub>

213
-continued
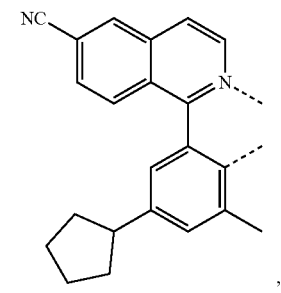
L<sub>x589</sub>
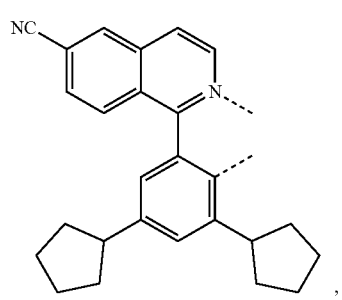
L<sub>x590</sub>
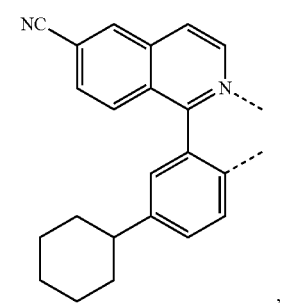
L<sub>x591</sub>
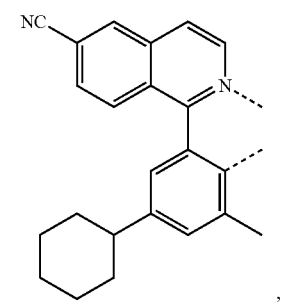
L<sub>x592</sub>
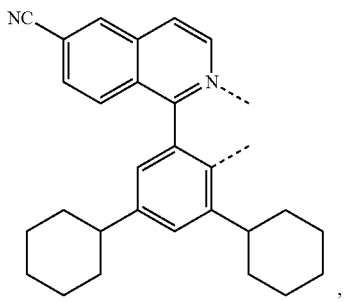
L<sub>x593</sub>
214
-continued
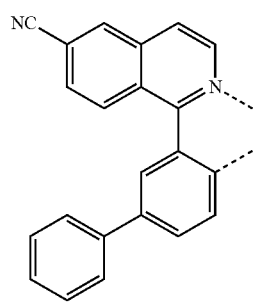
L<sub>x594</sub>
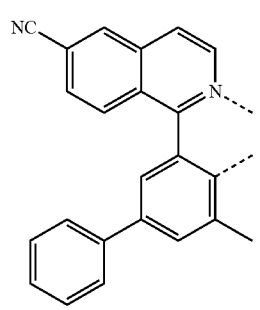
L<sub>x595</sub>
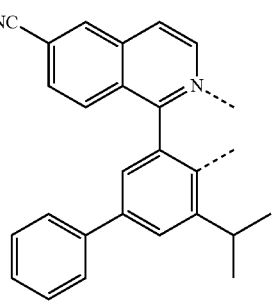
L<sub>x596</sub>
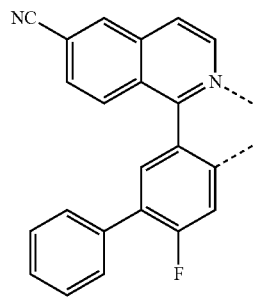
L<sub>x597</sub>
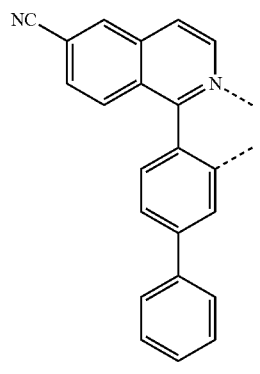
L<sub>x598</sub>

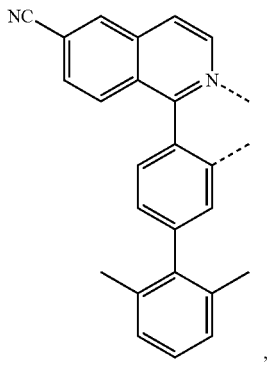
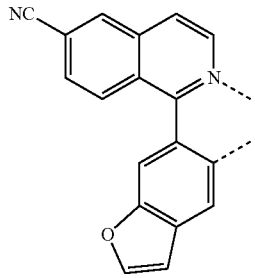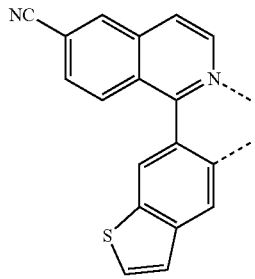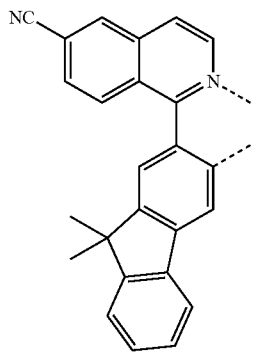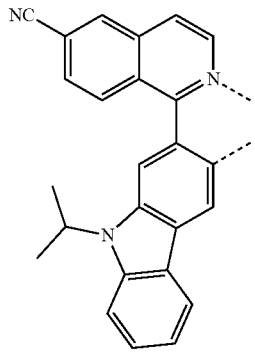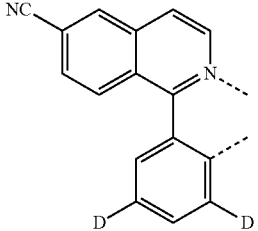

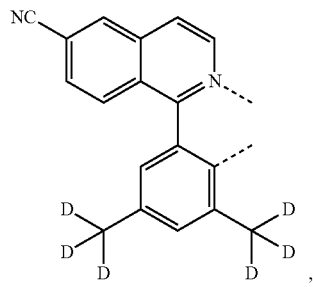 L<sub>x609</sub>
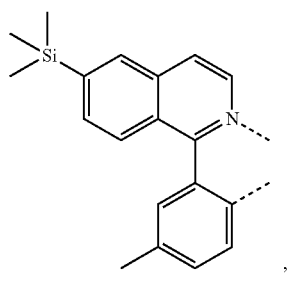 L<sub>x614</sub>
L<sub>x610</sub>
L<sub>x615</sub>
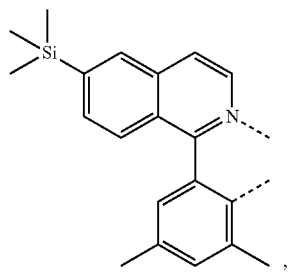 L<sub>x616</sub>
L<sub>x611</sub>
L<sub>x612</sub>
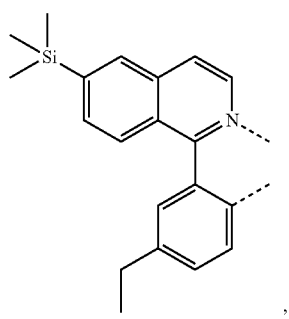 L<sub>x617</sub>
L<sub>x613</sub>
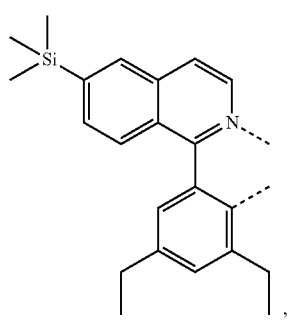
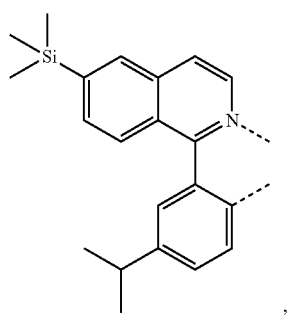 L<sub>x618</sub>

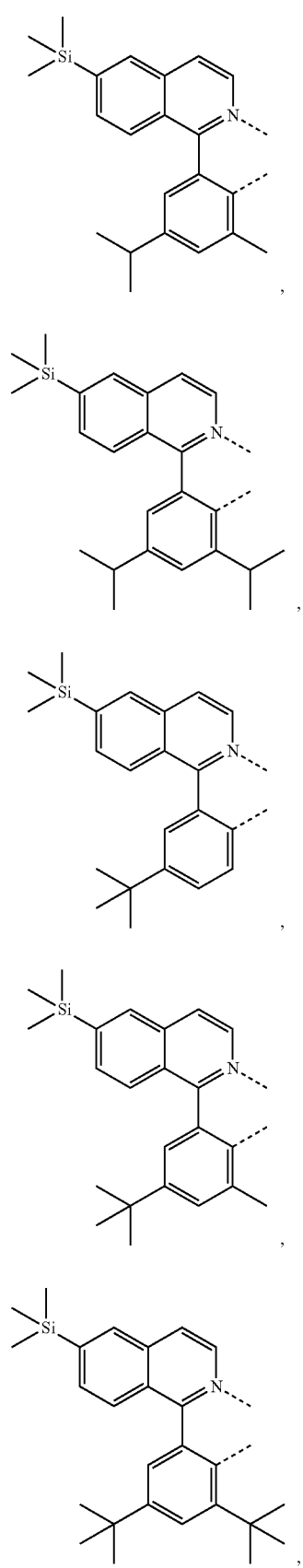
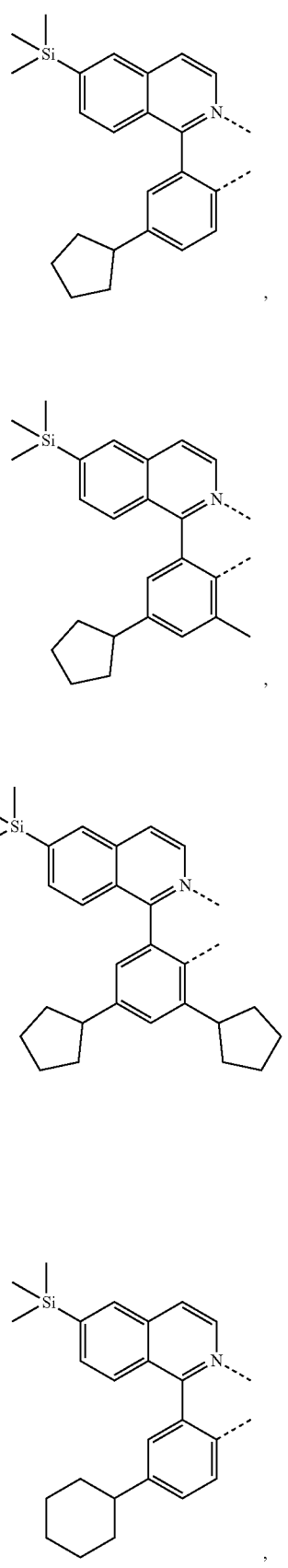

L$_{x628}$ 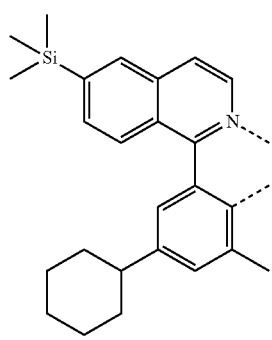
L$_{x629}$ 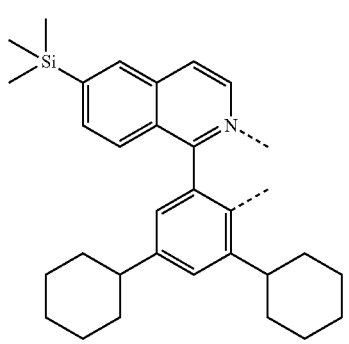
L$_{x630}$ 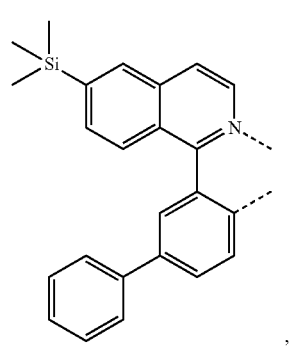
L$_{x631}$ 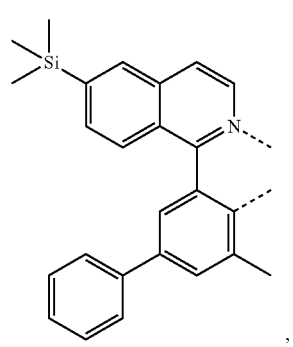
L$_{x632}$ 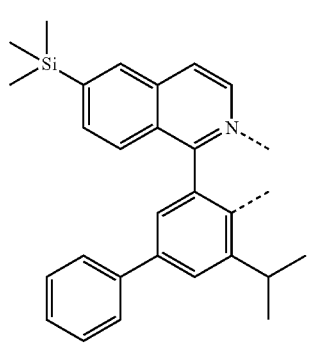
L$_{x633}$ 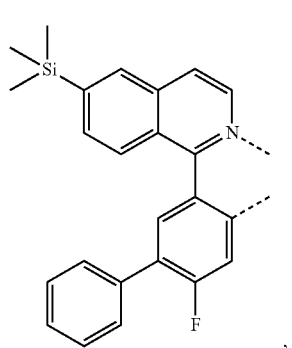
L$_{x634}$ 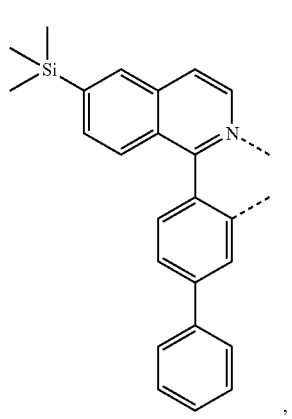
L$_{x635}$ 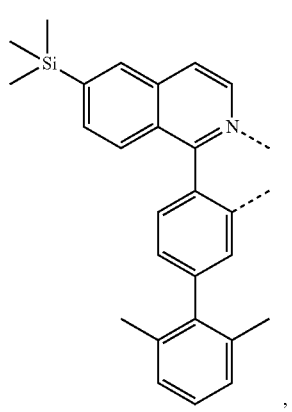

| | |
|---|---|
| $L_{x636}$ 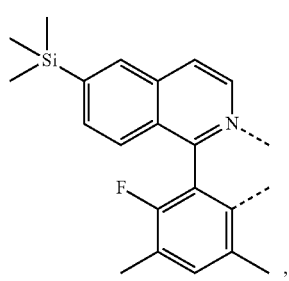 | $L_{x641}$ 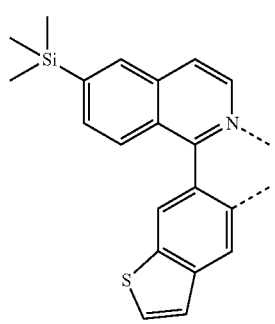 |
| $L_{x637}$ 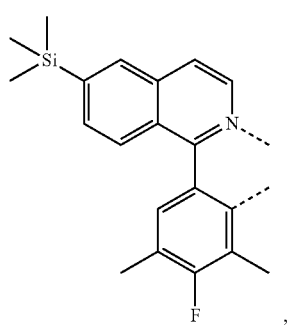 | $L_{x642}$ 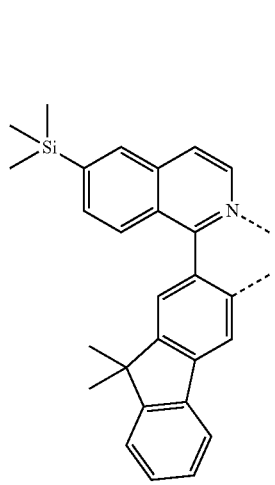 |
| $L_{x638}$ 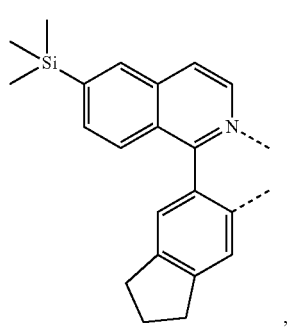 | $L_{x643}$ 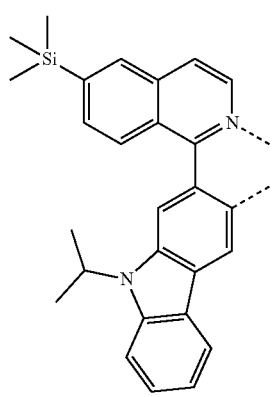 |
| $L_{x639}$ 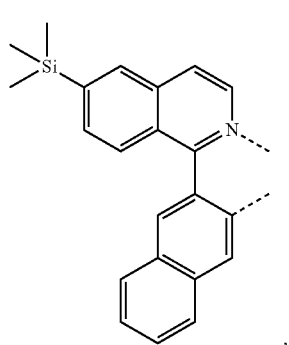 | $L_{x644}$ 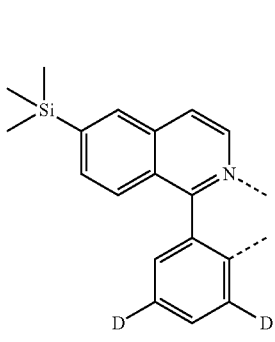 |
| $L_{x640}$ 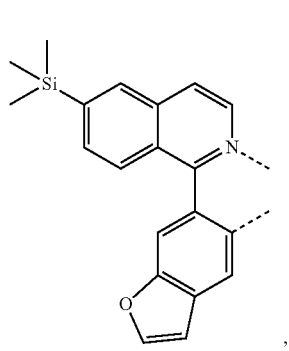 | |

L<sub>x645</sub>
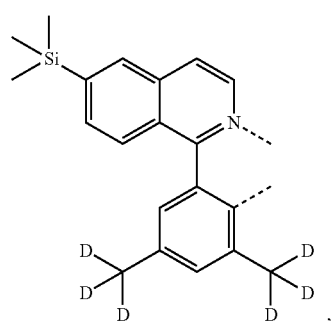
L<sub>x646</sub>
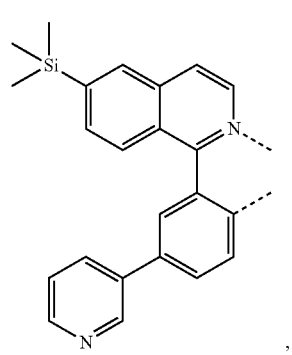
L<sub>x647</sub>
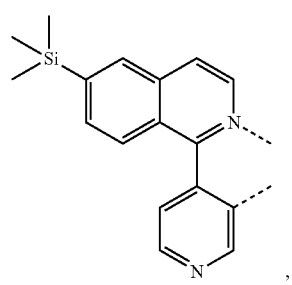
L<sub>x648</sub>
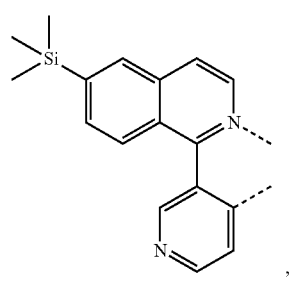
L<sub>x649</sub>
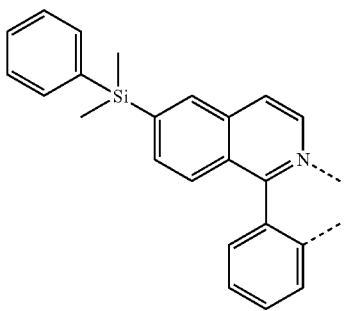
L<sub>x650</sub>
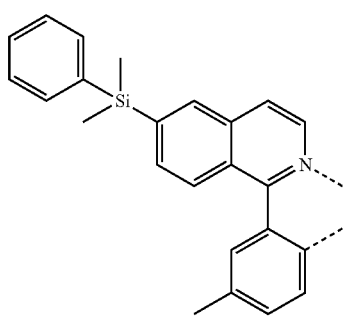
L<sub>x651</sub>
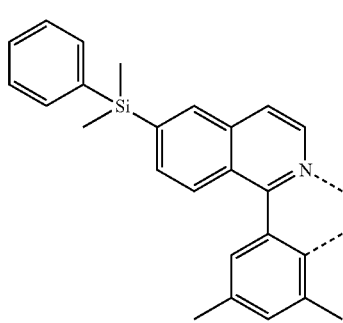
L<sub>x652</sub>
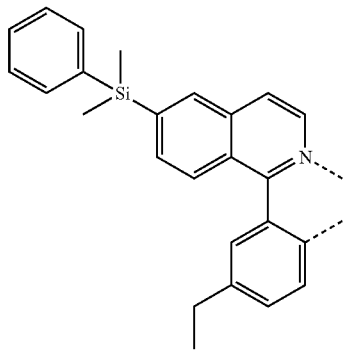
L<sub>x653</sub>
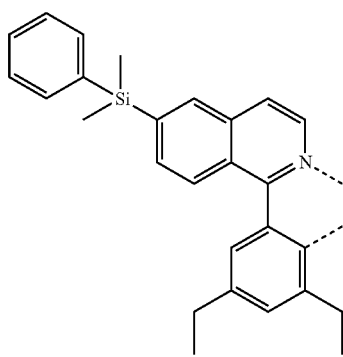

-continued
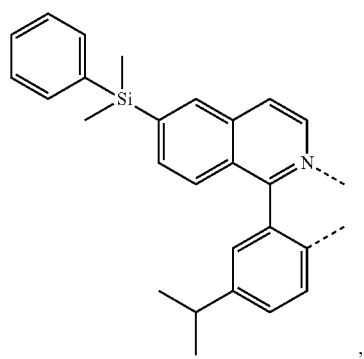
L<sub>x654</sub>
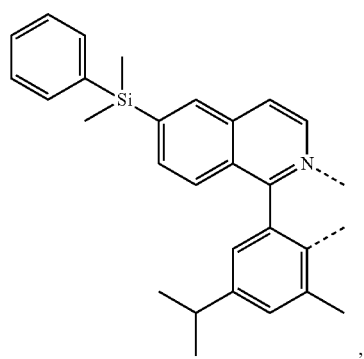
L<sub>x655</sub>
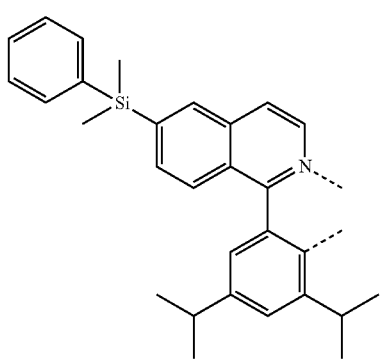
L<sub>x656</sub>
L<sub>x657</sub>
-continued
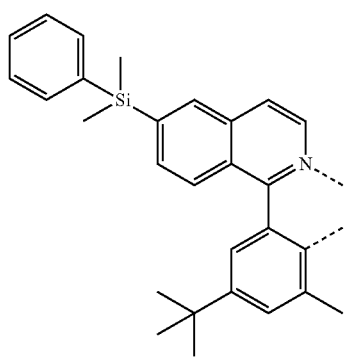
L<sub>x658</sub>
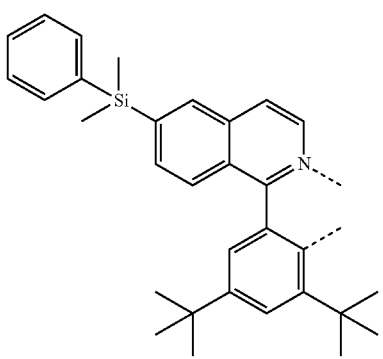
L<sub>x659</sub>
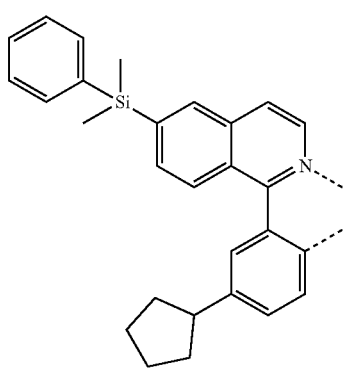
L<sub>x660</sub>
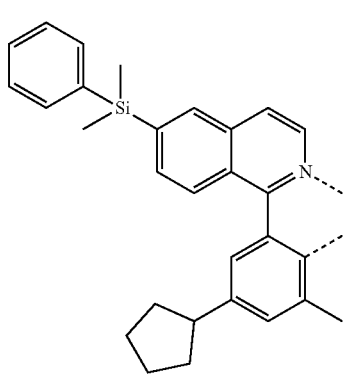
L<sub>x661</sub>

229
-continued
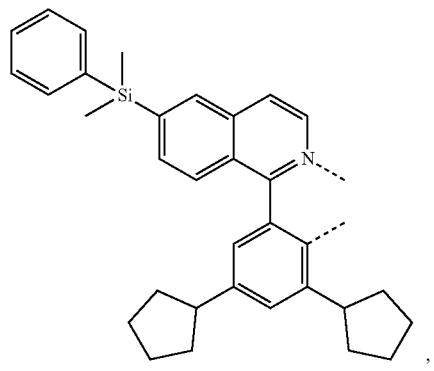
L<sub>x662</sub>
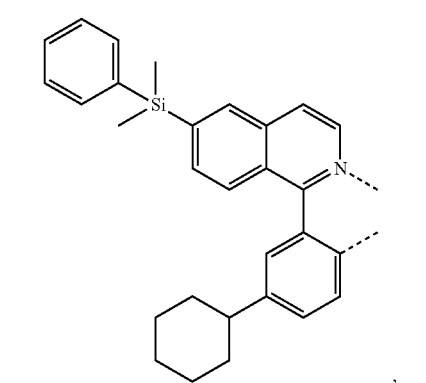
L<sub>x663</sub>
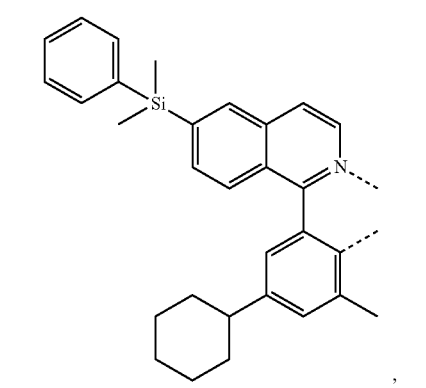
L<sub>x664</sub>
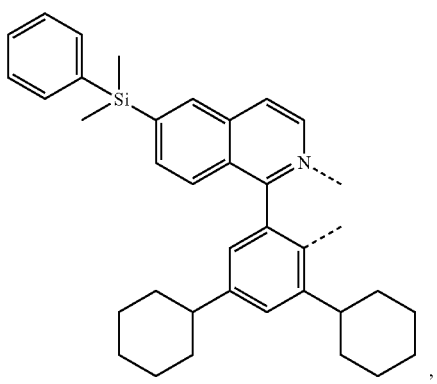
L<sub>x665</sub>
230
-continued
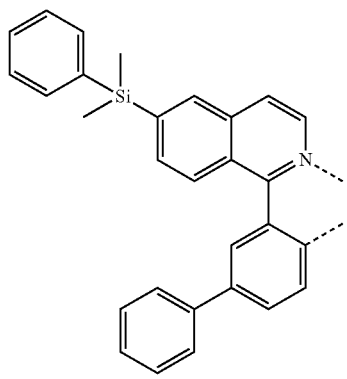
L<sub>x666</sub>
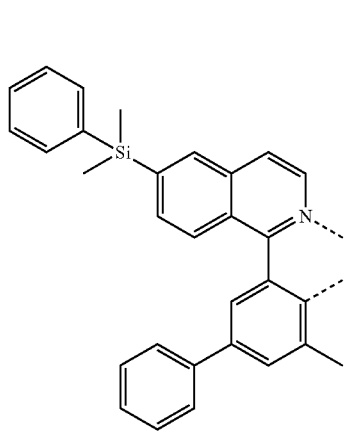
L<sub>x667</sub>
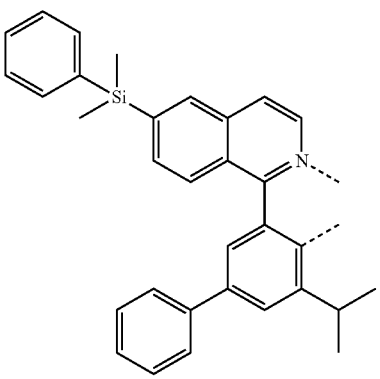
L<sub>x668</sub>
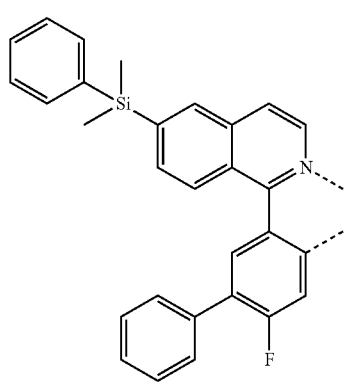
L<sub>x669</sub>

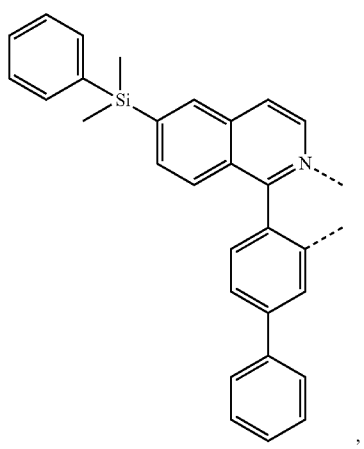, L<sub>x670</sub>
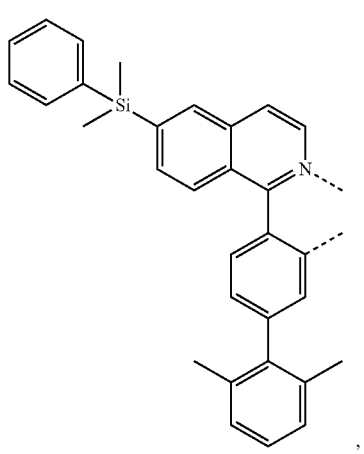, L<sub>x671</sub>
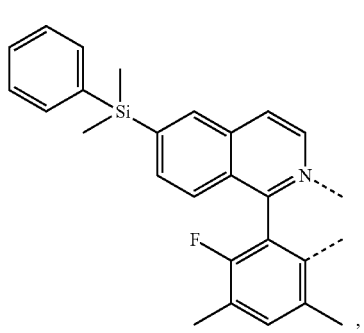, L<sub>x672</sub>
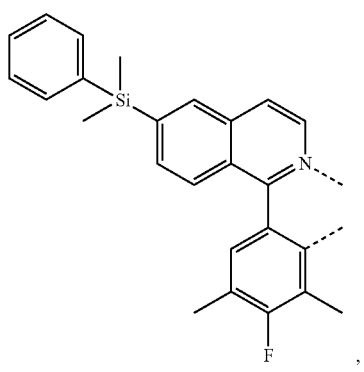, L<sub>x673</sub>
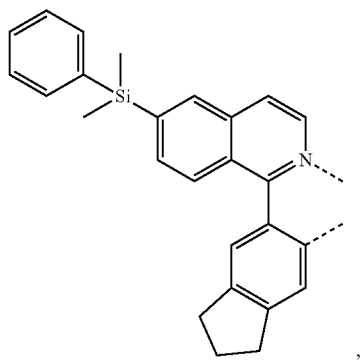, L<sub>x674</sub>
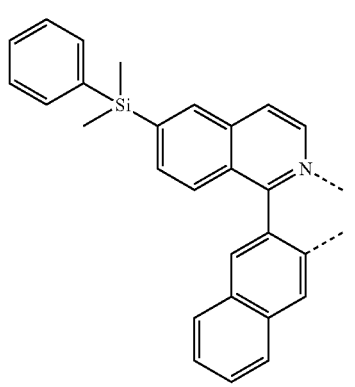, L<sub>x675</sub>
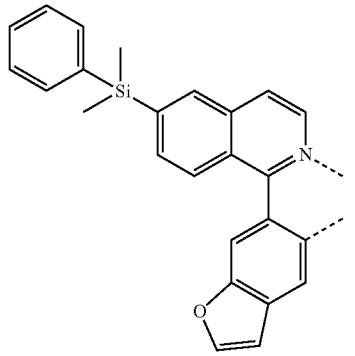, L<sub>x676</sub>
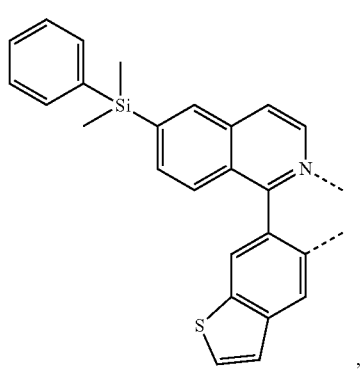, L<sub>x677</sub>

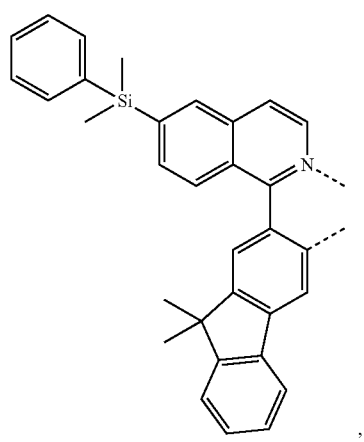  L<sub>x678</sub>
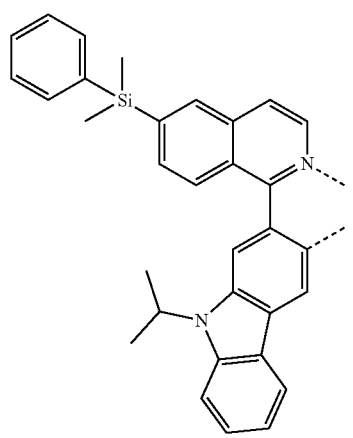  L<sub>x679</sub>
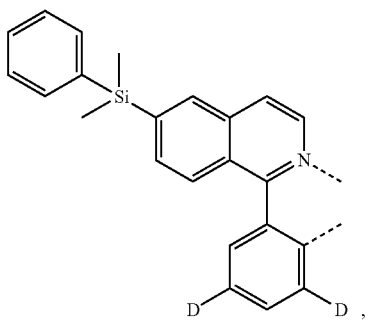  L<sub>x680</sub>
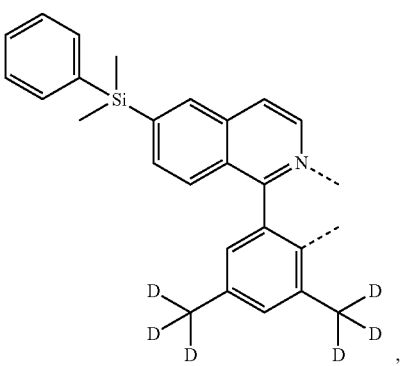  L<sub>x681</sub>
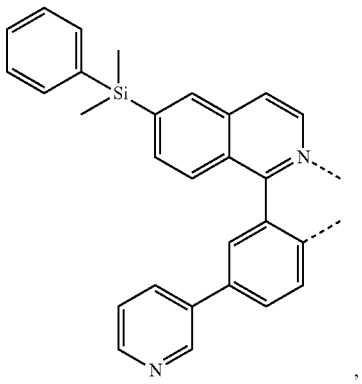  L<sub>x682</sub>
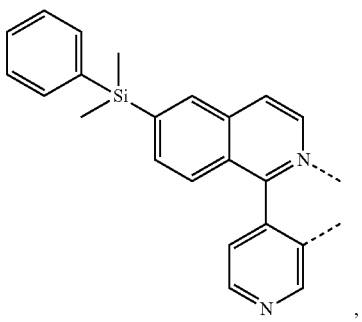  L<sub>x683</sub>
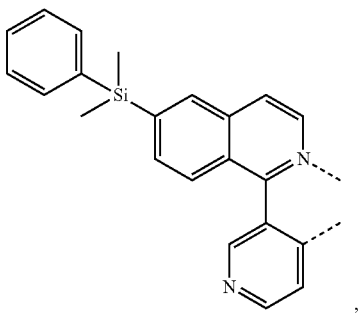  L<sub>x684</sub>
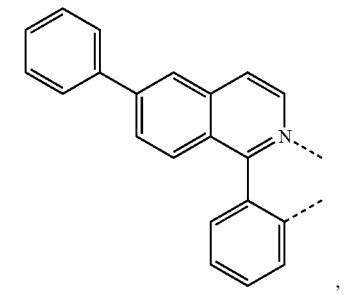  L<sub>x685</sub>
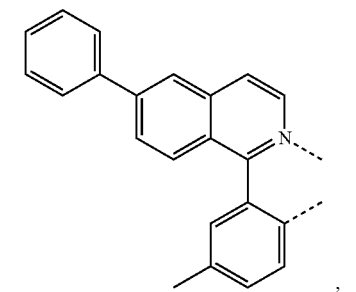  L<sub>x686</sub>

-continued
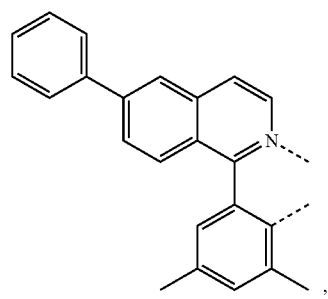
L<sub>x687</sub>
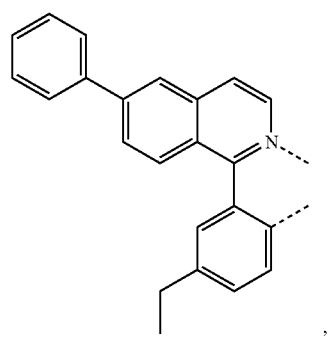
L<sub>x688</sub>
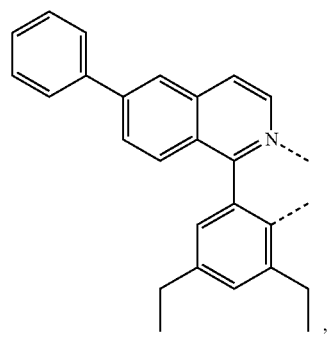
L<sub>x689</sub>
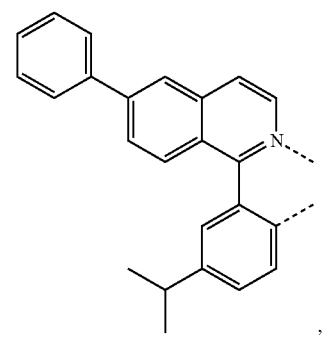
L<sub>x690</sub>
-continued
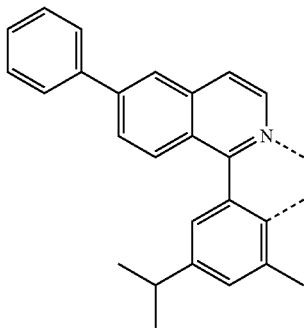
L<sub>x691</sub>
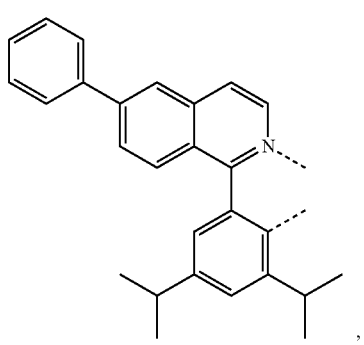
L<sub>x692</sub>
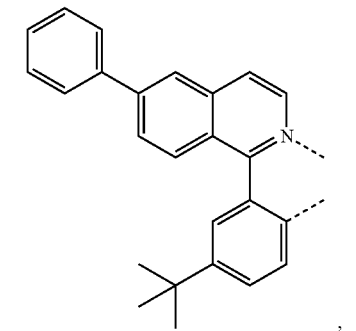
L<sub>x693</sub>
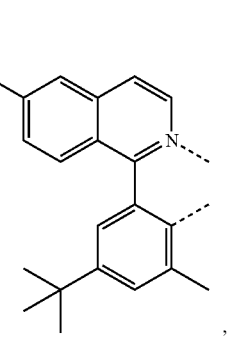
L<sub>x694</sub>

-continued
L<sub>x695</sub>
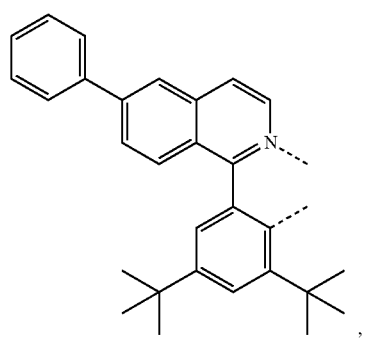
L<sub>x696</sub>
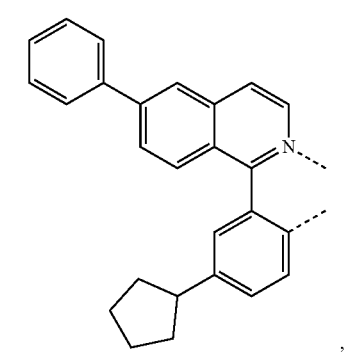
L<sub>x697</sub>
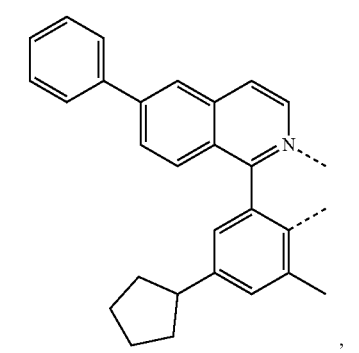
L<sub>x698</sub>
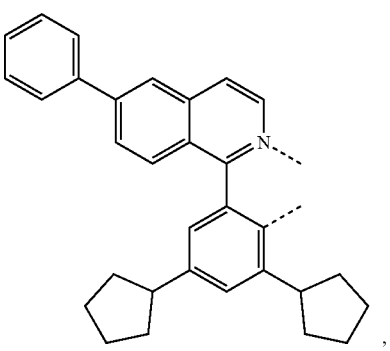
-continued
L<sub>x699</sub>
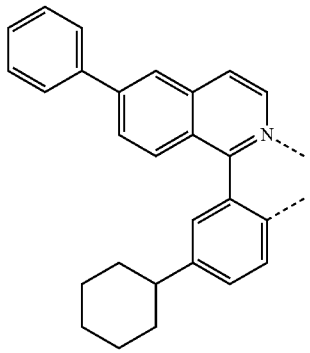
L<sub>x700</sub>
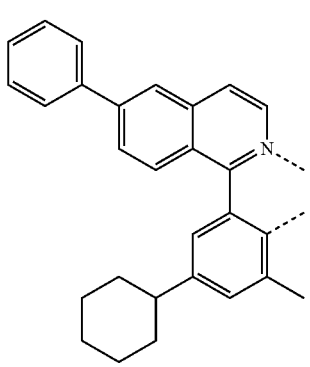
L<sub>x701</sub>
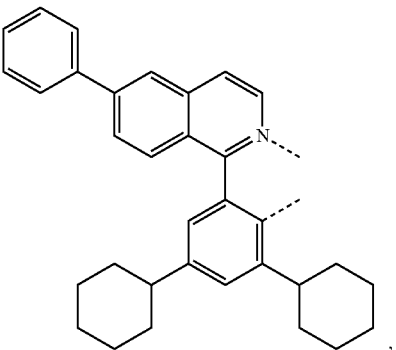
L<sub>x702</sub>
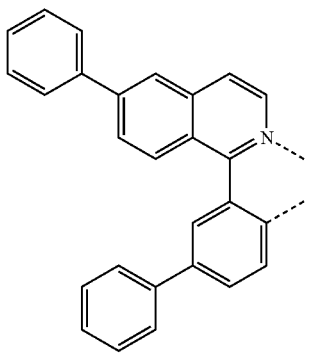

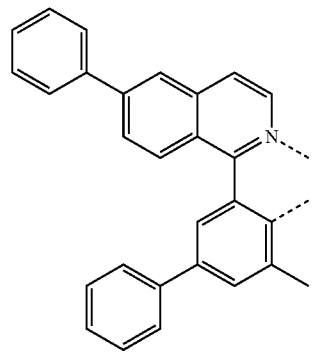 L<sub>x703</sub>
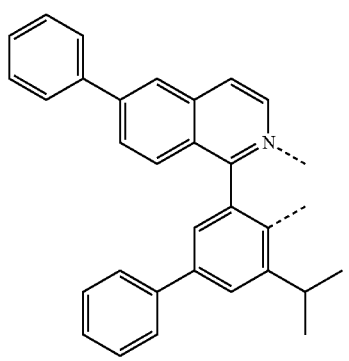 L<sub>x704</sub>
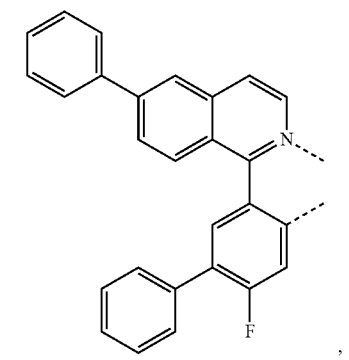 L<sub>x705</sub>
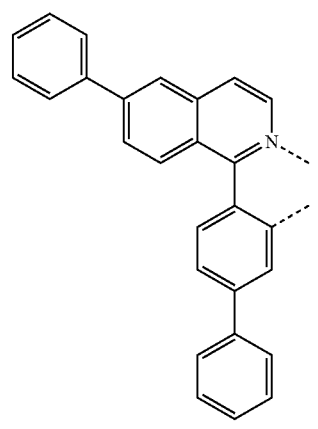 L<sub>x706</sub>
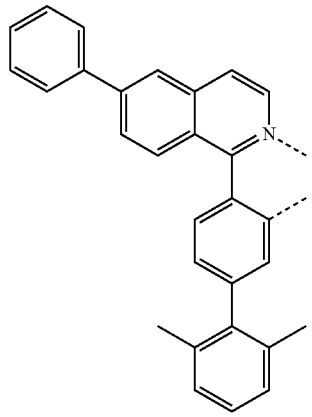 L<sub>x707</sub>
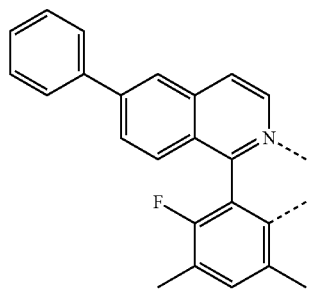 L<sub>x708</sub>
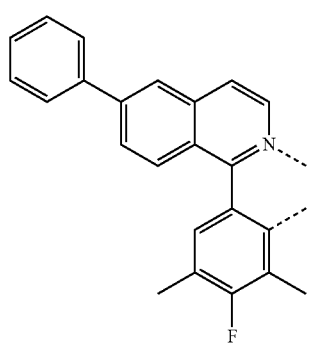 L<sub>x709</sub>
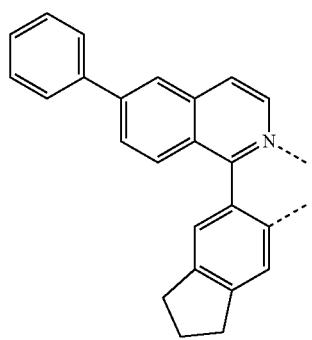 L<sub>x710</sub>

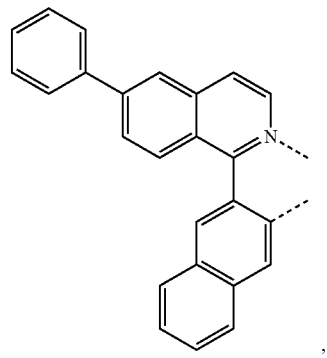
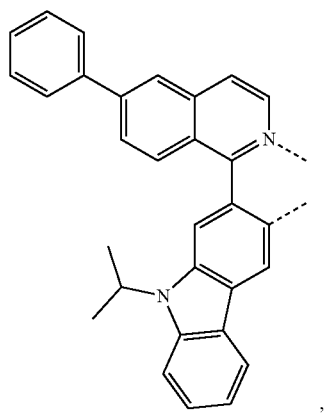

L_x719
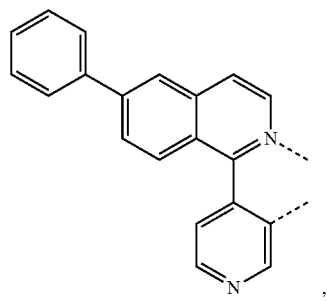
L_x720
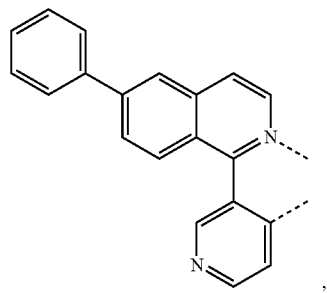
L_x721
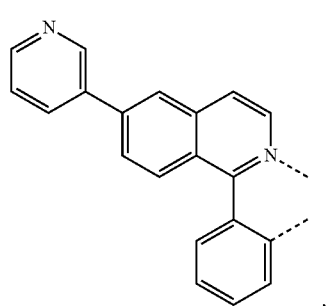
L_x722
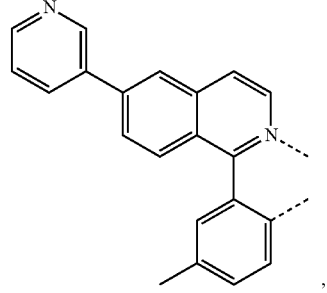
L_x723
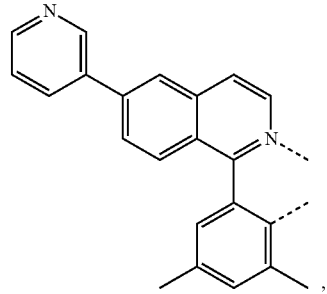
L_x724
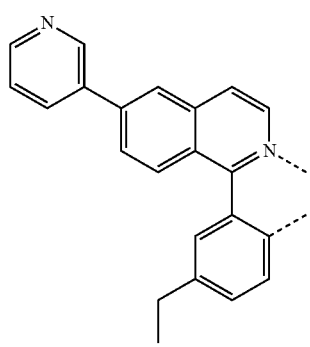
L_x725
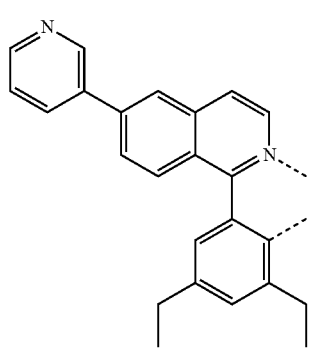
L_x726
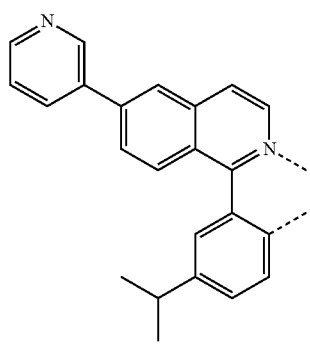
L_x727
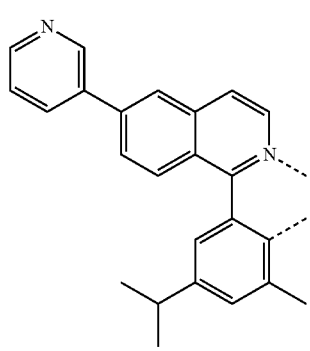

-continued
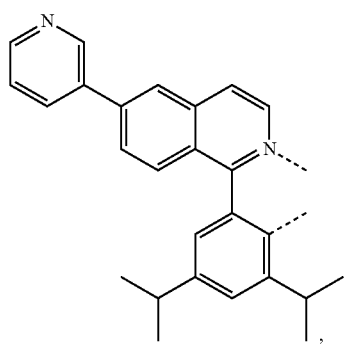 L<sub>x728</sub>
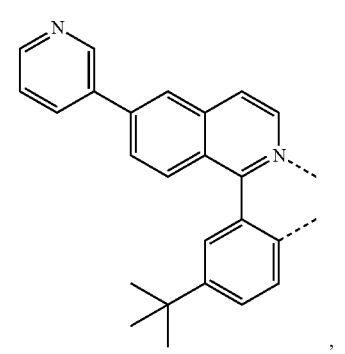 L<sub>x729</sub>
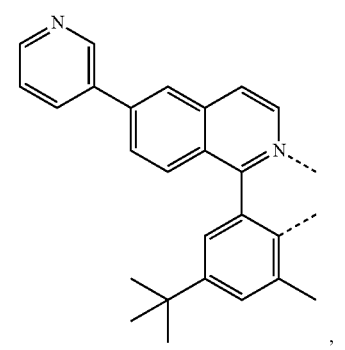 L<sub>x730</sub>
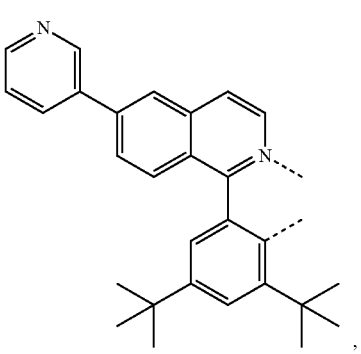 L<sub>x731</sub>
-continued
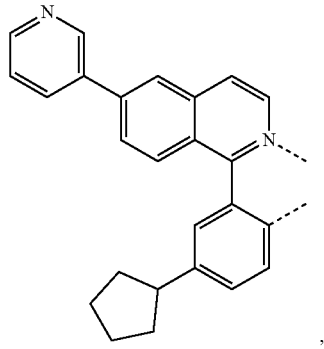 L<sub>x732</sub>
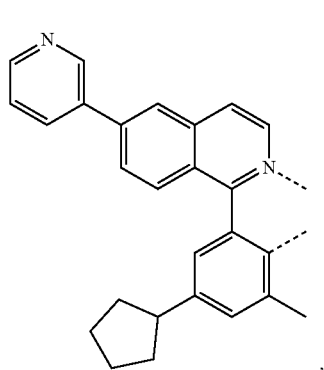 L<sub>x733</sub>
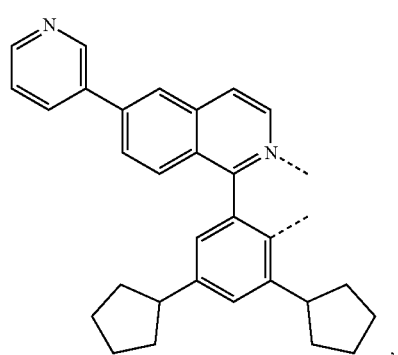 L<sub>x734</sub>
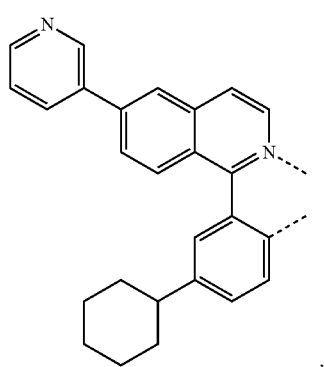 L<sub>x735</sub>

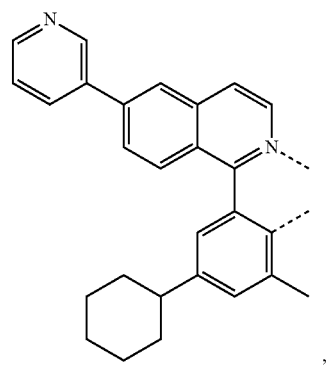
L<sub>x737</sub>
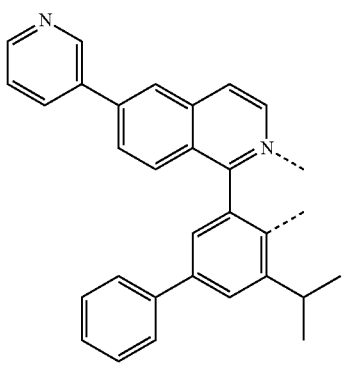 L<sub>x740</sub>
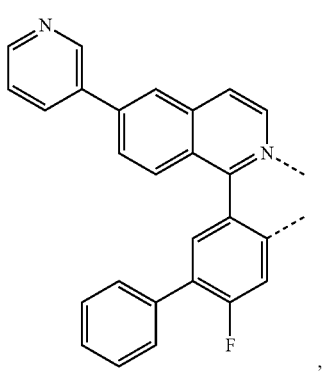 L<sub>x741</sub>
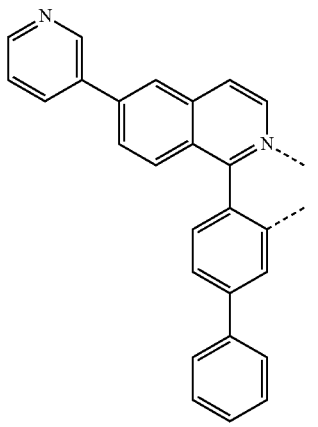 L<sub>x742</sub>
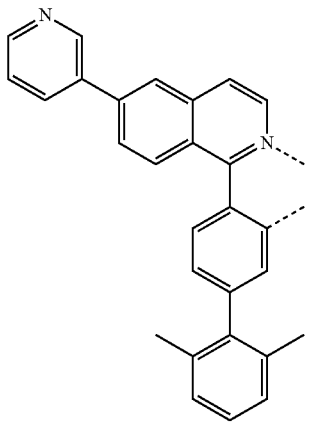 L<sub>x743</sub>

249
-continued
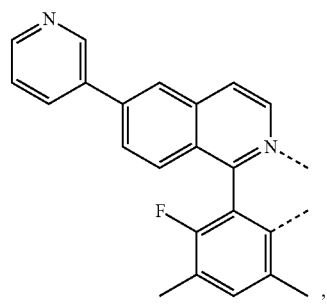 L$_{x744}$
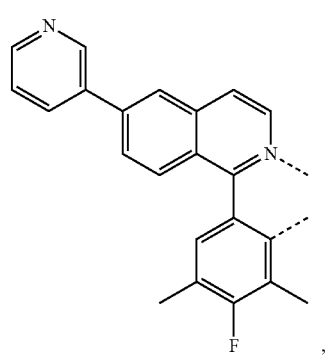 L$_{x745}$
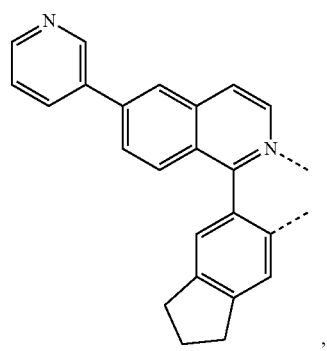 L$_{x746}$
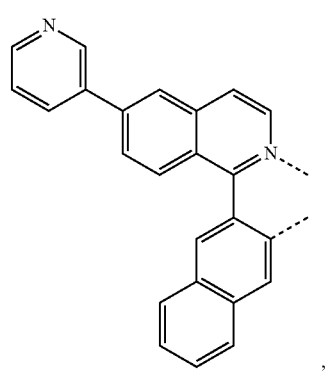 L$_{x747}$
250
-continued
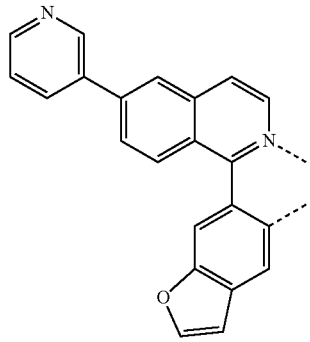 L$_{x748}$
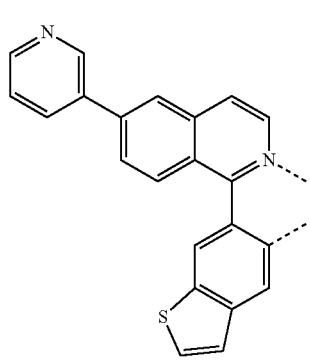 L$_{x749}$
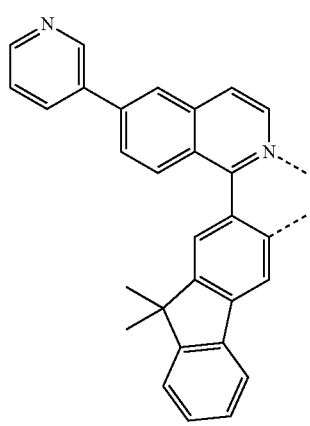 L$_{x750}$
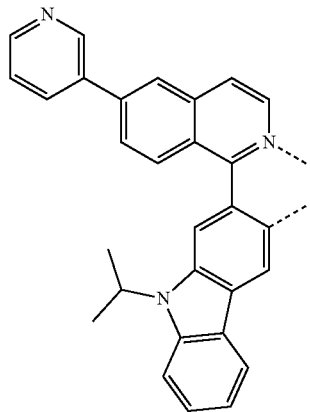 L$_{x751}$

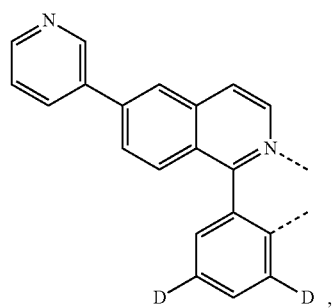 $L_{x752}$
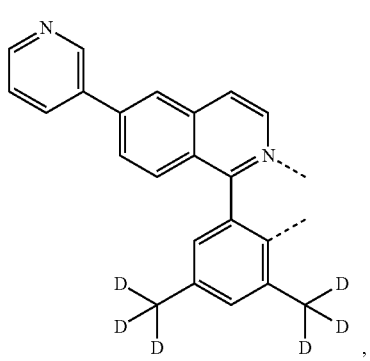 $L_{x753}$
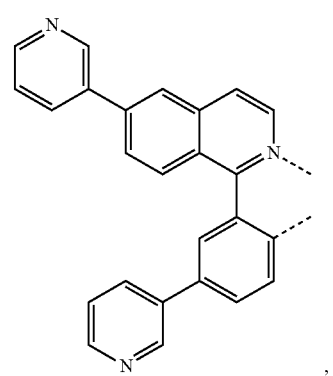 $L_{x754}$
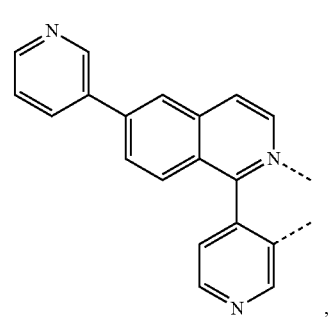 $L_{x755}$
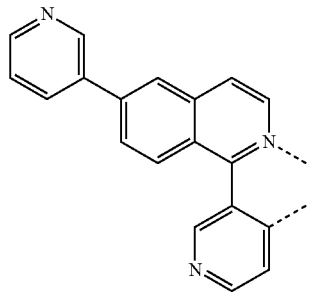 $L_{x756}$
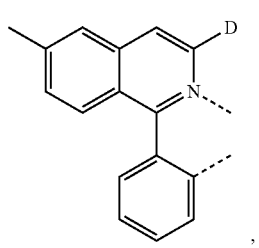 $L_{x757}$
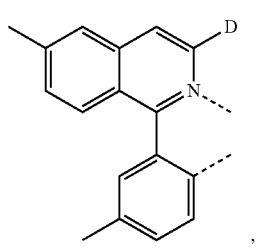 $L_{x758}$
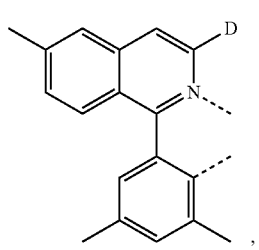 $L_{x759}$
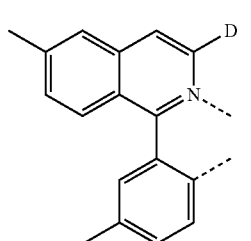 $L_{x760}$
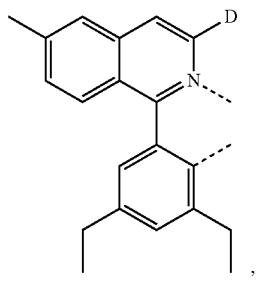 $L_{x761}$

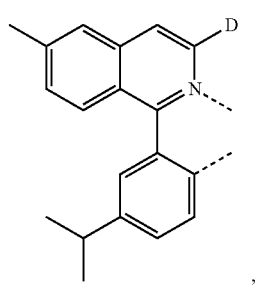 $L_{x762}$
,
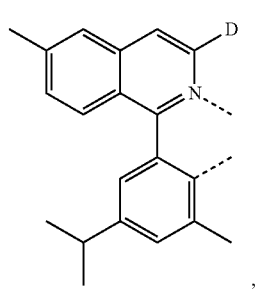 $L_{x763}$
,
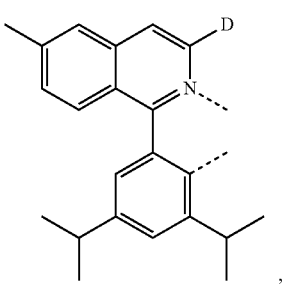 $L_{x764}$
,
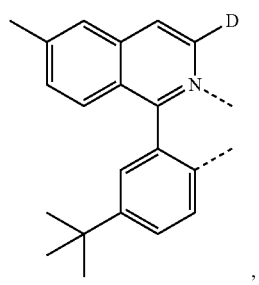 $L_{x765}$
,
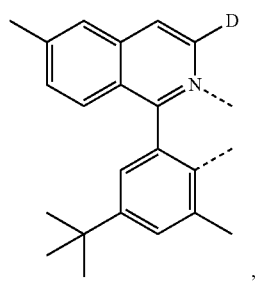 $L_{x766}$
,
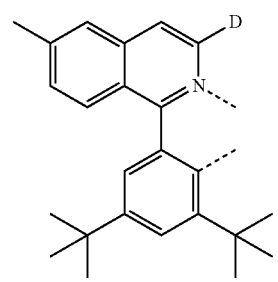 $L_{x767}$
,
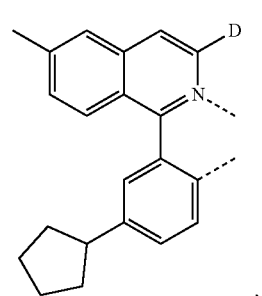 $L_{x768}$
,
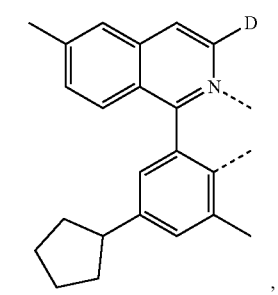 $L_{x769}$
,
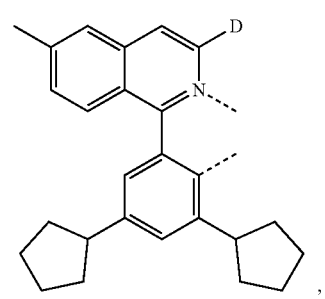 $L_{x770}$
,
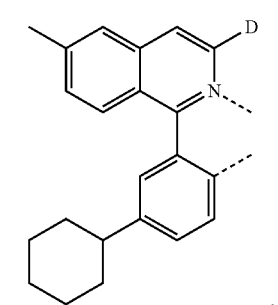 $L_{x771}$
,

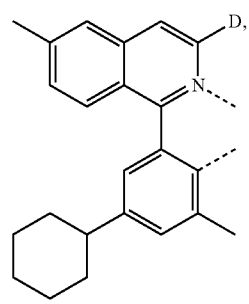 L$_{x772}$
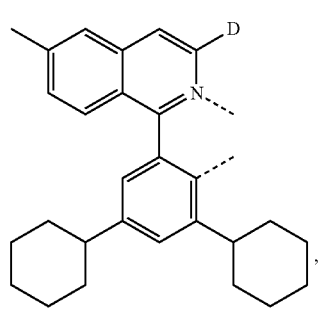 L$_{x773}$
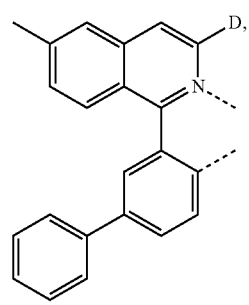 L$_{x774}$
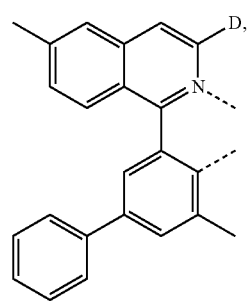 L$_{x775}$
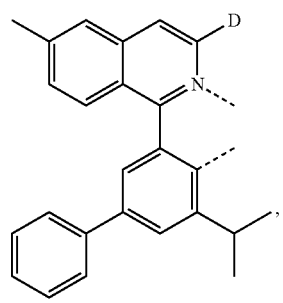 L$_{x776}$
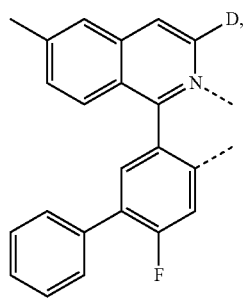 L$_{x777}$
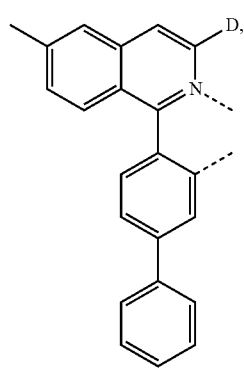 L$_{x778}$
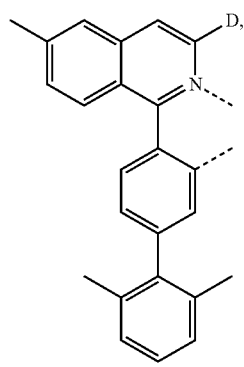 L$_{x779}$
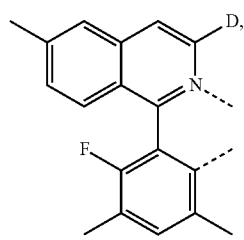 L$_{x780}$
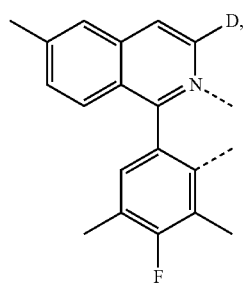 L$_{x781}$

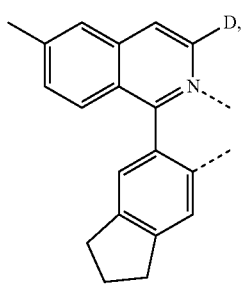 L_{x782}
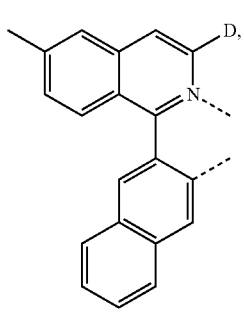 L_{x783}
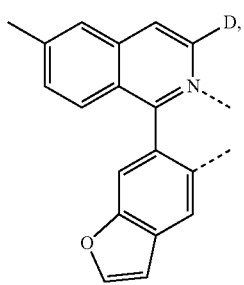 L_{x784}
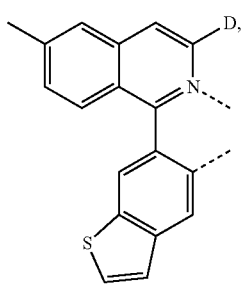 L_{x785}
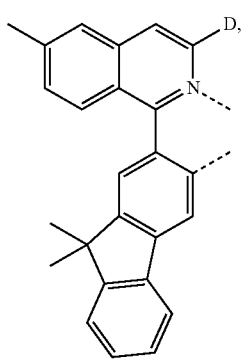 L_{x786}
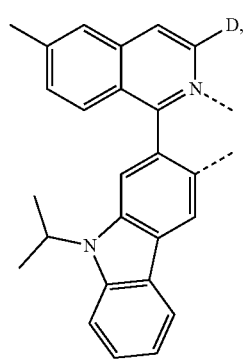 L_{x787}
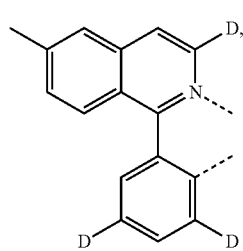 L_{x788}
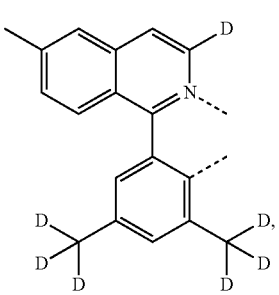 L_{x789}
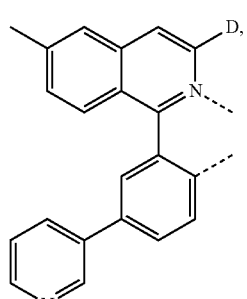 L_{x790}
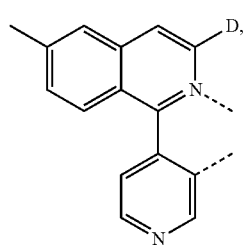 L_{x791}

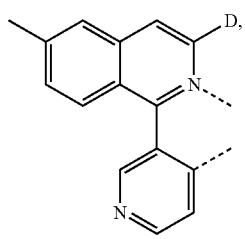 L<sub>x792</sub>
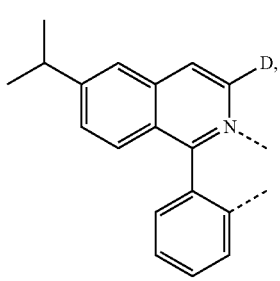 L<sub>x793</sub>
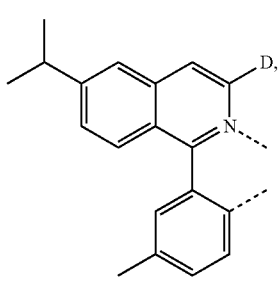 L<sub>x794</sub>
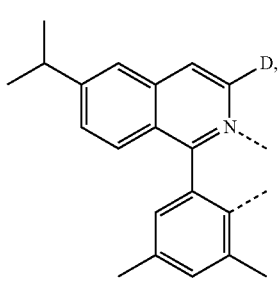 L<sub>x795</sub>
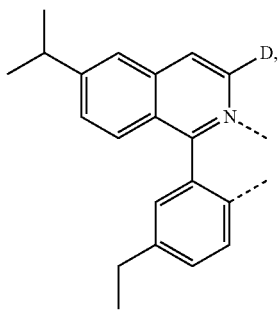 L<sub>x796</sub>
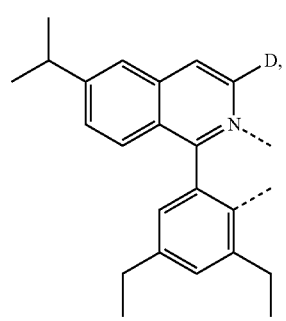 L<sub>x797</sub>
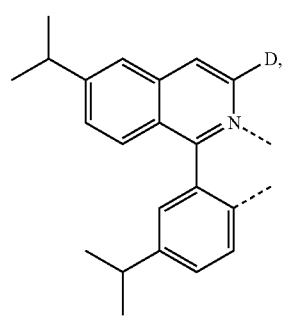 L<sub>x798</sub>
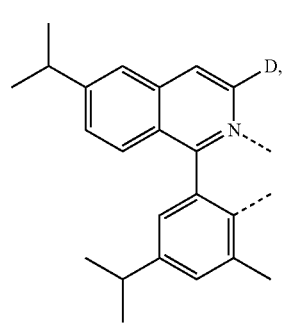 L<sub>x799</sub>
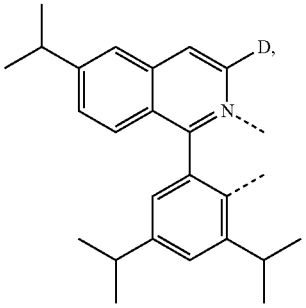 L<sub>x800</sub>
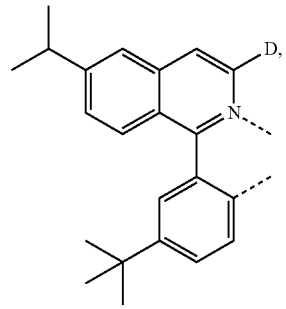 L<sub>x801</sub>

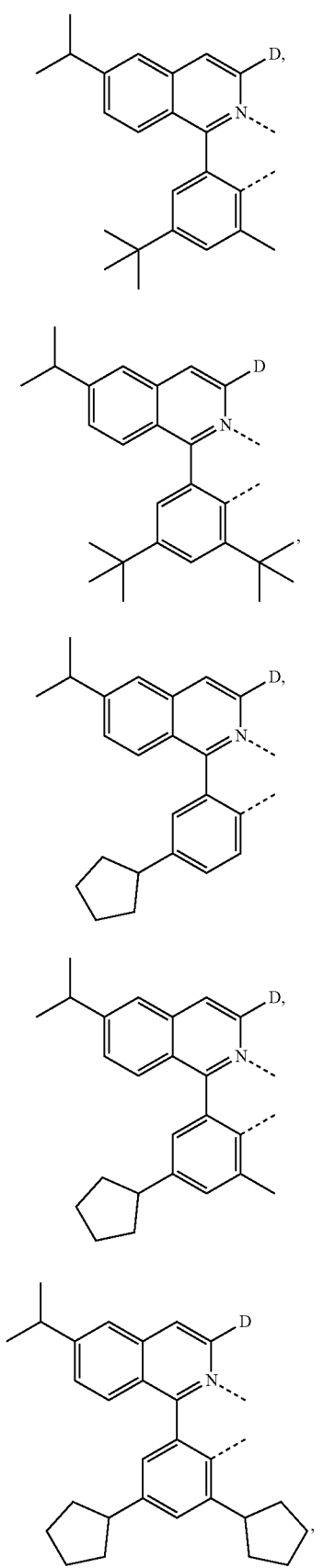
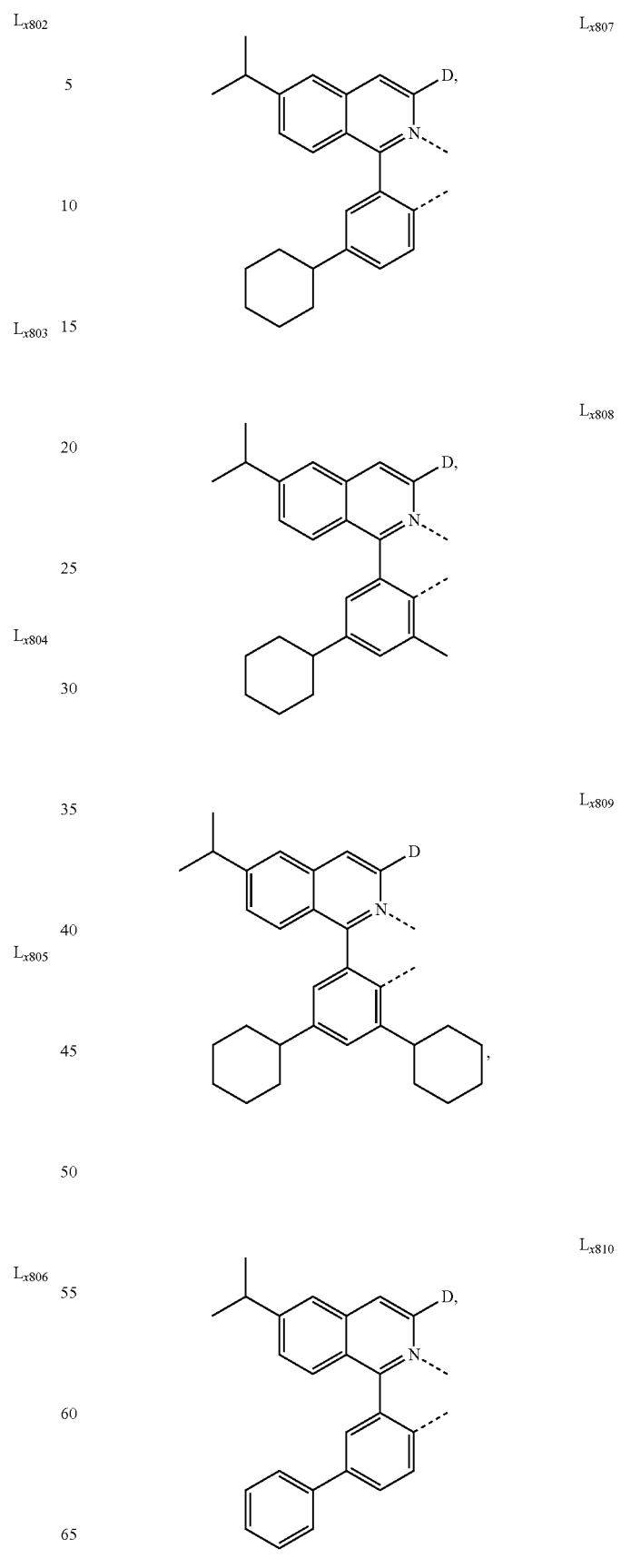

| | |
|---|---|
| L<sub>x811</sub> 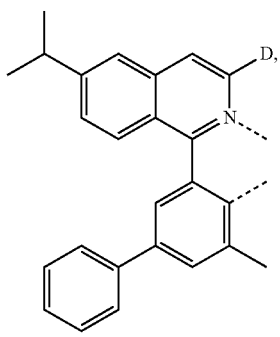 | L<sub>x815</sub> 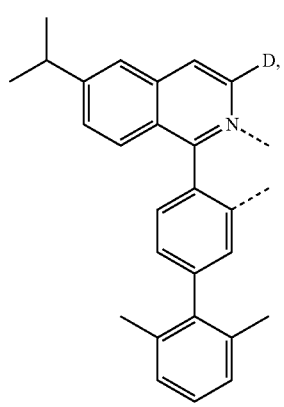 |
| L<sub>x812</sub> 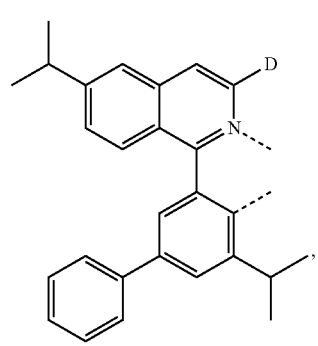 | L<sub>x816</sub> 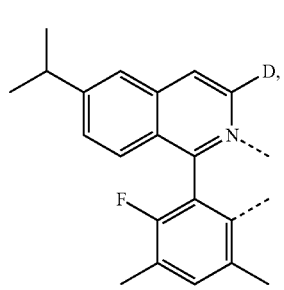 |
| L<sub>x813</sub> 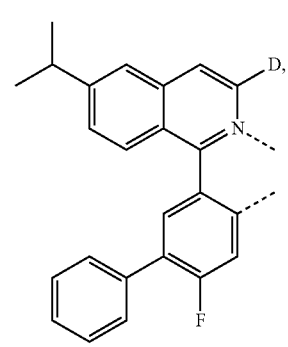 | L<sub>x817</sub> 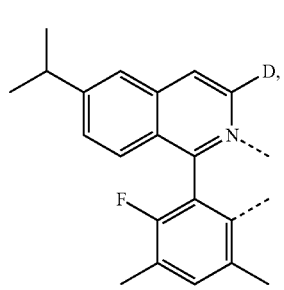 |
| L<sub>x814</sub> 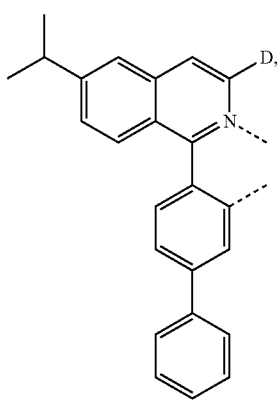 | L<sub>x818</sub> |

L<sub>x819</sub>
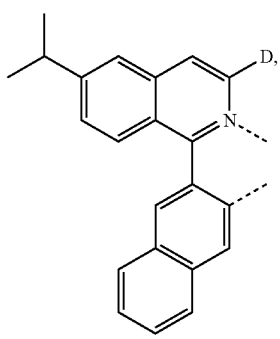
L<sub>x820</sub>
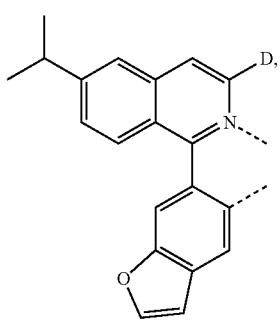
L<sub>x821</sub>
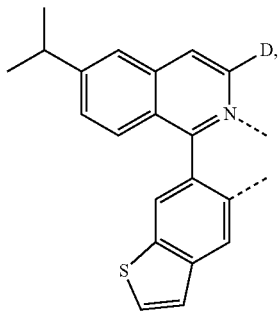
L<sub>x822</sub>
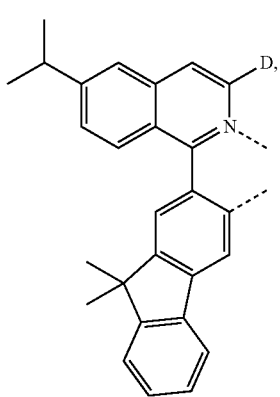
L<sub>x823</sub>
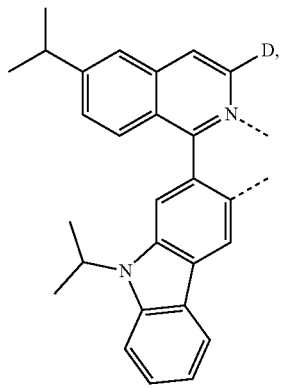
L<sub>x824</sub>
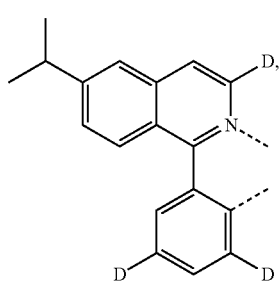
L<sub>x825</sub>
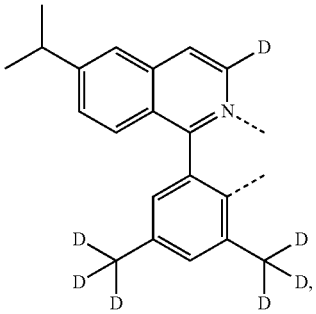
L<sub>x826</sub>
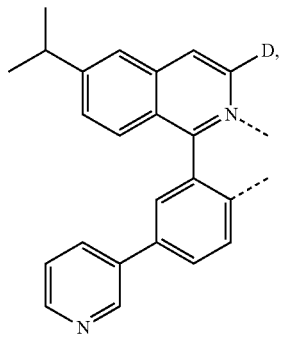
L<sub>x827</sub>
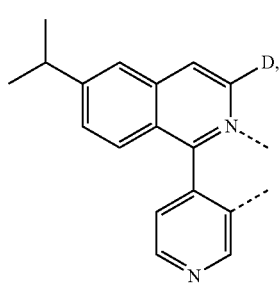

-continued
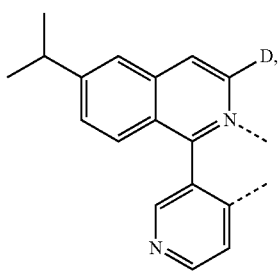 L_{x828}
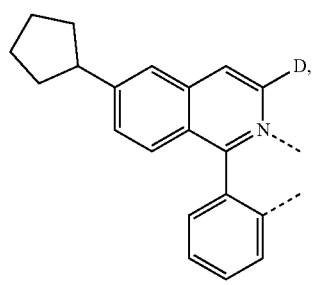 L_{x829}
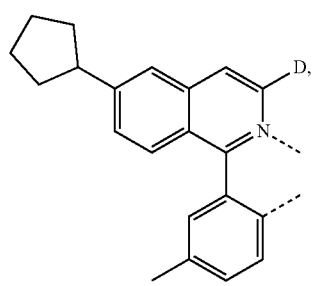 L_{x830}
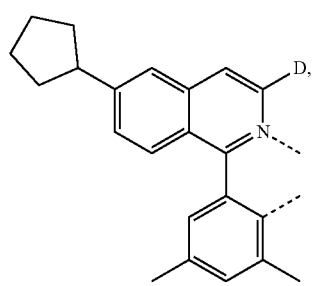 L_{x831}
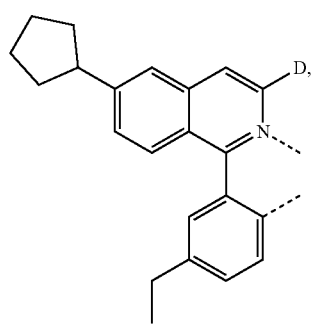 L_{x832}
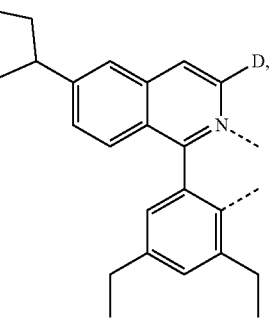 L_{x833}
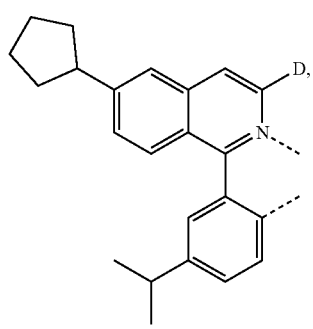 L_{x834}
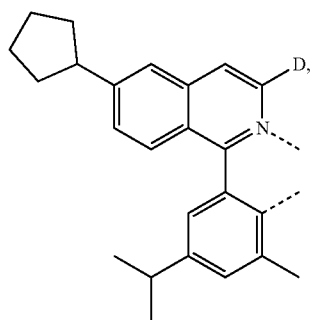 L_{x835}
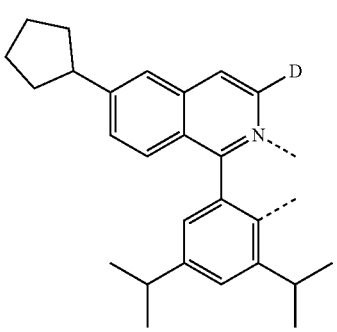 L_{x836}
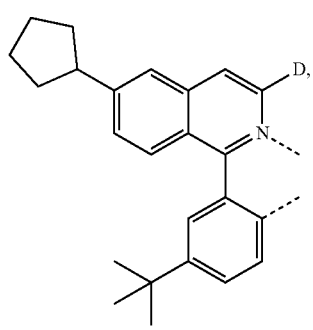 L_{x837}

269
-continued
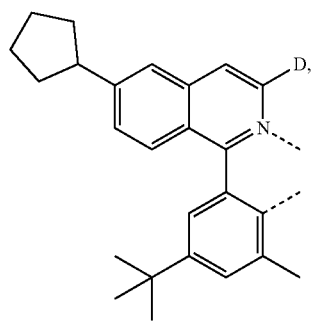
L<sub>x838</sub>
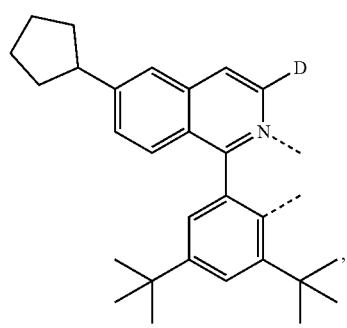
L<sub>x839</sub>
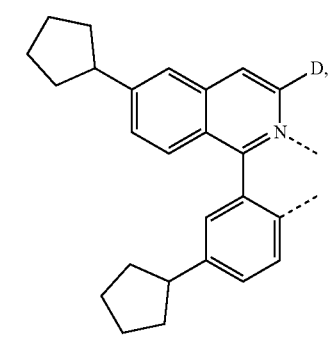
L<sub>x840</sub>
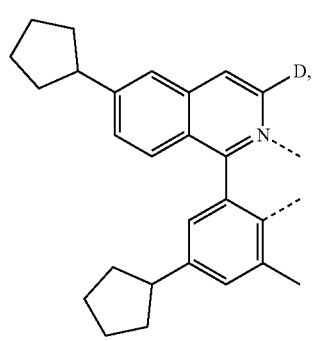
L<sub>x841</sub>
270
-continued
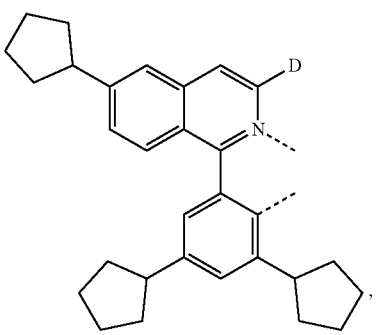
L<sub>x842</sub>
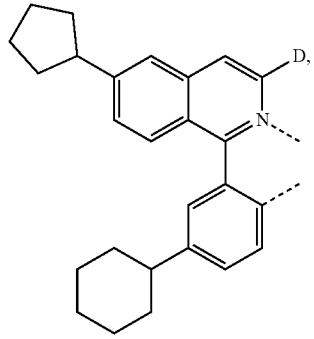
L<sub>x843</sub>
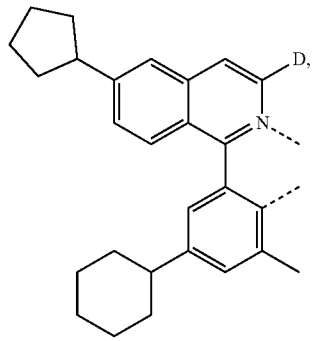
L<sub>x844</sub>
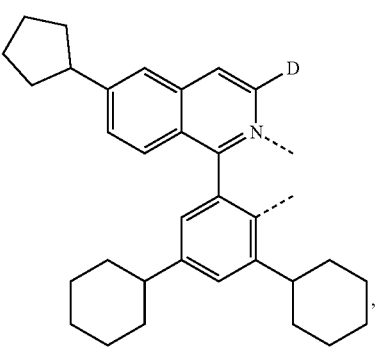
L<sub>x845</sub>

-continued
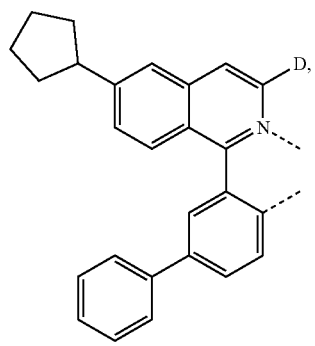
L<sub>x846</sub>
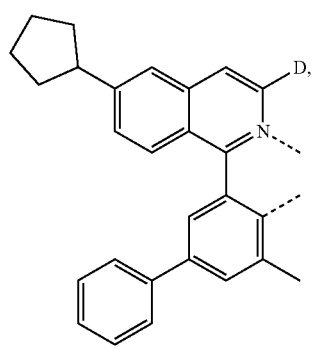
L<sub>x847</sub>
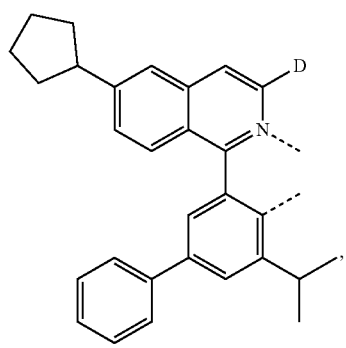
L<sub>x848</sub>
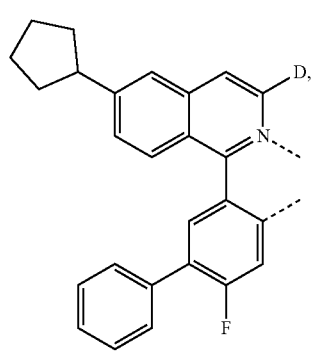
L<sub>x849</sub>
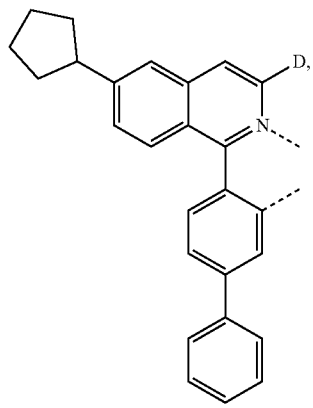
L<sub>x850</sub>
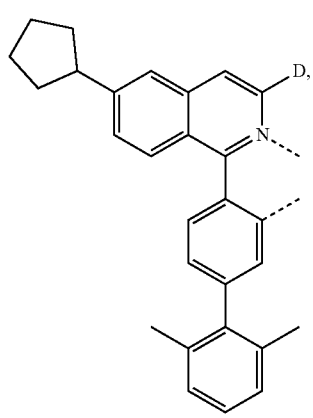
L<sub>x851</sub>
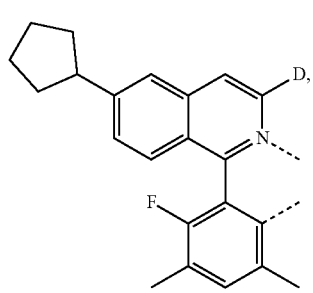
L<sub>x852</sub>
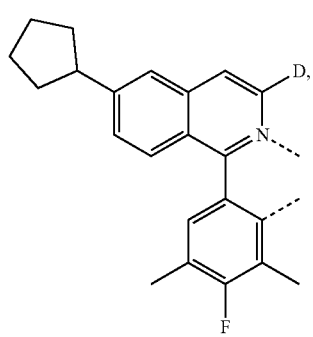
L<sub>x853</sub>

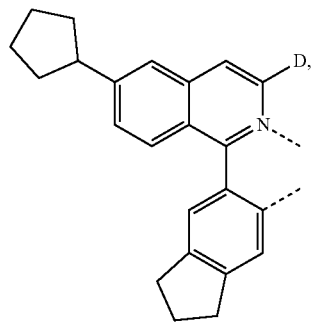 L_{x854}
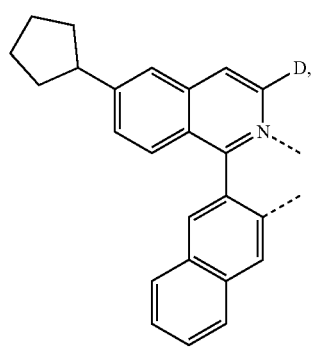 L_{x855}
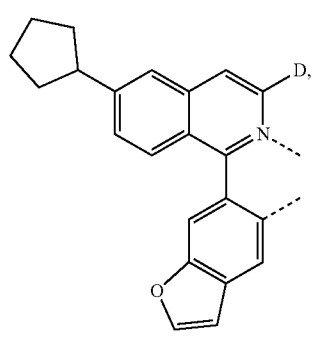 L_{x856}
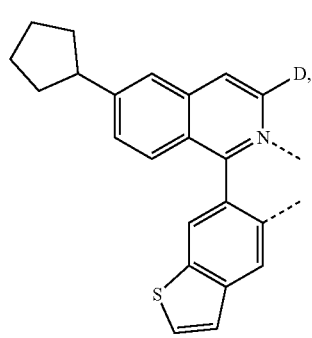 L_{x857}
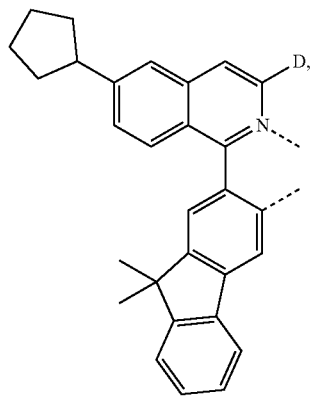 L_{x858}
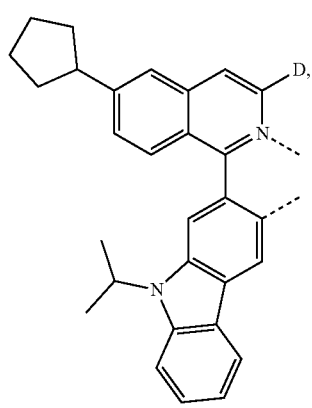 L_{x859}
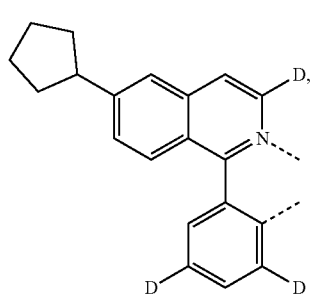 L_{x860}
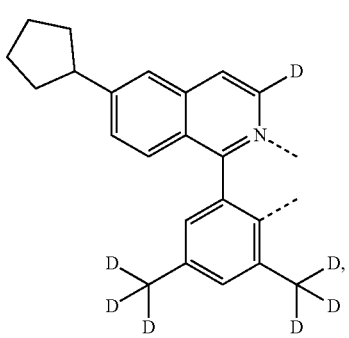 L_{x861}

| | |
|---|---|
| L_x862 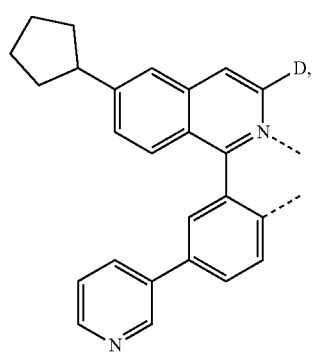 | L_x867 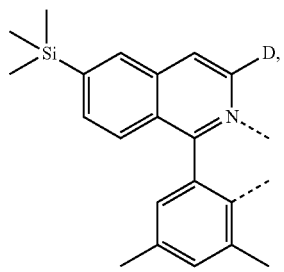 |
| L_x863 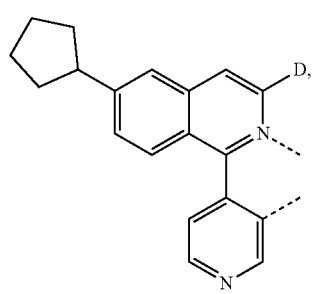 | L_x868 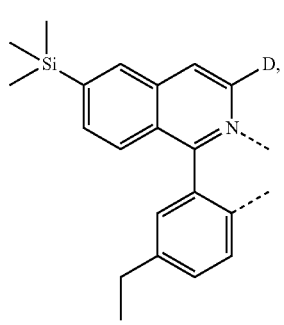 |
| L_x864 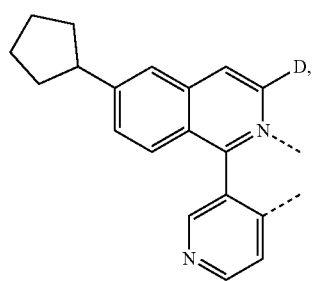 | L_x869 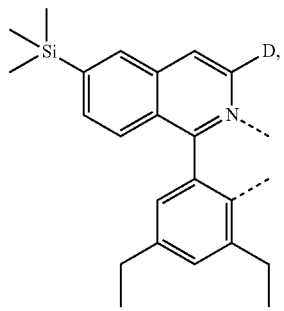 |
| L_x865 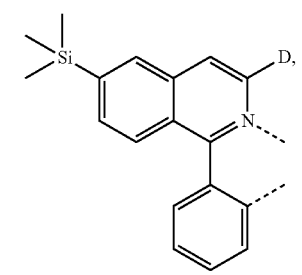 | L_x870 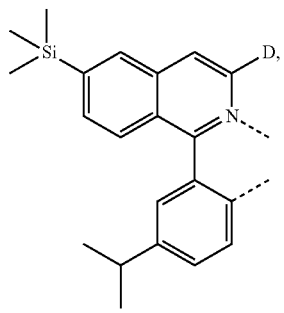 |
| L_x866 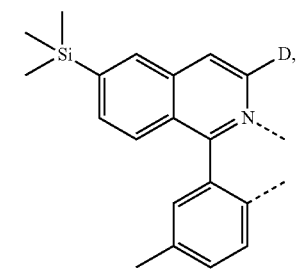 | L_x871 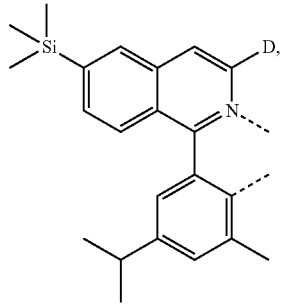 |

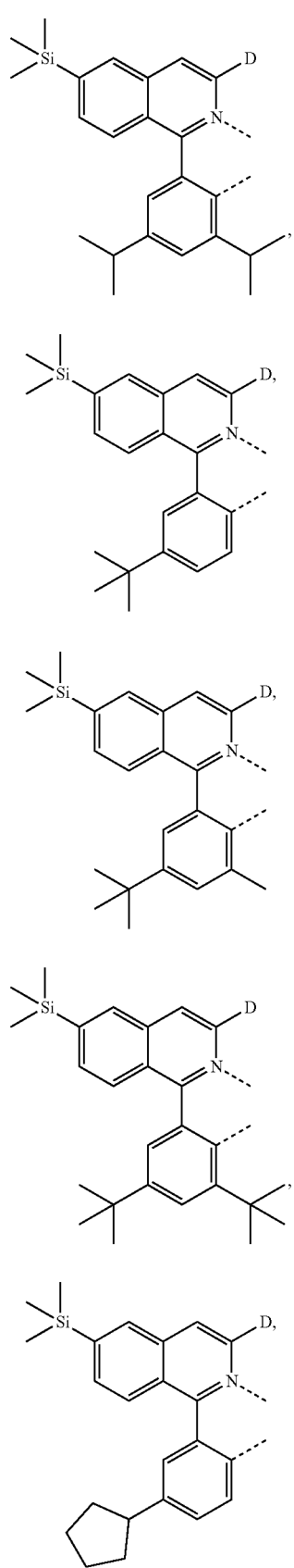
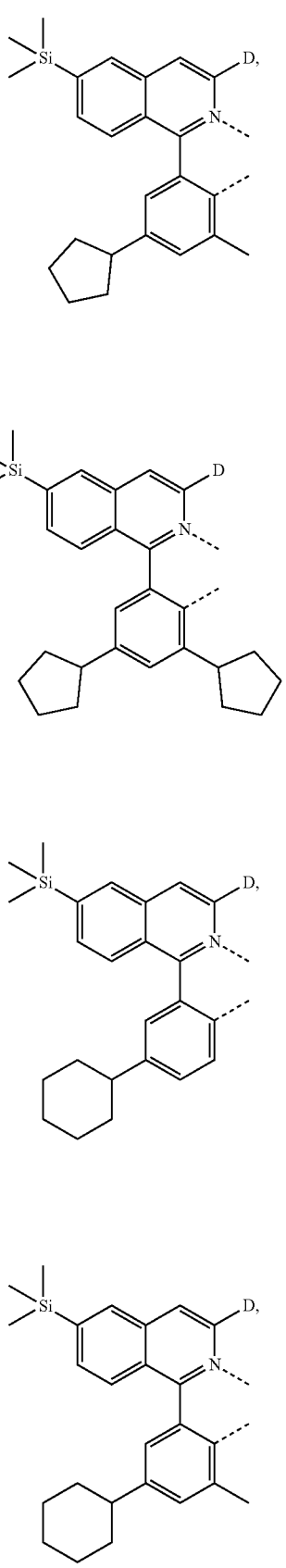

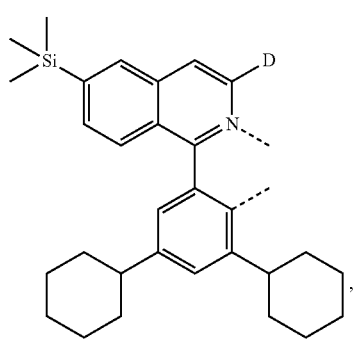
L<sub>x881</sub>
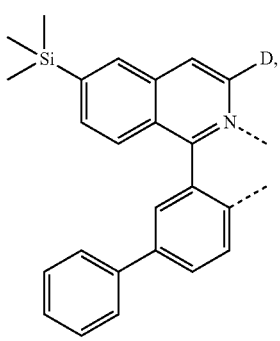
L<sub>x882</sub>
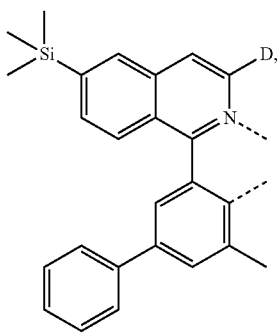
L<sub>x883</sub>
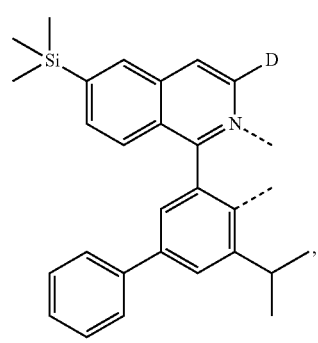
L<sub>x884</sub>
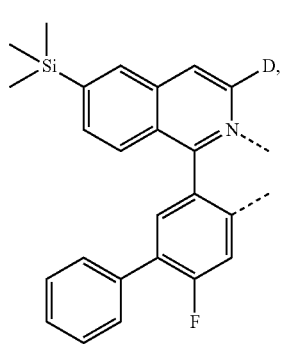
L<sub>x885</sub>
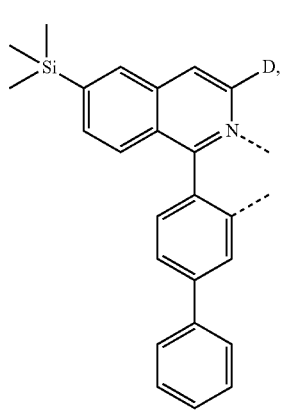
L<sub>x886</sub>
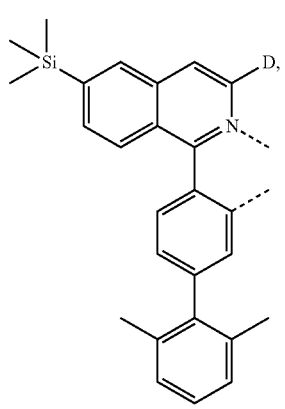
L<sub>x887</sub>
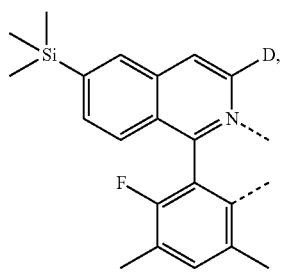
L<sub>x888</sub>

L_x889 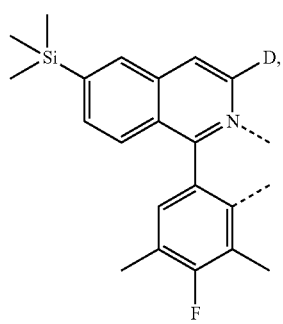
L_x890 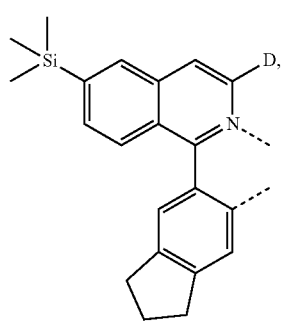
L_x891 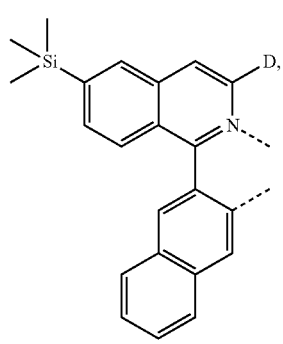
L_x892 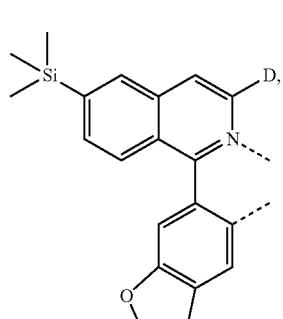
L_x893 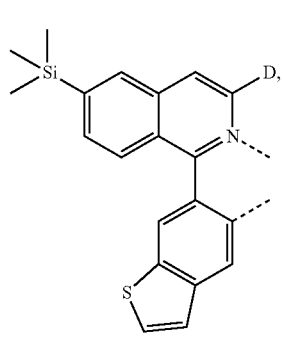
L_x894 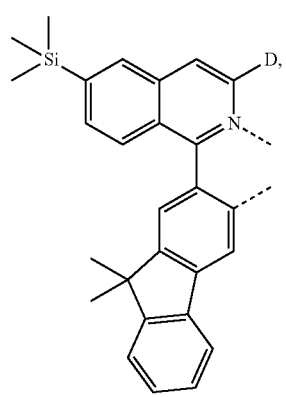
L_x895 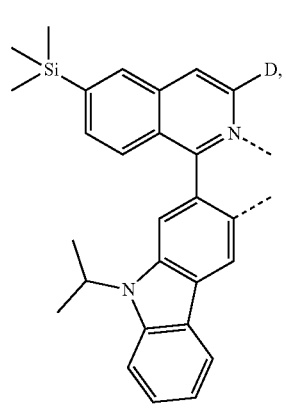
L_x896 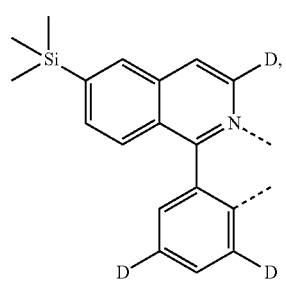
L_x897 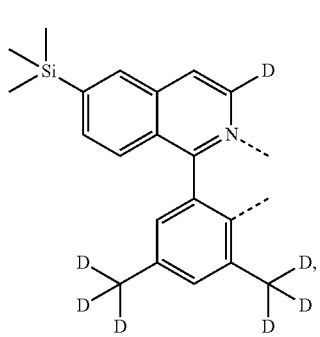

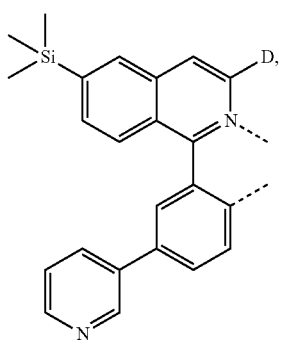 L<sub>x898</sub>
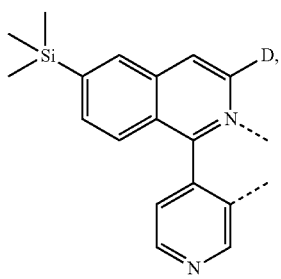 L<sub>x899</sub>
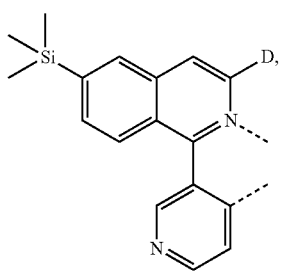 L<sub>x900</sub>
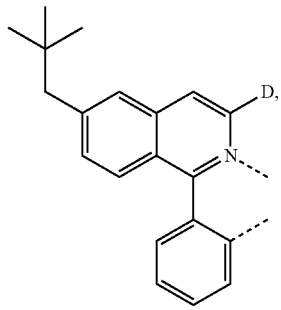 L<sub>x901</sub>
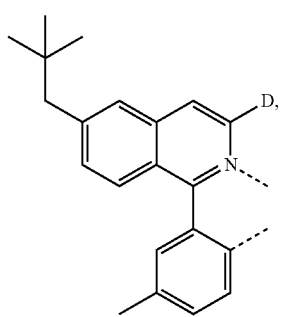 L<sub>x902</sub>
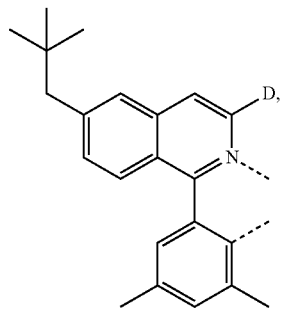 L<sub>x903</sub>
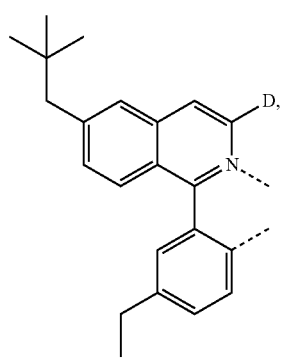 L<sub>x904</sub>
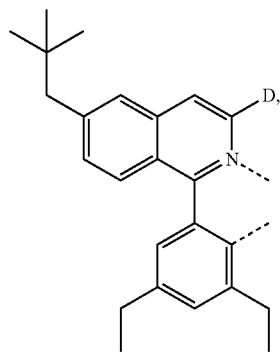 L<sub>x905</sub>
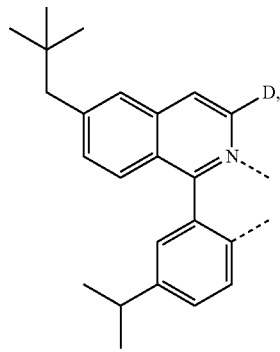 L<sub>x906</sub>

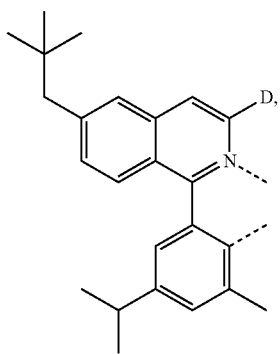 L_{x907}
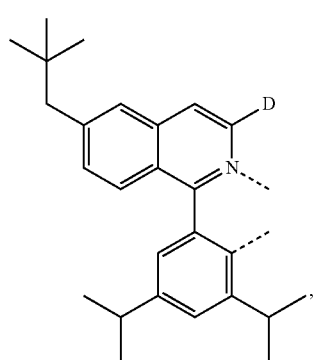 L_{x908}
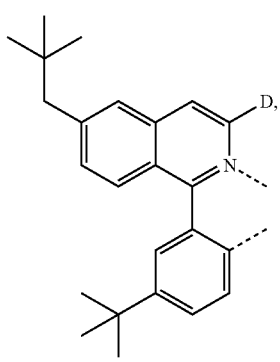 L_{x909}
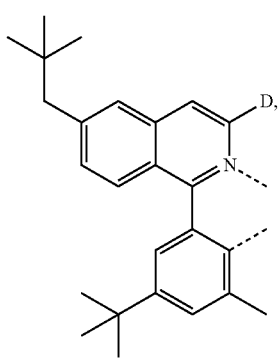 L_{x910}
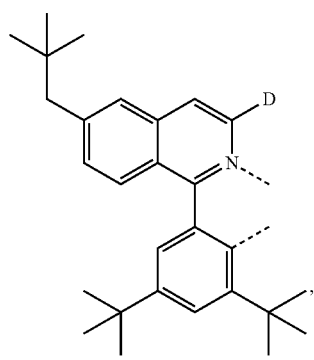 L_{x911}
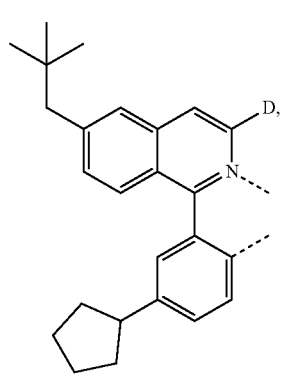 L_{x912}
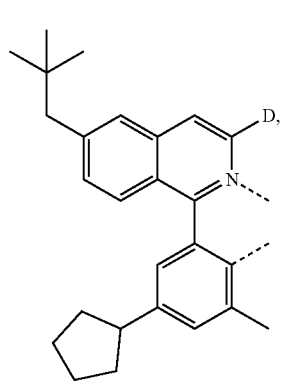 L_{x913}
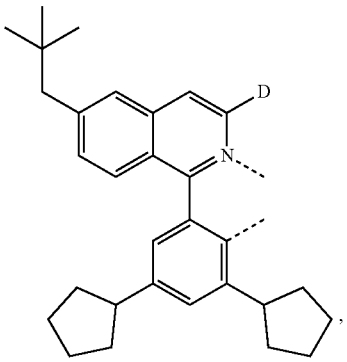 L_{x914}

287
-continued
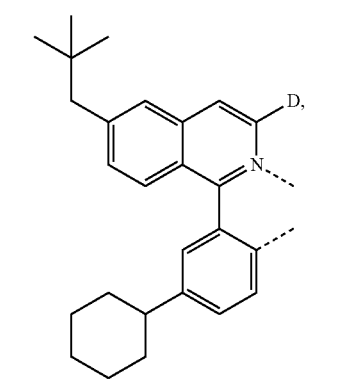 $L_{x915}$
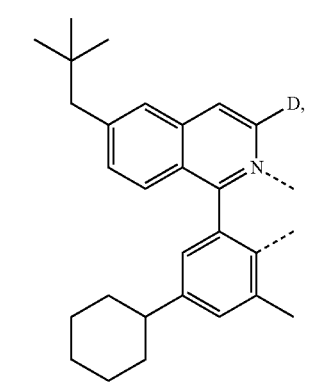 $L_{x916}$
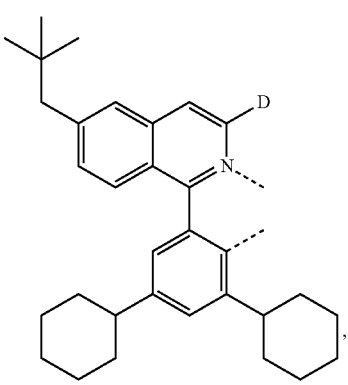 $L_{x917}$
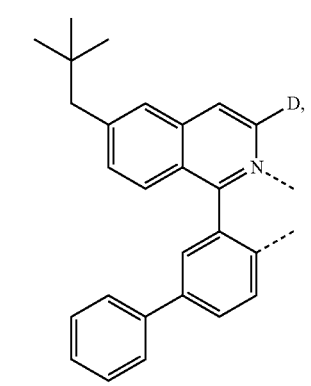 $L_{x918}$
288
-continued
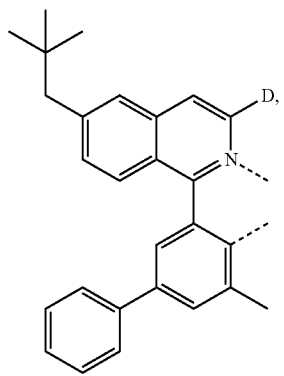 $L_{x919}$
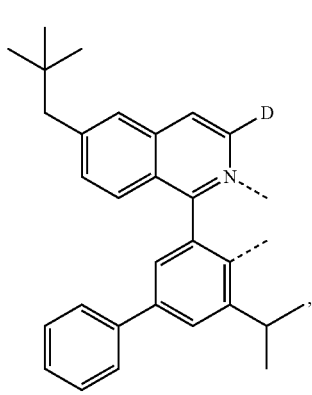 $L_{x920}$
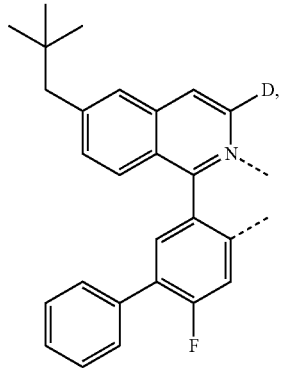 $L_{x921}$
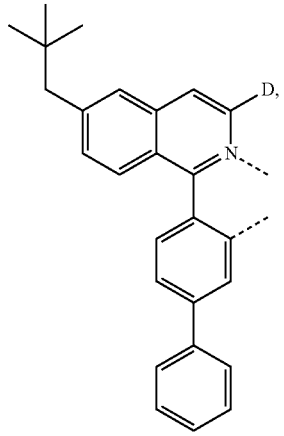 $L_{x922}$ 289
-continued
L_{x923}
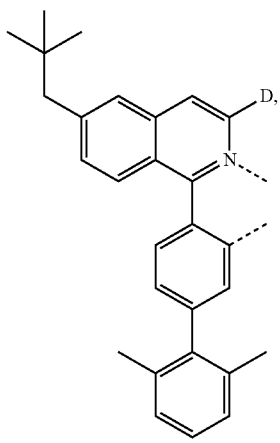
L_{x924}
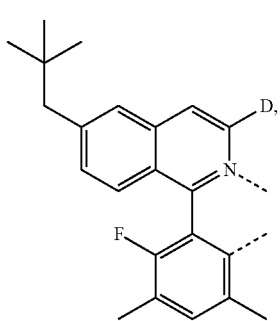
L_{x925}
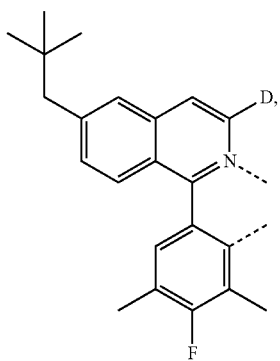
L_{x926}
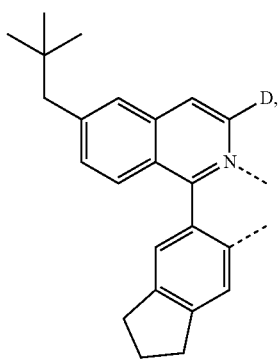
290
-continued
L_{x927}
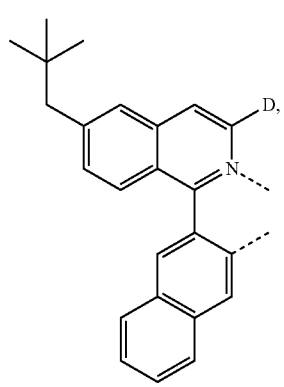
L_{x928}
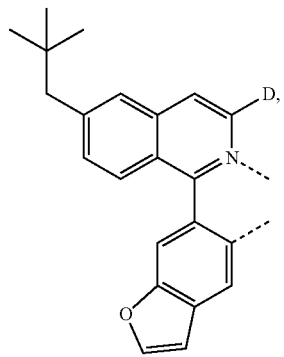
L_{x929}
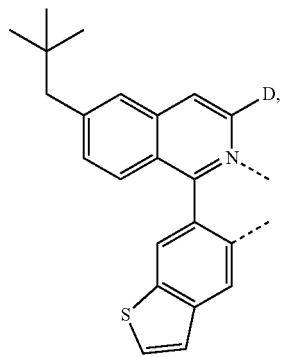
L_{x930}
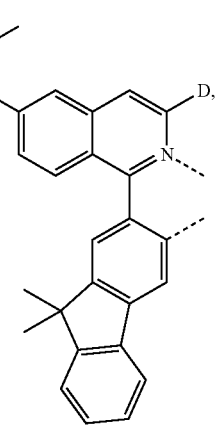

291
-continued
L$_{x931}$
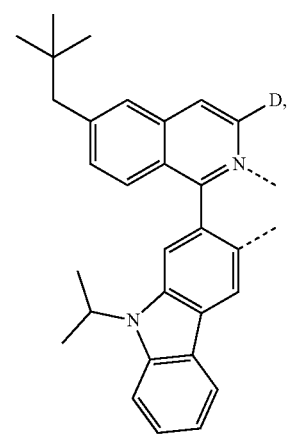
L$_{x932}$
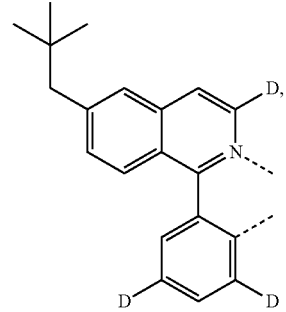
L$_{x933}$
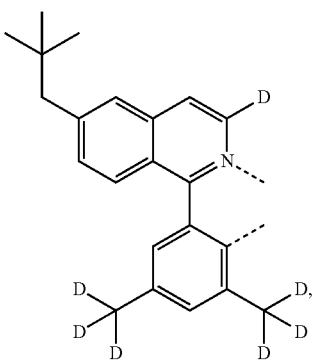
L$_{x934}$
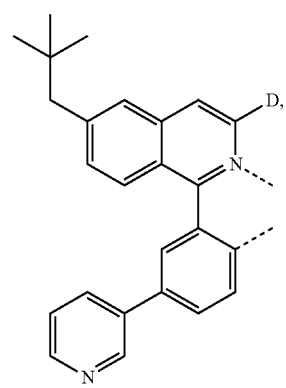
292
-continued
L$_{x935}$
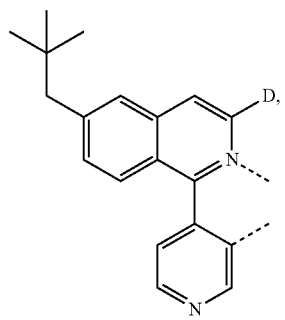
L$_{x936}$
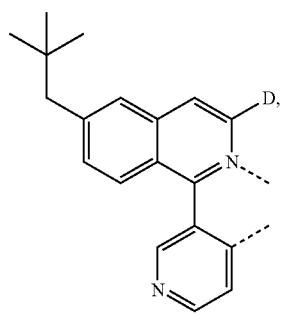
L$_{x937}$
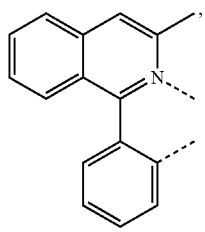
L$_{x938}$
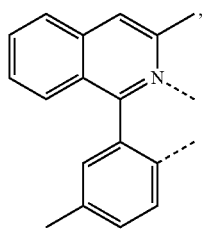
L$_{x939}$
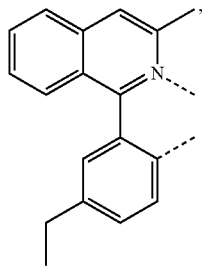

L$_{x940}$ 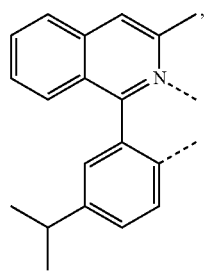
L$_{x941}$ 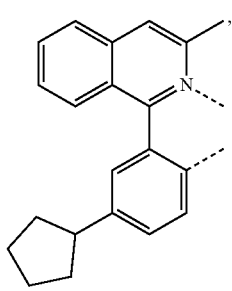
L$_{x942}$ 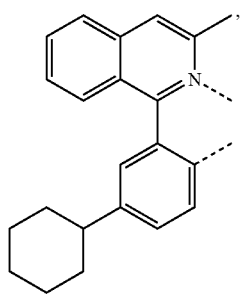
L$_{x943}$ 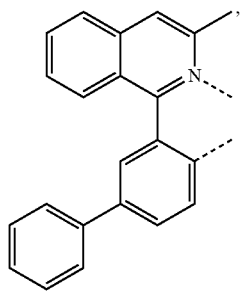
L$_{x944}$ 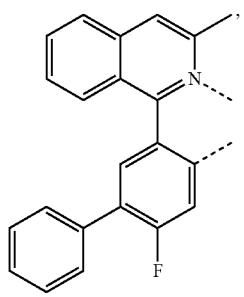
L$_{x945}$ 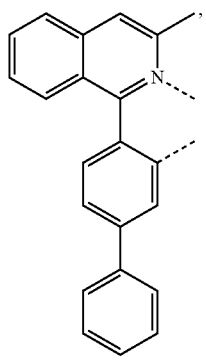
L$_{x946}$ 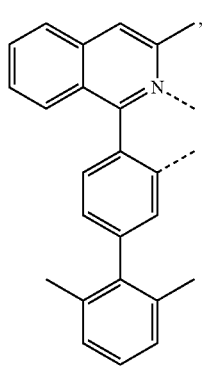
L$_{x947}$ 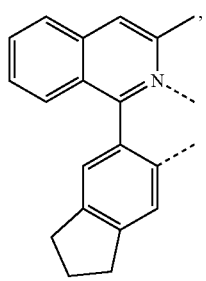
L$_{x948}$ 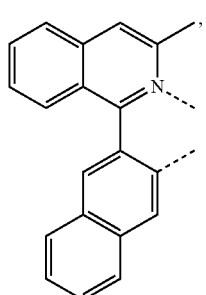
L$_{x949}$ 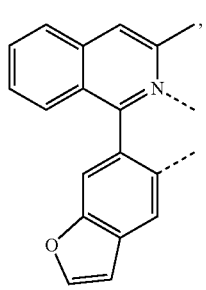

-continued
L<sub>x950</sub> 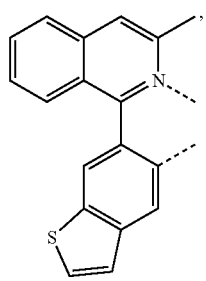
L<sub>x951</sub> 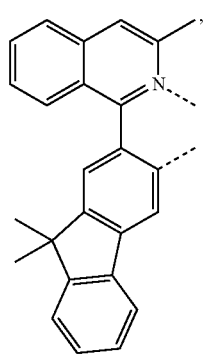
L<sub>x952</sub> 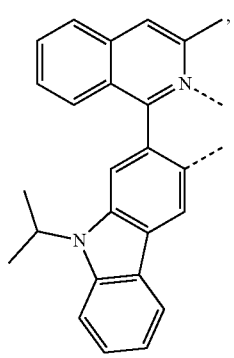
L<sub>x953</sub> 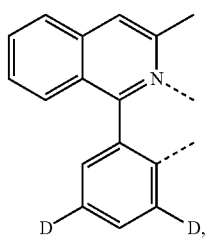
L<sub>x954</sub> 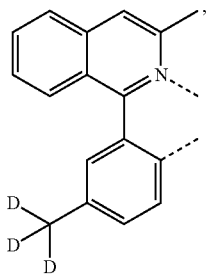
-continued
L<sub>x955</sub> 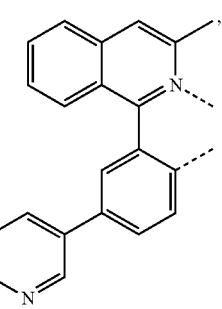
L<sub>x956</sub> 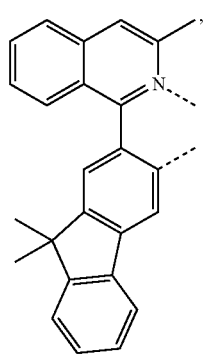
L<sub>x957</sub> 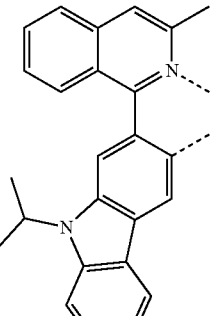
L<sub>x958</sub> 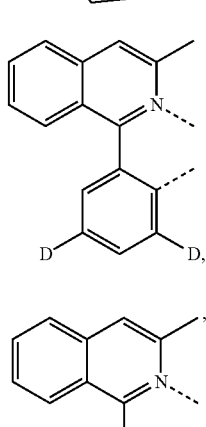
L<sub>x959</sub> 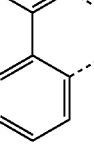

297
-continued
L_{x960}
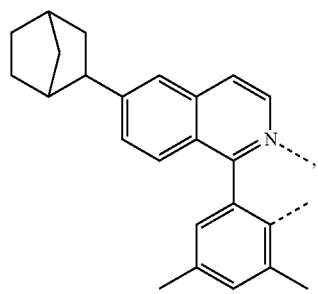
L_{x961}
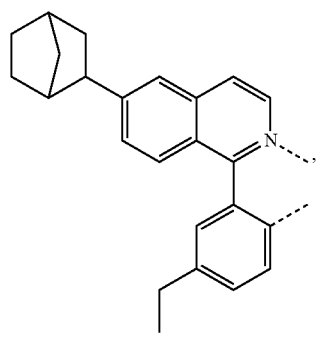
L_{x962}
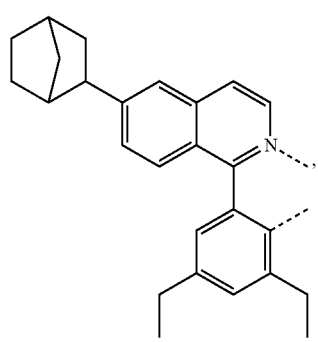
L_{x963}
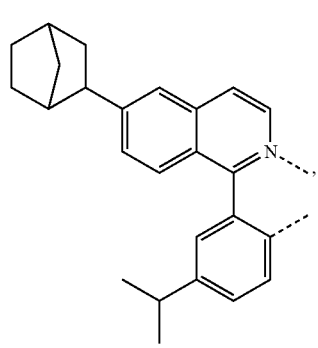
L_{x964}
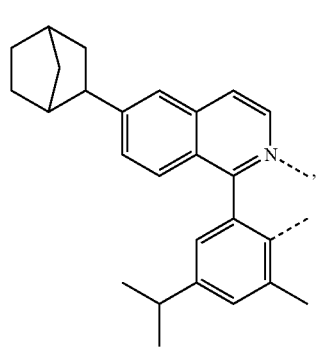
298
-continued
L_{x965}
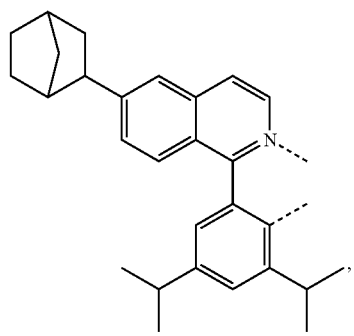
L_{x966}
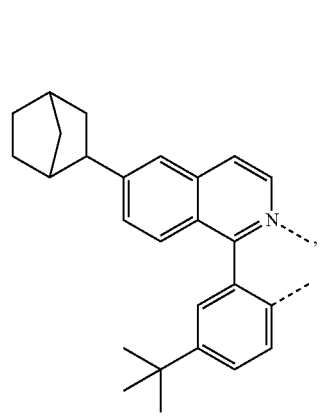
L_{x967}
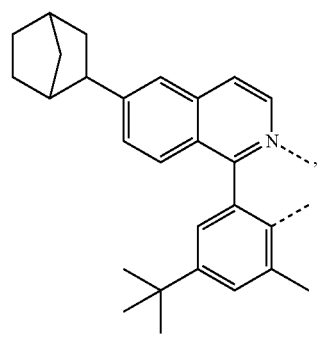
L_{x968}
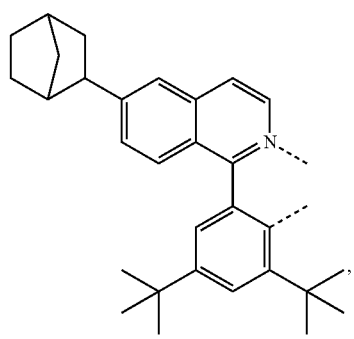

-continued
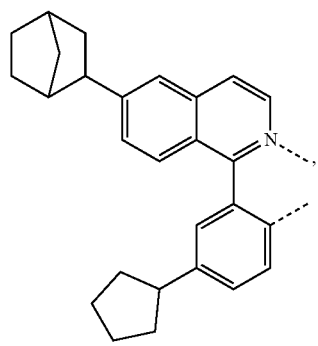
L<sub>x969</sub>
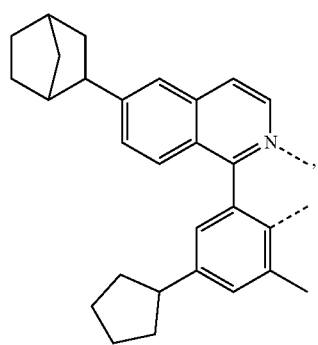
L<sub>x970</sub>
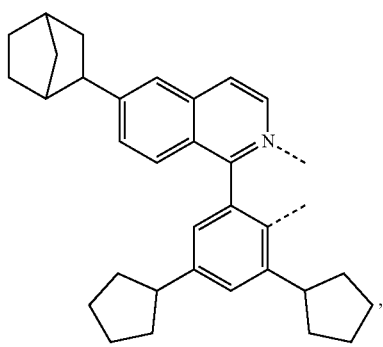
L<sub>x971</sub>
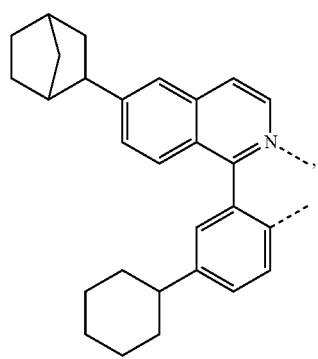
L<sub>x972</sub>
-continued
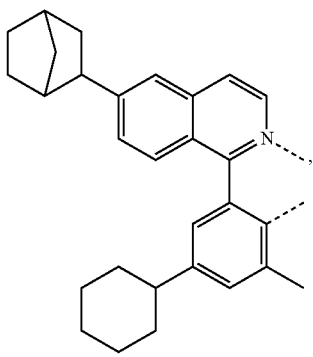
L<sub>x973</sub>
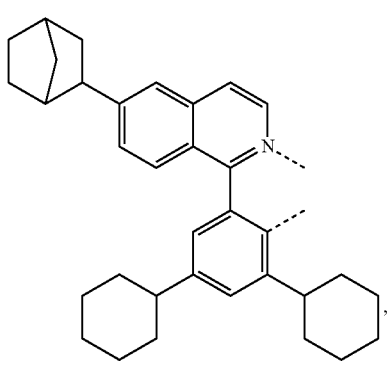
L<sub>x974</sub>
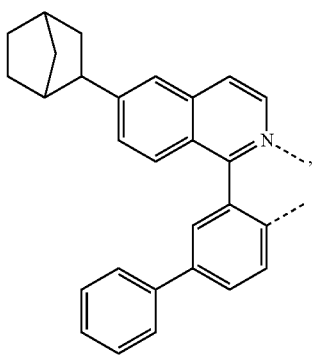
L<sub>x975</sub>
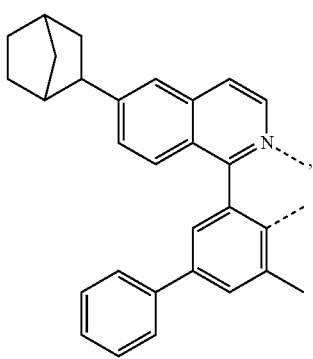
L<sub>x976</sub>

| | |
|---|---|
| 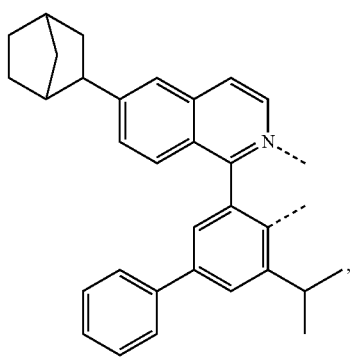 $L_{x977}$ | 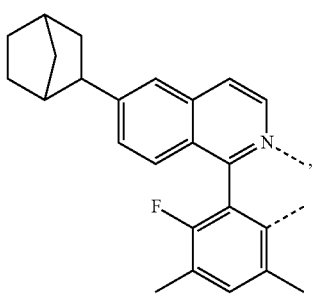 $L_{x981}$ |
| 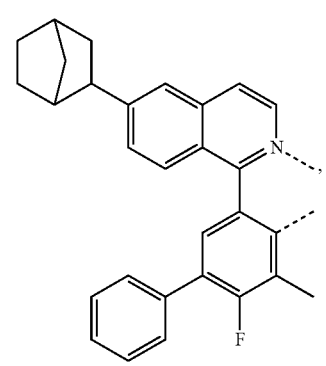 $L_{x978}$ | 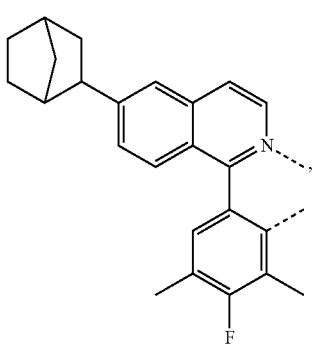 $L_{x982}$ |
| 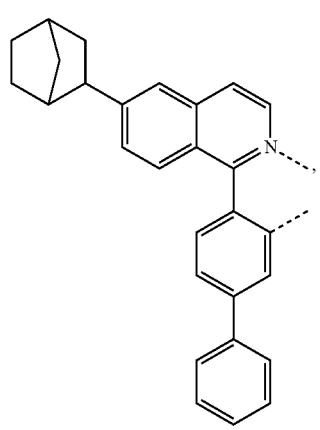 $L_{x979}$ | 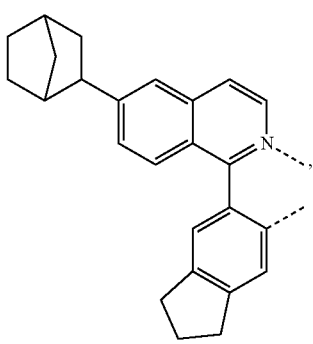 $L_{x983}$ |
| 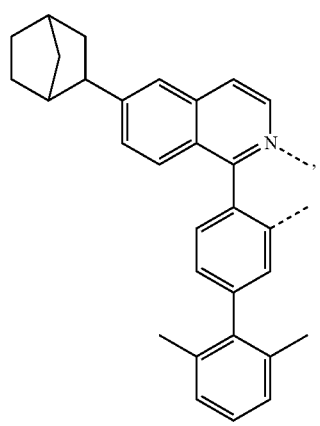 $L_{x980}$ | 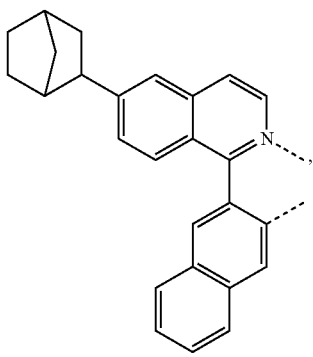 $L_{x984}$ |

303 -continued
L<sub>x985</sub>
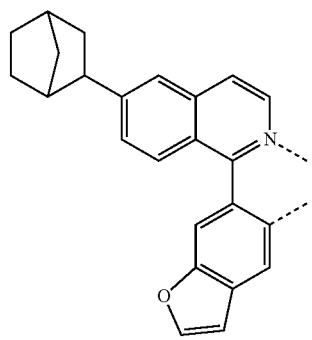
L<sub>x986</sub>
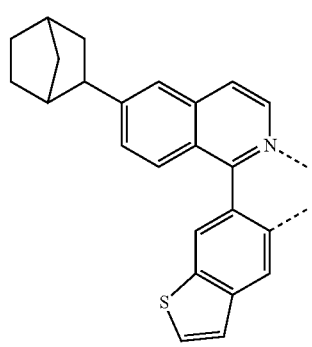
L<sub>x987</sub>
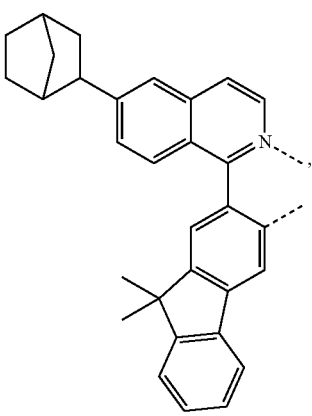
L<sub>x988</sub>
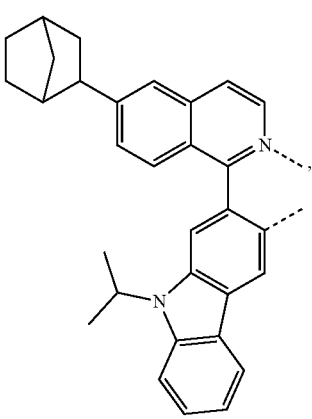
304 -continued
L<sub>x989</sub>
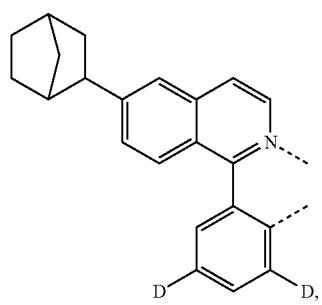
L<sub>x990</sub>
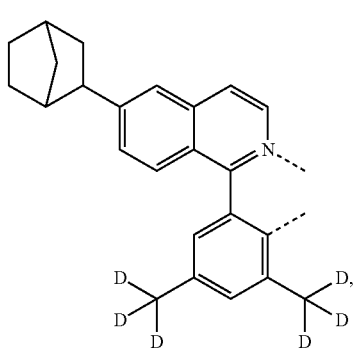
L<sub>x991</sub>
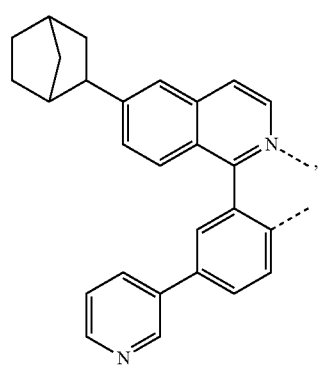
L<sub>x992</sub>
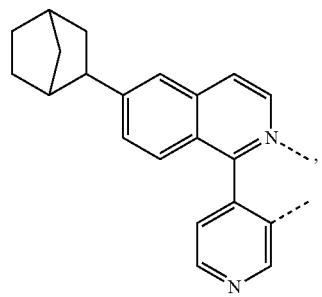
L<sub>x993</sub>
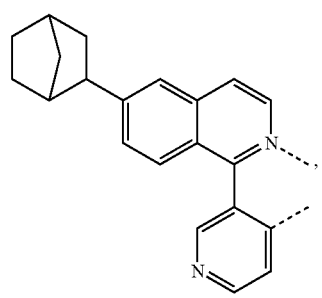

305
-continued
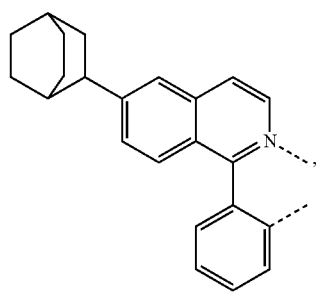  L$_{x994}$
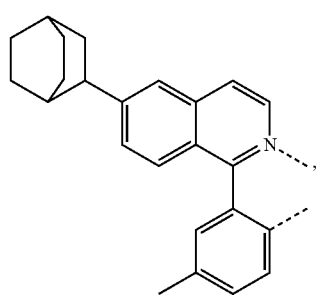  L$_{x995}$
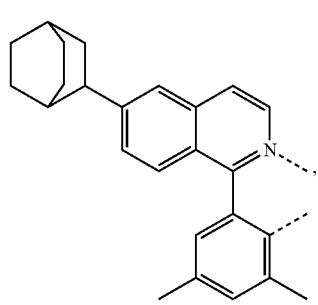  L$_{x996}$
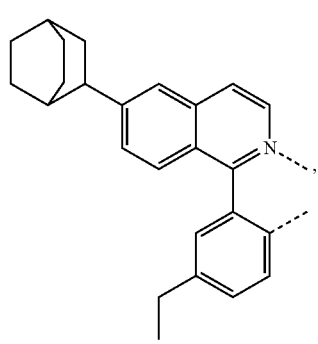  L$_{x997}$
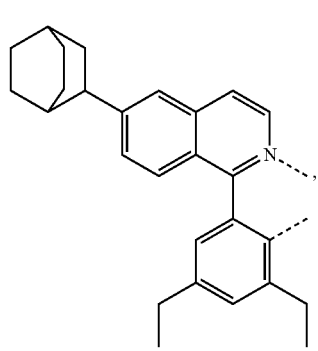  L$_{x998}$
306
-continued
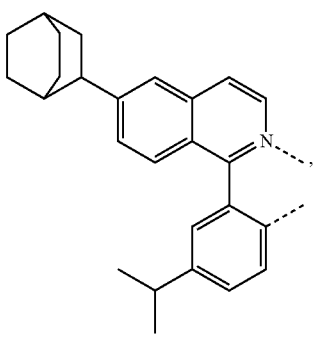  L$_{x999}$
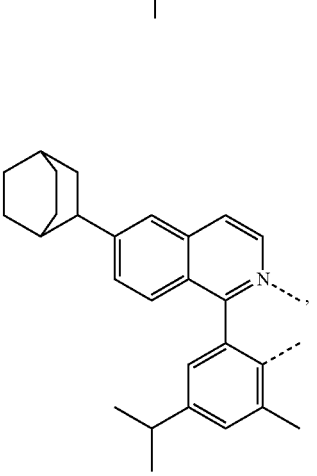  L$_{x1000}$
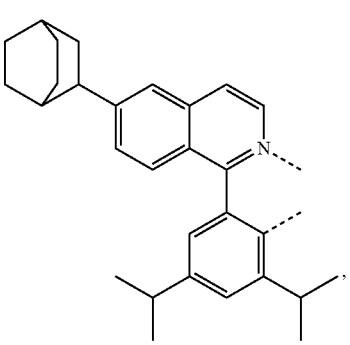  L$_{x1001}$
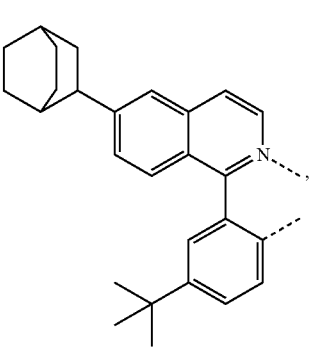  L$_{x1002}$ 307
-continued
308
-continued
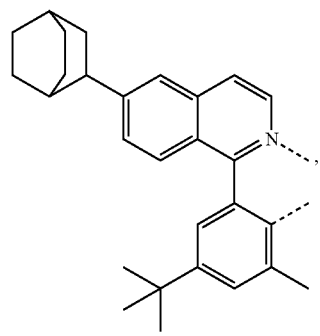
$L_{x1003}$
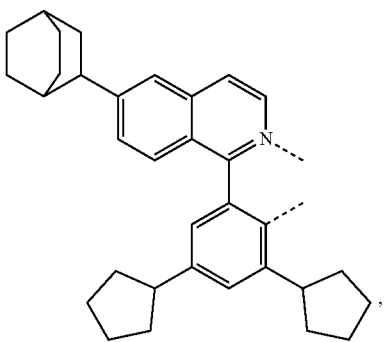
$L_{x1007}$
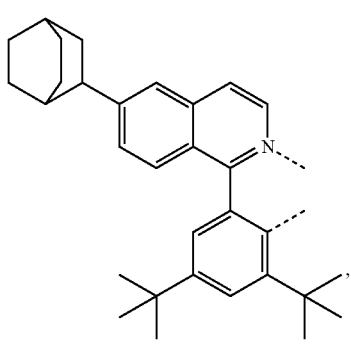
$L_{x1004}$
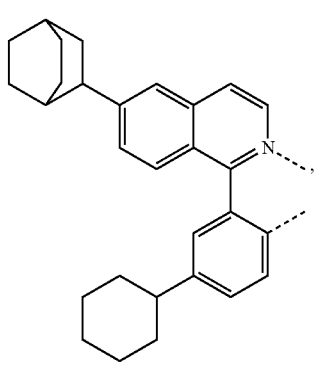
$L_{x1008}$
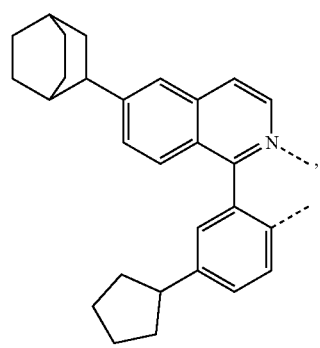
$L_{x1005}$
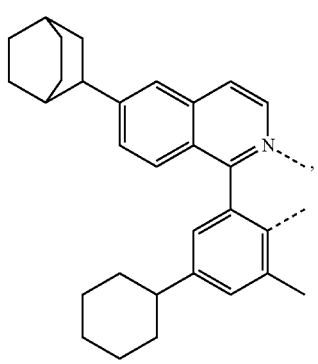
$L_{x1009}$
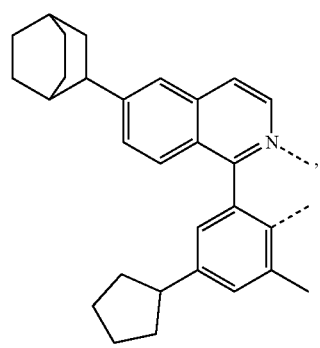
$L_{x1006}$
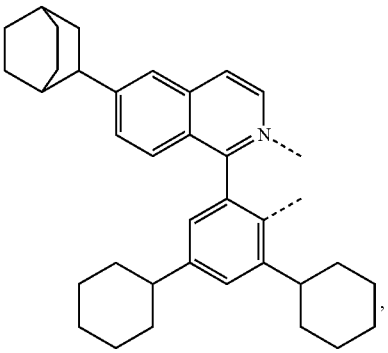
$L_{x1010}$ 309
-continued
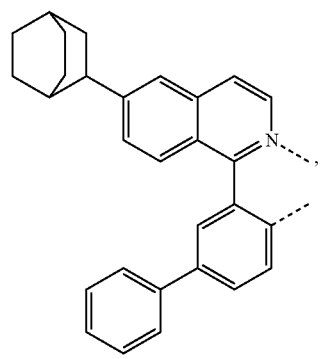
$L_{x1011}$
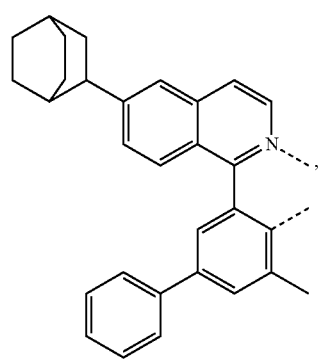
$L_{x1012}$
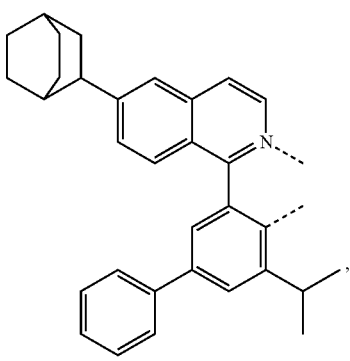
$L_{x1013}$
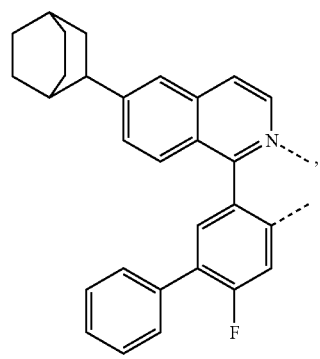
$L_{x1014}$
310
-continued
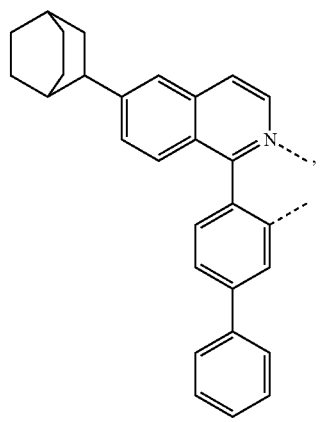
$L_{x1015}$
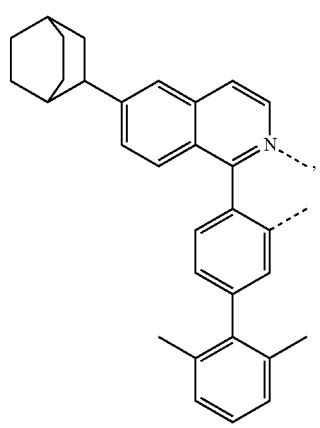
$L_{x1016}$
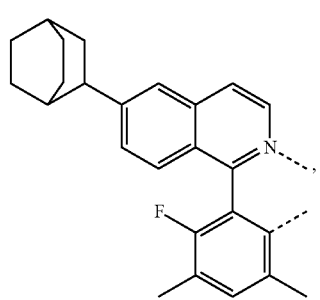
$L_{x1017}$
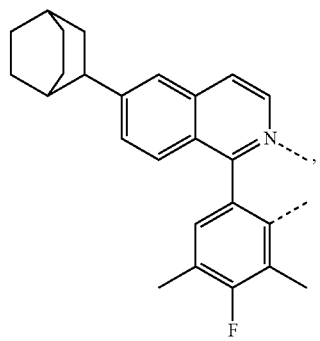
$L_{x1018}$ 311
-continued
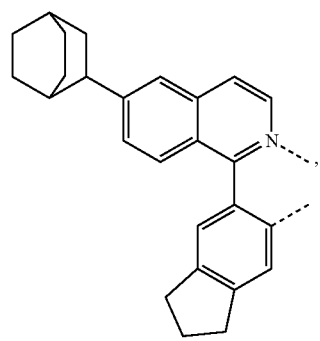
L_{x1019}
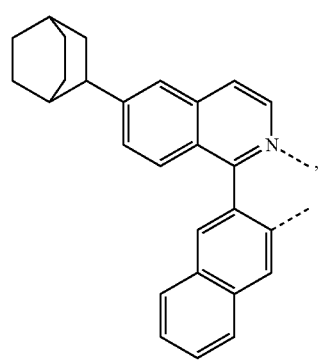
L_{x1020}
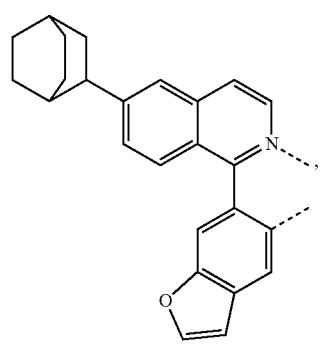
L_{x1021}
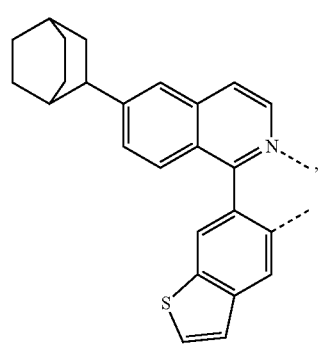
L_{x1022}
312
-continued
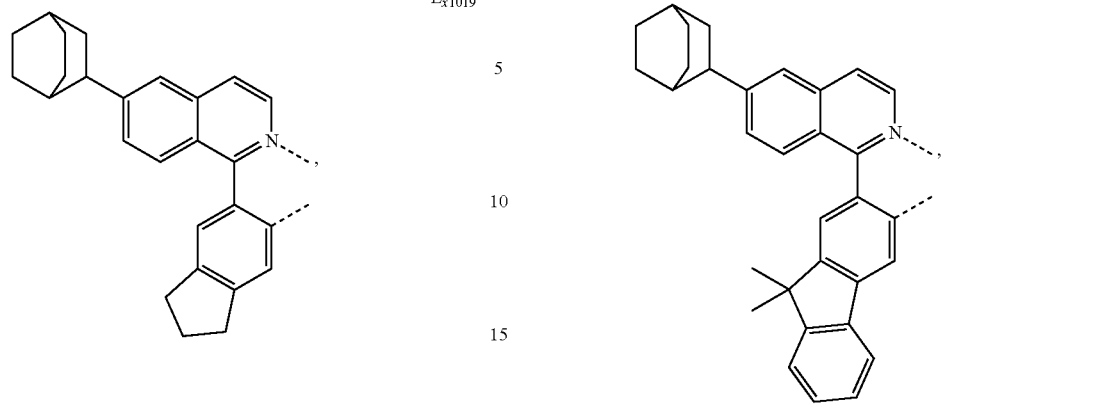
L_{x1023}
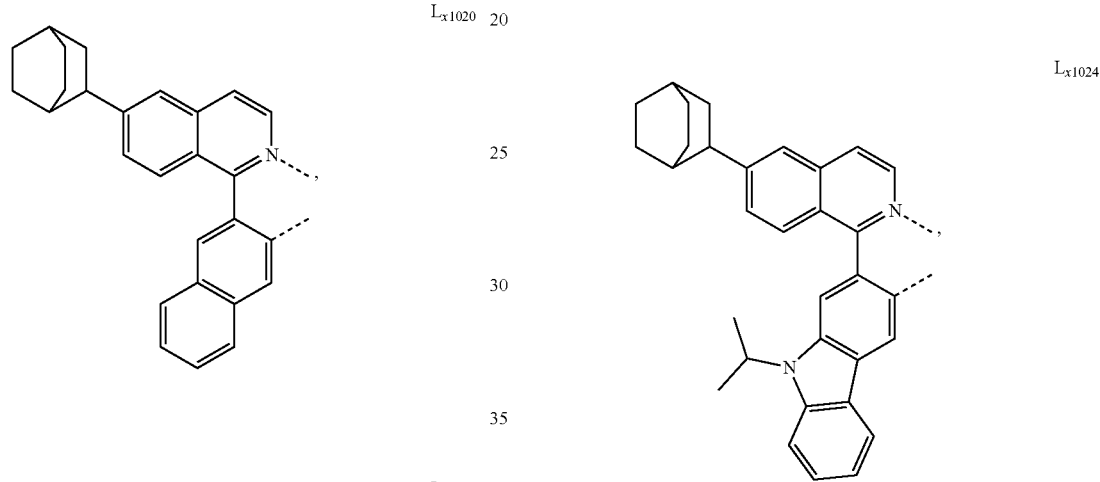
L_{x1024}
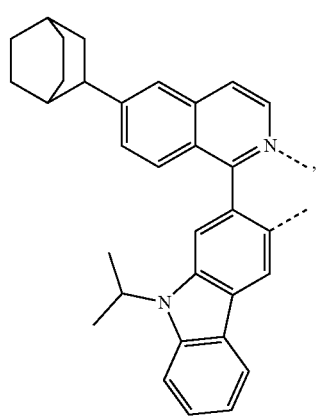
L_{x1025}
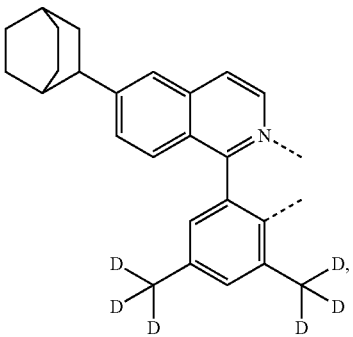
L_{x1026}

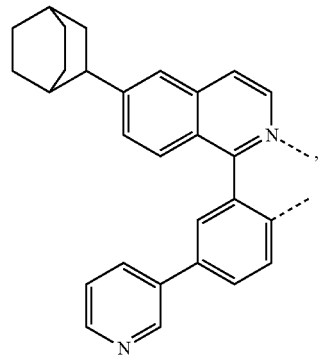 L<sub>x1027</sub>
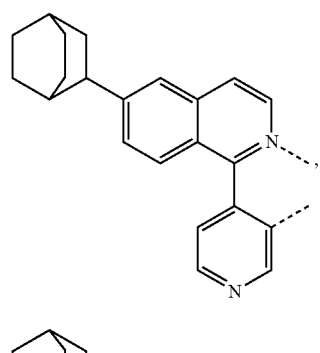 L<sub>x1028</sub>
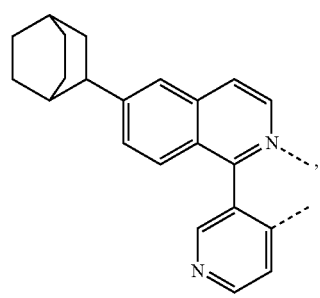 L<sub>x1029</sub>
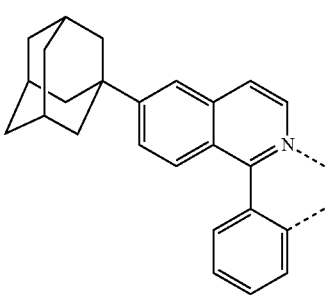 L<sub>x1030</sub>
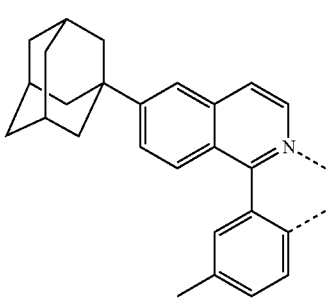 L<sub>x1031</sub>
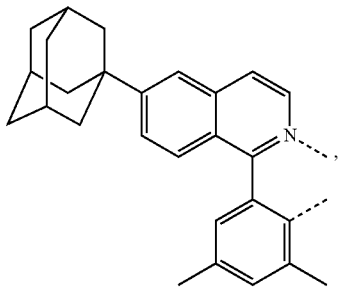 L<sub>x1032</sub>
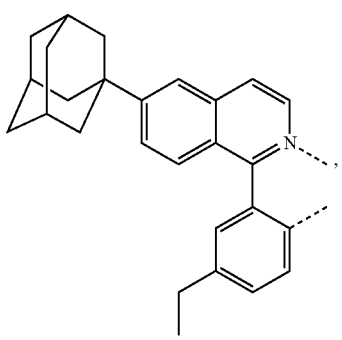 L<sub>x1033</sub>
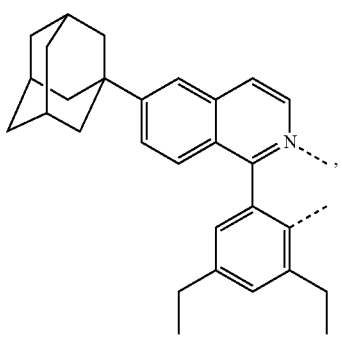 L<sub>x1034</sub>
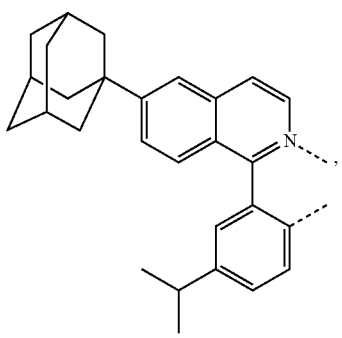 L<sub>x1035</sub>
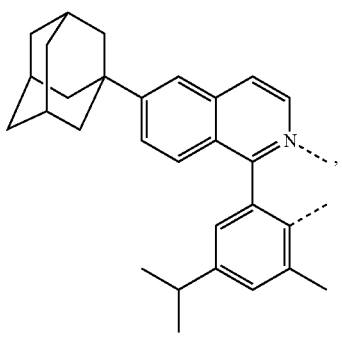 L<sub>x1036</sub>

315
-continued
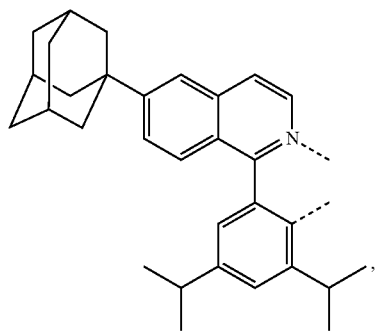
L$_{x1037}$
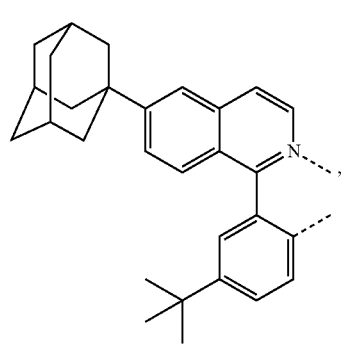
L$_{x1038}$
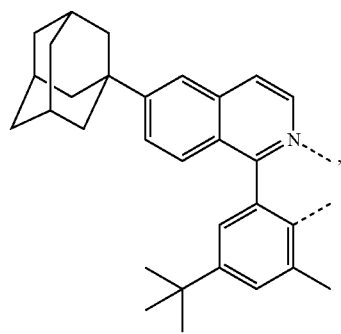
L$_{x1039}$
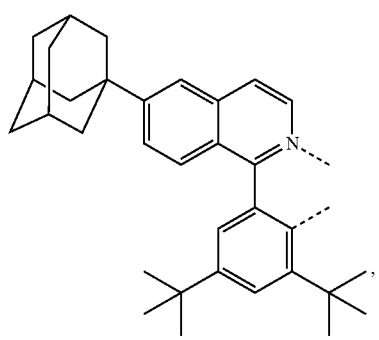
L$_{x1040}$
316
-continued
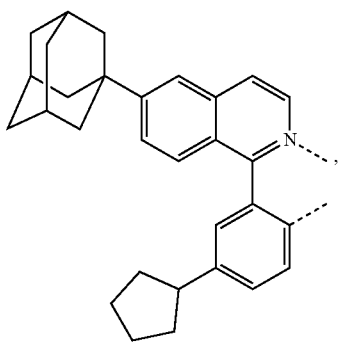
L$_{x1041}$
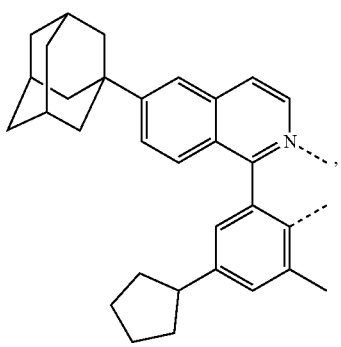
L$_{x1042}$
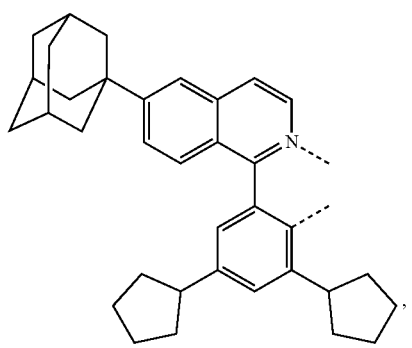
L$_{x1043}$
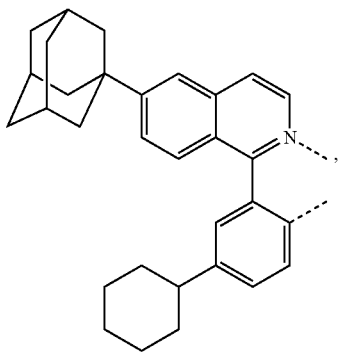
L$_{x1044}$

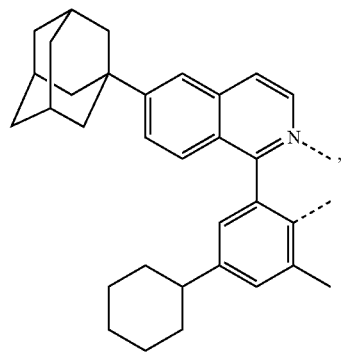 L<sub>x1045</sub>
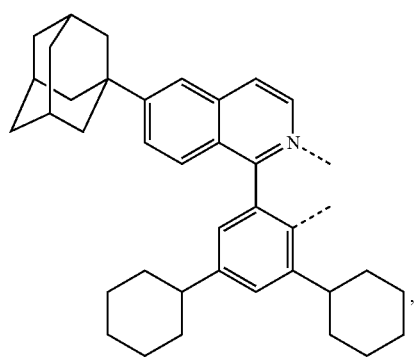 L<sub>x1046</sub>
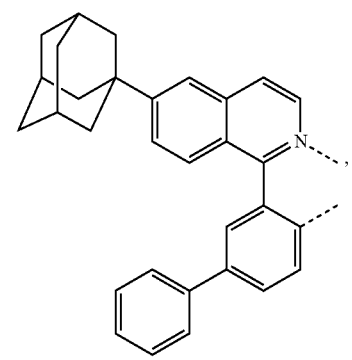 L<sub>x1047</sub>
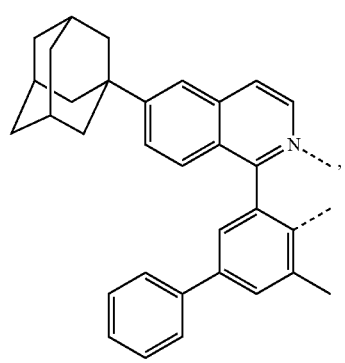 L<sub>x1048</sub>
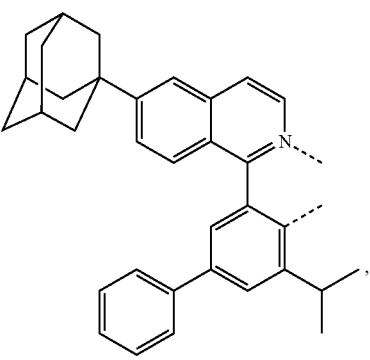 L<sub>x1049</sub>
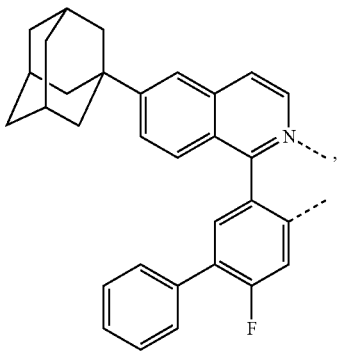 L<sub>x1050</sub>
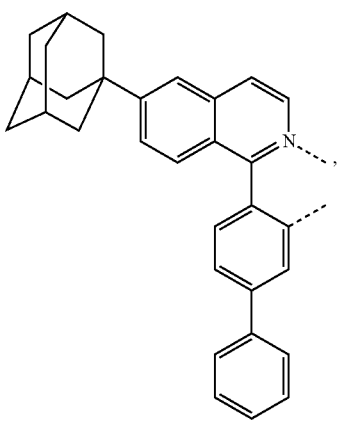 L<sub>x1051</sub>
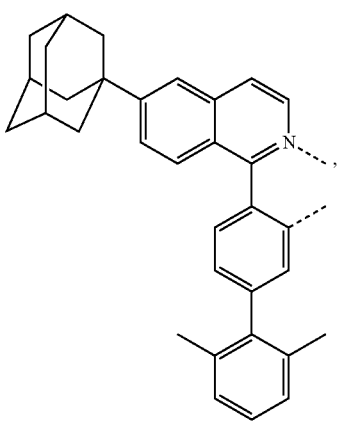 L<sub>x1052</sub>

319
-continued
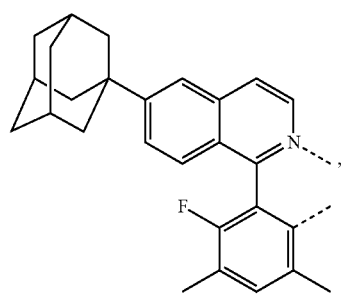 $L_{x1053}$
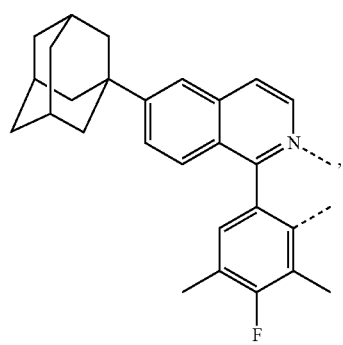 $L_{x1054}$
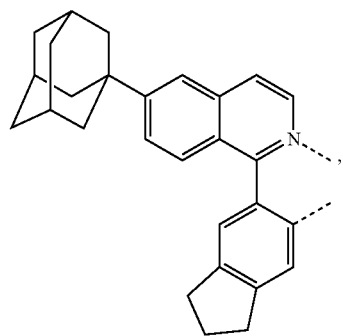 $L_{x1055}$
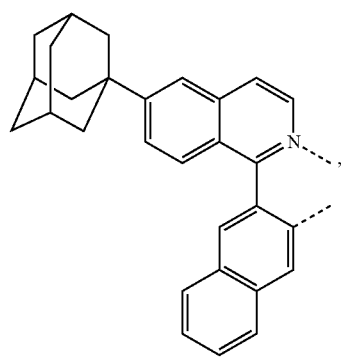 $L_{x1056}$
320
-continued
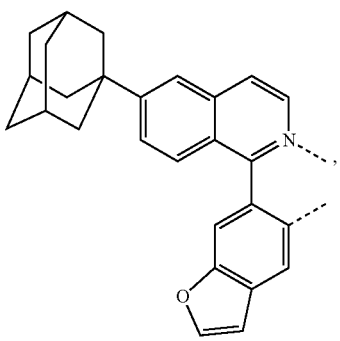 $L_{x1057}$
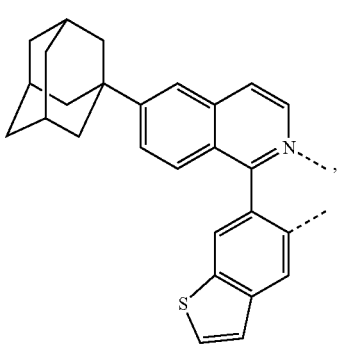 $L_{x1058}$
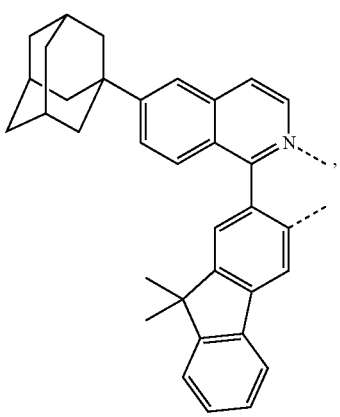 $L_{x1059}$
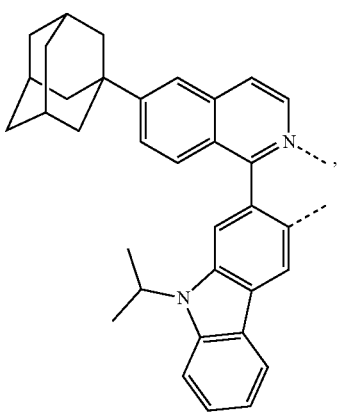 $L_{x1060}$ -continued L_{x1061} 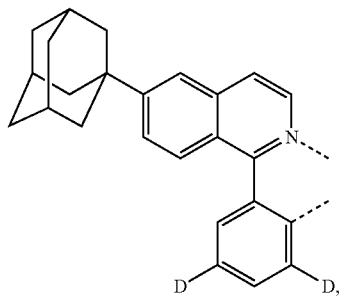

L_{x1062} 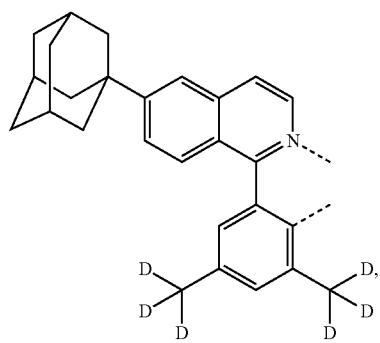

L_{x1063} 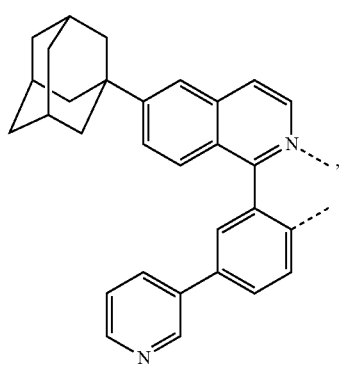

L_{x1064} 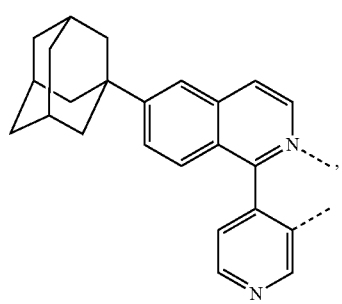

L_{x1065} 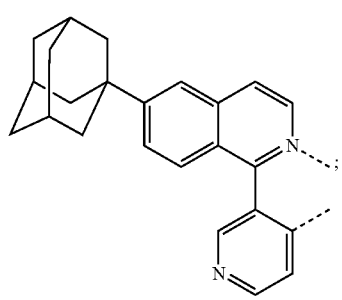

wherein x in numbers of the above specific structures of ligands represents a or b.

12. The metal complex of claim 1, wherein in Formula 2, $R_t$, $R_u$, $R_v$, $R_w$, $R_x$, $R_y$, and $R_z$ are each independently selected from the group consisting of: hydrogen, deuterium, substituted or unsubstituted alkyl having 1 to 20 carbon atoms, substituted or unsubstituted cycloalkyl having 3 to 20 ring carbon atoms, and combinations thereof;

preferably, $R_t$ is selected from hydrogen, deuterium or methyl, and $R_u$ to $R_z$ are each independently selected from hydrogen, deuterium, methyl, ethyl, propyl, cyclobutyl, cyclopentyl, cyclohexyl, 3-methylbutyl, 3-ethylpentyl or combinations thereof.

13. The metal complex of claim 11, wherein $L_c$ is selected from the group consisting of:

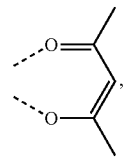 $L_{c1}$

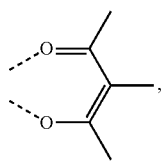 $L_{c2}$

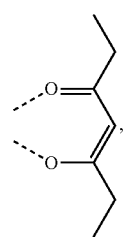 $L_{c3}$

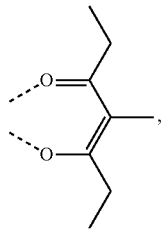 $L_{c4}$

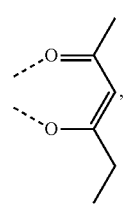 $L_{c5}$

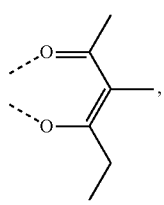 $L_{c6}$

-continued
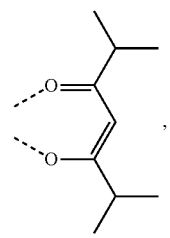, L$_{c7}$
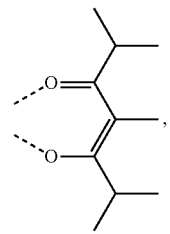, L$_{c8}$
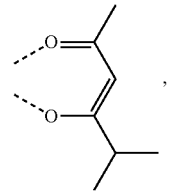, L$_{c9}$
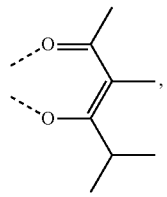, L$_{c10}$
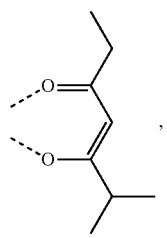, L$_{c11}$
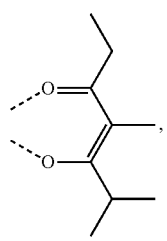, L$_{c12}$
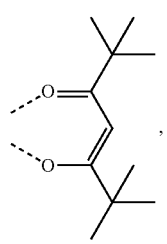, L$_{c13}$
-continued
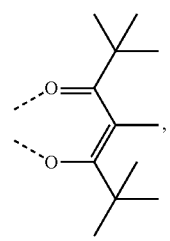, L$_{c14}$
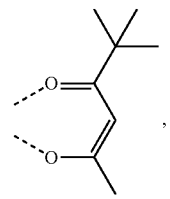, L$_{c15}$
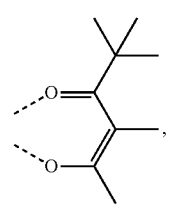, L$_{c16}$
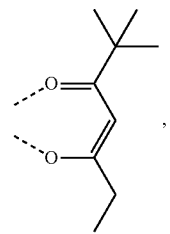, L$_{c17}$
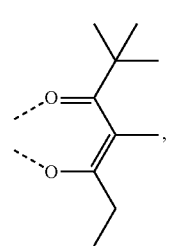, L$_{c18}$
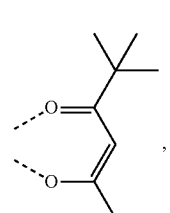, L$_{c19}$
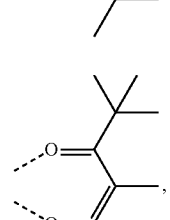, L$_{c20}$ -continued
L_{c21}
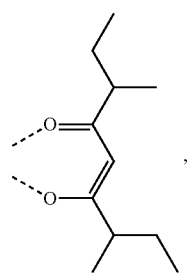,
L_{c22}
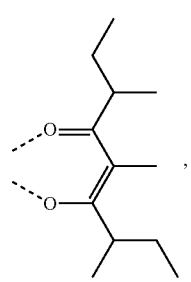,
L_{c23}
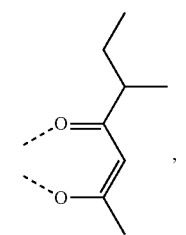,
L_{c24}
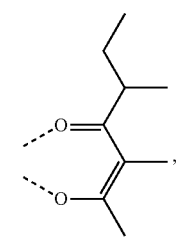,
L_{c25}
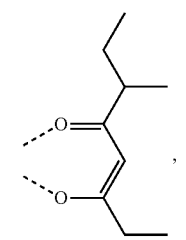,
L_{c26}
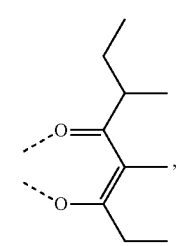,
-continued
L_{c27}
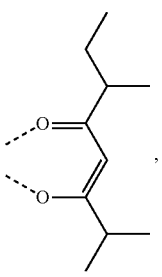,
L_{c28}
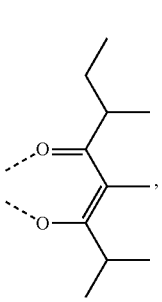,
L_{c29}
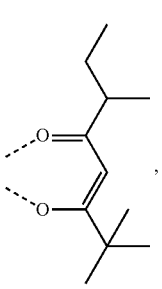,
L_{c30}
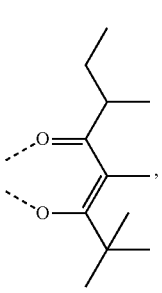,
L_{c31}
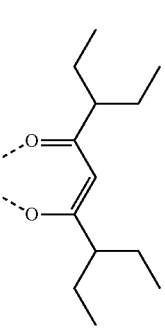, -continued
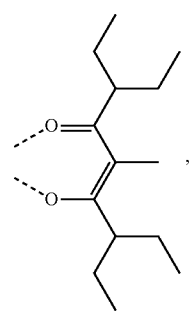, L$_{c32}$
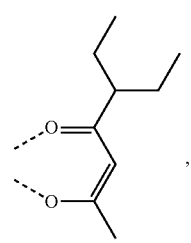, L$_{c33}$
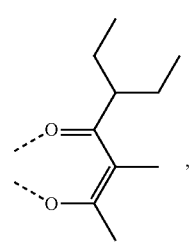, L$_{c34}$
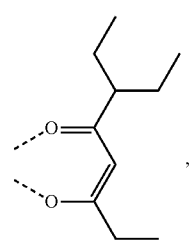, L$_{c35}$
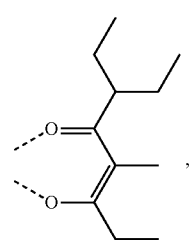, L$_{c36}$
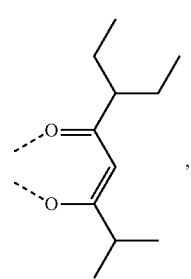, L$_{c37}$
-continued
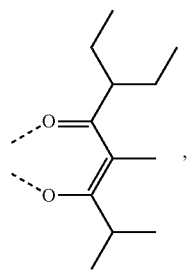, L$_{c38}$
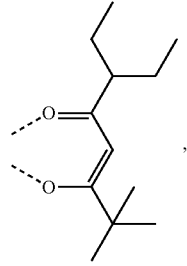, L$_{c39}$
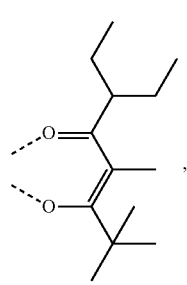, L$_{c40}$
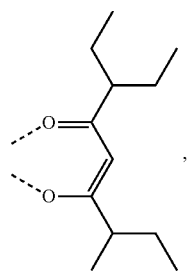, L$_{c41}$
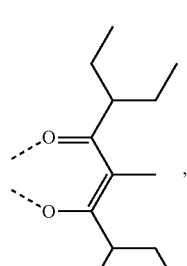, L$_{c42}$
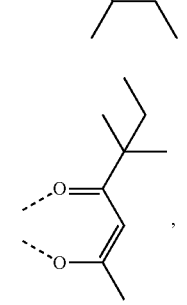, L$_{c43}$ -continued
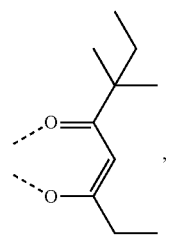, L<sub>c44</sub>
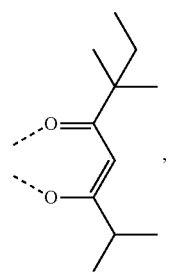, L<sub>c45</sub>
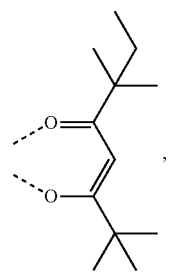, L<sub>c46</sub>
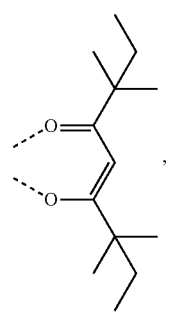, L<sub>c47</sub>
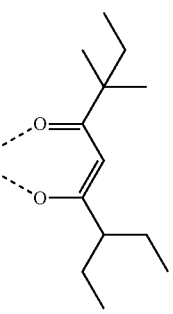, L<sub>c48</sub>
-continued
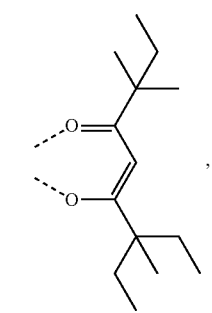, L<sub>c49</sub>
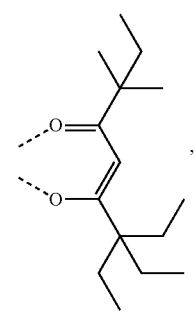, L<sub>c50</sub>
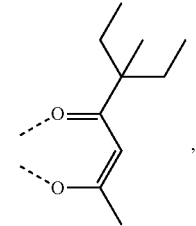, L<sub>c51</sub>
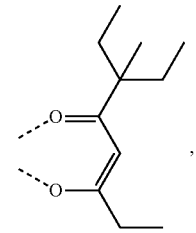, L<sub>c52</sub>
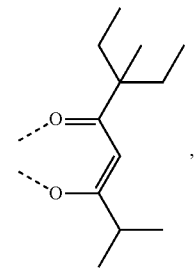, L<sub>c53</sub>

-continued
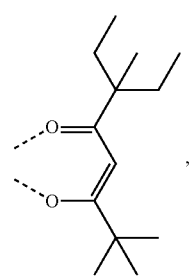 L$_{c54}$,
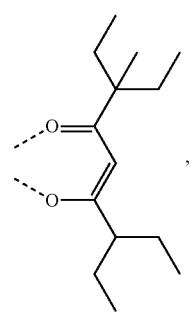 L$_{c55}$,
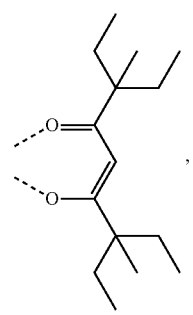 L$_{c56}$,
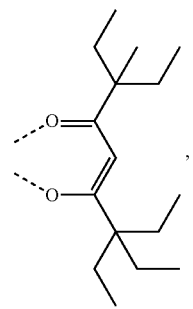 L$_{c57}$,
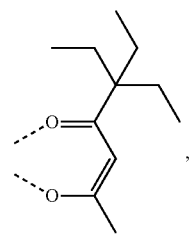 L$_{c58}$,
-continued
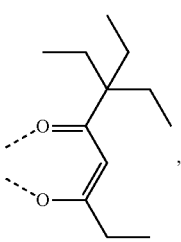 L$_{c59}$,
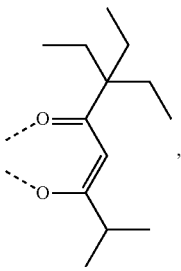 L$_{c60}$,
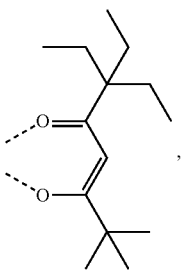 L$_{c61}$,
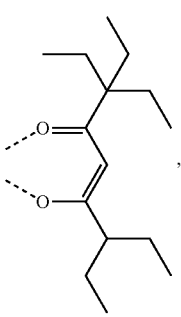 L$_{c62}$,
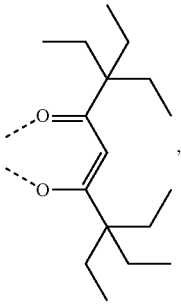 L$_{c63}$, -continued
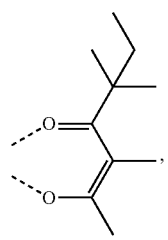
L_{c64}
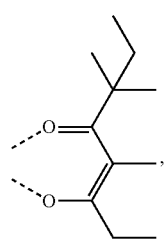
L_{c65}
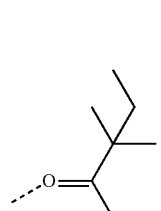
L_{c66}
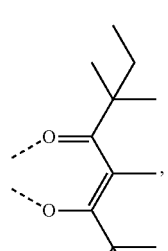
L_{c67}
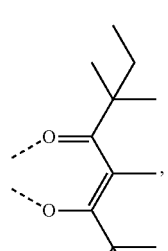
L_{c68}
-continued
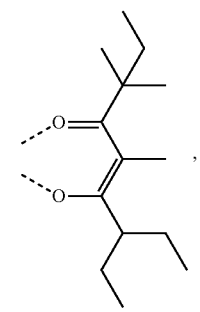
L_{c69}
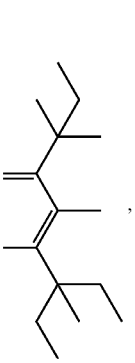
L_{c70}
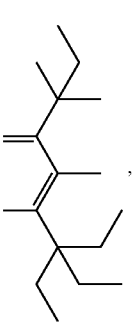
L_{c71}
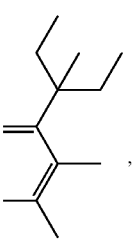
L_{c72}
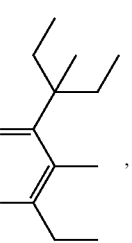
L_{c73}

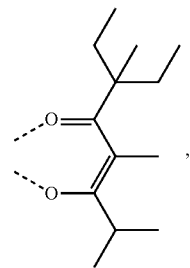 L_{c74}
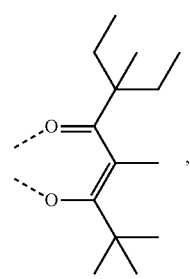 L_{c75}
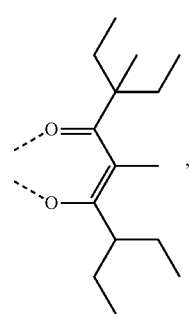 L_{c76}
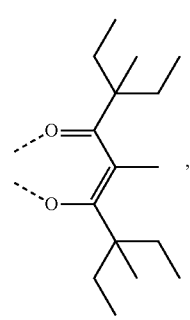 L_{c77}
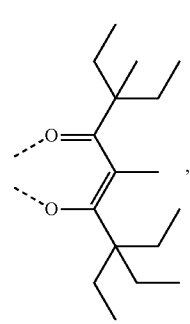 L_{c78}
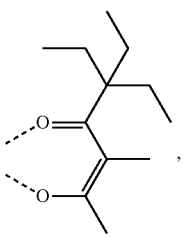 L_{c79}
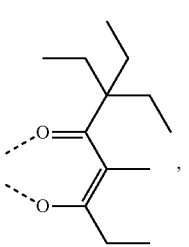 L_{c80}
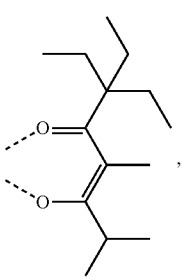 L_{c81}
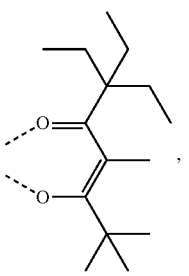 L_{c82}
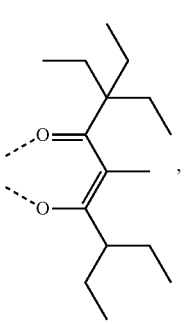 L_{c83}

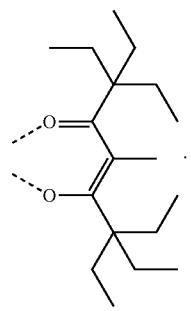

L_{c84}

14. The metal complex of claim 13, wherein hydrogen in any one, any two or three of the ligands $L_a$, $L_b$ and $L_c$ is partially or fully substituted by deuterium.

15. The metal complex of claim 13, wherein the metal complex is $IrL_aL_bL_c$, wherein $L_a$ and $L_b$ have different structures, $L_a$ is any one selected from $L_{a1}$ to $L_{a1065}$, $L_b$ is any one selected from $L_{b1}$ to $L_{b1065}$, and $L_c$ is any one selected from $L_1$ to $L_{c84}$; preferably, $L_a$ is any one selected from $L_{a1}$ to $L_{a108}$, $L_{a112}$ to $L_{a144}$, $L_{a148}$ to $L_{a288}$, $L_{a292}$ to $L_{a362}$, $L_{a364}$ to $L_{a432}$, $L_{a436}$ to $L_{a720}$ and $L_{a757}$ to $L_{a1065}$, $L_b$ is any one selected from $L_{b1}$ to $L_{b1065}$, and $L_c$ is any one selected from $L_{c1}$ to $L_{c84}$;

more preferably, the metal complex is selected from the group consisting of:

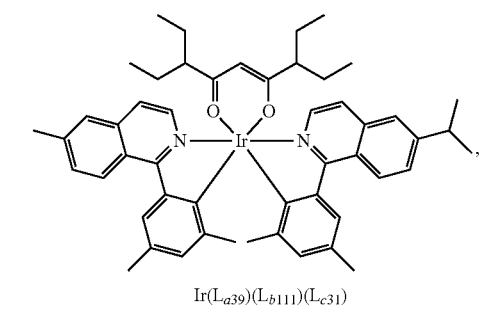

Ir($L_{a39}$)($L_{b111}$)($L_{c31}$)

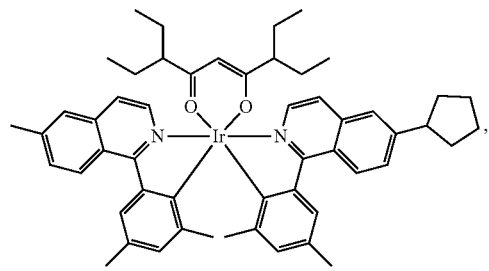

Ir($L_{a39}$)($L_{b291}$)($L_{c31}$)

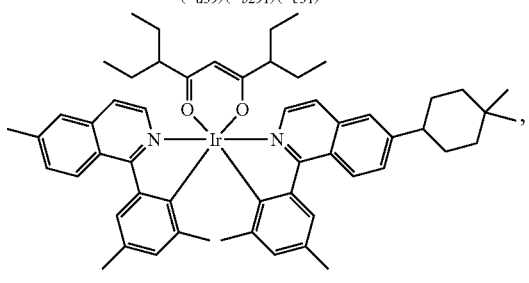

Ir($L_{a39}$)($L_{b363}$)($L_{c31}$)

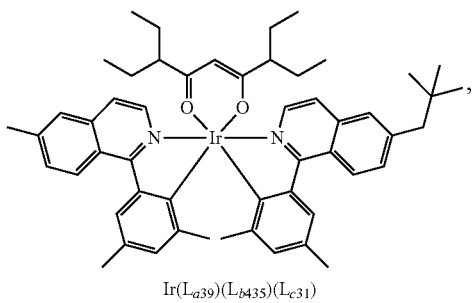

Ir($L_{a39}$)($L_{b435}$)($L_{c31}$)

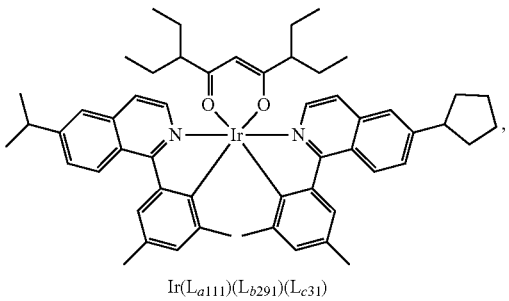

Ir($L_{a111}$)($L_{b291}$)($L_{c31}$)

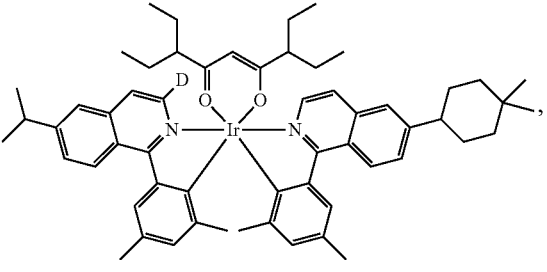

Ir($L_{a795}$)($L_{b363}$)($L_{c31}$)

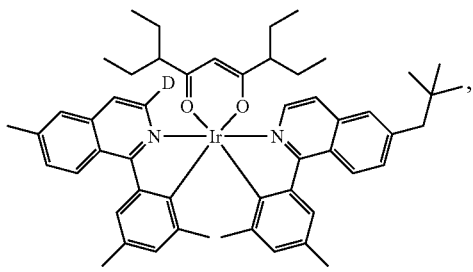

Ir($L_{a795}$)($L_{b435}$)($L_{c31}$)

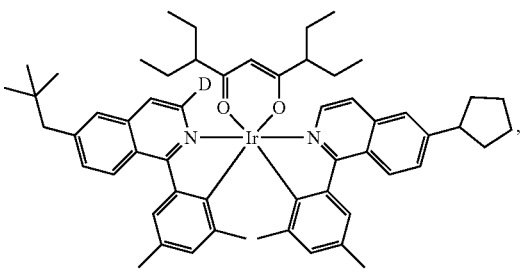

Ir($L_{a903}$)($L_{b291}$)($L_{c31}$)

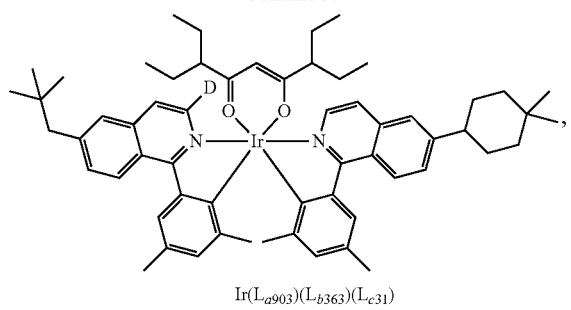
Ir(L$_{a903}$)(L$_{b363}$)(L$_{c31}$)
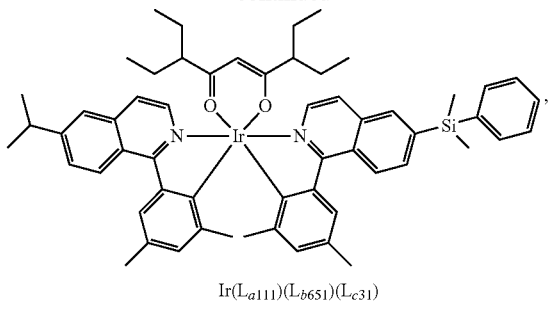
Ir(L$_{a111}$)(L$_{b651}$)(L$_{c31}$)
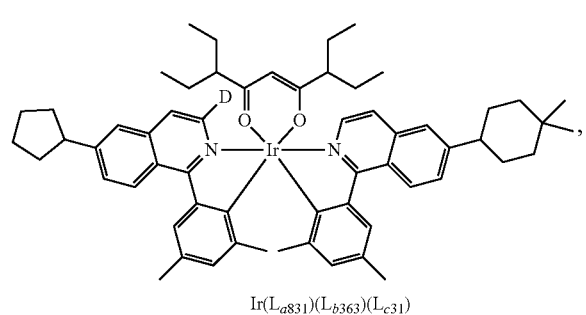
Ir(L$_{a831}$)(L$_{b363}$)(L$_{c31}$)
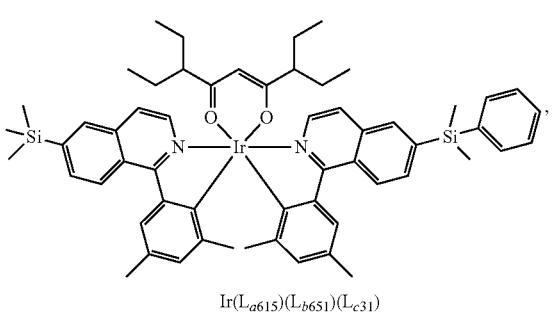
Ir(L$_{a615}$)(L$_{b651}$)(L$_{c31}$)
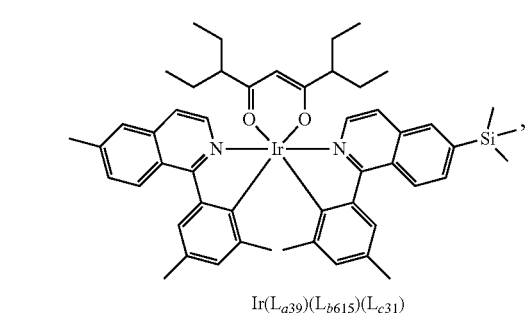
Ir(L$_{a39}$)(L$_{b615}$)(L$_{c31}$)
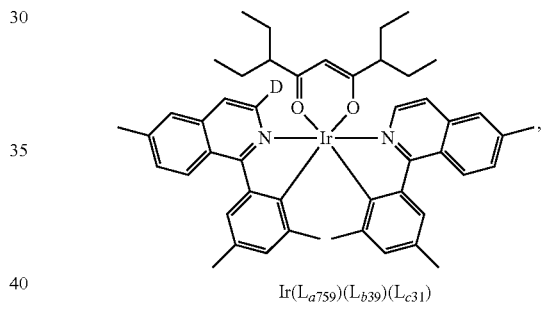
Ir(L$_{a759}$)(L$_{b39}$)(L$_{c31}$)
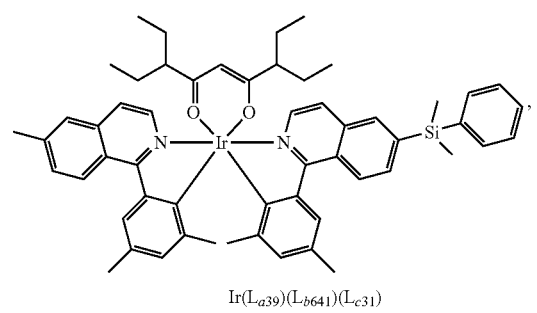
Ir(L$_{a39}$)(L$_{b641}$)(L$_{c31}$)
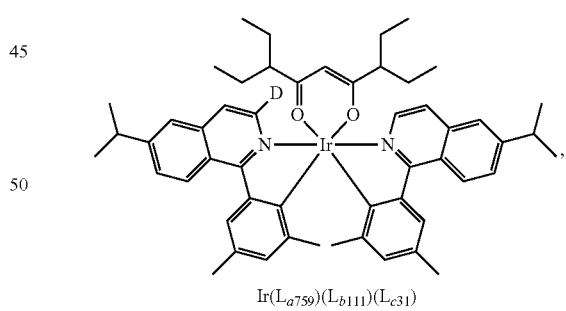
Ir(L$_{a759}$)(L$_{b111}$)(L$_{c31}$)
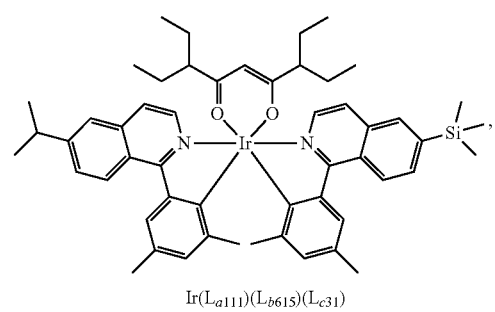
Ir(L$_{a111}$)(L$_{b615}$)(L$_{c31}$)
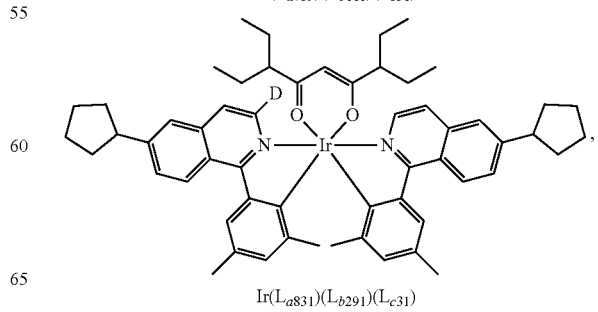
Ir(L$_{a831}$)(L$_{b291}$)(L$_{c31}$)

-continued
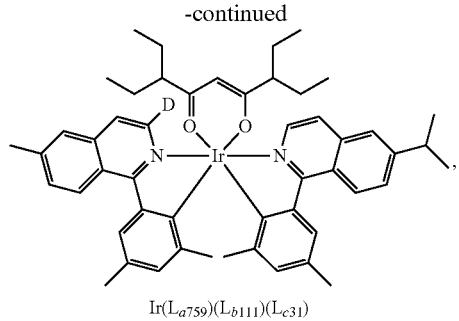
Ir(L$_{a759}$)(L$_{b111}$)(L$_{c31}$)
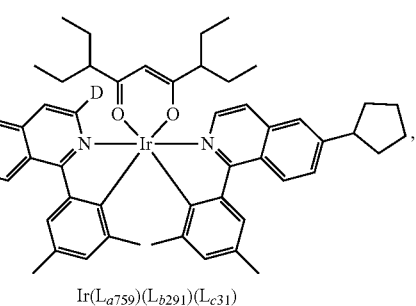
Ir(L$_{a759}$)(L$_{b291}$)(L$_{c31}$)
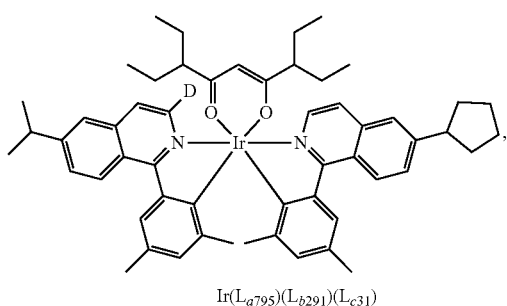
Ir(L$_{a795}$)(L$_{b291}$)(L$_{c31}$)
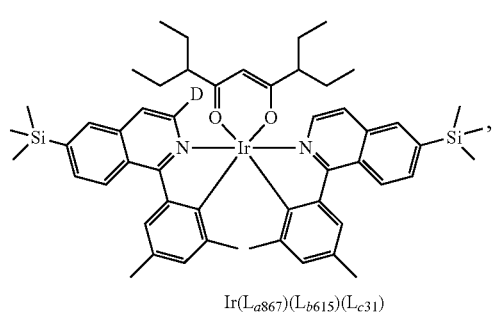
Ir(L$_{a867}$)(L$_{b615}$)(L$_{c31}$)
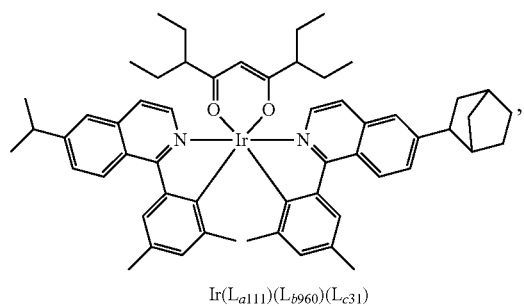
Ir(L$_{a111}$)(L$_{b960}$)(L$_{c31}$)
-continued
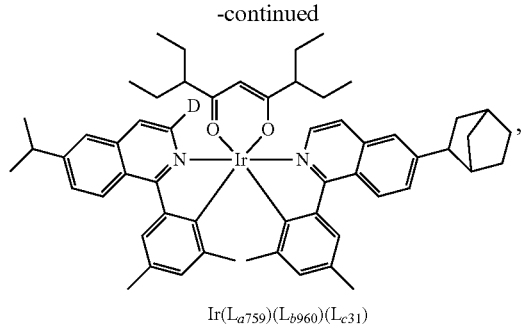
Ir(L$_{a759}$)(L$_{b960}$)(L$_{c31}$)
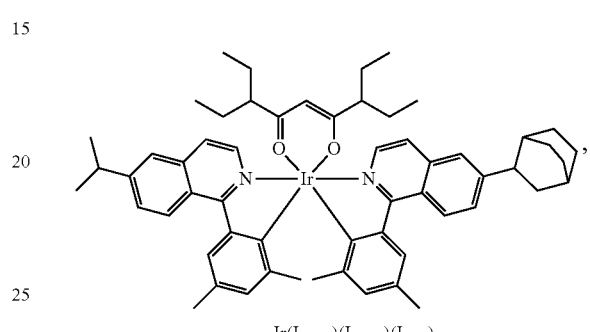
Ir(L$_{a111}$)(L$_{b996}$)(L$_{c31}$)
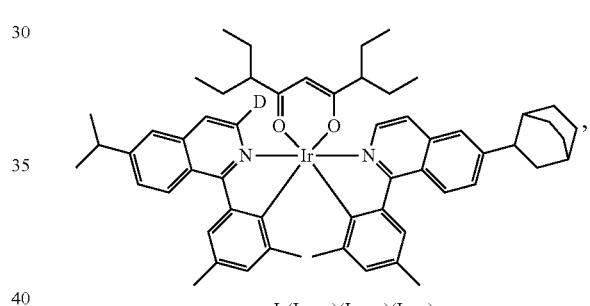
Ir(L$_{a759}$)(L$_{b996}$)(L$_{c31}$)
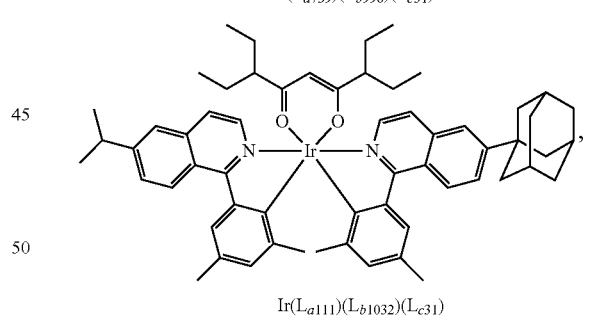
Ir(L$_{a111}$)(L$_{b1032}$)(L$_{c31}$)
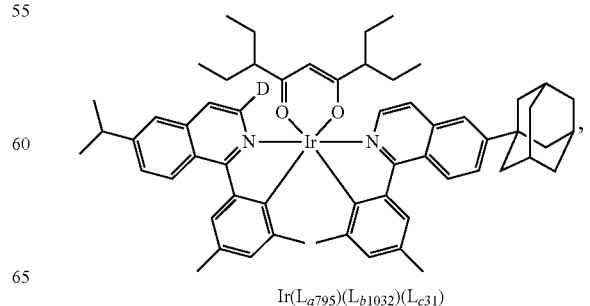
Ir(L$_{a795}$)(L$_{b1032}$)(L$_{c31}$)

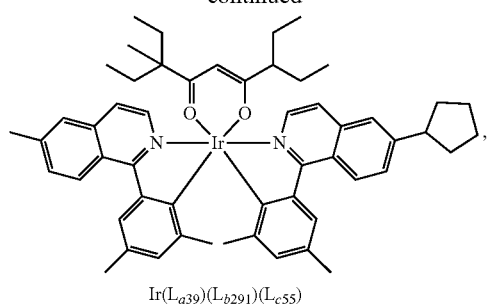
Ir(L_{a39})(L_{b291})(L_{c55})
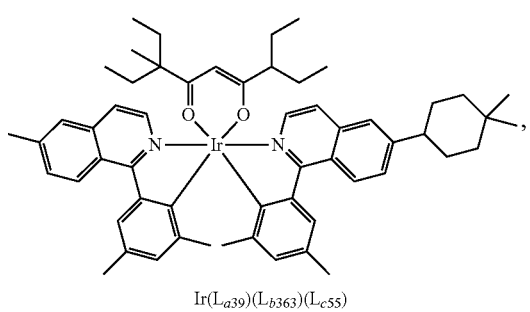
Ir(L_{a39})(L_{b363})(L_{c55})
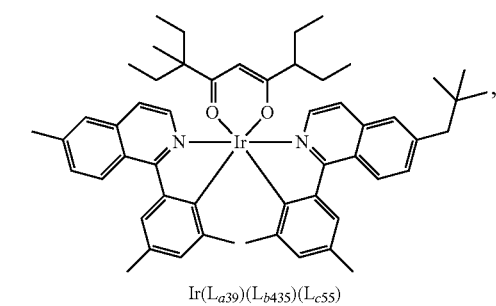
Ir(L_{a39})(L_{b435})(L_{c55})
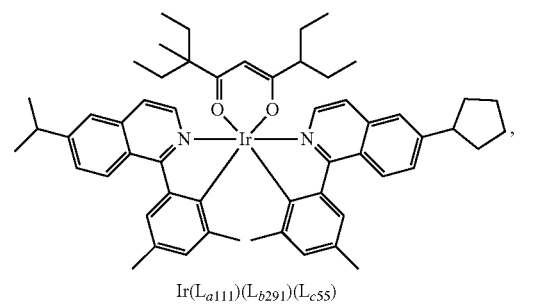
Ir(L_{a111})(L_{b291})(L_{c55})
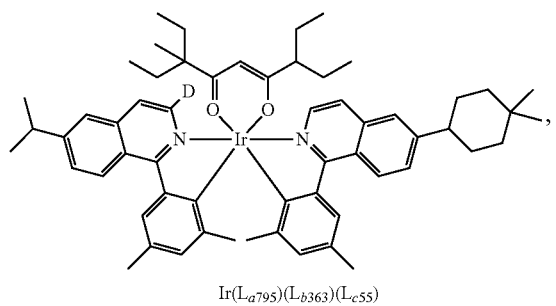
Ir(L_{a795})(L_{b363})(L_{c55})
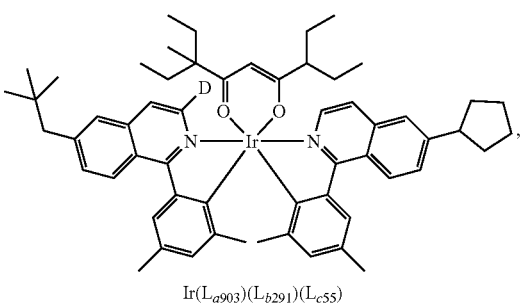
Ir(L_{a795})(L_{b435})(L_{c55})
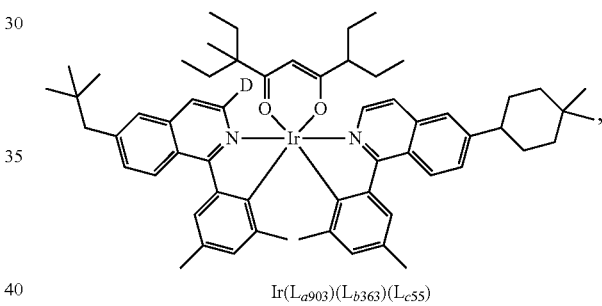
Ir(L_{a903})(L_{b291})(L_{c55})
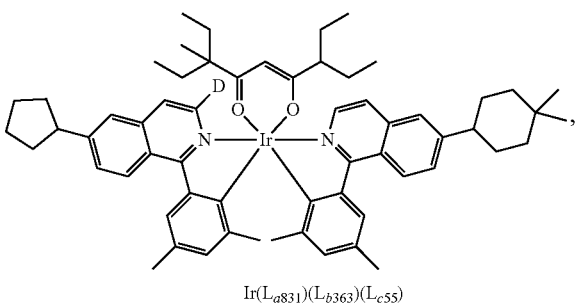
Ir(L_{a903})(L_{b363})(L_{c55})
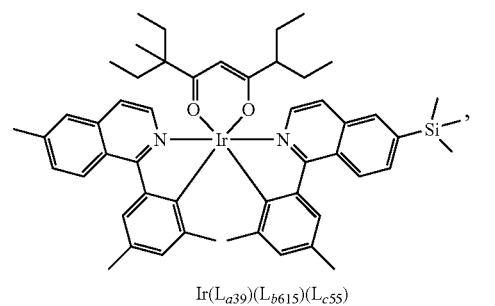
Ir(L_{a831})(L_{b363})(L_{c55})
Ir(L_{a39})(L_{b615})(L_{c55})

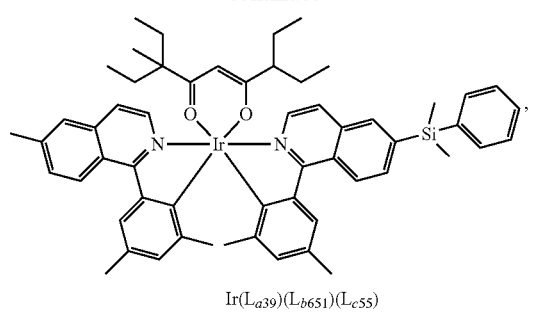

Ir(L<sub>a39</sub>)(L<sub>b651</sub>)(L<sub>c55</sub>),

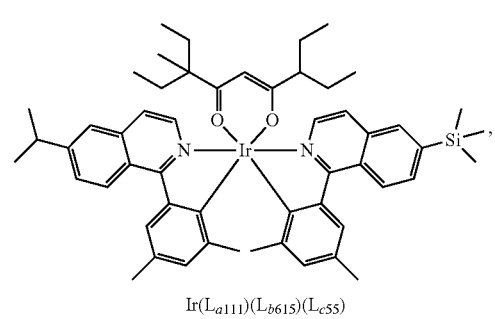

Ir(L<sub>a111</sub>)(L<sub>b615</sub>)(L<sub>c55</sub>),

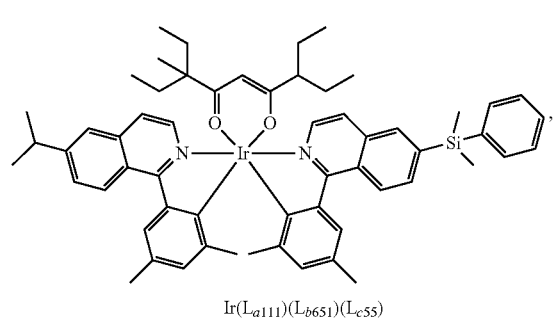

Ir(L<sub>a111</sub>)(L<sub>b651</sub>)(L<sub>c55</sub>),

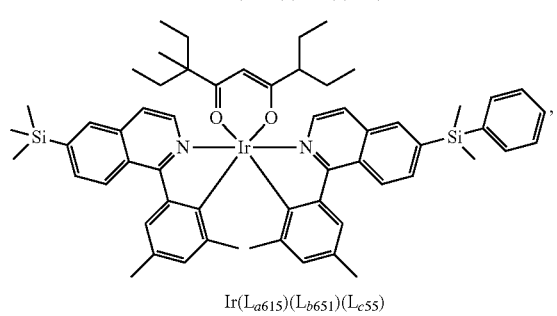

Ir(L<sub>a615</sub>)(L<sub>b651</sub>)(L<sub>c55</sub>),

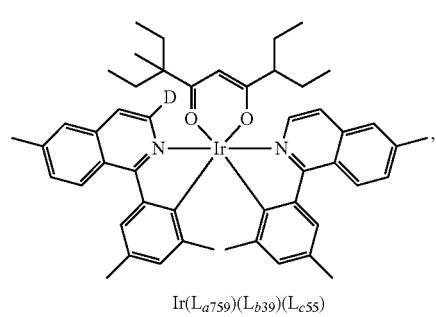

Ir(L<sub>a759</sub>)(L<sub>b39</sub>)(L<sub>c55</sub>),

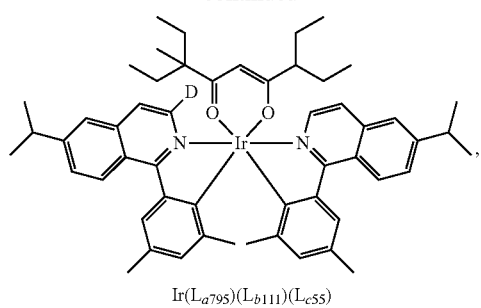

Ir(L<sub>a795</sub>)(L<sub>b111</sub>)(L<sub>c55</sub>),

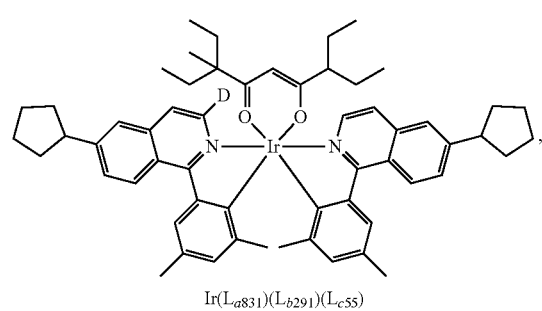

Ir(L<sub>a831</sub>)(L<sub>b291</sub>)(L<sub>c55</sub>),

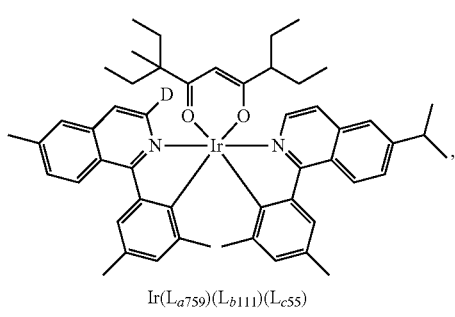

Ir(L<sub>a759</sub>)(L<sub>b111</sub>)(L<sub>c55</sub>),

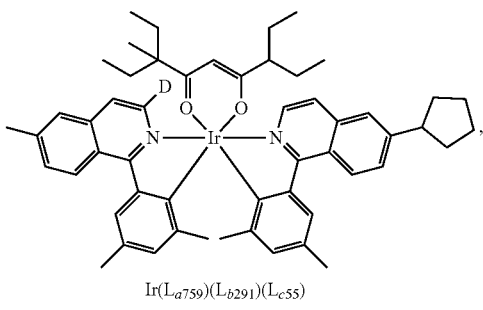

Ir(L<sub>a759</sub>)(L<sub>b291</sub>)(L<sub>c55</sub>),

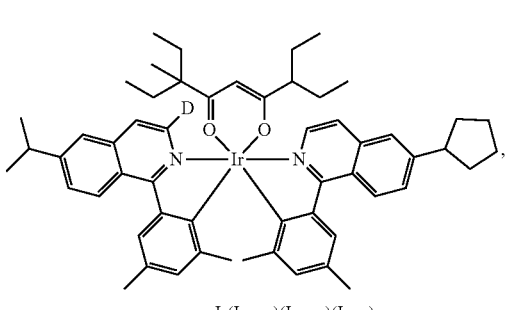

Ir(L<sub>a795</sub>)(L<sub>b291</sub>)(L<sub>c55</sub>),

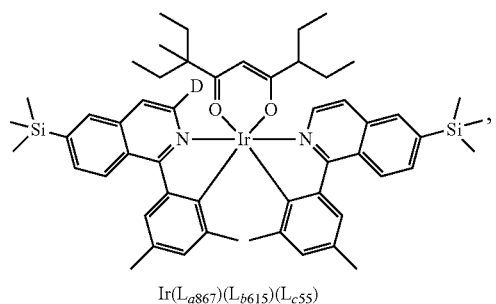

Ir(L*a867*)(L*b615*)(L*c55*)

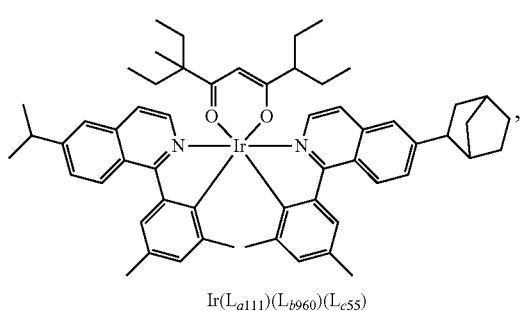

Ir(L*a111*)(L*b960*)(L*c55*)

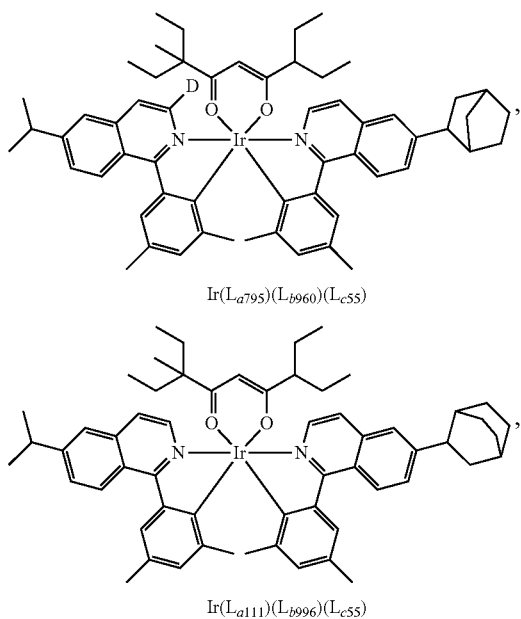

Ir(L*a795*)(L*b960*)(L*c55*)

Ir(L*a111*)(L*b996*)(L*c55*)

Ir(L*a795*)(L*b996*)(L*c55*)

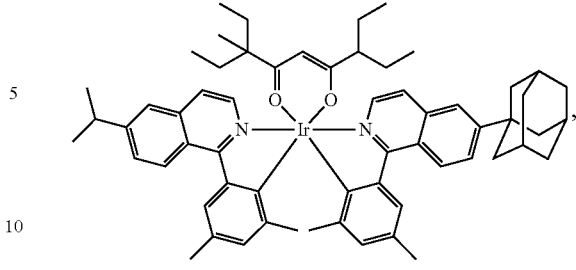

Ir(L*a831*)(L*b1032*)(L*c55*)

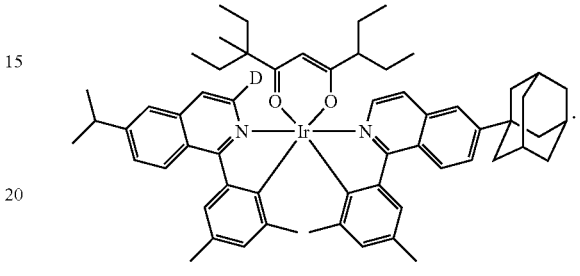

Ir(L*a795*)(L*b1032*)(L*c55*)

16. An electroluminescent device, comprising:
an anode,
a cathode, and
an organic layer disposed between the anode and the cathode, wherein the organic layer comprises the metal complex of claim 1.

17. The device of claim 16, wherein the organic layer is a light-emitting layer, and the metal complex is a light-emitting material; preferably, the organic layer further comprises a host material; preferably, the host material comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

18. The device of claim 16, wherein the device emits red light or white light.

19. A compound formulation, comprising the metal complex of claim 1.

20. The metal complex of claim 1, wherein $R_2$ is selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof;

in Formula 1, for substituents $R_1$ only, adjacent substituents can be optionally joined to form a ring which has a number of ring atoms less than or equal to 6;

in the ligands $L_a$ and/or $L_b$, at least one $R_2$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a thiol group, a sulfinyl group, a sulfonyl group, a phosphino group, and combinations thereof.

* * * * *